(12) United States Patent
Hirose et al.

(10) Patent No.: US 7,847,393 B2
(45) Date of Patent: Dec. 7, 2010

(54) CONDUCTIVE CONNECTING PINS FOR A PACKAGE SUBSTRATE

(75) Inventors: Naohiro Hirose, Ibi-gun (JP); Hitoshi Ito, Ibi-gun (JP); Yoshiyuki Iwata, Ibi-gun (JP); Masanori Kawade, Ibi-gun (JP); Hajime Yazu, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 0 days.

(21) Appl. No.: 12/257,501

(22) Filed: Oct. 24, 2008

(65) Prior Publication Data

US 2009/0053459 A1   Feb. 26, 2009

Related U.S. Application Data

(63) Continuation of application No. 09/830,949, filed as application No. PCT/JP99/06428 on Nov. 17, 1999.

(30) Foreign Application Priority Data

| Dec. 16, 1998 | (JP) | 10-357039 |
| Jan. 4, 1999 | (JP) | 11-034616 |
| Apr. 5, 1999 | (JP) | 11-097648 |
| Apr. 5, 1999 | (JP) | 11-097649 |
| Apr. 5, 1999 | (JP) | 11-097650 |
| Apr. 12, 1999 | (JP) | 11-104294 |
| Aug. 18, 1999 | (JP) | 11-231931 |
| Aug. 18, 1999 | (JP) | 11-231932 |
| Aug. 18, 1999 | (JP) | 11-231933 |
| Aug. 18, 1999 | (JP) | 11-231934 |

(51) Int. Cl.
*H01L 23/48* (2006.01)
*H01L 21/4763* (2006.01)

(52) U.S. Cl. ............... 257/697; 257/698; 257/700; 257/758; 257/786; 438/622

(58) Field of Classification Search ............ None
See application file for complete search history.

(56) References Cited

U.S. PATENT DOCUMENTS 4,418,857 A   12/1983   Ainslie et al.
(Continued)

FOREIGN PATENT DOCUMENTS

EP   0 534 733   3/1993
(Continued)

OTHER PUBLICATIONS

Patent Abstracts of Japan, 10-270143, Sep. 10, 1998, Nagaya Kunio, et al. Manufacture of Base with Terminal.
(Continued)

*Primary Examiner*—Alonzo Chambliss
(74) *Attorney, Agent, or Firm*—Oblon, Spivak, McClelland, Maier & Neustadt, L.L.P.

(57) ABSTRACT

A package substrate 310 incorporating a substrate provided with a conductor layer 5, a conductive connecting pin 100 arranged to establish the electrical connection with a mother board and secured to the surface of the substrate, wherein a pad 16 for securing the conductive connecting pin is provided for the package substrate 310. The pad 16 is covered with an organic resin insulating layer 15 having an opening 18 through which the pad 16 is partially exposed to the outside. The conductive connecting pin 100 is secured to the pad exposed to the outside through the opening with a conductive adhesive agent 17 so that solution of the conductive connecting pin 100 from the substrate occurring, for example when mounting is performed is prevented.

15 Claims, 76 Drawing Sheets

U.S. PATENT DOCUMENTS

| | | | |
|---|---|---|---|
| 4,736,266 A | 4/1988 | Tanibe | |
| 4,880,684 A | 11/1989 | Boss et al. | |
| 5,196,251 A | 3/1993 | Tummala et al. | |
| 5,313,021 A | 5/1994 | Sajja et al. | |
| 5,371,404 A | 12/1994 | Juskey et al. | |
| 5,442,239 A | 8/1995 | DiGiacomo et al. | |
| 5,485,039 A | 1/1996 | Fujita et al. | |
| 5,532,031 A | 7/1996 | Farooq et al. | |
| 5,586,006 A | 12/1996 | Seyama et al. | |
| 5,714,801 A | 2/1998 | Yano et al. | |
| 5,872,026 A | 2/1999 | Pasch | |
| 5,912,510 A | 6/1999 | Hwang et al. | |
| 5,965,064 A | 10/1999 | Yamada et al. | |
| 6,100,475 A | 8/2000 | Degani et al. | |
| 6,211,485 B1 | 4/2001 | Burgess | |
| 6,623,283 B1 | 9/2003 | Torigian et al. | |

FOREIGN PATENT DOCUMENTS

| | | |
|---|---|---|
| EP | 536 802 | 4/1993 |
| EP | 0 638 931 | 2/1995 |
| GB | 2 324 415 | 10/1998 |
| JP | 58-30175 | 2/1983 |
| JP | 58-030175 A | 2/1983 |
| JP | 58-194396 | 11/1983 |
| JP | 61-125060 | 6/1986 |
| JP | 62-173742 | 7/1987 |
| JP | 63-088834 | 4/1988 |
| JP | 1-253940 | 10/1989 |
| JP | 4-164358 | 6/1992 |
| JP | 04-164358 A | 6/1992 |
| JP | 04-055555 | 9/1992 |
| JP | 5-102382 | 4/1993 |
| JP | 5-136313 | 6/1993 |
| JP | 05-226052 | 9/1993 |
| JP | 5-226052 | 9/1993 |
| JP | 6-77348 | 3/1994 |
| JP | 06-077348 A | 3/1994 |
| JP | 07-058276 | 3/1995 |
| JP | 7-61871 | 3/1995 |
| JP | 07-061871 A | 3/1995 |
| JP | 7-273452 | 10/1995 |
| JP | 07-273452 | 10/1995 |
| JP | 07-326706 | 12/1995 |
| JP | 7-326706 | 12/1995 |
| JP | 8-162563 | 6/1996 |
| JP | 08-162563 A | 6/1996 |
| JP | 8-172273 | 7/1996 |
| JP | 8-195466 | 7/1996 |
| JP | 08-316367 | 11/1996 |
| JP | 8-316367 | 11/1996 |
| JP | 09-008204 | 1/1997 |
| JP | 9-8204 | 1/1997 |
| JP | 09-008460 | 1/1997 |
| JP | 9-8460 | 1/1997 |
| JP | 09-129778 | 5/1997 |
| JP | 9-129778 | 5/1997 |
| JP | 08-195466 | 7/1997 |
| JP | 9-219420 | 8/1997 |
| JP | 09-219420 A | 8/1997 |
| JP | 9-223719 | 8/1997 |
| JP | 09-223719 | 8/1997 |
| JP | 09-298365 | 11/1997 |
| JP | 10-022601 | 1/1998 |
| JP | 10-022601 A | 1/1998 |
| JP | 02-781881 B2 | 5/1998 |
| JP | 2781881 | 5/1998 |
| JP | 10-242625 | 9/1998 |
| JP | 10-270143 | 10/1998 |
| JP | 10-270144 | 10/1998 |
| KR | 1998-41884 | 8/1998 |
| KR | 153210 | 12/1998 |
| TW | 345591 | 11/1998 |
| WO | WO 92/20100 | 11/1992 |
| WO | WO 94/18707 | 8/1994 |

OTHER PUBLICATIONS

Patent Abstracts of Japan, 10-270144, Sep. 10, 1998, Nagaya Kunio, et al. Jig for Manufacturing Base with Terminal.

Patent Abstracts of Japan, 09-008460, Oct. 1, 1997, Asai Motoo, et al. Electronic Component Mounting Board.

Patent Abstracts of Japan, 08-195466, Jul. 30, 1996, Ito Osamu, et al. Semiconductor Device.

Patent Abstracts of Japan, 09-223719, Aug. 26, 1997, Matsunaga Hayashi. Semiconductor Device.

Patent Abstracts of Japan, 05-226052, Mar. 9, 1993, Okada Yoshitsugu, Formation of Input/Output Pin for Ceramic Multilayer Wiring Board.

Fig. 1
(a)
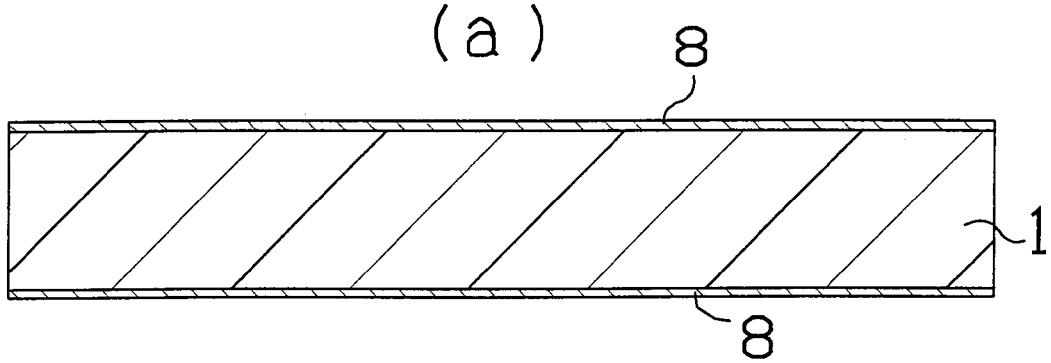
(b)
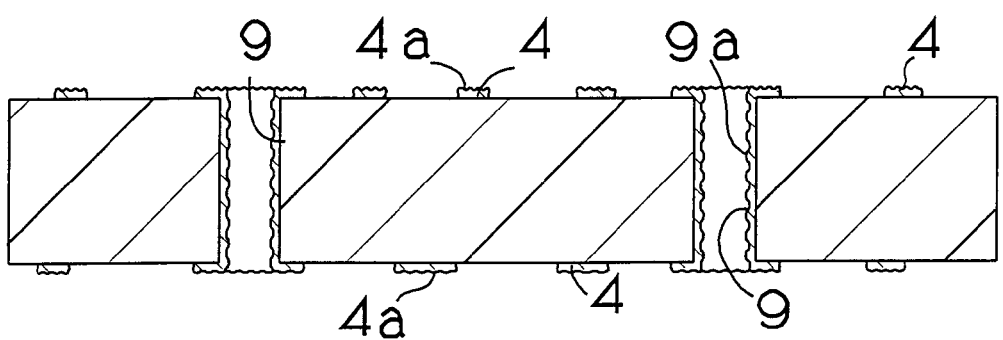
(c)
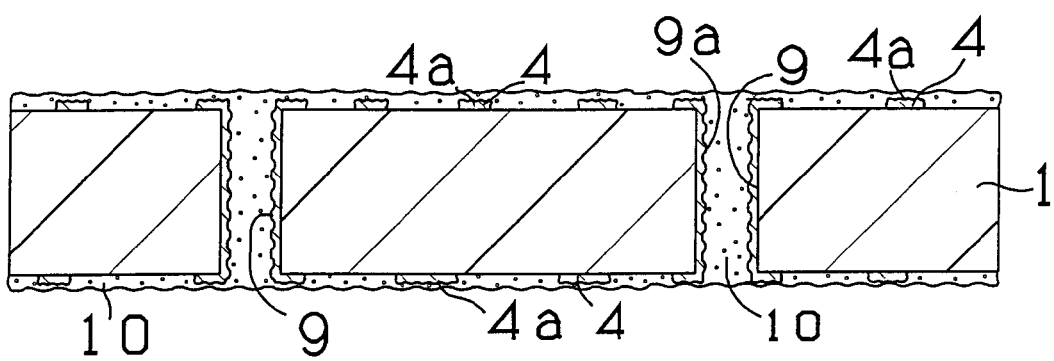
(d)
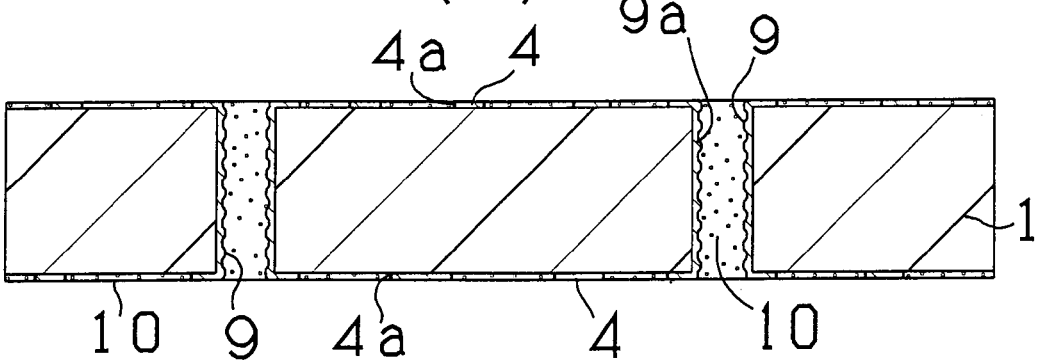

Fig. 2
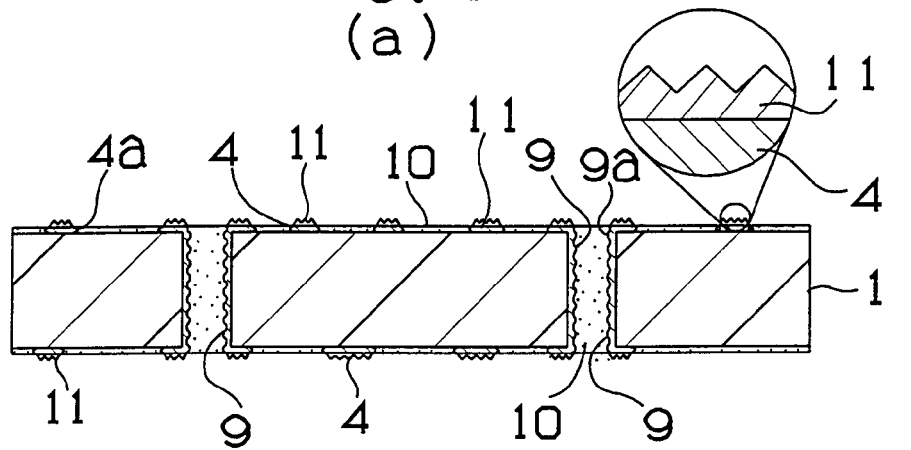
(a)
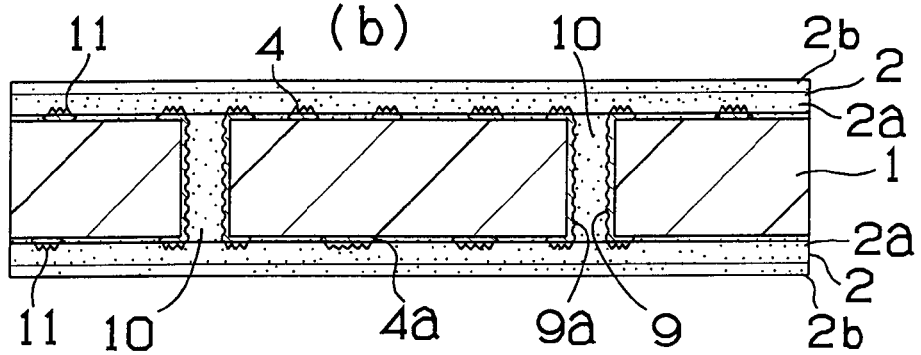
(b)
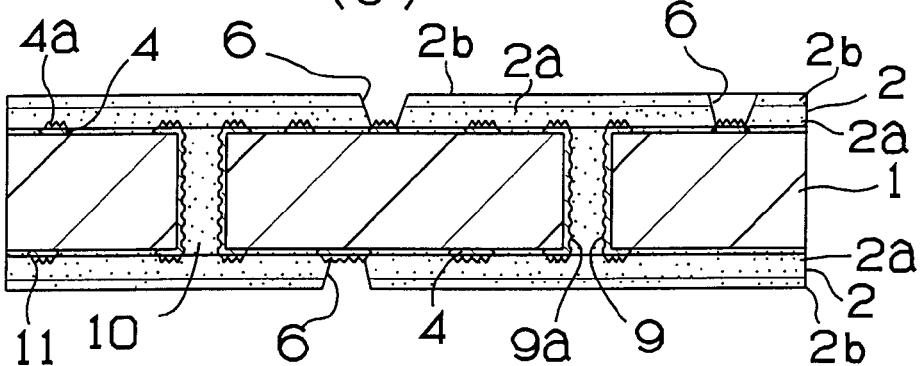
(c)
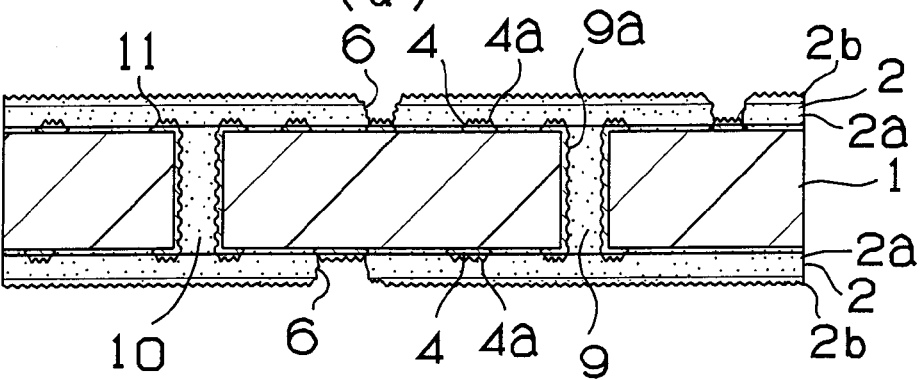
(d)

Fig. 9
(A)
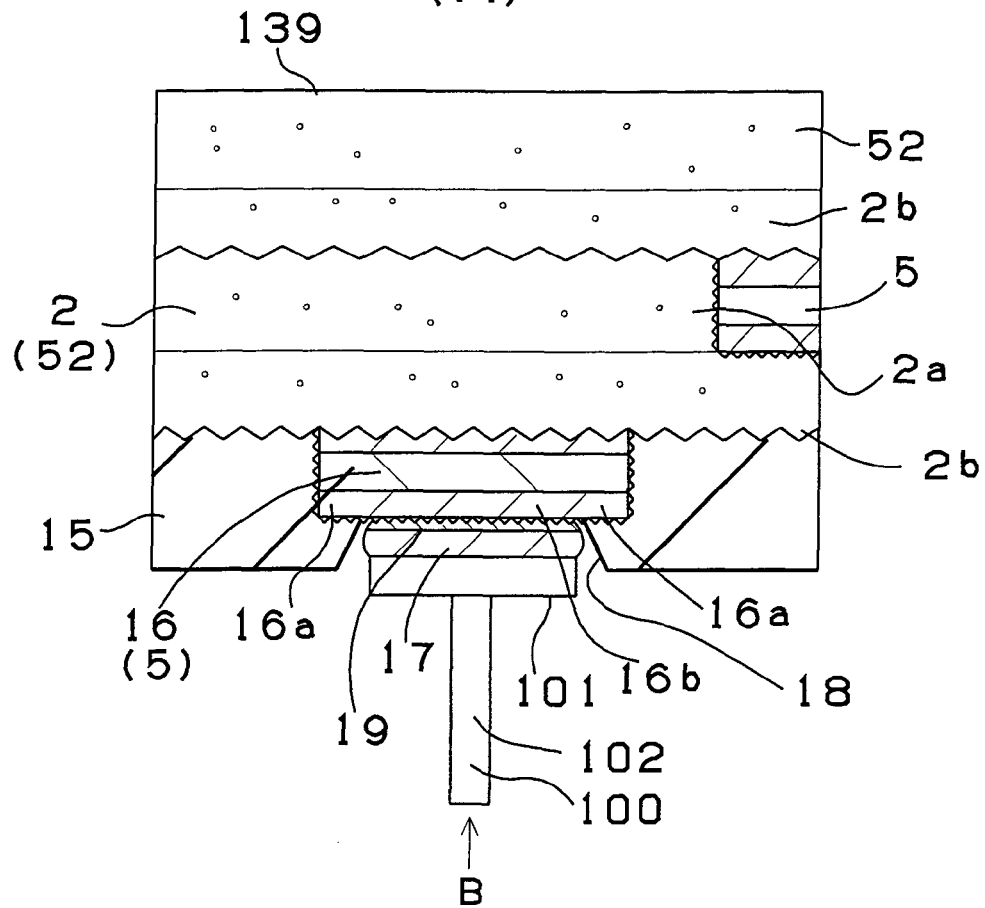
(B)
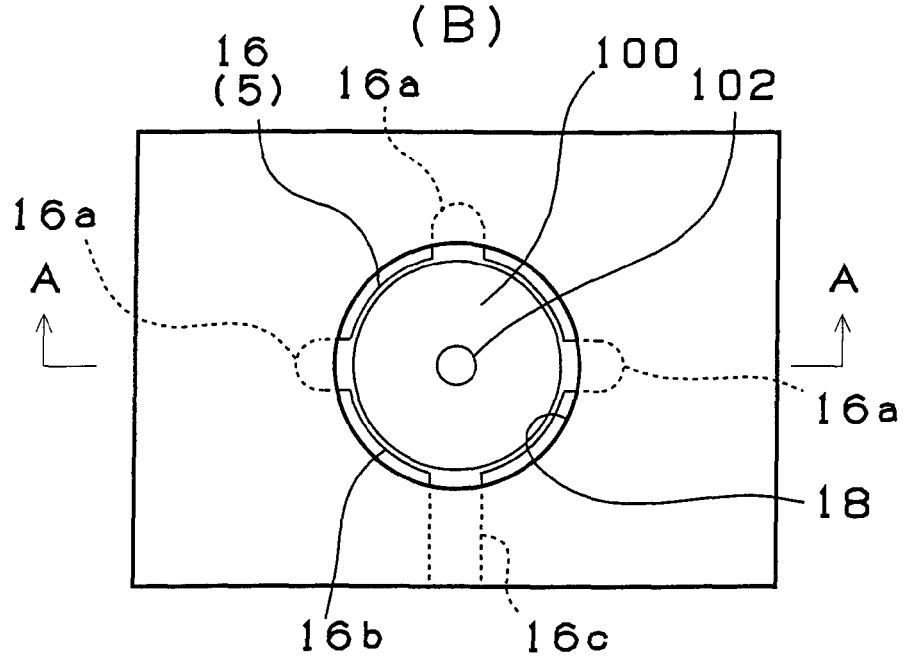

Fig.12
(A)
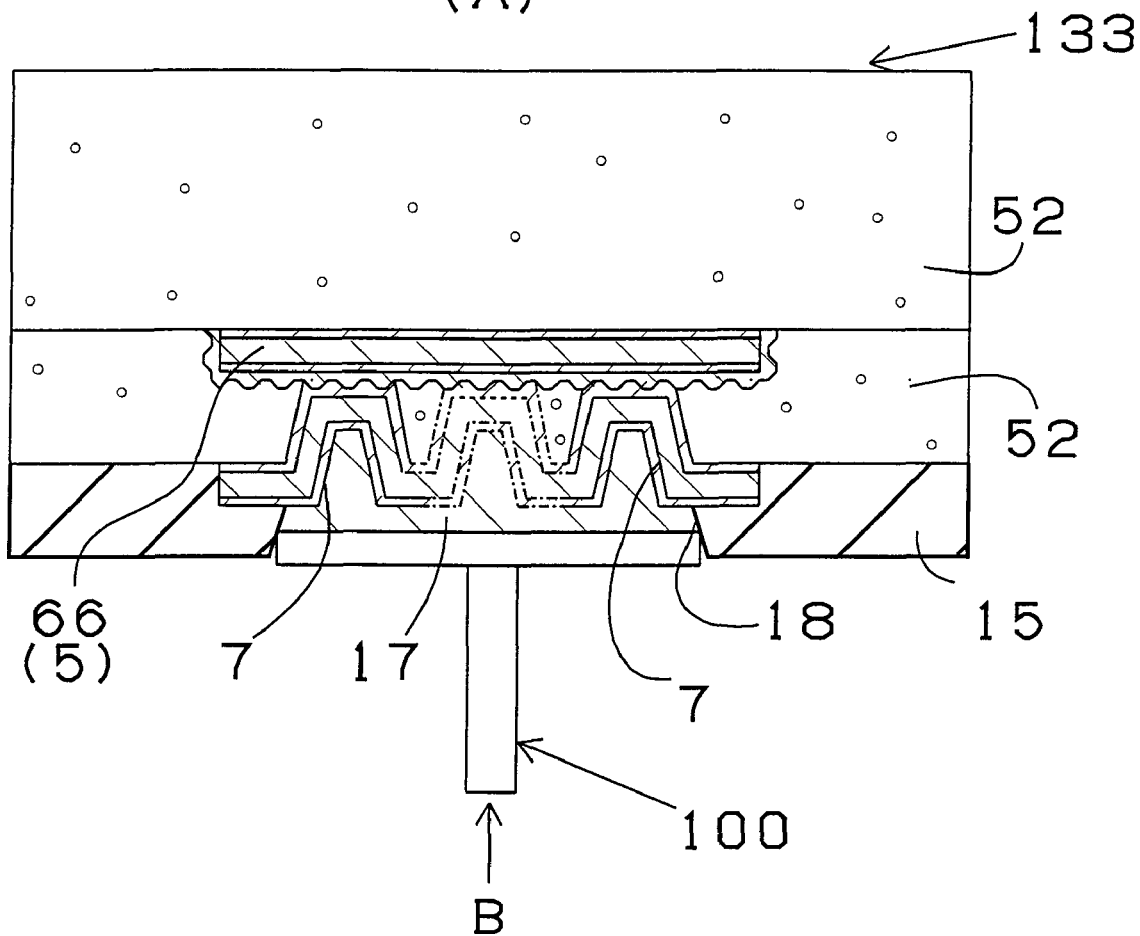
(B)
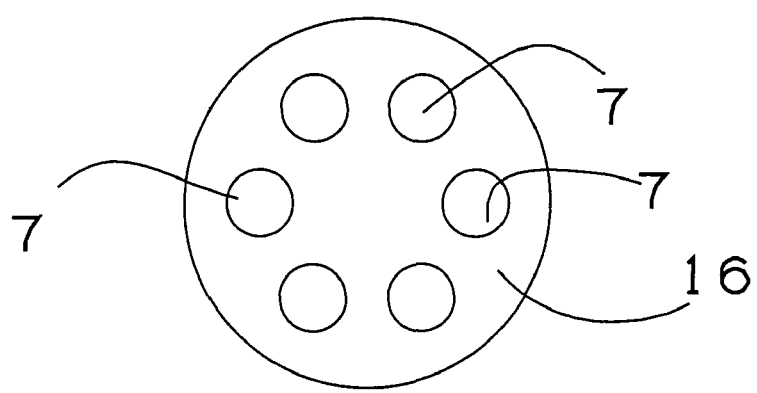

Fig.13
(A)
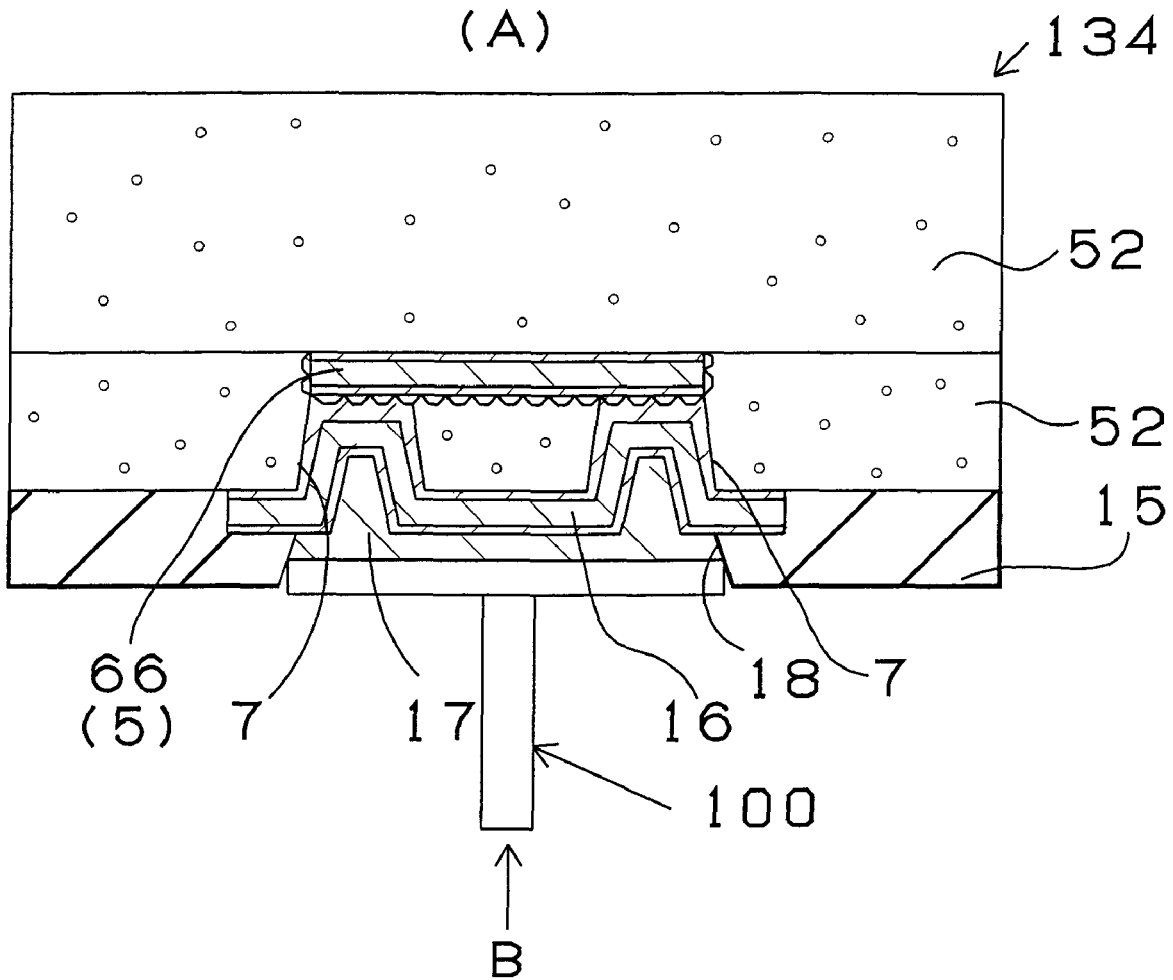
(B)
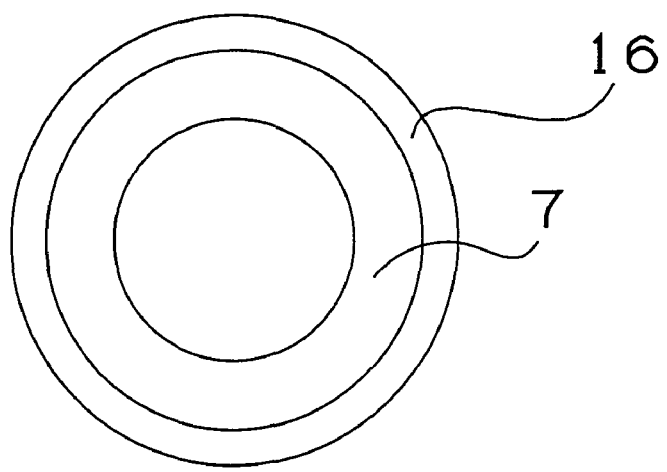

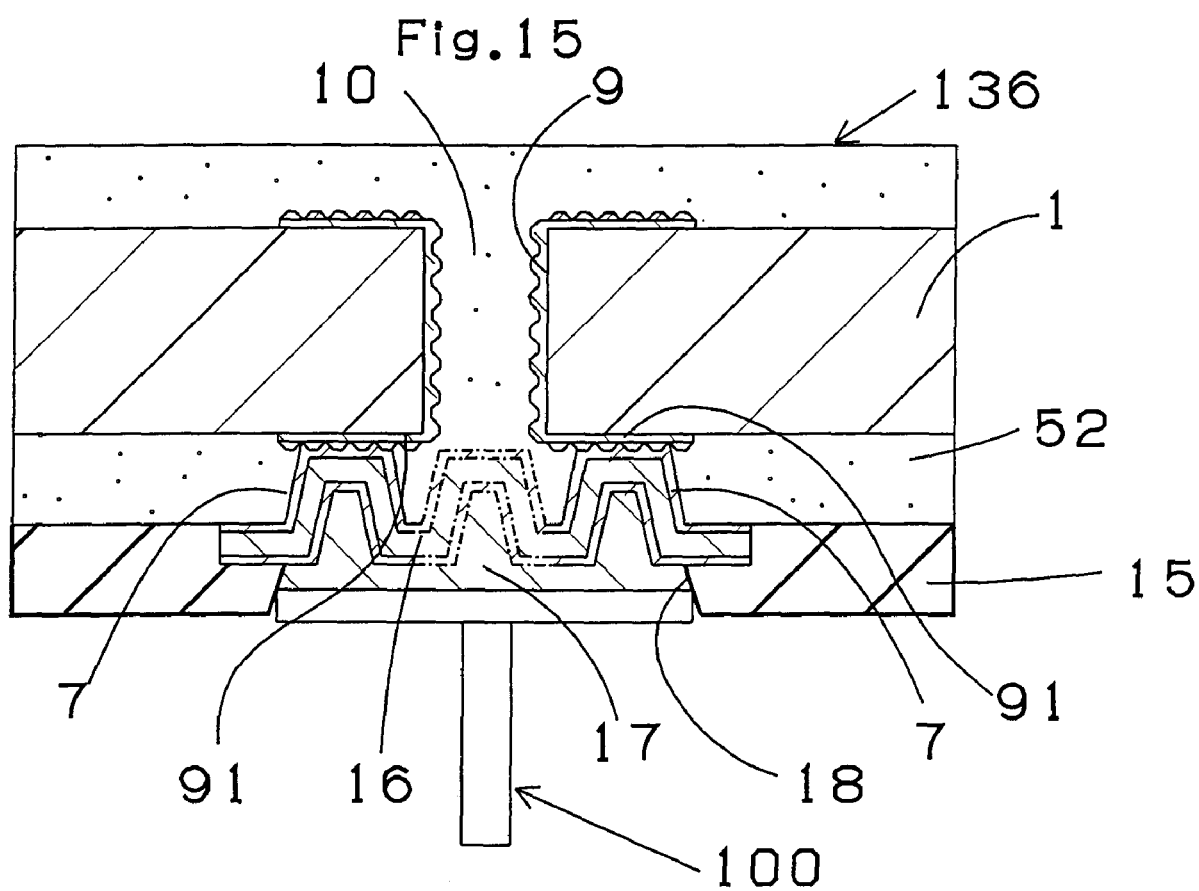

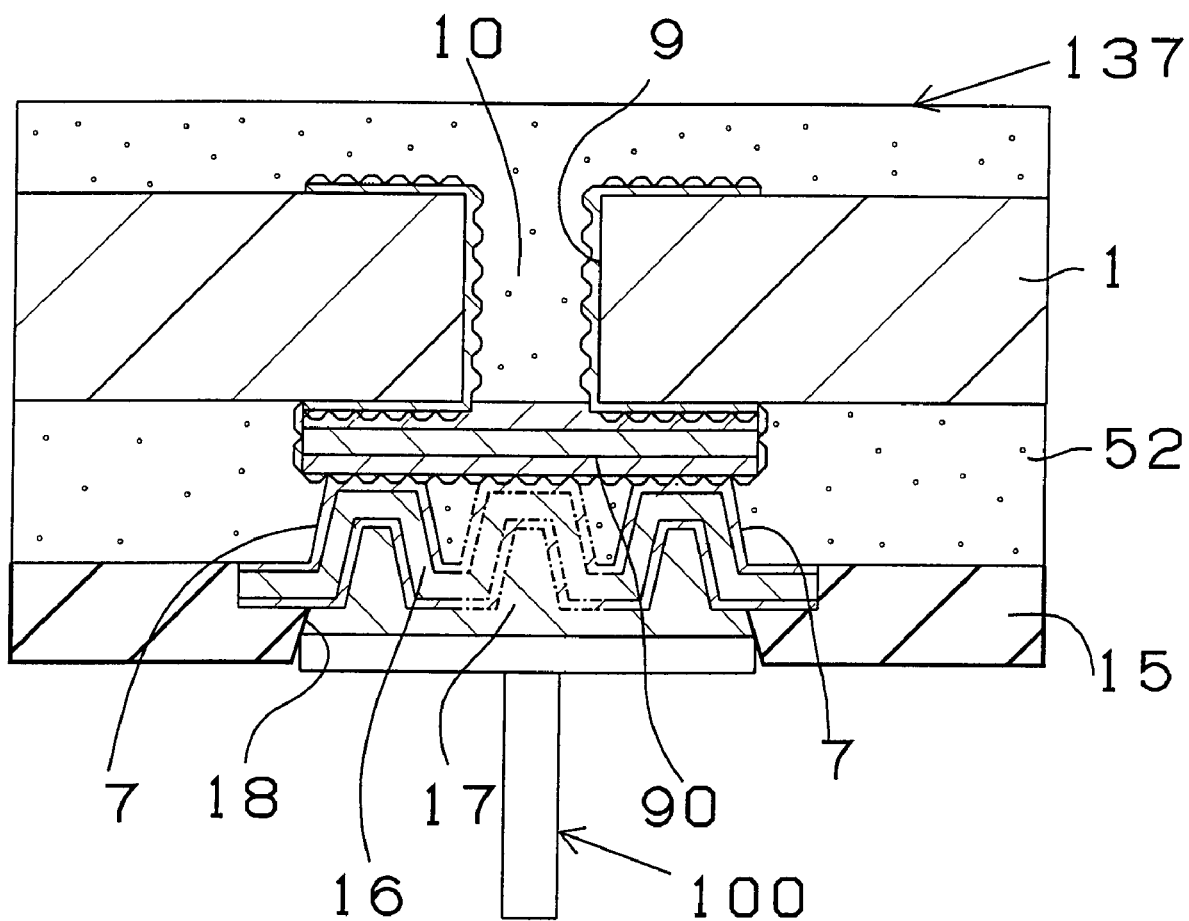

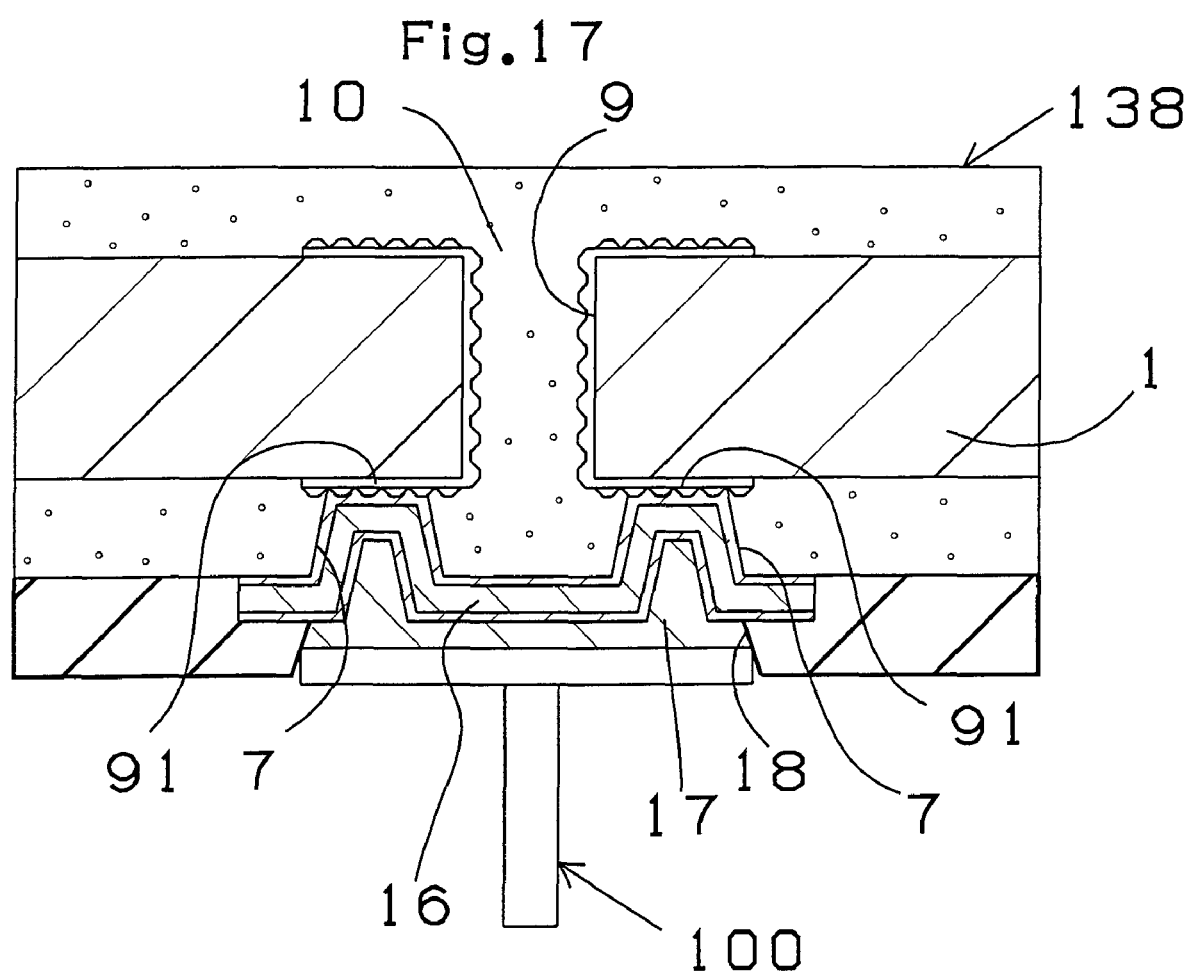

Fig. 18

| | conductive connecting pin | | after heating test | | | | | after heat cycle test | | | |
|---|---|---|---|---|---|---|---|---|---|---|---|
| | strength of adhesive bonding | | state of pin | state of pin | strength of adhesive bonding | | conduction test | state of pin | strength of adhesive bonding | | conduction test |
| | minimum value | average value | | | minimum value | average value | | | minimum value | average value | |
| first embodiment | 2.0 | 3.2 | OK | OK | 2.0 | 3.2 | OK | OK | 1.9 | 3.1 | OK |
| example 1 of first embodiment | 2.0 | 3.0 | OK | OK | 2.0 | 3.0 | OK | OK | 1.9 | 2.9 | OK |
| first modification | 2.1 | 3.2 | OK | OK | 2.1 | 3.2 | OK | OK | 2.0 | 3.1 | OK |
| example 1 of first modification | 2.1 | 3.5 | OK | OK | 2.1 | 3.5 | OK | OK | 2.0 | 3.4 | OK |
| example 2 of first modification | 2.1 | 3.6 | OK | OK | 2.1 | 3.6 | OK | OK | 2.0 | 3.5 | OK |
| example 3 of first modification | 2.1 | 3.5 | OK | OK | 2.1 | 3.5 | OK | OK | 2.0 | 3.4 | OK |
| example 4 of first modification | 2.1 | 3.8 | OK | OK | 2.1 | 3.8 | OK | OK | 2.0 | 3.6 | OK |
| second modification | 2.0 | 3.0 | OK | OK | 2.0 | 3.0 | OK | OK | 1.9 | 2.9 | OK |
| example 1 of second modification | 2.0 | 3.2 | OK | OK | 2.0 | 3.2 | OK | OK | 1.9 | 3.1 | OK |
| example 2 of second modification | 2.0 | 3.2 | OK | OK | 2.0 | 3.2 | OK | OK | 1.9 | 3.1 | OK |
| third modification | 2.0 | 3.6 | OK | OK | 2.0 | 3.6 | OK | OK | 1.9 | 3.5 | OK |

Fig.24
(A)
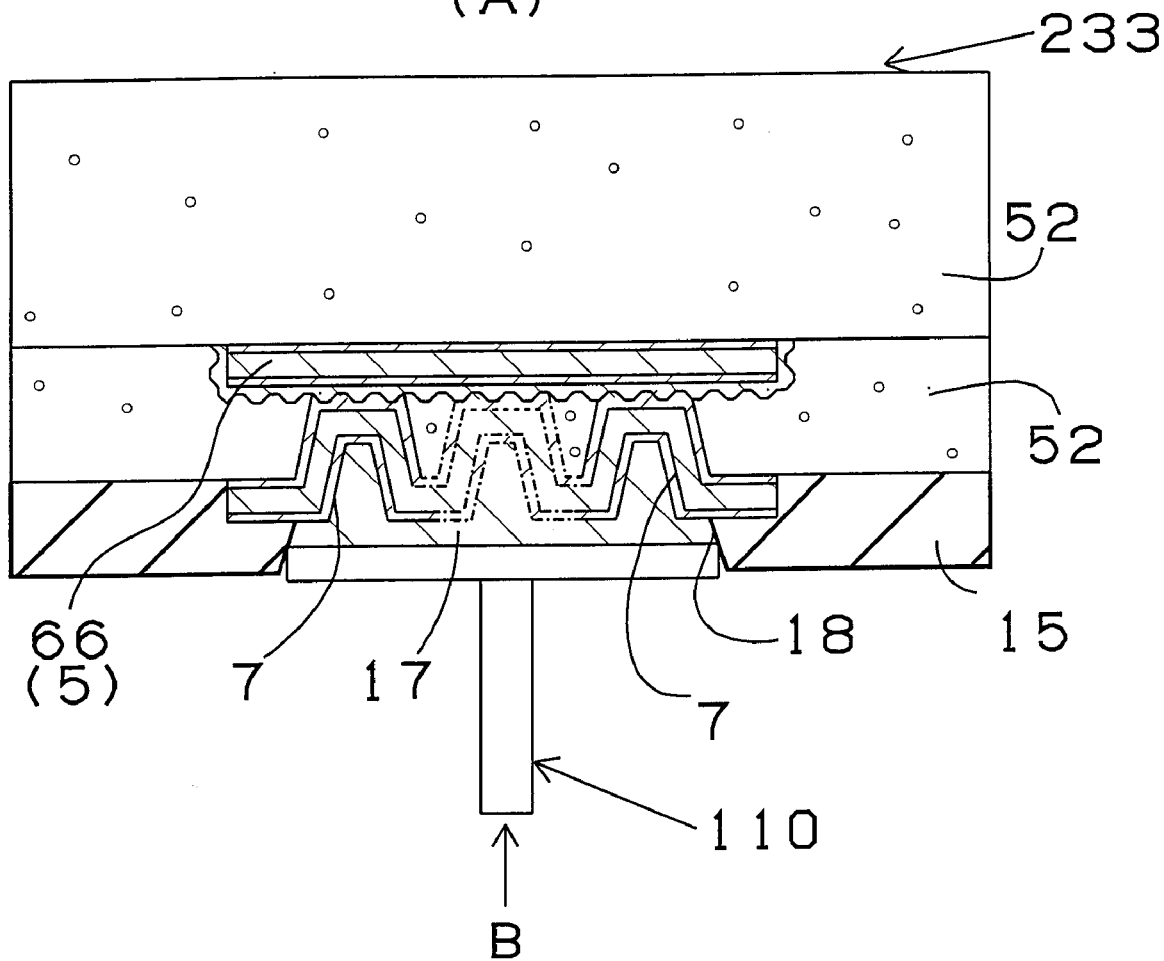
(B)
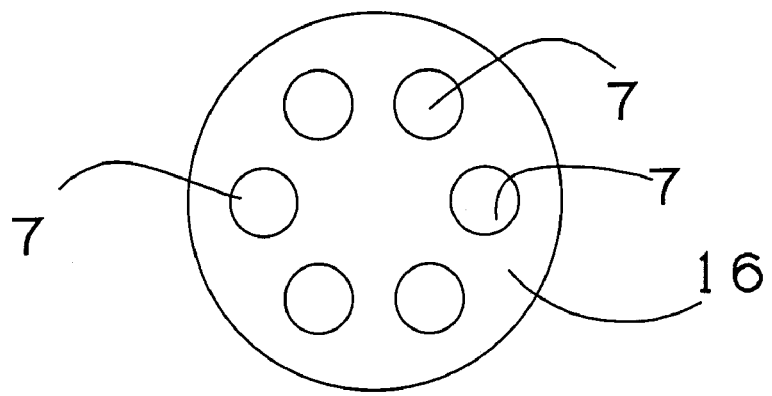

Fig.25
(A)
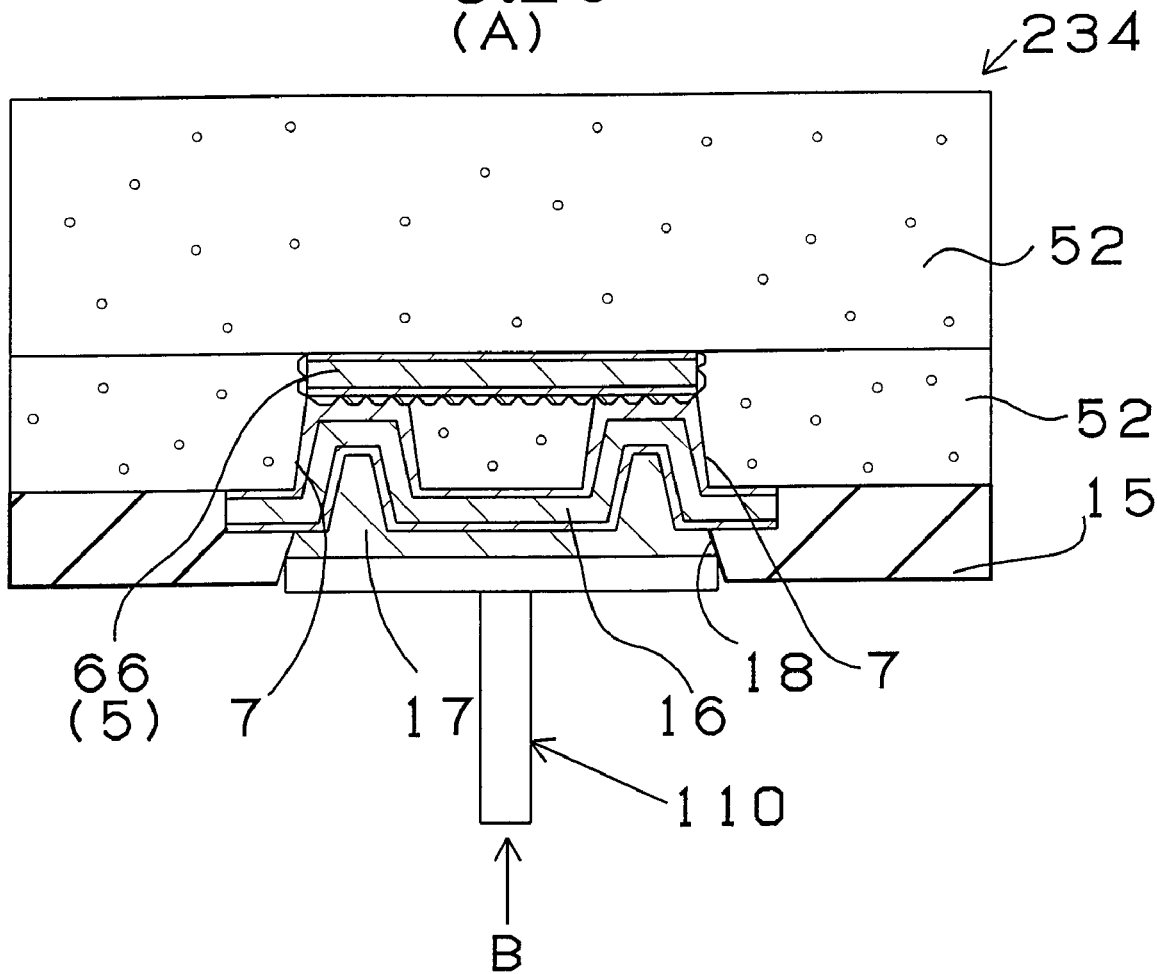
(B)
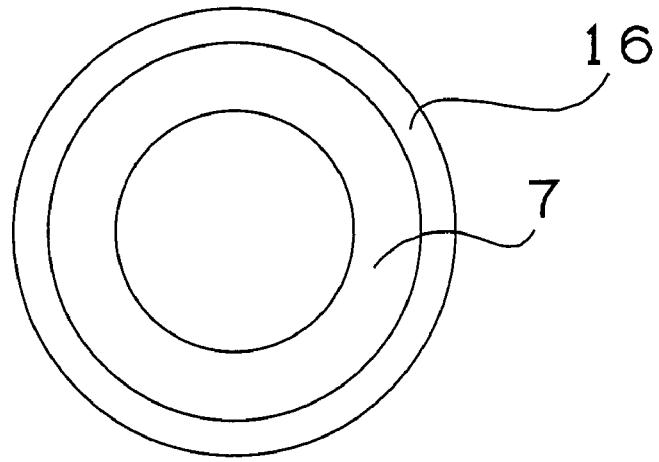

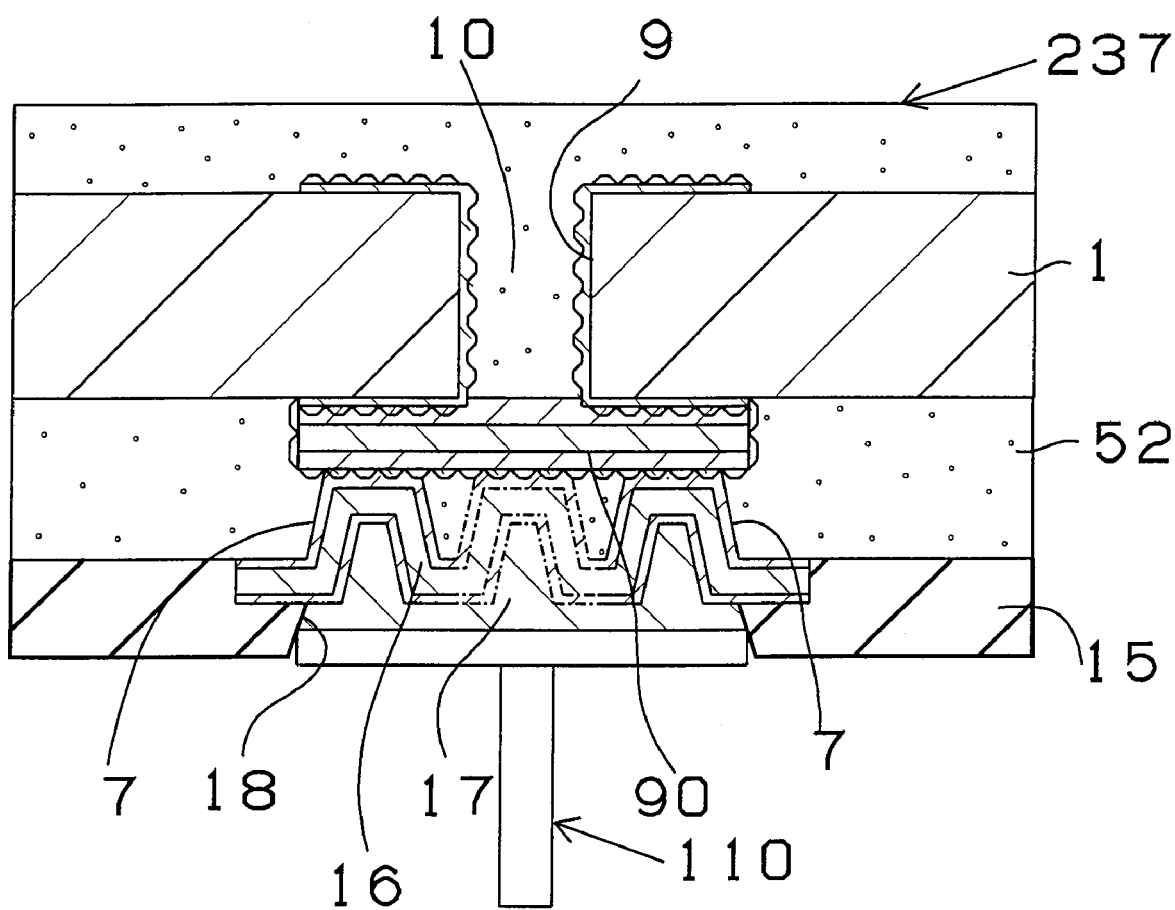

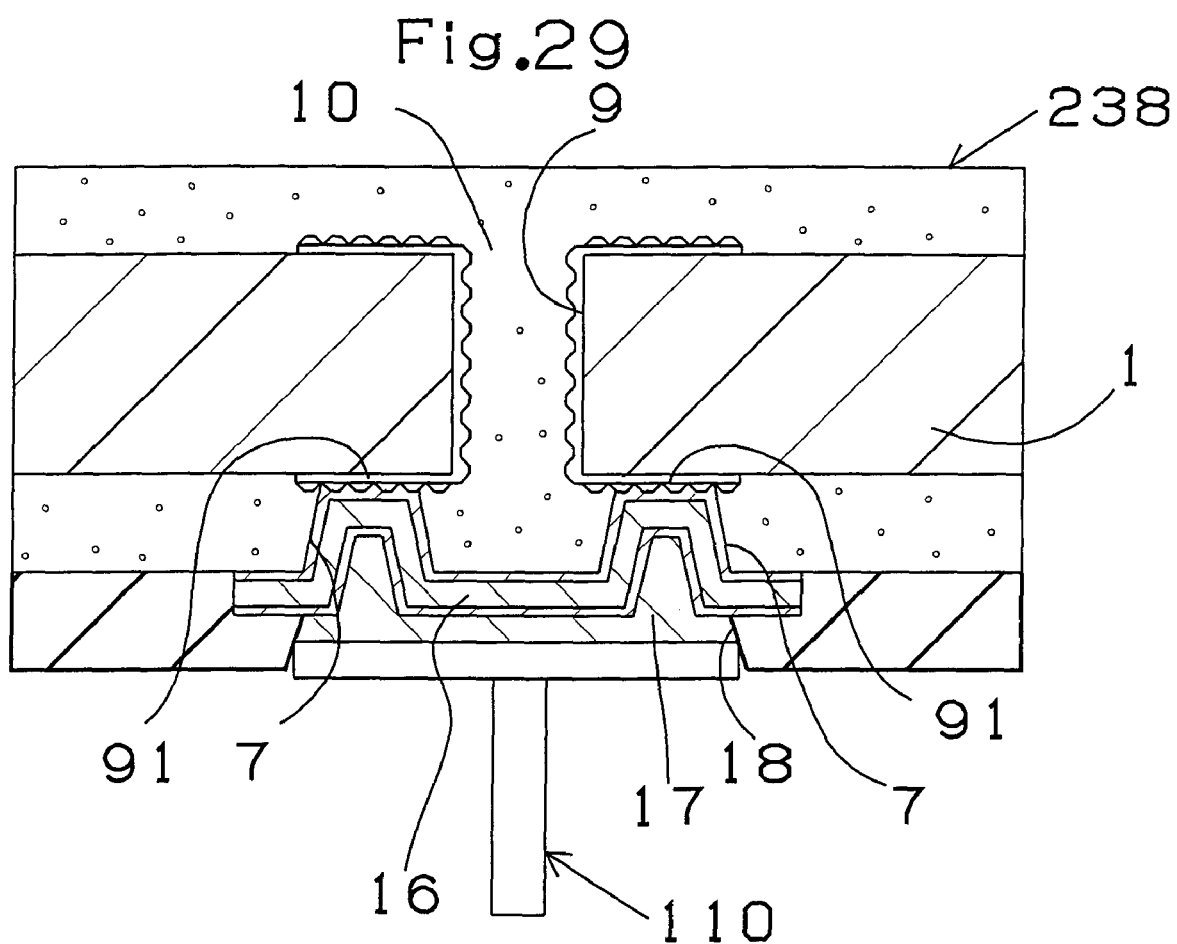

Fig. 30

| | conductive connecting pin | | state of pin | after heating test | | | conduction test | after heat cycle test | | | conduction test |
|---|---|---|---|---|---|---|---|---|---|---|---|
| | strength of adhesive bonding | | | state of pin | strength of adhesive bonding | | | state of pin | strength of adhesive bonding | | |
| | minimum value | average value | | | minimum value | average value | | | minimum value | average value | |
| second embodiment | 2.0 | 3.2 | OK | OK | 2.0 | 3.2 | OK | OK | 1.9 | 3.1 | OK |
| example 1 of second embodiment | 2.0 | 3.0 | OK | OK | 2.0 | 3.0 | OK | OK | 1.9 | 3.0 | OK |
| first modification | 2.1 | 3.2 | OK | OK | 2.1 | 3.2 | OK | OK | 2.0 | 3.1 | OK |
| example 1 of first modification | 2.1 | 3.5 | OK | OK | 2.1 | 3.5 | OK | OK | 2.0 | 3.4 | OK |
| example 2 of first modification | 2.1 | 3.6 | OK | OK | 2.1 | 3.6 | OK | OK | 2.0 | 3.5 | OK |
| example 3 of first modification | 2.1 | 3.5 | OK | OK | 2.1 | 3.5 | OK | OK | 2.0 | 3.4 | OK |
| second modification | 2.0 | 3.0 | OK | OK | 2.0 | 3.0 | OK | OK | 1.9 | 2.8 | OK |
| example 1 of second modification | 2.0 | 3.2 | OK | OK | 2.0 | 3.2 | OK | OK | 1.9 | 3.1 | OK |
| example 2 of second modification | 2.0 | 3.2 | OK | OK | 2.0 | 3.2 | OK | OK | 1.9 | 3.1 | OK |
| third modification | 2.0 | 3.6 | OK | OK | 2.0 | 3.6 | OK | OK | 1.9 | 3.5 | OK |

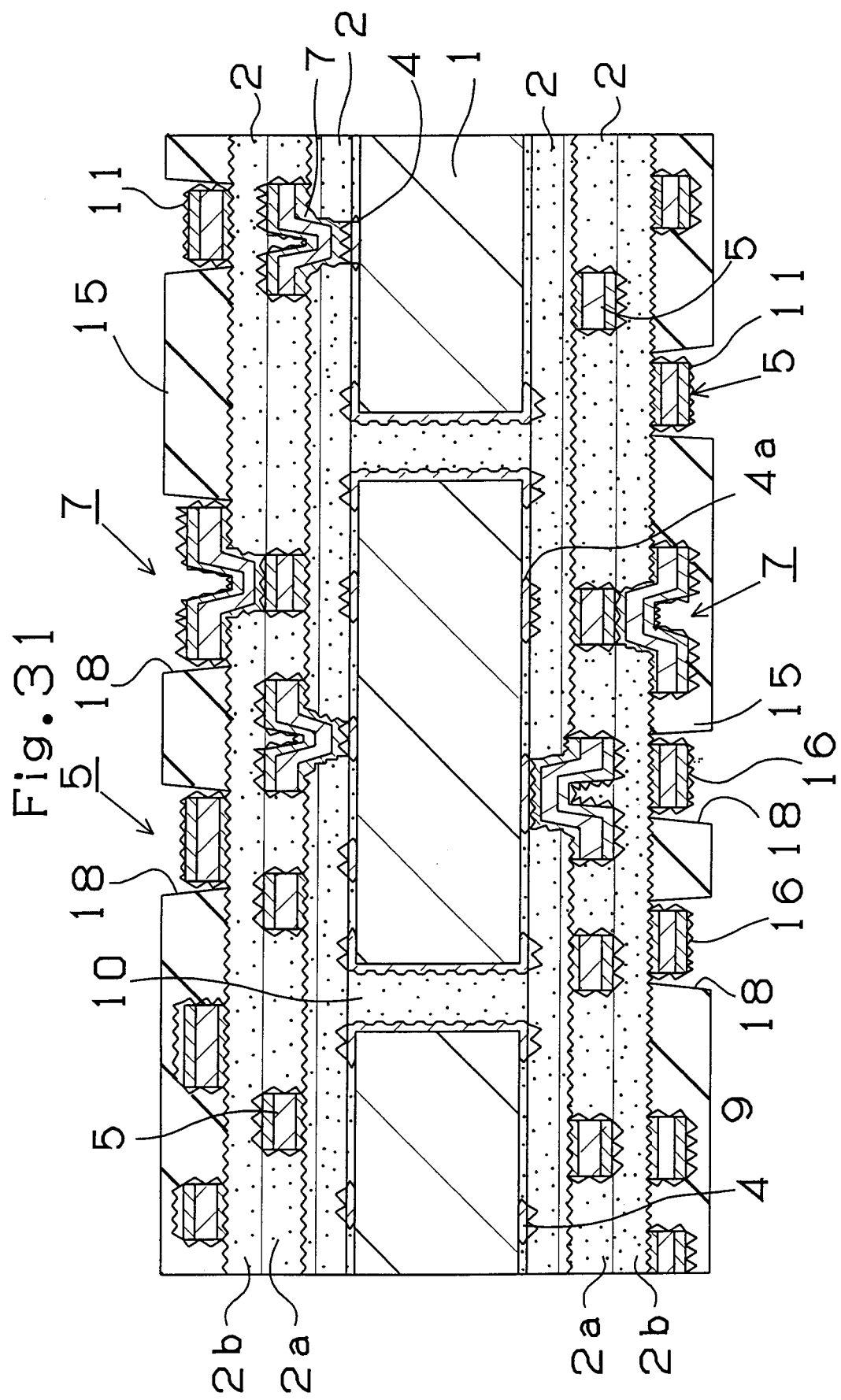

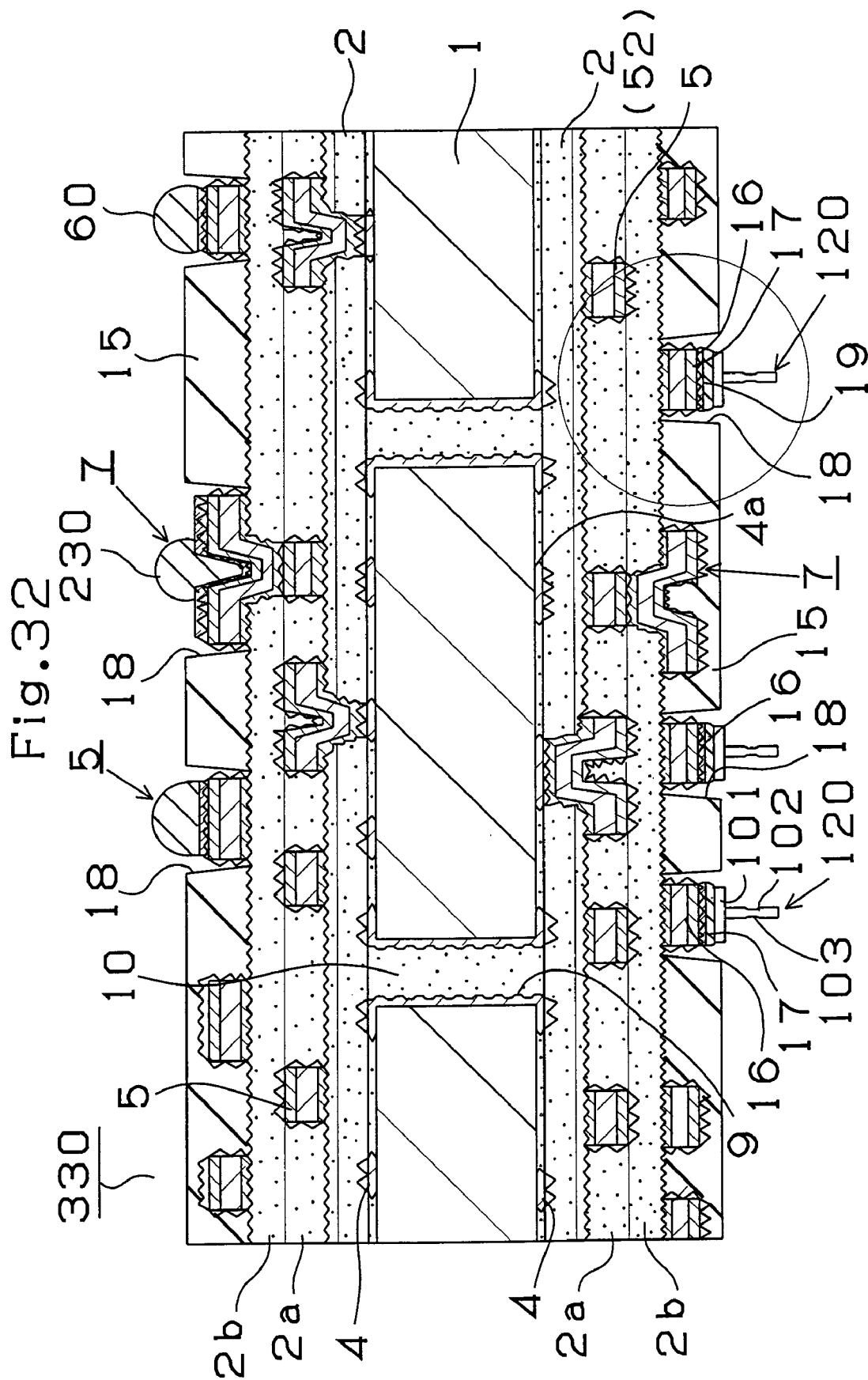

Fig.33
(A)
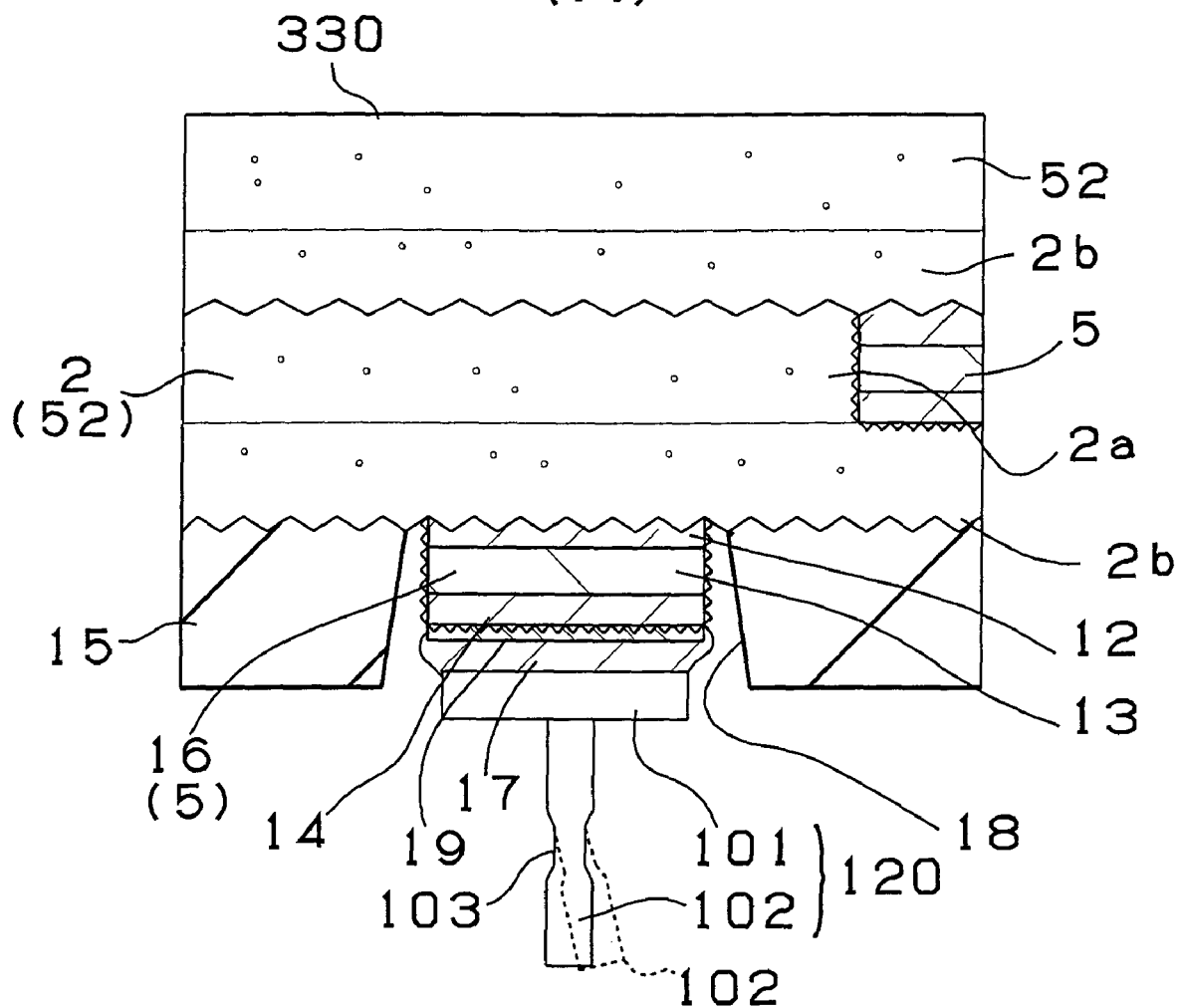
(B)
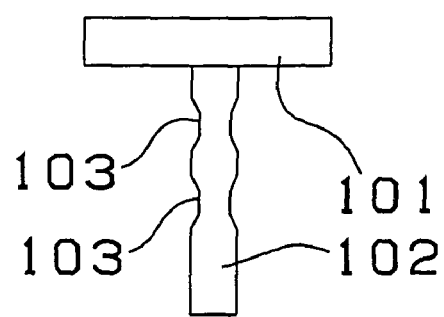

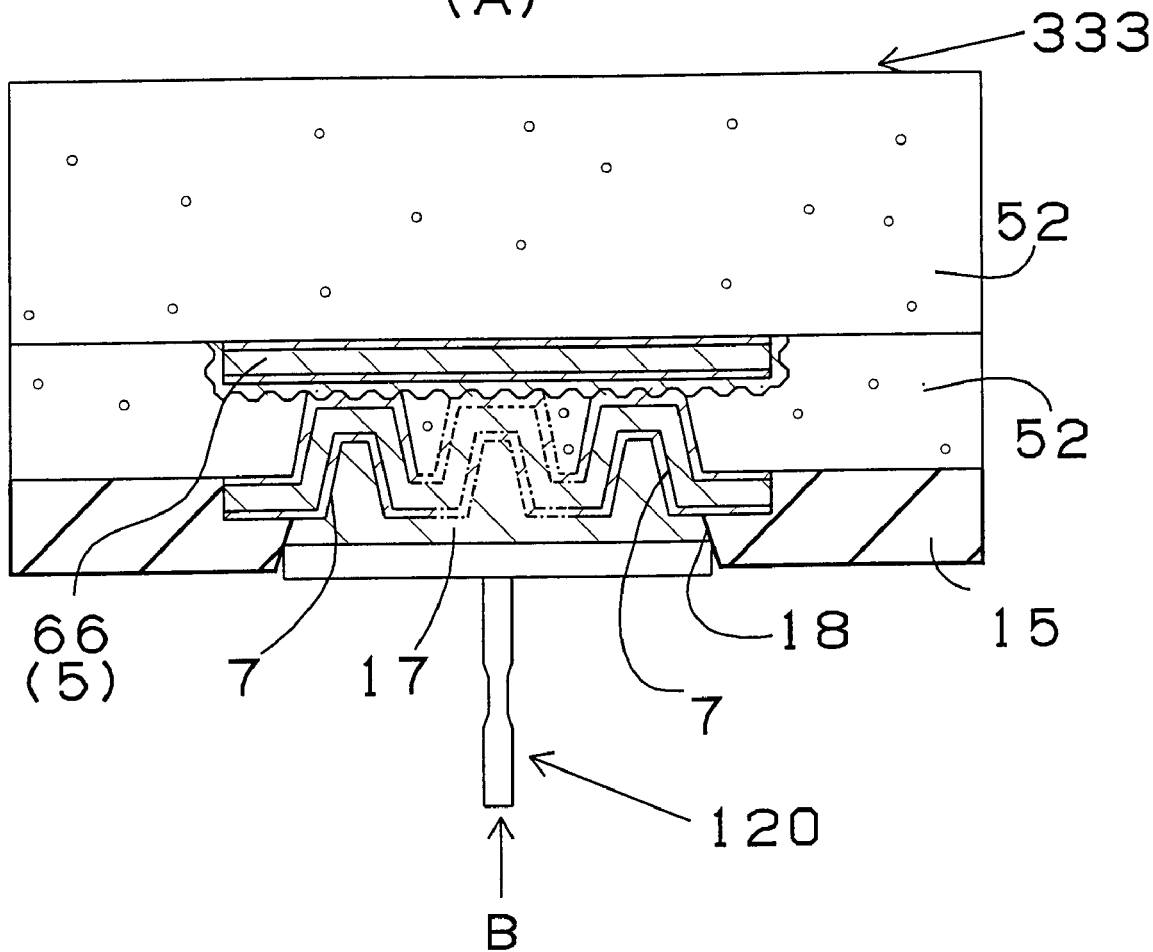
Fig.36
(A)
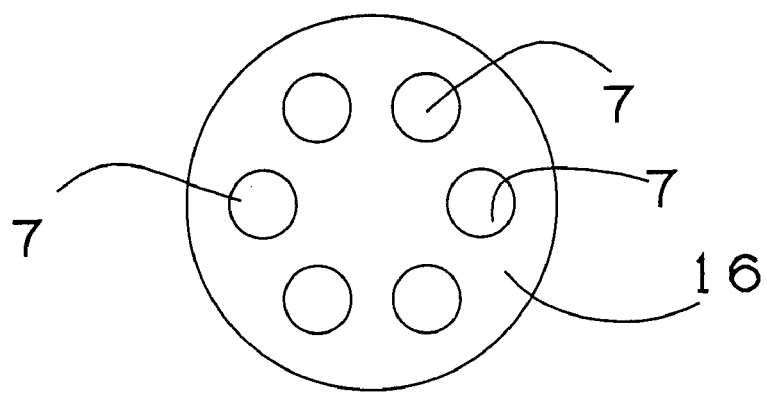
(B)

Fig.37
(A)
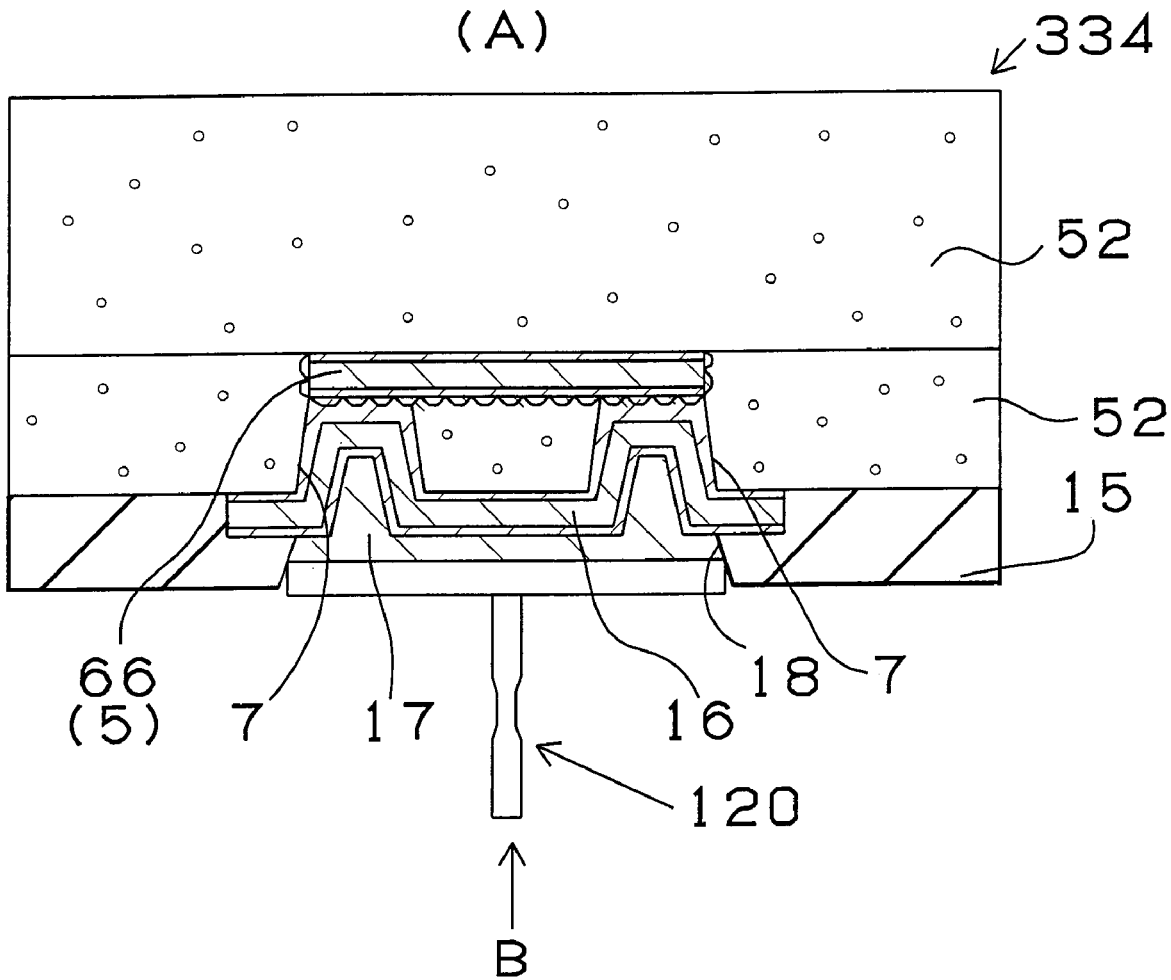
(B)
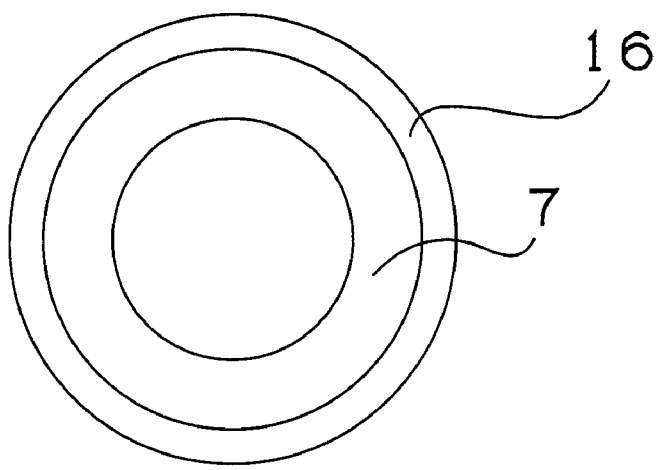

Fig.38
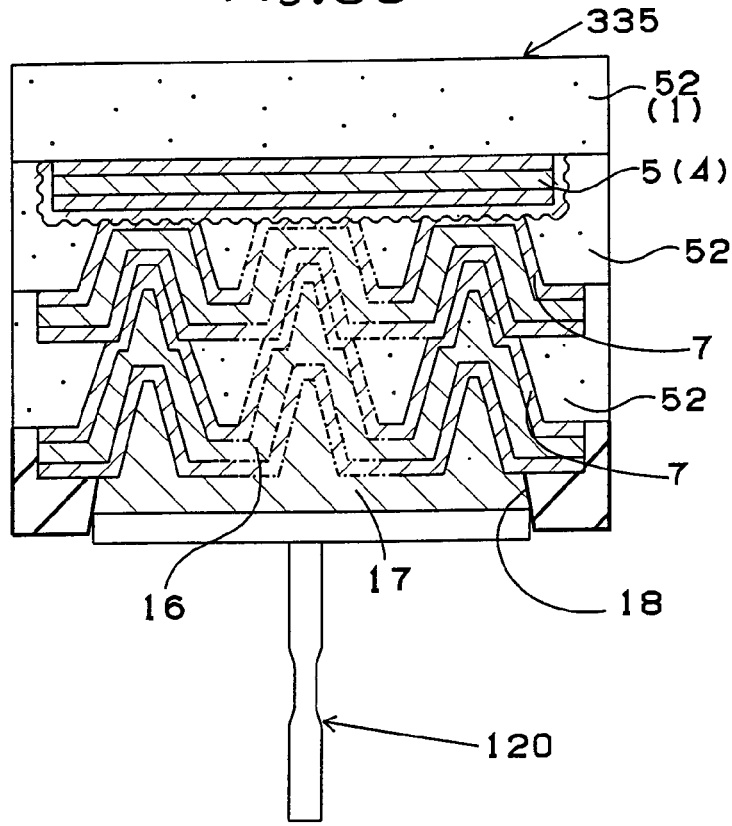
(A)
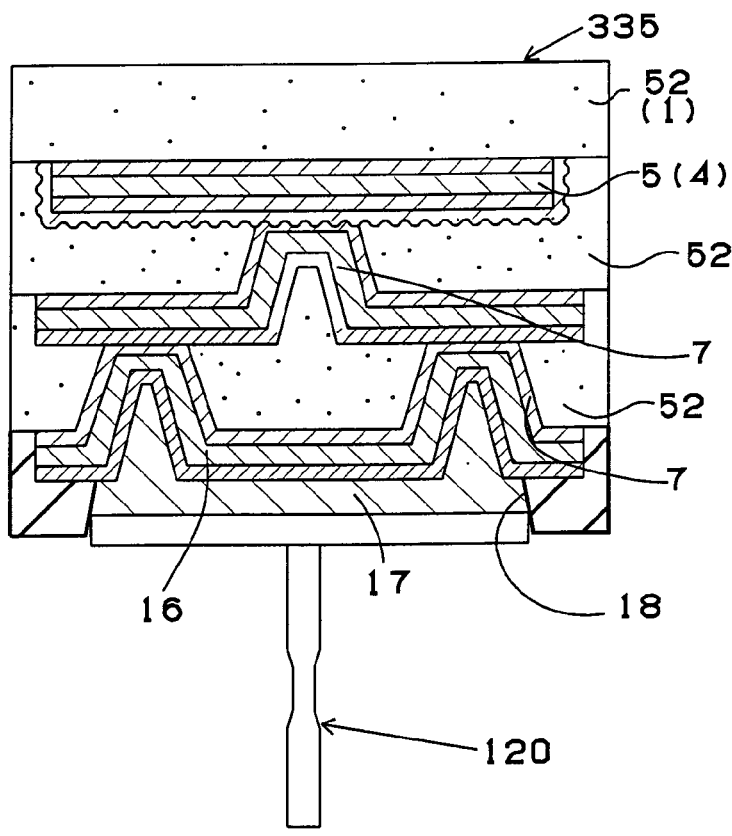
(B)

Fig. 42

| | conductive connecting pin | | state of pin | after heating test | | | condu-ction test | after heat cycle test | | | condu-ction test |
|---|---|---|---|---|---|---|---|---|---|---|---|
| | strength of adhesive bonding | | | state of pin | strength of adhesive bonding | | | state of pin | strength of adhesive bonding | | |
| | mini-mum value | ave-rage value | | | mini-mum value | ave-rage value | | | mini-mum value | ave-rage value | |
| third embodiment | 2.0 | 3.2 | OK | OK | 2.0 | 3.2 | OK | OK | 1.9 | 3.1 | OK |
| example 1 of third embodiment | 2.0 | 3.0 | OK | OK | 2.0 | 3.0 | OK | OK | 1.9 | 3.0 | OK |
| first modification | 2.1 | 3.2 | OK | OK | 2.1 | 3.2 | OK | OK | 2.0 | 3.1 | OK |
| example 1 of first modification | 2.1 | 3.5 | OK | OK | 2.1 | 3.5 | OK | OK | 2.0 | 3.4 | OK |
| example 2 of first modification | 2.1 | 3.6 | OK | OK | 2.1 | 3.6 | OK | OK | 2.0 | 3.5 | OK |
| example 3 of first modification | 2.1 | 3.5 | OK | OK | 2.1 | 3.5 | OK | OK | 2.0 | 3.4 | OK |
| second modification | 2.0 | 3.0 | OK | OK | 2.0 | 3.0 | OK | OK | 1.9 | 2.8 | OK |
| example 1 of second modification | 2.0 | 3.2 | OK | OK | 2.0 | 3.2 | OK | OK | 1.9 | 3.1 | OK |
| example 2 of second modification | 2.0 | 3.2 | OK | OK | 2.0 | 3.2 | OK | OK | 1.9 | 3.1 | OK |
| third modification | 2.0 | 3.6 | OK | OK | 2.0 | 3.6 | OK | OK | 1.9 | 3.5 | OK |

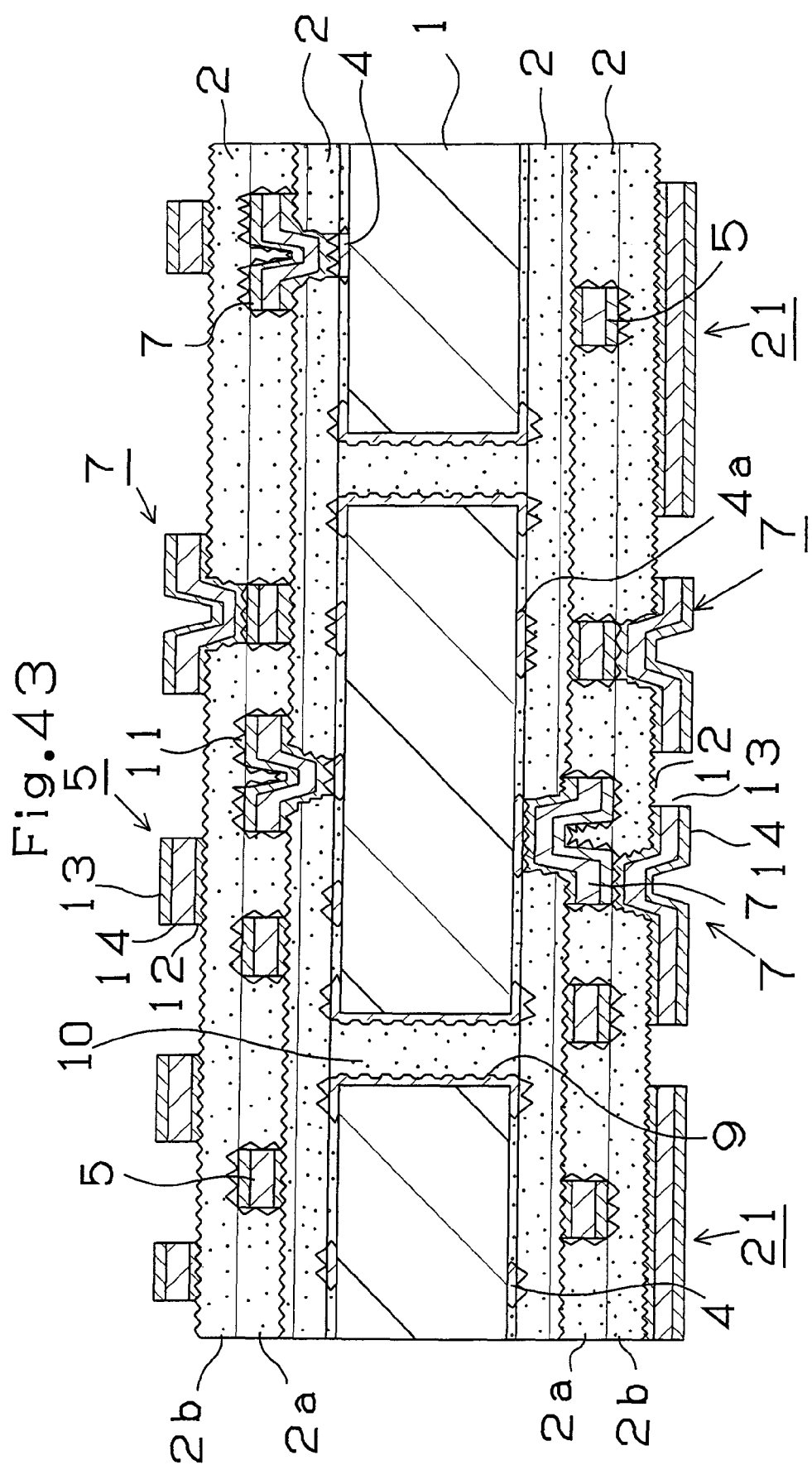

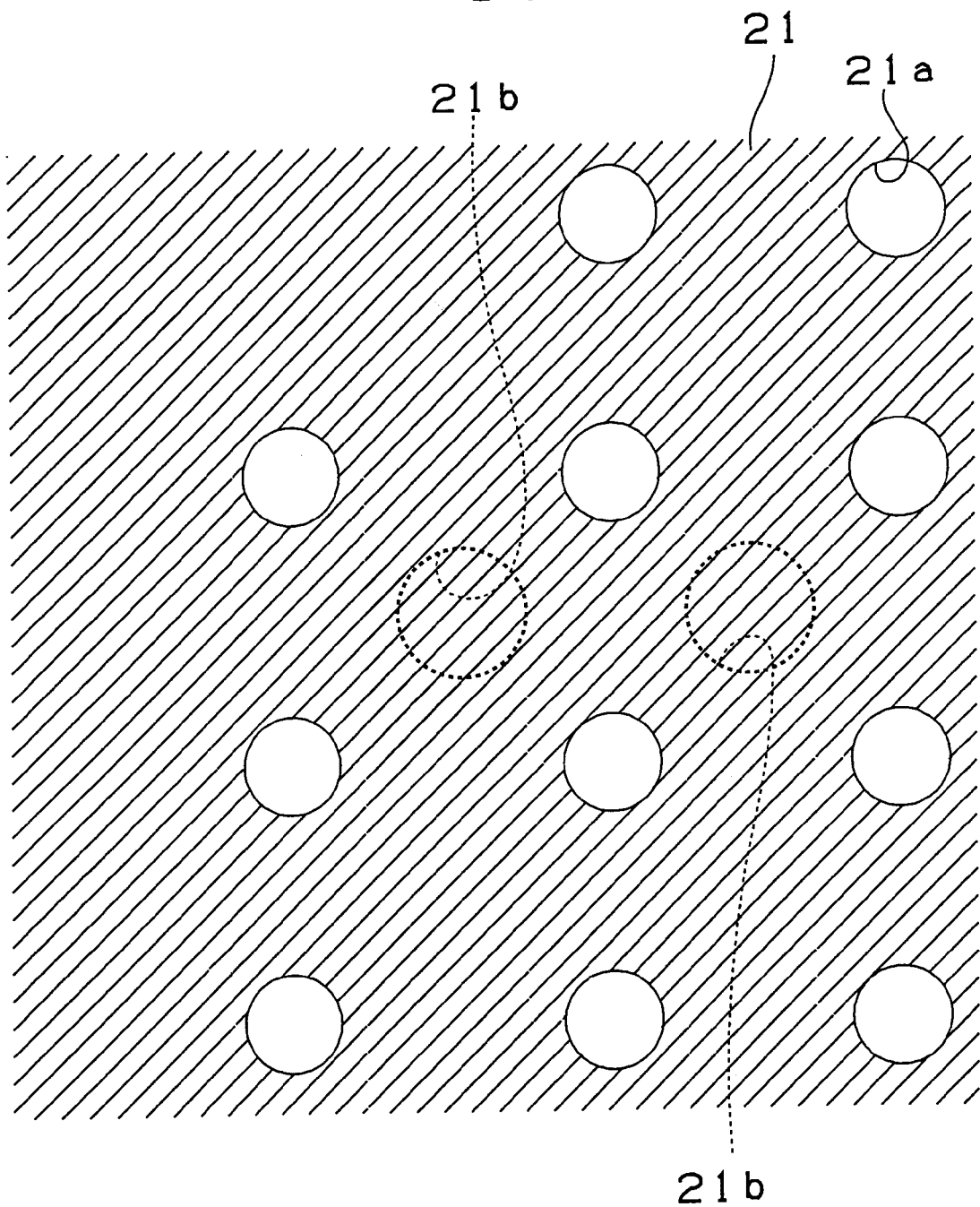

Fig. 51

|  | conductive connecting pin | | state of pin | after heating test | | | | after heat cycle test | | | |
|---|---|---|---|---|---|---|---|---|---|---|---|
|  | strength of adhesive bonding | | | state of pin | strength of adhesive bonding | | conduction test | state of pin | strength of adhesive bonding | | conduction test |
|  | minimum value | average value | | | minimum value | average value | | | minimum value | average value | |
| fourth embodiment | 2.0 | 3.2 | OK | OK | 2.0 | 3.2 | OK | OK | 1.9 | 3.1 | OK |
| first modification | 2.0 | 3.2 | OK | OK | 2.0 | 3.2 | OK | OK | 1.9 | 3.1 | OK |
| second modification | 2.0 | 3.0 | OK | OK | 2.0 | 3.0 | OK | OK | 1.9 | 2.9 | OK |
| third modification | 2.1 | 3.6 | OK | OK | 2.1 | 3.6 | OK | OK | 2.0 | 3.5 | OK |

Fig.56
(Q)
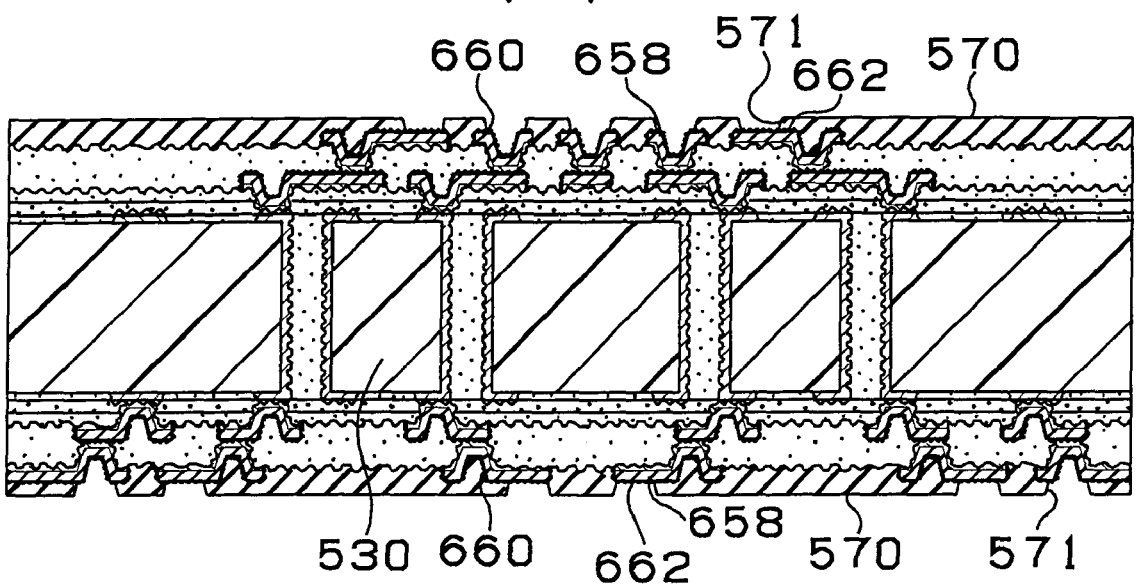
(R)
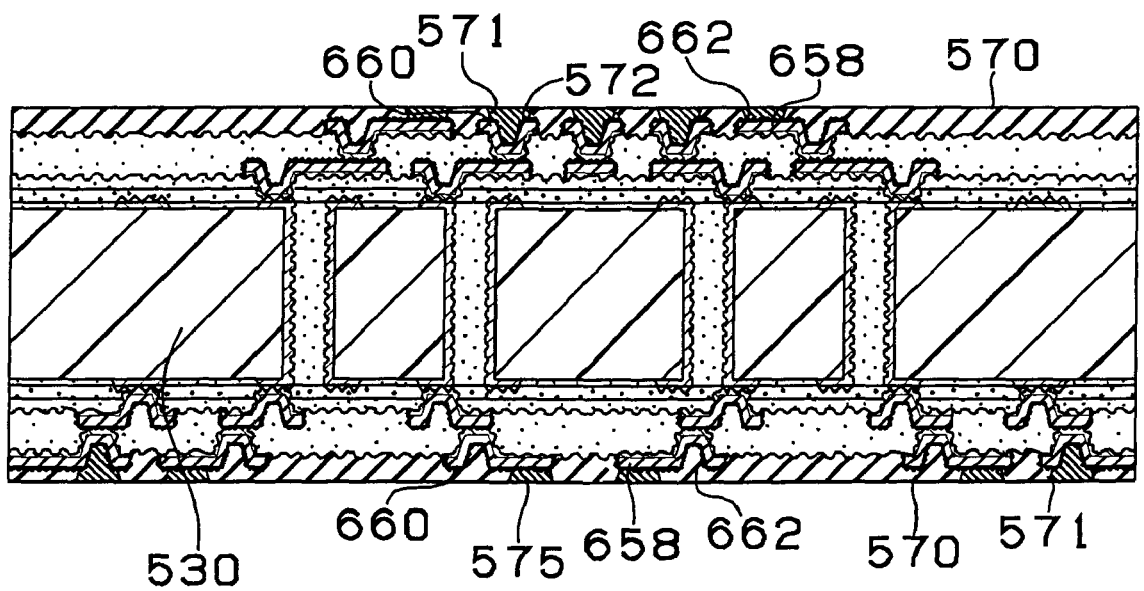

Fig.58
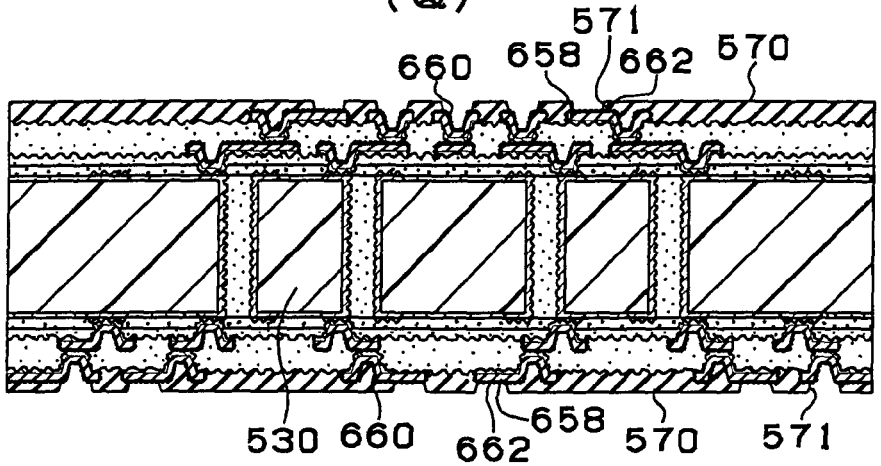
(Q)
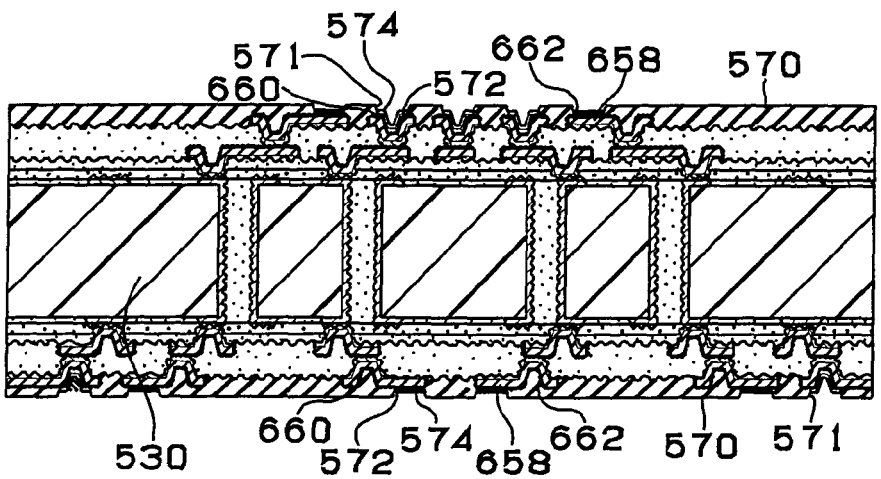
(R)
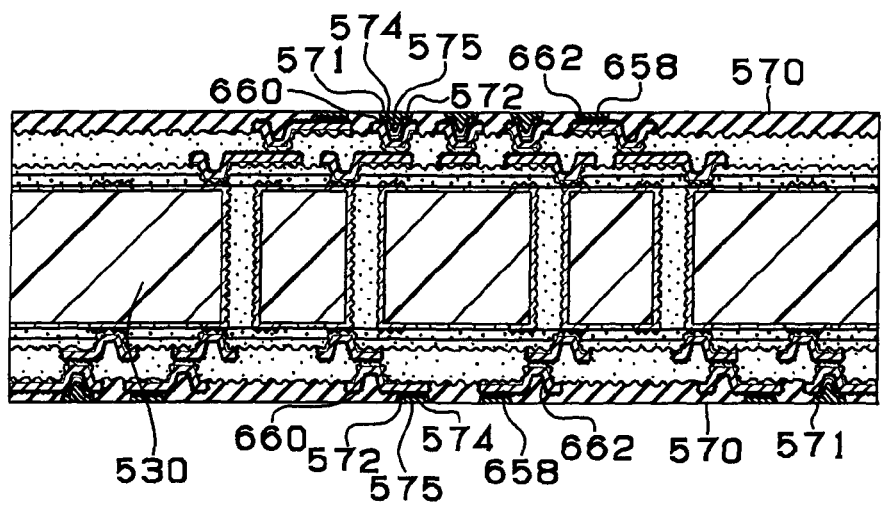
(S)

Fig.61
(A)
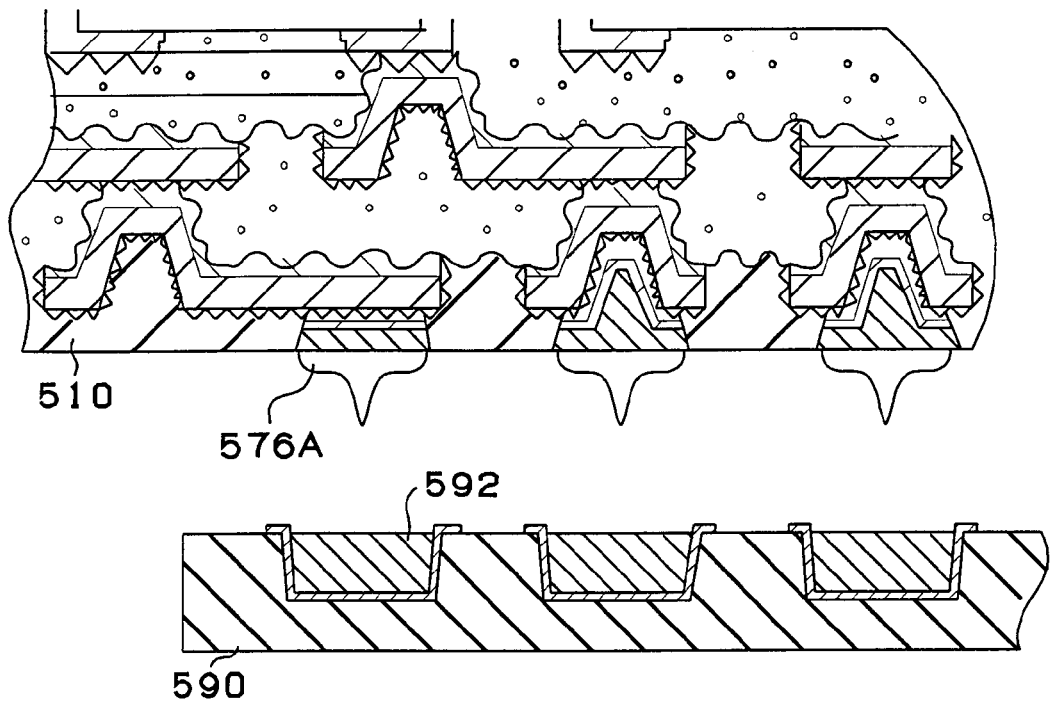
(B)
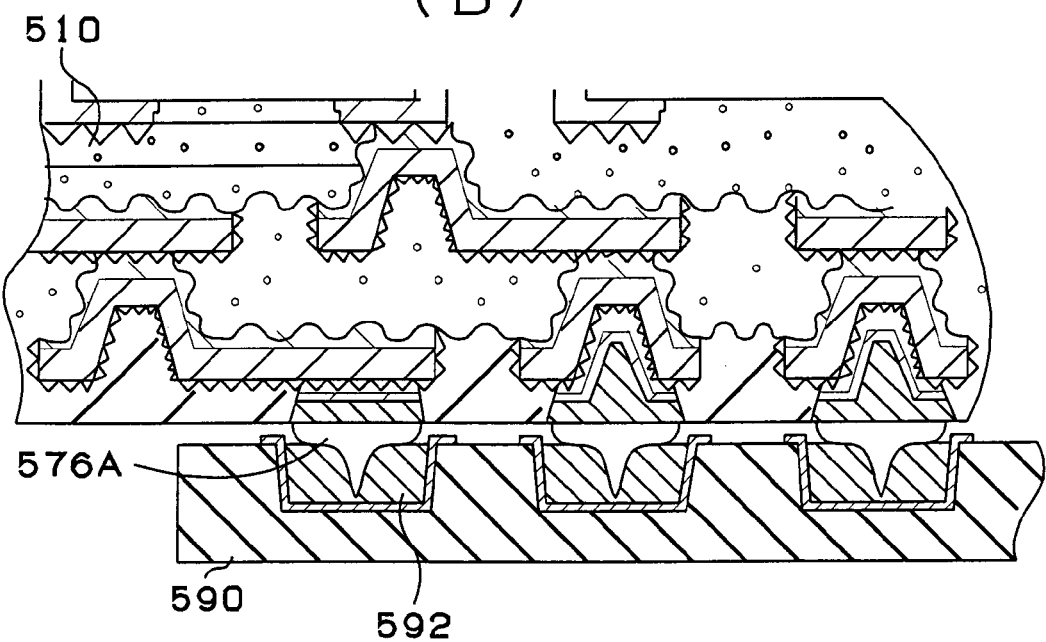

Fig.62
(A)
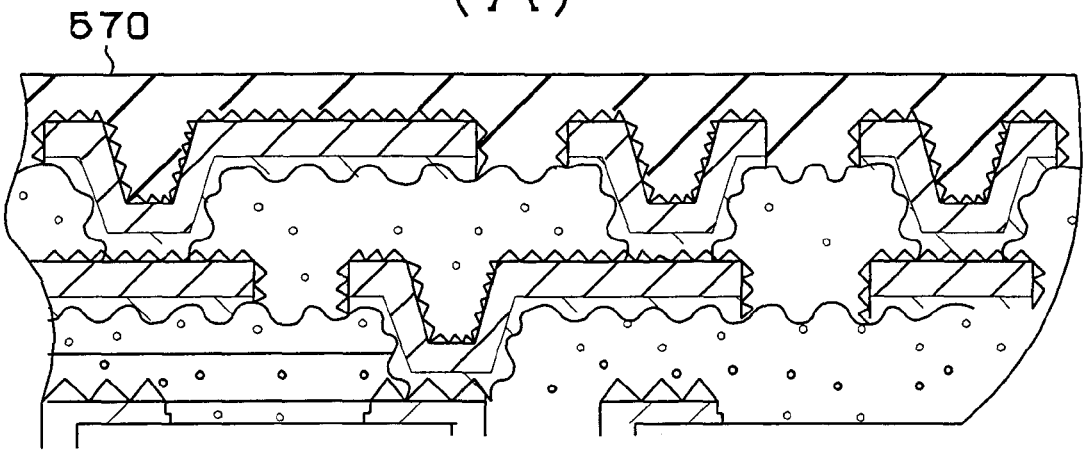
(B)
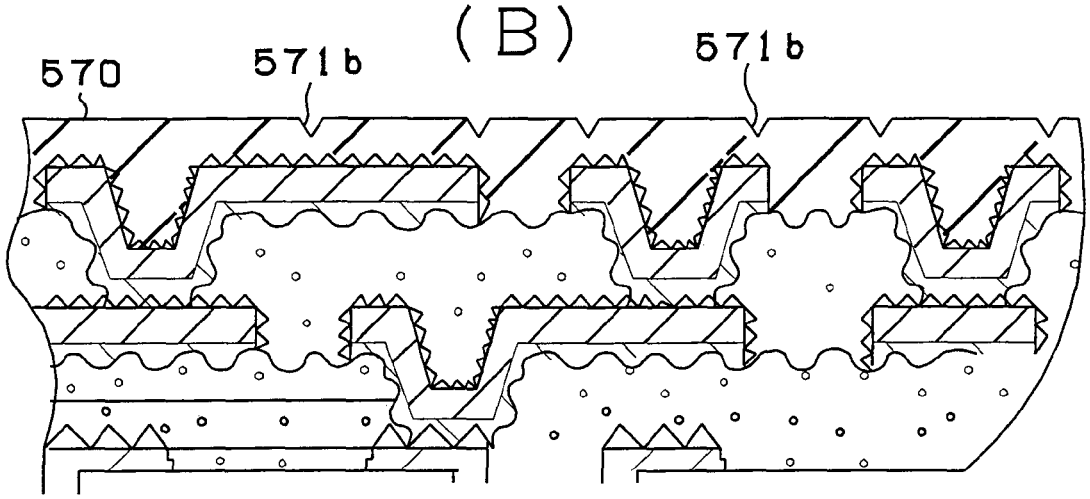
(C)
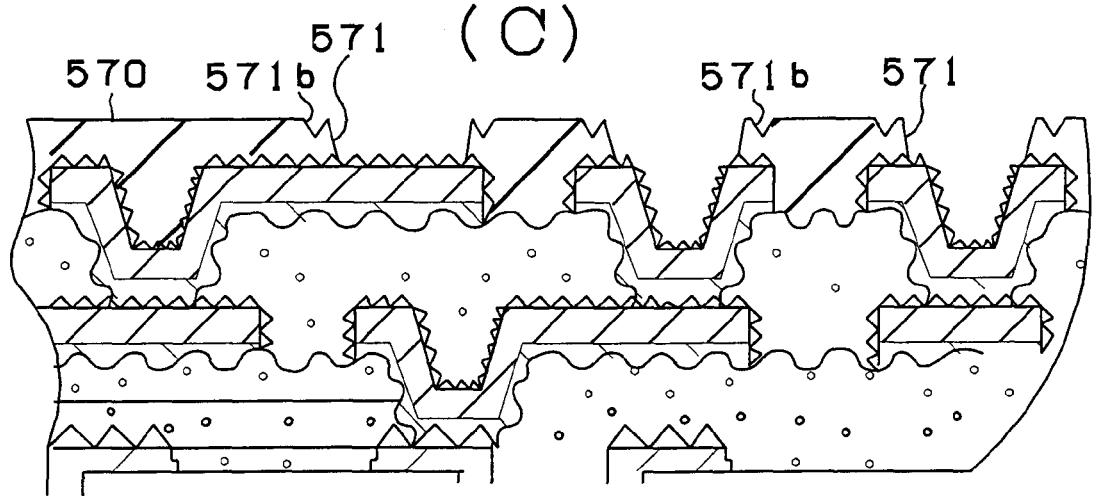

Fig.63
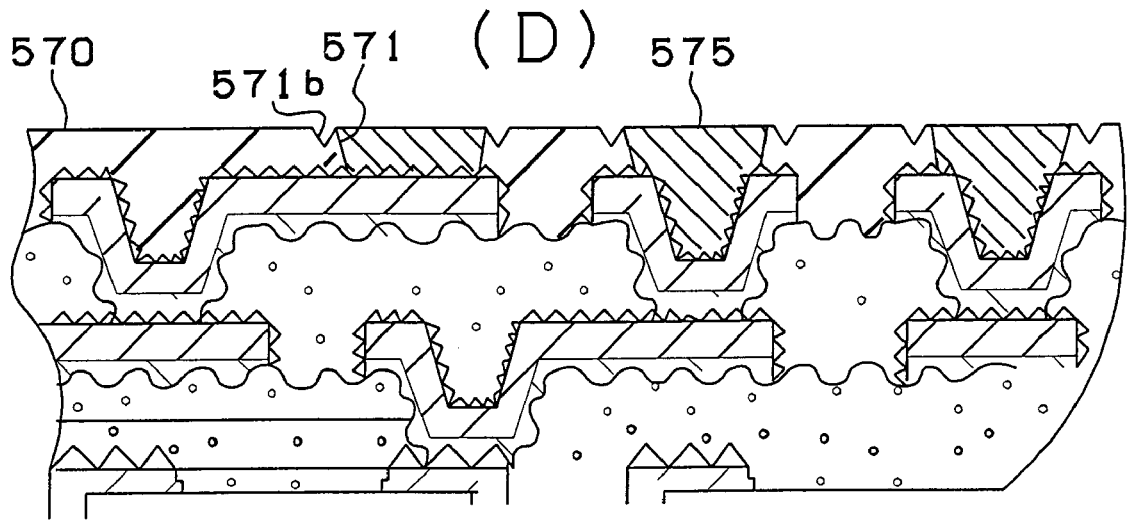
(D)
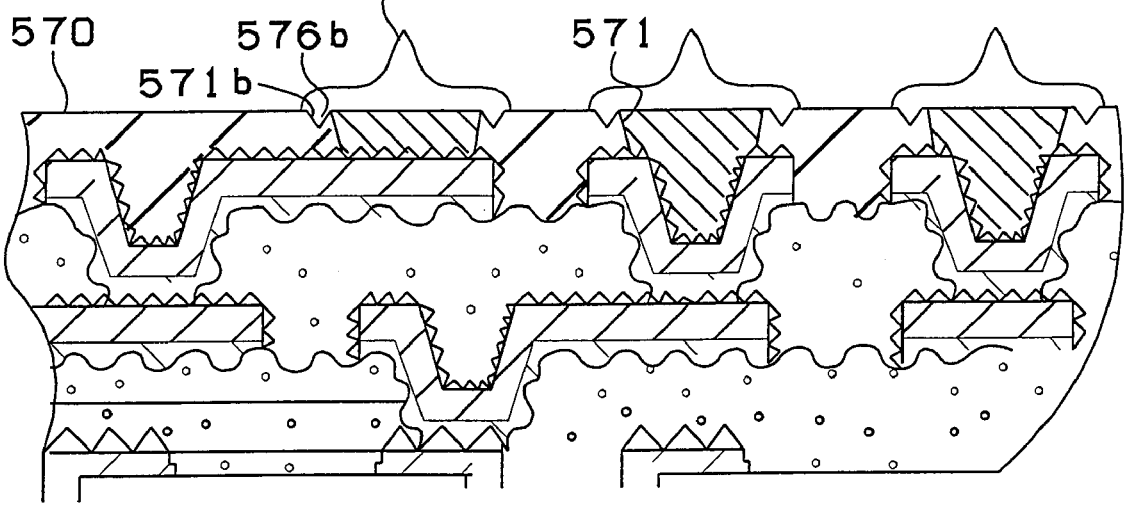
(E)

Fig.65
(A)
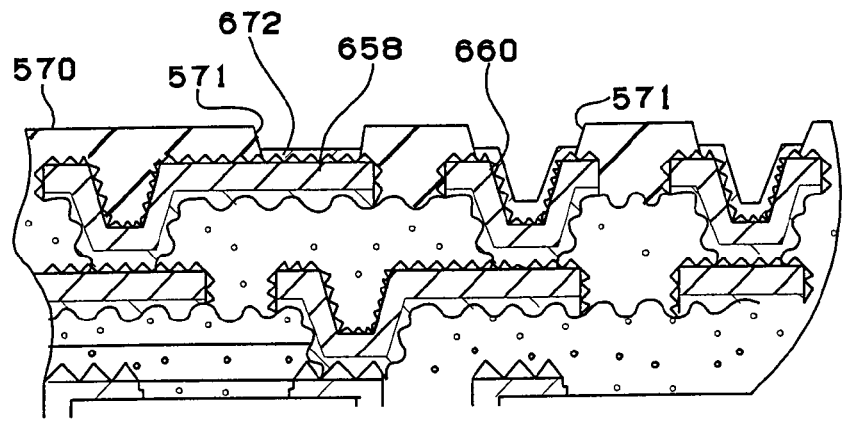
(B)
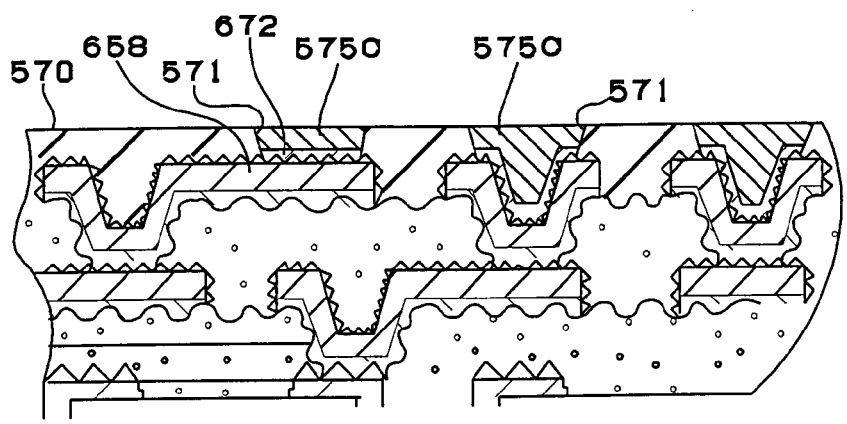
(C)
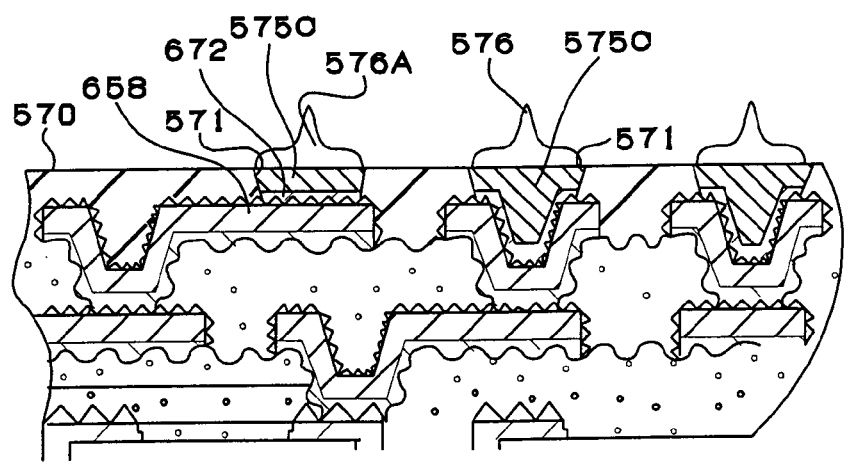

Fig.66
(A)
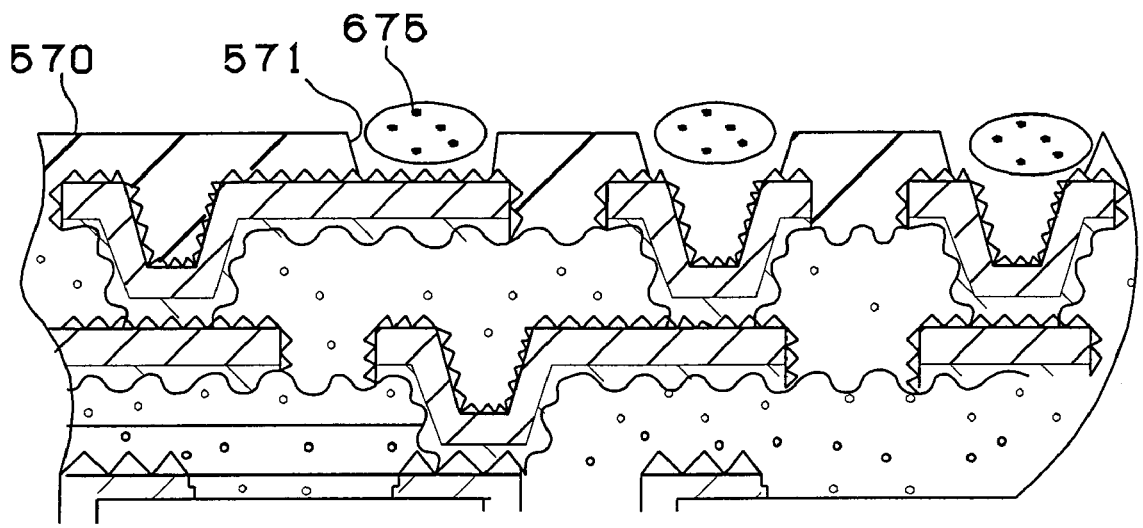
(B)
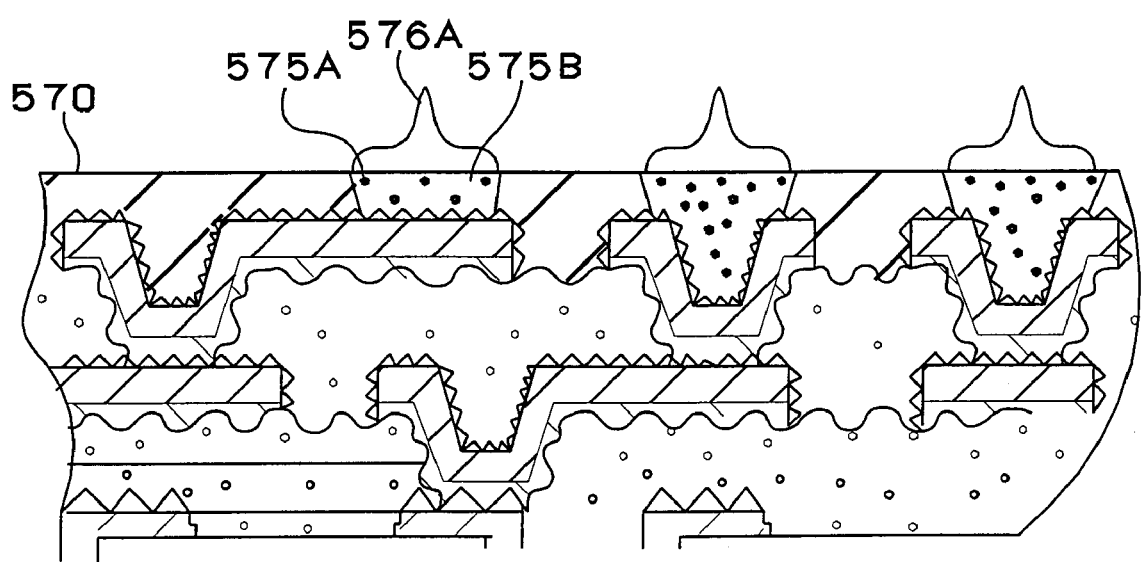

Fig. 67
(A)
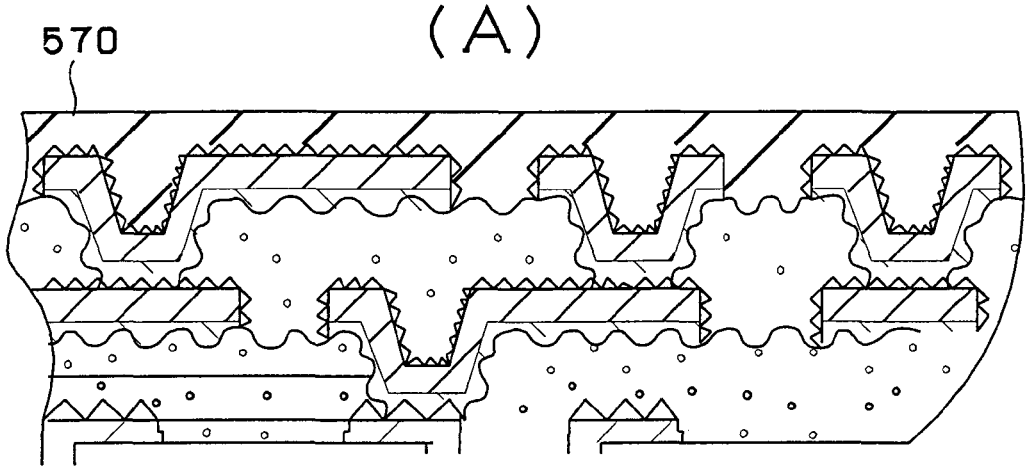
(B)
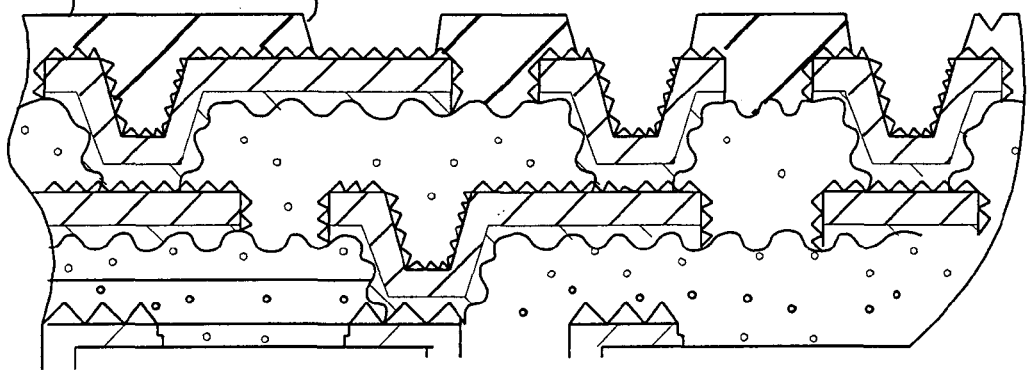
(C)
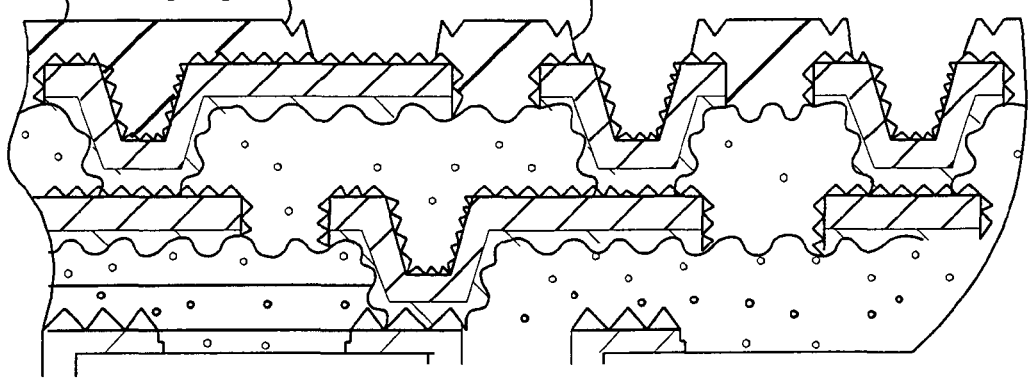

Fig.68
(D)
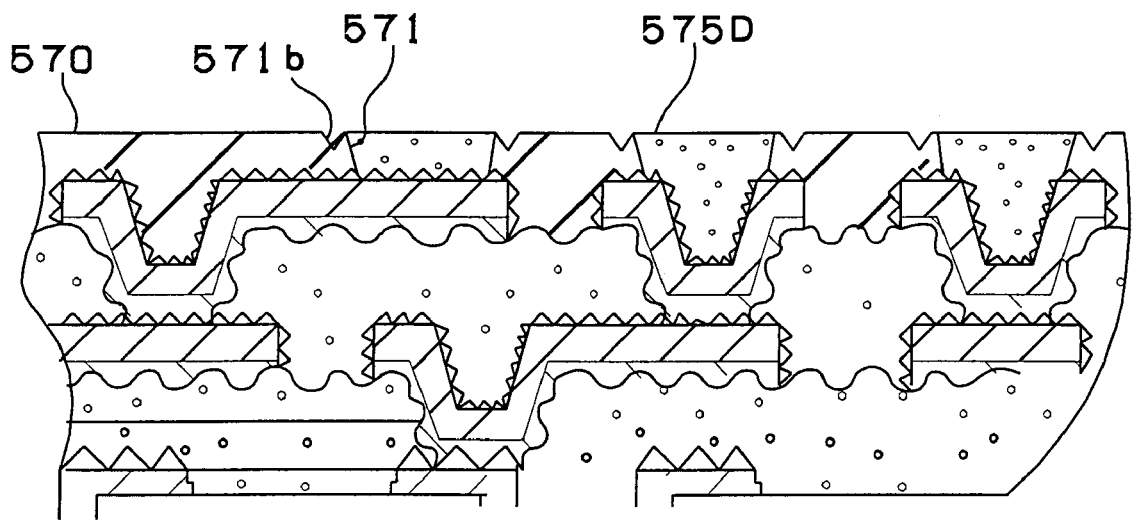
(E)
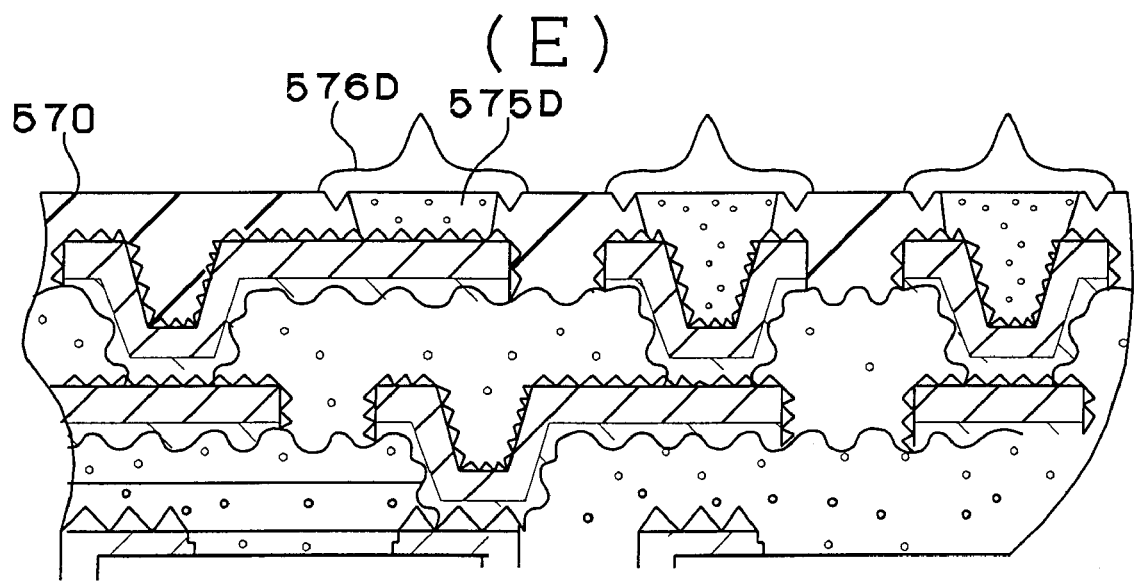

Fig. 69
(A)
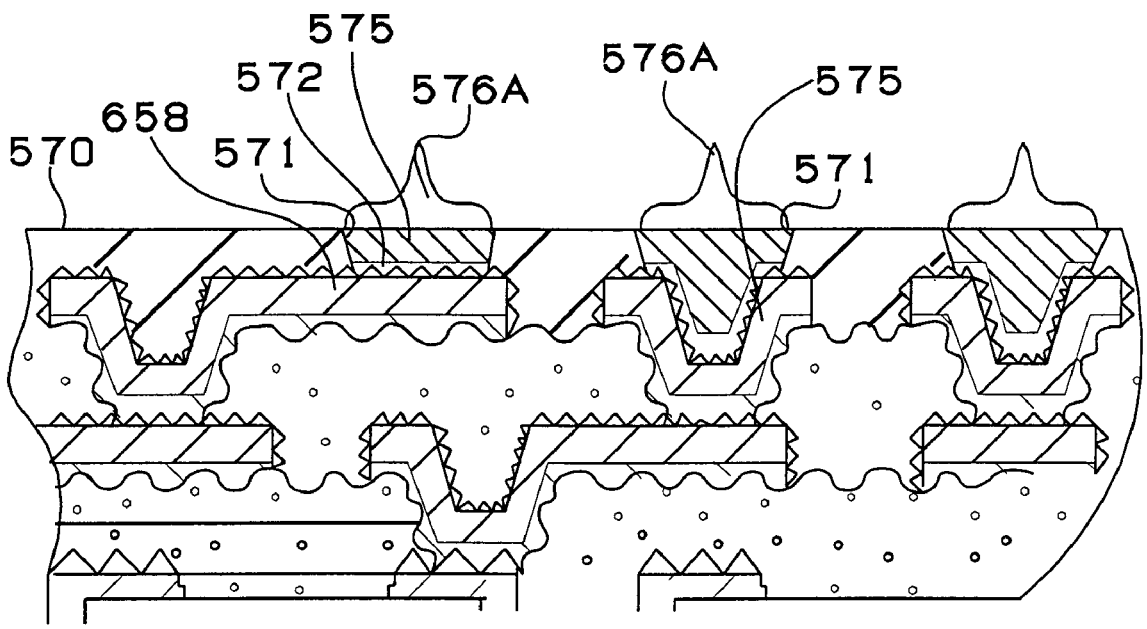
(B)
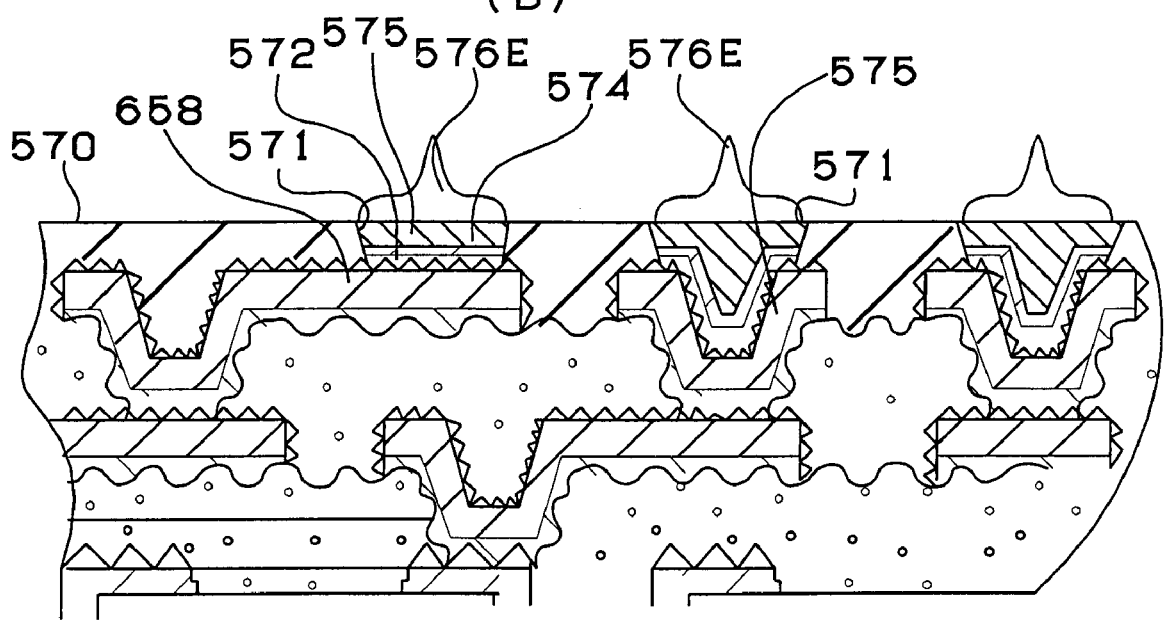

Fig.70
(A)
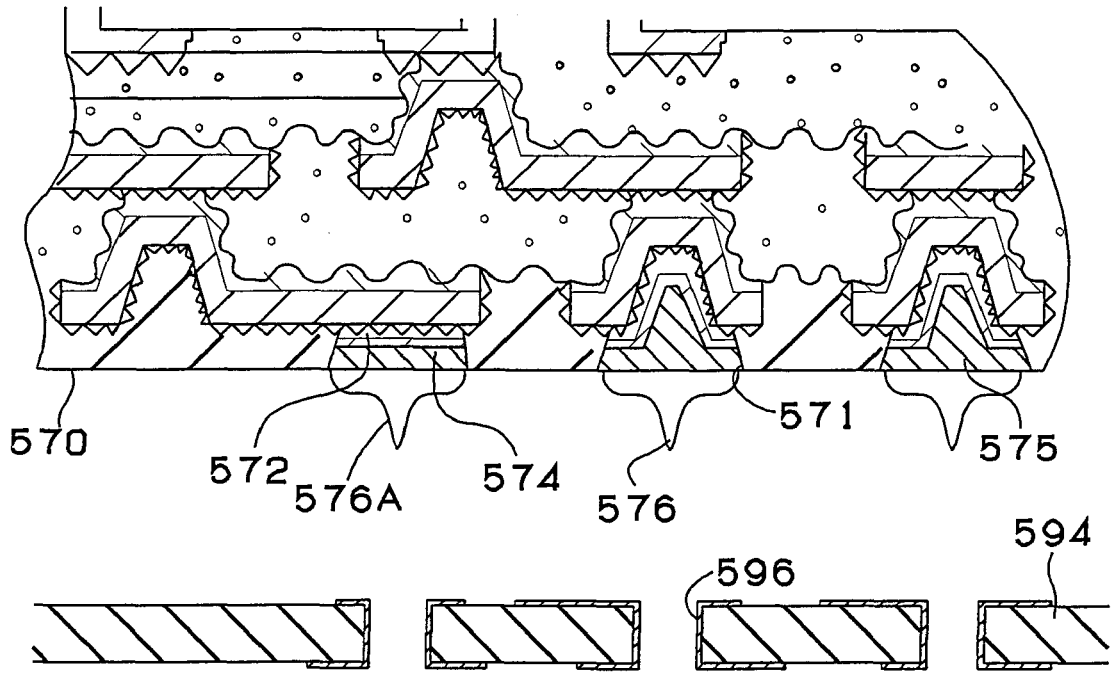
(B)
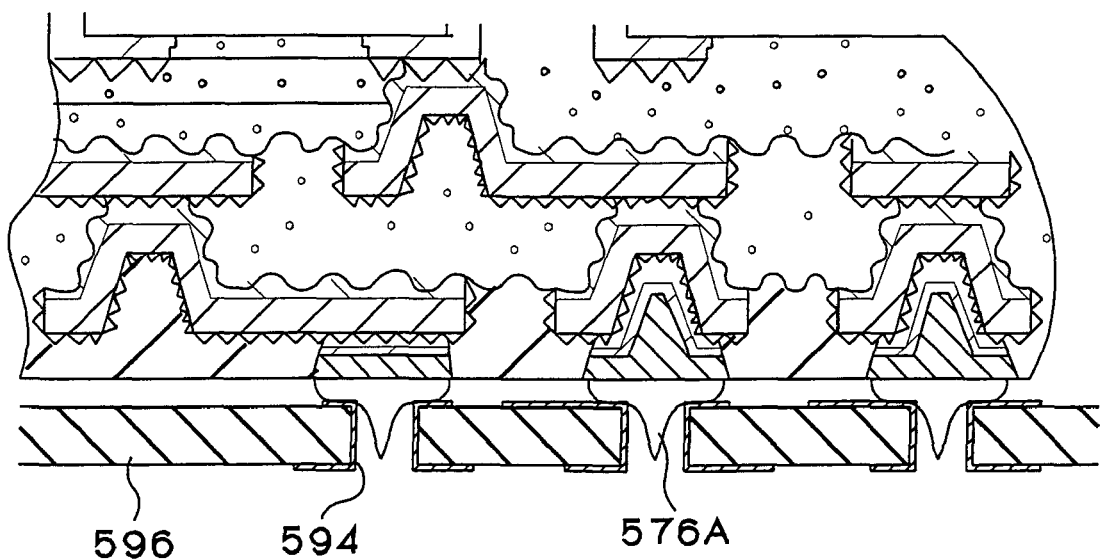

Fig.71
(A)
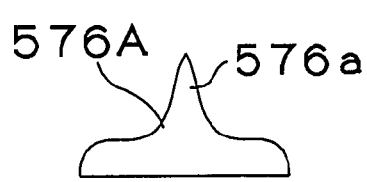
(B)
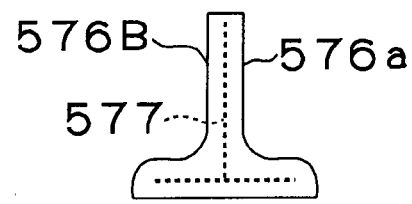
(C)
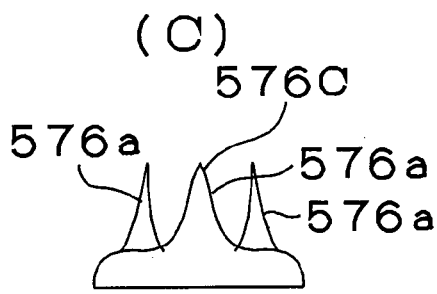
(D)
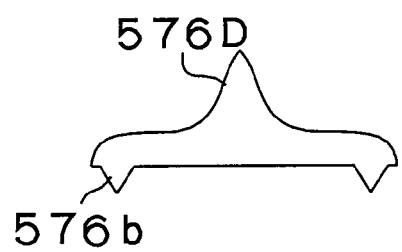
(E)
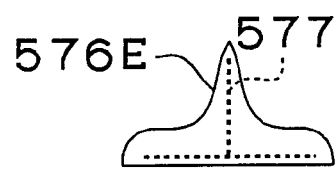
(F)
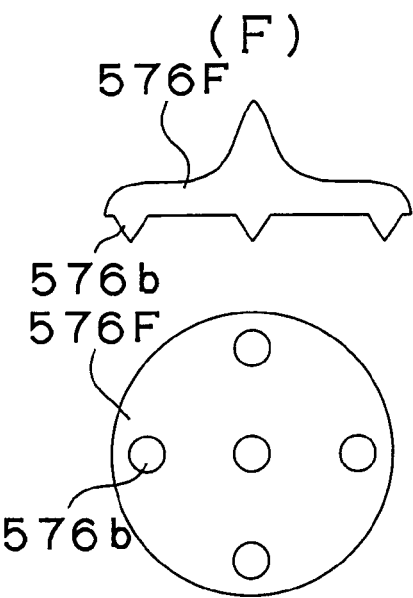

Fig.72
(A)
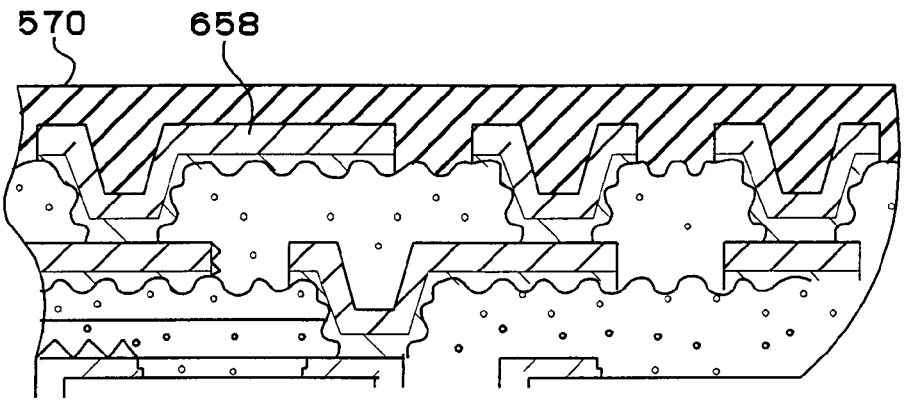
(B)
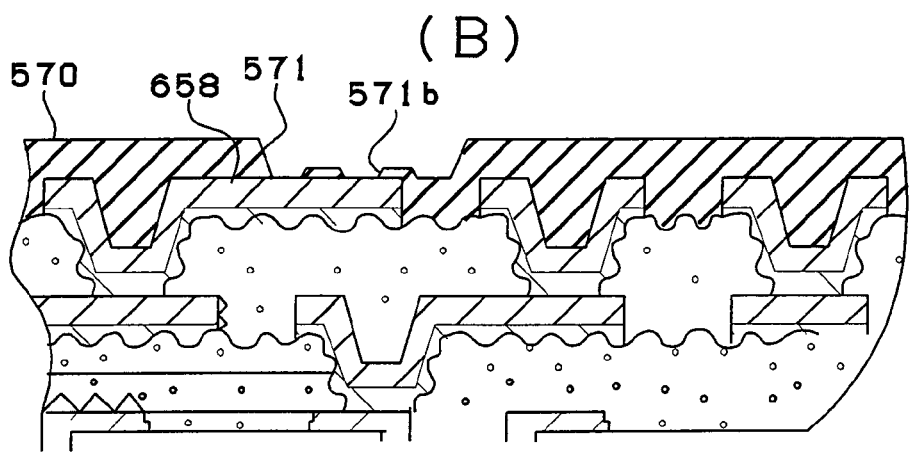
(C)
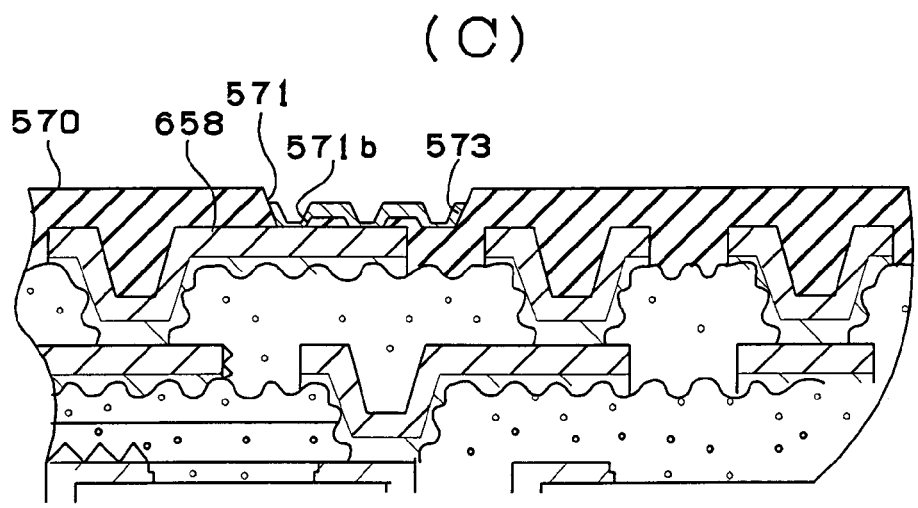

Fig.73
(D)
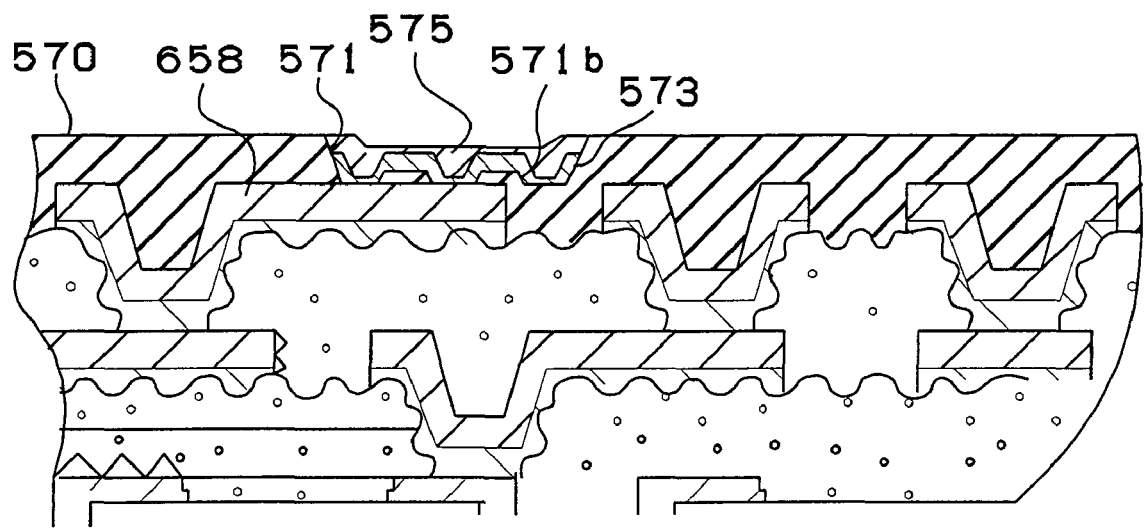
(E)
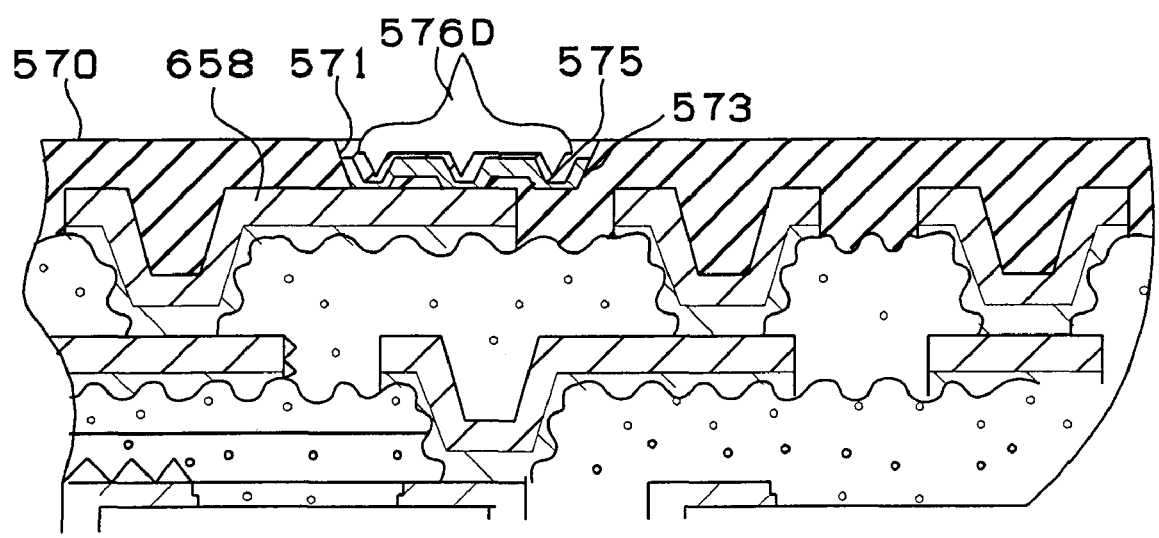

Fig. 74

|  | joining strength (kg/cm$^2$) | problem of pin | | after tensile test |
|---|---|---|---|---|
|  |  | after mounting on substrate | after reliability test | conduction test |
| fifth embodiment | 20 | no problem | no problem | no problem |
| first modification | 20 | no problem | no problem | no problem |
| second modification | 21 | no problem | no problem | no problem |
| third modification | 21 | no problem | no problem | no problem |
| fourth modification | 20 | no problem | no problem | no problem |
| fifth modification | 20 | no problem | no problem | no problem |
| sixth modification | 20 | no problem | no problem | no problem |
| seventh modification | 20 | no problem | no problem | no problem |
| eighth modification | 21 | no problem | no problem | no problem |
| tenth modification | 22 | no problem | no problem | no problem |
| comparative example | 18 | problem arisen | problem arisen | problem arisen |

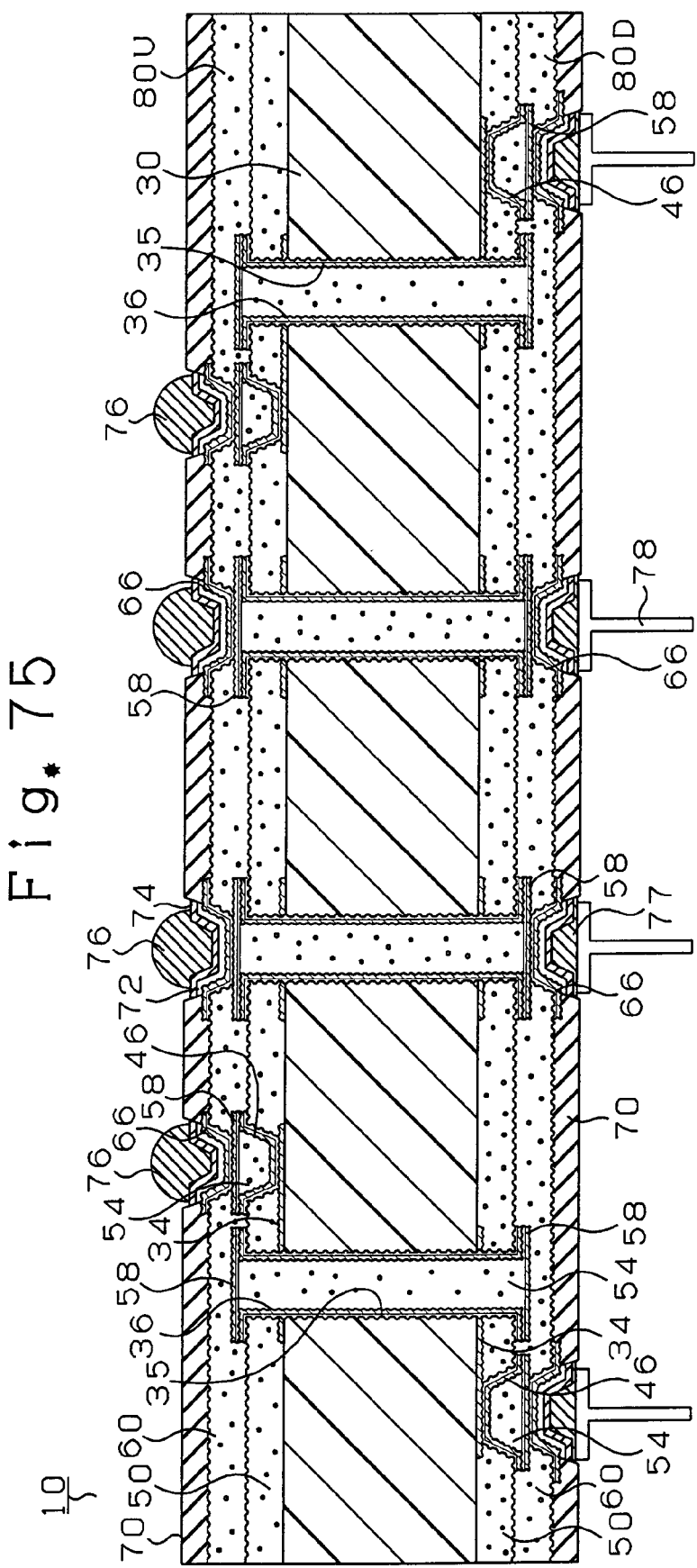

US 7,847,393 B2

CONDUCTIVE CONNECTING PINS FOR A PACKAGE SUBSTRATE

TECHNICAL FIELD

This application is a continuation of and claims the benefit of priority under 35 U.S.C. §120 from U.S. Ser. No. 09/830,949, filed Jul. 6, 2001, which is a National Stage of PCT/JP99/06428, filed Nov. 17, 1999, and claims the benefit of priority under 35 U.S.C. §119 of Japanese Application Nos. 10-357039, filed Dec. 16, 1998; 11-034616, filed Jan. 4, 1999; 11-097648, filed Apr. 5, 1999; 11-097649, filed Apr. 5, 1999; 11-097650, filed Apr. 5, 1999; 11-104294, filed Apr. 12, 1999; 11-231931, filed Aug. 18, 1999; 11-231932, filed Aug. 18, 1999; 11-231933, filed Aug. 18, 1999; and 11-231934, filed Aug. 18, 1999. The present invention relates to a conductive connecting pin and a resin package substrate to which the conductive connecting pin is secured.

BACKGROUND ART

In recent years, a package substrate for connecting IC chip or the like to a mother board or a daughter board have been required to reduce its dielectric constant and dielectric loss factor because the frequency of each signal has been raised. Therefore, the mainstream of the material of the substrate has been changed from ceramics to resin.

In the foregoing background, as a technique relating to a printed circuit board incorporating a resin substrate, a so-called build-up multilayer printed board has been suggested in Japanese Patent Publication No. 4-55555. That is, epoxy acrylate is used to form an interlayer resin insulating layer on a glass epoxy substrate having formed circuits. Then, a photolithographic method is employed to form an opening for a via hole. The surface is coarsened, and then a plating resist is provided to perform a plating process so that a conductive circuit and the via hole are formed.

When the foregoing build-up multilayer printed circuit board is employed as a package substrate, a conductive connecting pin for establishing the connection with a mother board or daughter board must be joined.

The foregoing pin is called a "T-type pin" having a T-like side shape realized by a columnar connecting portion 722 and a plate-like secured portion 721 as shown in FIG. 76. Thus, the connecting portion 722 is used to establish the connection with a socket of mother board or the like. The foregoing conductive pin 710 is, with a conductive adhesive agent 717, such as solder, bonded and secured to a pad 716 which is a conductive layer of an interlayer resin insulating layer 752 (or a core substrate) which is the outermost layer of the build-up multilayer circuit plate.

The foregoing structure suffers from an excessively small area of contact between the pad 716 and the interlayer resin insulating layer 752. Moreover, the metal pad and the resin insulating layer are made of different materials. Therefore, there arises a problem in that the strength of adhesive bonding is unsatisfactorily small. Therefore, warp or asperities of the substrate sometimes occur owing to the difference in the coefficiency of thermal expansion between the package substrate and the mother board or the daughter board under a heat cycle condition in which a high temperature and a low temperature are repeated and which is performed as a reliability test. In the foregoing case, fracture of the interface occurs between the pad 716 and the interlayer resin insulating layer 752. Thus, there arises a problem in that the conductive connecting pin 720 separates from the substrate together with the substrate. When the package substrate is mounted on the mother board by using the conductive connecting pin, displacement between the position of the conductive connecting pin and the socket of the mother board causes stress to be concentrated to the connection portion. As a result, the conductive connecting pin sometimes separates together with the pad. Heat in the high temperature region in the heat cycle and that generated when the IC chip is mounted, sometimes causes the conductive pin to be separated or inclined. Moreover, the electrical connection cannot sometimes be established.

To solve the above-mentioned problems, an object of the present invention is to provide a conductive connecting pin which is free from concentration of stress under heat cycle conditions or during a mounting an electronic component such as an IC chip and a resin package substrate incorporating the conductive connecting pin which cannot easily be peeled and separated and with which the electrical connection can easily be established if the stress is exerted.

The build-up multilayer circuit plate for use as a package substrate has a plane layer for constituting a power supply layer to permit supply of large electric power to the IC chip or a plane layer for constituting an earth layer to reduce noise.

However, the plane layer is connected to the pad which establishes the connection with an external substrate (for example, a daughter board) through a via hole. The plane layer which constitutes the power supply layer for the purpose of supplying electric current from the daughter board portion through the fine via hole is able to supply only limited electric power to the IC chip. Therefore, a satisfactory function cannot be realized. Also the plane layer, which constitutes the earth layer and which is connected to the earth line of the daughter board through the fine via hole having high resistance, cannot satisfactorily reduce noise.

To connect the multilayer printed circuit board for use as the package substrate to the daughter board, the conductive connecting pin must be joined to the pad provided for the multilayer printed circuit board. If a metal pad is provided for the package substrate made of resin, the conductive connecting pin separates together with the pad when stress has been exerted on the conductive connecting pin because the strength of adhesive bonding of each of the two elements is unsatisfactorily low.

To solve the above-mentioned problem, an object of the present invention is to provide a package substrate incorporating a plane layer having a satisfactory function.

Another object of the present invention is to provide a resin package substrate incorporating a plane layer having a satisfactory function and a conductive connecting pin which cannot easily be separated.

On the other hand, the build-up multilayer circuit plate incorporates a BGA constituted by solder or the like in order to establish the connection with an external substrate. Thus, the build-up multilayer circuit plate is mounted on the surface of the external substrate.

When the connection with an external substrate is established through the BGA, too small area of adhesion between the BGA and the solder resist causes the tensile strength to be reduced. As a result, concentration of stress to the BGA or the heat cycle condition employed as the reliable test causes the BGA or a metal layer for holding the BGA to be cracked or broken.

A variety of heat hysteresis experienced with the build-up multilayer circuit board when it is formed, such as drying and hardening of the interlayer resin insulating layer and the solder resist (an organic resin insulating layer), drying occurring after a plated film has been formed and an annealing process causes the substrate to be warped or asperities to occur. The warp and asperities sometimes inhibit the connection between the build-up multilayer circuit plate and the external substrate by using the small BGA.

It might be considered feasible to establish the connection with the external substrate by using PGA as a substitute for the BGA of the build-up multilayer circuit plate. That is, the PGA establishes the electrical connection by inserting a pin into a connection portion of the external substrate. Therefore, the foregoing defect in the connection experienced with the BGA does not occur.

When the PGA is formed, through holes are formed in the substrate by using a drill or a laser beam. Then, the PGA is inserted into the through hole. The build-up multilayer circuit plate incorporates the insulating resin layer which does not contain a reinforcing agent made of glass epoxy resin or the like. Therefore, the strength for supporting the PGA is too small to enlarge the tensile strength. What is worse, plating solution which is used to form a conductive layer in the through hole after the drilling operation has been performed, a variety of heat hysteresis or heat required to melt solder in the through hole to secure the PGA sometimes causes the resin in the inter layer insulating layer to be melted. Thus, the PGA cannot sometimes be disposed.

Since the PGA requires the through hole to be formed, disposition of an electric line in the lower layer is inhibited which is permitted for the BGA. Therefore, the degree of freedom required when the substrate is designed is narrowed excessively.

To solve the foregoing problems, an object of the present invention is to provide a package substrate with which the tensile strength of the PGA is enlarged and the degree of freedom of wiring can be widened and which exhibits a satisfactory connection characteristic with an external substrate.

DISCLOSURE OF THE INVENTION

The inventors of the present invention have energetically performed studies. As a result, the present invention has been established. That is, an aspect of the present invention claimed in claim 1 has a structure that a pad to which a conductive connecting pin is secured is covered with an organic resin insulating layer having an opening for partially exposing the pad. Therefore, for example, when the package substrate is joined to another substrate, such as a mother board through the conductive connecting pin in a state where, for example, the positions of the conductive connecting pin and the socket of the mother board are sometimes deviated from each other. As an alternative to this, the heat hysteresis of the heat cycle condition sometimes causes the substrate to be warped. Even in the foregoing case, separation of the pad from the substrate, which is held by the organic resin insulating layer, can be prevented. If sufficiently large strength of adhesive bonding cannot be realized in a case of bonding different materials to each other, such as bonding between a metal pad and an inter layer resin insulating layer, covering of the pad with the organic resin insulating layer realize large peel strength.

It is an important fact for the aspect claimed in claim 1 that the size of the pad is somewhat larger than the opening of the organic resin insulating layer through which the pad is exposed. Thus, the pad is partially exposed to the outside through the foregoing opening. That is, the periphery of the pad is covered with the organic resin insulating layer. It is preferable that the size of the pad is 1.02 time to 100 times the diameter of the opening of the organic resin insulating layer through which the pad is exposed to the outside. If the diameter of the pad is smaller than 1.02 of the diameter of the opening, the organic resin insulating layer cannot reliably hold the periphery of the pad. Therefore, separation of the conductive connecting pin cannot be prevented. If the size is larger than 100 times, raising of the density of conductive layer is inhibited. Specifically, when the diameter of the opening formed in the organic resin insulating layer is 100 μm to 1,500 μm, the diameter of the pad is 110 μm to 2,000 μm.

Another aspect of the present invention claimed in claim 2 has a structure that an extending portion over the periphery of the pad is covered with an organic resin insulating layer. Therefore, if stress is applied to the conductive connecting pin, separation from the substrate can be prevented because the pad is held by the organic resin insulating layer. On the other hand, the body of the pad is exposed to the outside through the opening of the organic resin insulating layer. That is, the organic resin insulating layer and the body of the pad are not in contact with each other. Therefore, the contact between the organic resin insulating layer and the body of the pad does not cause any crack to occur.

Another aspect of the present invention claimed in claim 5 has a structure that the pad is, through the via hole, joined to the conductive layer which is the inner layer. Therefore, the area of contact between the pad and the substrate is enlarged, causing the two elements to be joined firmly. As described above, the aspect claimed in claim 1 has the structure that the pad to which the conductive connecting pin is secured and the inter layer resin insulating layer to which the pad is bonded are bonded to each other as bonding of different materials. On the other hand, the aspect of the present invention claimed in claim 5 has the structure that the pad is connected to the conductive layer which is the inner layer. Therefore, the two elements are connected to each other as the connection of metal elements. Therefore, the connection can furthermore reliably be established. The peeling strength of the pad can be enlarged.

The pad may be connected to the conductive layer, which is the inner layer, through one or more via holes. The reason for this lies in that the area of contact of the pad can furthermore be enlarged to effectively prevent the separation. When the pad is connected to the conductive layer, which is the inner layer, through the via hole, it is effective that the via hole is formed in the periphery of the pad. Therefore, the via hole may be formed into a ring shape and the pad may be disposed to cover the ring.

The pad to which the conductive connecting pin of the build-up multilayer circuit plate is connected may be so structured as to be connected to the conductive layer, which is the inner layer, through two or more layers of via holes. The two or more layers of the via holes may be one via hole according to the shape or the type of the package substrate. In either case, the surface area of the pad can be enlarged to effectively enlarge the strength of adhesive bonding. When the via hole provided with the pad is covered with the organic resin insulating layer having the opening through which the pad is partially exposed to the outside, separation of the pad can reliably be prevented.

Another aspect of the present invention claimed in claim 6 has a structure that the conductive layer of the core substrate is made firmly contact with the surface of a resin substrate serving as a core substrate through a coarsened surface (a mat surface). When a pad is connected to the foregoing conductive layer, the pad cannot easily be separated from the inter layer resin insulating layer. Also in a case where the pad is joined to the conductive layer, which is the inner layer, through one or more via holes and two or more layers of via holes, the conductive layer, which is the inner layer, may be provided for the core substrate.

According to another aspect of the present invention claimed in claim 7 is able to elongate the length of the electric wire from the conductive connecting pin, which is an external terminal, to another substrate disposed on a side surface opposite to the side surface for which the conductive connecting pin is prevented. Specifically, the pad is connected to the land around the through hole and a filer filled in the through hole through a via hole. Moreover, so-called "cover plating" may be performed such that the through hole is covered with a conductive layer. Then, the pad may be connected to the conductive layer through the via hole. Moreover, the pad may be connected to only the land of the through hole through the via hole.

According to another aspect of the present invention claimed in claim 14 has a structure that the strength of adhesive bonding with the conductive connecting pin can be made to be 2.0 Kg/pin or greater because the melting point of the conductive adhesive agent is 180° C. to 280° C. The foregoing strength is not considerably reduced even after the reliability test, such as a heat cycle test, or even after heat has been applied during mounting of IC chips. If the melting point is lower than 180° C., realized strength of adhesive bonding is about 2.0 Kg/pin. In some cases, only unsatisfactory strength of adhesive bonding of 1.5 Kg/pin can be realized. What is worse, heating applied during mounting of the IC chips sometimes causes the conductive adhesive agent to be melted. Thus, the conductive connecting pin is undesirably separated and inclined. If the melting point is higher than 280° C., the resin insulating which is the resin layer and the solder resist layer are unsatisfactory dissolved at a temperature at which the conductive adhesive agent is dissolved. It is preferable that the temperature is 200° C. to 260° C. When the conductive adhesive agent has the above-mentioned melting point, dispersion of the strength of adhesive bonding of the conductive connecting pin can be reduced. Moreover, applied heat does not damage the resin layer which constitutes the package substrate.

Another aspect of the present invention claimed in claim 15 has a structure that the conductive adhesive agent is made of at least one type of material selected from tin, lead, antimony, silver, gold and copper. Therefore, the conductive adhesive agent having the above-mentioned melting point can be prepared. In particular, a conductive adhesive agent containing at least tin-lead or tin-antimony is able to realize the above-mentioned range of the melting point. If the conductive adhesive agent is melted, re-fixation easily occurs. Thus, separation and inclination of the conductive connecting pin do not occur.

When the conductive adhesive agent is made of an alloy, such as Sn/Pb, Sn/Sb, Sn/Ag or Sn/Sb/Pb, the strength of adhesive bonding can be made to be 2.0 Kg/pin. Moreover, dispersion of the strength of adhesive bonding can be restrained. Even with the heat cycle condition and heat applied during mounting of IC chips, reduction in the strength of adhesive bonding of the conductive connecting pin can be prevented. Moreover, separation and inclination of the pin can be prevented. In addition, also electrical connection can also be maintained.

Another aspect of the present invention has a structure that the conductive connecting pin is made of at least one type of metal materials selected from copper, a copper alloy, tin, zinc, aluminum and noble metal having excellent flexibility. Therefore, when stress is applied to the pin, the pin is deflected so that the stress is absorbed. As a result, the conductive connecting pin cannot easily be separated from the substrate. It is preferable that the copper alloy for constituting the conductive connecting pin is phosphor bronze which exhibits excellent flexibility and satisfactory electric characteristics and which permits easy processing of the conductive connecting pin.

It is preferable that the conductive connecting pin is a so-called T-type pin incorporating a plate-like secured portion and a columnar connection portion projecting over the central portion of the plate-like secured portion. The plate-like secured portion is a portion which is, through the conductive adhesive agent, secured to the conductive layer which is formed into the pad. The foregoing plate-like secured portion is formed into an arbitrary shape including a circular shape and a polygonal shape adaptable to the size of the pad. The shape of the connection portion is required to permit insertion into another substrate. The shape may be any one of a cylindrical shape, a prismatic shape, a conical shape and a pyramid shape. Usually, one pin is provided for the pin disposed at a usual position. Two or more connection portions may be provided. The number of the connection portions may arbitrarily be determined.

It is preferable that the columnar connection portion of the conductive connecting pin has a diameter of 0.1 mm to 0.8 mm, the length of 1.0 mm to 10 mm and the diameter of the columnar secured portion is 0.5 mm to 2.0 mm. The foregoing values are arbitrarily determined according to the size of the pad and the type or the like of another substrate which must be mounted.

Another aspect of the present invention is able to absorb stress because the connection portion is deflected if the stress is applied to the conductive connecting pin because the positions of the conductive connecting pin and the other substrate are deviated from each other. If warp of the substrate or the like occurs owing to heat hysteresis of the heat cycle condition, the secured portion is deflected to correspond to the deformation. Therefore, separation of the conductive connecting pin from the substrate can be prevented. As a result, a reliable package substrate can be obtained.

The package substrate may have a structure that a pad, to which the conductive connecting pin is connected, is covered with an organic resin insulating layer having an opening through which the pad is partially exposed. As a result, if concentration of stress to the conductive connecting pin or deformation of the substrate takes place as described above, the structure that the pad is pressed by the organic resin insulating layer is able to prevent separation of the pad from the substrate, can be prevented. If sufficiently large strength of adhesive bonding cannot easily be obtained in a case of bonding of different materials to each other, such as the metal pad and the interlayer resin insulating layer, covering of the surface of the pad with the organic resin insulating layer permits great peeling strength to be obtained.

When the pad is covered with the organic resin insulating layer, it is an important fact that the size of the pad is somewhat larger than that of the opening formed in the organic resin insulating layer through which the pad is exposed to the outside. As a result, the pad can partially be exposed to the outside through the opening. That is, the periphery can be covered with the organic resin insulating layer. It is preferable that the size of the pad is such that the diameter of the pad is 1.02 time to 100 times the diameter of the opening of the organic resin insulating layer through which the pad is exposed to the outside. If the diameter of the pad is smaller than 1.02 time the diameter of the opening, the periphery of the pad cannot reliably be held by the organic resin insulating layer. Therefore, separation of the conductive connecting pin cannot be prevented. If the diameter is larger than 100 times, raising of the density of the conductive layer is inhibited. Specifically, when the diameter of the opening formed in the organic resin insulating layer is 100 μm to 1,500 μm, the diameter of the pad is 110 μm to 2,000 μm.

Another aspect of the present invention has a structure that the conductive connecting pin is made of at least one type of metal selected from copper, a copper alloy, tin, zinc, aluminum and noble metal, exhibiting excellent flexibility. Moreover, the pad for securing the conductive connecting pin is joined to a conductive layer, which is the inner layer, through the via hole. In addition to the effect that stress is absorbed owing to easy deflection of the conductive connecting pin, the area of contact between the pad and the substrate can be enlarged so that the two elements are firmly joined to each other. As described above, the aspect has the structure that the pad, to which the conductive connecting pin is secured, and the interlayer resin insulating layer to which the pad is bonded are bonded to each other such that different materials are bonded to each other. On the other hand, the aspect claimed in this claim has the structure that the pad is connected to the conductive layer which is the inner layer. Therefore, the two elements are connected to each other as the connection between metal elements. Thus, hermetic contact can furthermore reliably be established and the peeling strength of the pad can be enlarged.

The pad may be connected to the conductive layer, which is the inner layer, through one or more via holes. The reason for this lies in that the area of contact of the pad can furthermore be enlarged. Thus, a structure with which peeling does not easily occur can be realized. When the pad is connected to the conductive layer, which is the inner layer, through the via hole, it is effective that the via hole is disposed in the periphery of the pad from a viewpoint of improving the connection characteristic. Therefore, a structure may be formed such that the via hole is formed into a ring shape and the pad is disposed to cover the ring.

The pad of the build-up multilayer circuit plate to which the conductive connecting pin is secured may be so structured as to be connected to the conductive layer, which is the inner layer, through two or more layers of the via holes. According to the shape and type of the package substrate, the two or more layers of the via holes may be constituted by one or more via holes. In either case, the surface area of the pad can be enlarged to effectively enlarge the strength of adhesive bonding. When the via hole provided with the pad is covered with the organic resin insulating layer having the opening through which the pad is partially exposed to the outside, separation of the pad can reliably be prevented.

Another aspect of the present invention has a structure that the conductive layer on the core substrate is made to hermetically contact with the surface of the resin substrate through the coarsened surface (the mat surface). When the pad is connected to the foregoing conductive layer, separation of the pad from the interlayer resin insulating layer can furthermore reliably be prevented. Also in a case where the pad is joined to the conductive layer, which is the inner layer, through one or more via holes or two or more layers of the via holes, the conductive layer, which is the inner layer, may be provided for the core substrate.

Another aspect of the present invention is able to shorten the length of the electric wire from the conductive connecting pin to another substrate disposed on the side surface opposite to the side surface provided with the conductive connecting pin. Specifically, the pad is connected to the land around the through hole and a filer filled in the through hole through a via hole. Moreover, so-called "cover plating" may be performed such that the through hole is covered with a conductive layer. Then, the pad may be connected to the conductive layer through the via hole. Moreover, the pad may be connected to only the land of the through hole through the via hole.

Another aspect of the present invention has a structure that the strength of adhesive bonding with the conductive connecting pin can be made to be 2.0 Kg/pin or greater because the melting point of the conductive adhesive agent is 180° C. to 280° C. The foregoing strength is not considerably reduced even after the reliability test, such as a heat cycle test, or even after heat has been applied during mounting of IC chips. If the melting point is lower than 180° C., realized strength of adhesive bonding is about 2.0 Kg/pin. In some cases, only unsatisfactory strength of adhesive bonding of 1.5 Kg/pin can be realized. What is worse, heating applied during mounting of the IC chips sometimes causes the conductive adhesive agent to be melted. Thus, the conductive connecting pin is undesirably separated and inclined. If the melting point is higher than 280° C., the resin insulating which is the resin layer and the solder resist layer are unsatisfactorily dissolved at a temperature at which the conductive adhesive agent is dissolved. It is preferable that the temperature is 200° C. to 260° C. When the conductive adhesive agent has the above-mentioned melting point, dispersion of the strength of adhesive bonding of the conductive connecting pin can be reduced. Moreover, applied heat does not damage the resin layer which constitutes the package substrate.

Another aspect of the present invention has a structure that the conductive adhesive agent is made of at least one type of material selected from tin, lead, antimony, silver, gold and copper. Therefore, the conductive adhesive agent having the above-mentioned melting point can be prepared. In particular, a conductive adhesive agent containing at least tin-lead or tin-antimony is able to realize the above-mentioned range of the melting point. If the conductive adhesive agent is melted, re-fixation easily occurs. Thus, separation and inclination of the conductive connecting pin do not occur.

When the conductive adhesive agent is made of an alloy, such as Sn/Pb, Sn/Sb, Sn/Ag or Sn/Sb/Pb, the strength of adhesive bonding can be made to be 2.0 Kg/pin. Moreover, dispersion of the strength of adhesive bonding can be restrained. Even with the heat cycle condition and heat applied during mounting of IC chips, reduction in the strength of adhesive bonding of the conductive connecting pin can be prevented. Moreover, separation and inclination of the pin can be prevented. In addition, also electrical connection can be maintained.

Another aspect of the present invention has a structure that the columnar connection portion of the conductive connecting pin has a constriction portion having a diameter smaller than that of the other portions. Therefore, flexibility is imparted to the pin. Therefore, if stress is applied to the conductive connecting pin, the connection portion is bent at the constriction portion. Therefore, stress can be absorbed so that easy separation of the conductive connecting pin from the substrate is prevented.

It is preferable that the conductive connecting pin is a so-called T-type pin incorporating a plate-like secured portion and a columnar connection portion projecting over the central portion of the plate-like secured portion.

The plate-like secured portion is a portion which is, through the conductive adhesive agent, secured to the conductive layer which is formed into the pad. The foregoing plate-like secured portion is formed into an arbitrary shape including a circular shape and a polygonal shape adaptable to the size of the pad. The shape of the connection portion is required to permit insertion into another substrate. The shape may be any one of a cylindrical shape, a prismatic shape, a conical shape and a pyramid shape. Usually, one pin is provided for the pin disposed at a usual position. Two or more connection portions may be provided. The number of the connection portions may arbitrarily be determined.

It is preferable that the conductive connecting pin is structured such that the diameter of the plate-like secured portion is 0.5 mm to 2.0 mm, the diameter of the columnar connection portion is 0.1 mm to 0.8 mm and the length is 1 mm to 10 mm. The foregoing values are arbitrarily determined according to the size of the package substrate which must be secured and the type or the like of another substrate which must be mounted.

The constriction portion is formed at an intermediate position of the connection portion such that the diameter of the constriction portion is smaller than the diameter of the other portions. The diameter of the constriction portion varies according to the material of the conductive connecting pin and the size of the conductive connecting pin. It is an important fact that the foregoing diameter is not less than 50% nor more than 98% of the diameter of the connection portion. If the diameter of the constriction portion is smaller than 50% of the diameter of the other portions, the strength of the connection portion is unsatisfactory. When the package substrate has been joined, deformation and breakage sometimes occur. If the diameter of the constriction portion is larger than 98% of the other portion, predetermined flexibility cannot be imparted to the connection portion. Therefore, the effect of absorbing stress cannot be obtained. A plurality of the constriction portions may be formed (see FIG. 33 (B)).

The material of the conductive connecting pin according to the present invention is not limited if the material is a metal material. It is preferable that at least any one of metal materials, such as gold, silver, copper, nickel, cobalt, tin and lead is employed to form the conductive connecting pin. Any one of an iron alloy having trade name "COBAL" (an alloy of Ni—Co—Fe), stainless steel and a phosphor bronze which is a copper alloy is a preferred material because of an external electrical characteristic and satisfactory processability of the conductive connecting pin. Phosphor bronze having external flexibility is able to satisfactorily absorb stress.

Another aspect of the present invention is able to absorb stress because the connection portion is deflected if the stress is applied to the conductive connecting pin because the positions of the conductive connecting pin and the other substrate are deviated from each other. If warp of the substrate or the like occurs owing to heat hysteresis of the heat cycle condition, the secured portion is deflected to correspond to the deformation. Therefore, separation of the conductive connecting pin from the substrate can be prevented. As a result, a reliable package substrate can be obtained.

The package substrate may have a structure that a pad, to which the conductive connecting pin is connected, is covered with an organic resin insulating layer having an opening through which the pad is partially exposed. As a result, if concentration of stress to the conductive connecting pin or deformation of the substrate takes place as described above, the structure that the pad is pressed by the organic resin insulating layer is able to prevent separation of the pad from the substrate, can be prevented. If sufficiently large strength of adhesive bonding cannot easily be obtained in a case of bonding of different materials to each other, such as the metal pad and the interlayer resin insulating layer, covering of the surface of the pad with the organic resin insulating layer permits great peeling strength to be obtained.

When the pad is covered with the organic resin insulating layer, it is an important fact that the size of the pad is somewhat larger than that of the opening formed in the organic resin insulating layer through which the pad is exposed to the outside. As a result, the pad can partially be exposed to the outside through the opening. That is, the periphery can be covered with the organic resin insulating layer. It is preferable that the size of the pad is such that the diameter of the pad is 1.02 time to 100 times the diameter of the opening of the organic resin insulating layer through which the pad is exposed to the outside. If the diameter of the pad is smaller than 1.02 time the diameter of the opening, the periphery of the pad cannot reliably be held by the organic resin insulating layer. Therefore, separation of the conductive connecting pin cannot be prevented. If the diameter is larger than 100 times, raising of the density of the conductive layer is inhibited. Specifically, when the diameter of the opening formed in the organic resin insulating layer is 100 µm to 1,500 µm, the diameter of the pad is 110 µm to 2,000 vm.

Another aspect of the present invention has a structure that the connection portion of the conductive connecting pin has a constriction portion to obtain flexibility. Moreover, the pad for securing the conductive connecting pin is joined to the conductive layer, which is the inner layer, through the via hole. Therefore, the area of contact between the pad and the substrate can be enlarged to firmly join the two elements. As described above, the structure that the pad, to which the conductive connecting pin is secured, and the interlayer resin insulating layer to which the pad has been bonded are bonded to each other as bonding between different materials. This aspect has the structure that the pad is connected to the conductive layer which is the inner layer. Therefore, the two elements can reliably be made to contact hermetically with each other because metal elements are connected to each other. Therefore, the peeling strength of the pad can be enlarged.

The pad may be connected to the conductive layer, which is the inner layer, through one or more via holes. The reason for this lies in that the area of contact of the pad can furthermore be enlarged to effectively prevent the separation. When the pad is connected to the conductive layer, which is the inner layer, through the via hole, it is effective that the via hole is formed in the periphery of the pad. Therefore, the via hole may be formed into a ring shape and the pad may be disposed to cover the ring.

The pad to which the conductive connecting pin of the build-up multilayer circuit plate is connected may be so structured as to be connected to the conductive layer, which is the inner layer, through two or more layers of via holes. The two or more layers of the via holes may be one via hole according to the shape or the type of the package substrate. In either case, the surface area of the pad can be enlarged to effectively enlarge the strength of adhesive bonding. When the via hole provided with the pad is covered with the organic resin insulating layer having the opening through which the pad is partially exposed to the outside, separation of the pad can reliably be prevented.

Another aspect of the present invention has a structure that the conductive layer of the core substrate is made to firmly contact with the surface of a resin substrate serving as a core substrate through a coarsened surface (a mat surface). When a pad is connected to the foregoing conductive layer, the pad cannot easily be separated from the inter layer resin insulating layer. Also in a case where the pad is joined to the conductive layer, which is the inner layer, through one or more via holes and two or more layers of via holes, the conductive layer, which is the inner layer, may be provided for the core substrate.

According to another aspect of the present invention, it is able to elongate the length of the electric wire from the conductive connecting pin, which is an external terminal, to another substrate disposed on a side surface opposite to the side surface for which the conductive connecting pin is prevented. Specifically, the pad is connected to the land around the through hole and a filer filled in the through hole through a via hole. Moreover, so-called "cover plating" may be performed such that the through hole is covered with a conductive layer. Then, the pad may be connected to the conductive layer through the via hole. Moreover, the pad may be connected to only the land of the through hole through the via hole.

According to another aspect of the present invention has a structure that the strength of adhesive bonding with the conductive connecting pin can be made to be 2.0 Kg/pin or greater because the melting point of the conductive adhesive agent is 180° C. to 280° C. The foregoing strength is not considerably reduced even after the reliability test, such as a heat cycle test, or even after heat has been applied during mounting of IC chips. If the melting point is lower than 180° C., realized strength of adhesive bonding is about 2.0 Kg/pin. In some cases, only unsatisfactory strength of adhesive bonding of 1.5 Kg/pin can be realized. What is worse, heating applied during mounting of the IC chips sometimes causes the conductive adhesive agent to be melted. Thus, the conductive connecting pin is undesirably separated and inclined. If the melting point is higher than 280° C., the resin insulating which is the resin layer and the solder resist layer are unsatisfactorily dissolved at a temperature at which the conductive adhesive agent is dissolved. It is preferable that the temperature is 200° C. to 260° C. When the conductive adhesive agent has the above-mentioned melting point, dispersion of the strength of adhesive bonding of the conductive connecting pin can be reduced. Moreover, applied heat does not damage the resin layer which constitutes the package substrate.

Another aspect of the present invention has a structure that the conductive adhesive agent is made of at least one type of material selected from tin, lead, antimony, silver, gold and copper. Therefore, the conductive adhesive agent having the above-mentioned melting point can be prepared. In particular, a conductive adhesive agent containing at least tin-lead or tin-antimony is able to realize the above-mentioned range of the melting point. If the conductive adhesive agent is melted, re-fixation easily occurs. Thus, separation and inclination of the conductive connecting pin do not occur.

When the conductive adhesive agent is made of an alloy, such as Sn/Pb, Sn/Sb, Sn/Ag or Sn/Sb/Pb, the strength of adhesive bonding can be made to be 2.0 Kg/pin. Moreover, dispersion of the strength of adhesive bonding can be restrained. Even with the heat cycle condition and heat applied during mounting of IC chips, reduction in the strength of adhesive bonding of the conductive connecting pin can be prevented. Moreover, separation and inclination of the pin can be prevented. In addition, also electrical connection can be maintained.

Other aspects have the structure that a plane layer which is a conductive layer is formed on the surface of the substrate. Moreover, the conductive connecting pin is directly connected to the plane layer so that the electric resistance from an external substrate (for example, a daughter board) to the plane layer is reduced. Thus, supply of electric power from the daughter board can be facilitated. Therefore, the plane layer constituting the power source layer has a satisfactory function. Also the plane layer constituting the earth layer is connected to the earth line of the daughter board through the conductive connecting pin having low resistance so that the foregoing plane layer has a satisfactory function for preventing noise. The plane layer may be formed into a mesh shape. The mesh can be formed by forming a square or a circular portion in which no conductor is formed (refer to FIG. 50).

Another aspect of the present invention has a structure that the pad, to which the conductive connecting pin is secured, is covered with an organic resin insulating layer having an opening through which the pad is partially exposed to the outside. When the package substrate is joined to another substrate, such as a mother board, through the conductive connecting pin, deviation of the position of the conductive connecting pin and that of the socket of the motherboard sometimes causes stress to be applied to the conductive connecting pin. As an alternative to this, warp of the substrate occurs owing to heat hysteresis of the heat cycle condition, sometimes occurs. Even in the foregoing case, the pad is held by the organic resin insulating layer to prevent separation from the substrate. If sufficiently large strength of adhesive bonding cannot easily be obtained in a case of bonding between different materials, such as between the metal pad and the interlayer resin insulating layer, covering of the surface of the pad with the organic resin insulating layer enables great peeling strength to be imparted.

Another aspect of the present invention has a structure that the conductive connecting pin is made of at least one type of metal materials selected from copper, a copper alloy, tin, zinc, aluminum and noble metal having excellent flexibility. Therefore, when stress is applied to the pin, the pin is deflected so that the stress is absorbed. As a result, the conductive connecting pin cannot easily be separated from the substrate. It is preferable that the copper alloy for constituting the conductive connecting pin is phosphor bronze which exhibits excellent flexibility and satisfactory electric characteristics and which permits easy processing of the conductive connecting pin.

It is preferable that the conductive connecting pin is a so-called T-type pin incorporating a plate-like secured portion and a columnar connection portion projecting over the central portion of the plate-like secured portion. The plate-like secured portion is a portion which is, through the conductive adhesive agent, secured to the conductive layer which is formed into the pad. The foregoing plate-like secured portion is formed into an arbitrary shape including a circular shape and a polygonal shape adaptable to the size of the pad. The shape of the connection portion is required to permit insertion into another substrate. The shape may be any one of a cylindrical shape, a prismatic shape, a conical shape and a pyramid shape. Usually, one pin is provided for the pin disposed at a usual position. Two or more connection portions may be provided. The number of the connection portions may arbitrarily be determined.

It is preferable that the columnar connection portion of the conductive connecting pin has a diameter of 0.1 mm to 0.8 mm, the length of 1.0 mm to 10 mm and the diameter of the columnar secured portion is 0.5 mm to 2.0 mm. The foregoing values are arbitrarily determined according to the size of the pad and the type or the like of another substrate which must be mounted.

Another aspect of the present invention has a structure that the columnar connection portion of the conductive connecting pin has a constriction portion having a diameter smaller than that of the other portions. Therefore, flexibility is imparted to the pin. Therefore, if stress is applied to the conductive connecting pin, the connection portion is bent at the constriction portion. Therefore, stress can be absorbed so that easy separation of the conductive connecting pin from the substrate is prevented.

It is preferable that the conductive connecting pin is a so-called T-type pin incorporating a plate-like secured portion and a columnar connection portion projecting over the central portion of the plate-like secured portion.

The plate-like secured portion is a portion which is, through the conductive adhesive agent, secured to the conductive layer which is formed into the pad. The foregoing plate-like secured portion is formed into an arbitrary shape including a circular shape and a polygonal shape adaptable to the size of the pad. The shape of the connection portion is required to permit insertion into another substrate. The shape may be any one of a cylindrical shape, a prismatic shape, a conical shape and a pyramid shape. Usually, one pin is provided for the pin disposed at a usual position. Two or more connection portions may be provided. The number of the connection portions may arbitrarily be determined.

It is preferable that the conductive connecting pin is structured such that the diameter of the plate-like secured portion is 0.5 mm to 2.0 mm, the diameter of the columnar connection portion is 0.1 mm to 0.8 mm and the length is 1 mm to 10 mm. The foregoing values are arbitrarily determined according to the size of the package substrate which must be secured and the type or the like of another substrate which must be mounted.

The constriction portion is formed at an intermediate position of the connection portion such that the diameter of the constriction portion is smaller than the diameter of the other portions. The diameter of the constriction portion varies according to the material of the conductive connecting pin and the size of the conductive connecting pin. It is an important fact that the foregoing diameter is no less than 50% nor more than 98% of the diameter of the connection portion. If the diameter of the constriction portion is smaller than 50% of the diameter of the other portions, the strength of the connection portion is unsatisfactory. When the package substrate has been joined, deformation and breakage sometimes occur. If the diameter of the constriction portion is larger than 98% of the other portion, predetermined flexibility cannot be imparted to the connection portion. Therefore, the effect of absorbing stress cannot be obtained. A plurality of the constriction portions may be formed.

The material of the conductive connecting pin according to the present invention is not limited if the material is a metal material. It is preferable that at least any one of metal materials, such as gold, silver, copper, nickel, cobalt, tin and lead is employed to form the conductive connecting pin. Any one of an iron alloy having trade name "COBAL" (an alloy of Ni—Co—Fe), stainless steel and a phosphor bronze which is a copper alloy is a preferred material because of an external electrical characteristic and satisfactory processability of the conductive connecting pin. Since phosphor bronze having external flexibility is able to satisfactorily absorb stress.

Another aspect of the present invention has a structure that the strength of adhesive bonding with the conductive connecting pin can be made to be 2.0 Kg/pin or greater because the melting point of the conductive adhesive agent is 180° C. to 280° C. The foregoing strength is not considerably reduced even after the reliability test, such as a heat cycle test, or even after heat has been applied during mounting of IC chips. If the melting point is lower than 180° C., realized strength of adhesive bonding is about 2.0 Kg/pin. In some cases, only unsatisfactory strength of adhesive bonding of 1.5 Kg/pin can be realized. What is worse, heating applied during mounting of the IC chips sometimes causes the conductive adhesive agent to be melted. Thus, the conductive connecting pin is undesirably separated and inclined. If the melting point is higher than 280° C., the resin insulating which is the resin layer and the solder resist layer are unsatisfactory dissolved at a temperature at which the conductive adhesive agent is dissolved. It is preferable that the temperature is 200° C. to 260° C. When the conductive adhesive agent has the above-mentioned melting point, dispersion of the strength of adhesive bonding of the conductive connecting pin can be reduced. Moreover, applied heat does not damage the resin layer which constitutes the package substrate.

Another aspect of the present invention has a structure that the conductive adhesive agent is made of at least one type of material selected from tin, lead, antimony, silver, gold and copper. Therefore, the conductive adhesive agent having the above-mentioned melting point can be prepared. In particular, a conductive adhesive agent containing at least tin-lead or tin-antimony is able to realize the above-mentioned range of the melting point. If the conductive adhesive agent is melted, re-fixation easily occurs. Thus, separation and inclination of the conductive connecting pin do not occur.

When the conductive adhesive agent is made of an alloy, such as Sn/Pb, Sn/Sb, Sn/Ag or Sn/Sb/Pb, the strength of adhesive bonding can be made to be 2.0 Kg/pin. Moreover, dispersion of the strength of adhesive bonding can be restrained. Even with the heat cycle condition and heat applied during mounting of IC chips, reduction in the strength of adhesive bonding of the conductive connecting pin can be prevented. Moreover, separation and inclination of the pin can be prevented. In addition, also electrical connection can be maintained.

To overcome the foregoing problems, crack portions of the BGA have been detected. As a result, cracks and breakage have occurred in the metal plated layer and a connection portion between the metal plated layer and the BGA. Thus, a fact has been detected that cracks have occurred owing to thermal stress applied when crimping has been performed during the mounting process or when the duration of the heat cycle condition in which a high temperature and a low temperature are repeated as the connection reliability test is 100 hours or longer. The reason for this can be considered that the area of bonding between the BGA and the solder resist is too small to prevent concentration of stress. The area of bonding is too small to obtain satisfactory great strength of adhesive bonding.

Investigations have been performed to obtain a method capable of overcoming the foregoing problem. As a result, a structure has been invented with which PGA of a projecting pin is disposed in the opening of the solder resist layer through a conductive adhesive layer as a substitute for the BGA. The PGA is able to enlarge the area of bonding as compared with the area permitted by the BGA. Therefore, concentration of stress can be prevented, causing a crack and breakage in the joining interface to be prevented. Moreover, the strength of adhesive bonding can be enlarged, and defecting connection with an external substrate can be prevented. Since the through hole for the PGA is not required, electric wires can be disposed below the PGA. Therefore, an equivalent degree of design freedom to that permitted by the BGA can be maintained.

The projecting pin may be inserted and disposed in a recess formed in the periphery of the opening in the solder resist layer. The projecting pin may be disposed through a metal layer or a conductive adhesive layer.

The electrical connection with the conductor circuit may be established through a recess as a substitute for the opening. Since the electrical connection is established, large-capacity electric power or large-capacity electric signal can be transmitted to an external substrate without any problem.

The opening must be electrically connected with the conductor circuit of the inner substrate. When a recess is formed around the opening, electrical connection through the recess is not required. If necessary, electrical connection with the conductor circuit may be established.

Preferred aspects of the present invention are as follows.

The opening in the solder resist layer has a diameter of 100 µm to 900 µm. If the diameter is smaller than 100 µm, the strength of adhesive bonding of the projecting pin is sometimes reduced. If the diameter is larger than 900 µm, a merit obtain able from the connection with an external substrate by flip-chip mounting can be canceled. When the recess for connecting the projecting pin is formed around the opening, it is preferable that the diameter of the opening is 120 µm to 800 µm.

Two or more recess each having a diameter of 20 µm to 100 µm for connecting the projecting pin are formed around the opening. To enlarge the strength of adhesive bonding of the projecting pin to the solder resist, it is preferable that four to eight recesses each having a diameter of 25 µm to 70 µm are formed on the diagonal.

It is preferable that each of the opening and the recesses are formed into a circular shape. The reason for this lies in that occurrence of a corner crack can easily be prevented in the opening and a variety of forming methods may be employed. Another shape may be employed which includes a rectangular shape and an ecliptic shape.

The opening and the recesses are formed by any one of a photo-via, laser, drill and punching. It is preferable that photo-via is employed which is capable of simultaneously forming the opening and the recesses. When the metal layer is formed in the opening, the recesses may be formed by etching.

A metal layer may be formed on the conductor circuit in which the opening is exposed to the outside. The metal layer may be constituted by one or more materials selected from a group consisting of gold, silver, nickel, tin, copper, aluminum, lead, phosphorus, chrome, tungsten, molybdenum, titanium, platinum and solder. It is preferable that gold, silver, tin or nickel is employed to form the metal layer. The reason for this lies in that the foregoing metal materials exhibit satisfactory corrosion resistance to prevent corrosion of the exposed conductor circuit.

The metal layer may be made of one of the foregoing metal material or an alloy with another metal material. Two or more metal layers may be laminated.

The metal layer may be formed by a method selected from electroless plating, electroplating, substitutional plating, sputtering and evaporation. It is preferable that the electroless plating is employed because a uniform metal film can be formed and the cost can be reduced.

The conductive adhesive layer is formed by solder, a brazing material, granular substances and thermoplastic resin or granular substances and a thermosetting resin. It is preferable that the adhesive layer is formed by the solder among the foregoing materials. The reason for this lies in that the strength of adhesive bonding can easily be enlarged and a variety of forming methods can be employed.

When the conductive adhesive layer is formed by the solder, it is preferable that solder which satisfies Sn:Pb=1:9 to 4:6 and which is usually employed for a printed circuit board.

The solder which does not include the lead may be used. That reason is that it can be taken into consideration in the environment and moreover strength of adhesive bonding can be secured.

The forming method is arranged such that printing, potting, resist etching or plating is performed to embed the solder adhesive layer in the opening. Another method may be employed with which the adhesive surface of the projecting pin is subjected to plating or potting to form the solder adhesive layer so as to be melted owing to heat or the like.

When the adhesive layer is formed by the brazing material, it is preferable that a metal brazing material constituted by one or more materials selected from gold, silver, copper, phosphorus, nickel, palladium, zinc, indium, molybdenum and manganese. In particular, it is preferable that an eutectic brazing material called a "silver brazing material" or a "gold brazing material" is employed. The brazing method is performed such that a brazing material formed into a spherical shape is introduced into the opening so as to be melted so that the adhesive layer is formed. Another method may be employed with which coating of portions except for the opening is performed. Then, immersion is performed so that the material is filled in the opening. Another method has the steps of forming a brazing material on the adhesive surface of the projecting metal electrode, performing heating and melting to introduce the brazing material into the opening. As an alternative to this, all usual methods may be employed.

When the adhesive layer is formed by the granular substances and the thermoplastic resin or the thermosetting resin, it is preferable that the granular substances are made of at least one of metal particles, inorganic particles and resin particles.

The metal particles of the granular substances may be a metal material, such as copper, gold, silver, nickel, aluminum, titanium, chrome, tin, palladium or platinum. Either of the foregoing metal material may be employed or an alloy of two or more metal materials may be employed.

The shape of the metal particles may be a spherical shape, a polygonal shape or a mixed shape of the spherical shape and the polygonal shape. The inorganic particles of the granular substances may be silica, alumina, mullite or silicon carbide.

The shape of the inorganic particle may be a spherical shape, a polygonal shape, a porous shape or a mixed shape of the spherical shape and the polygonal shape. The surface layer of the inorganic particle is coated with conductive substance substances, such as a metal layer or a conductive resin so that conductivity is imparted to the inorganic particles.

It is preferable that the resin particles of the granular substances is at least any one of epoxy resin, benzoguanamine resin and amino resin. Conductive resin, such as anisotropic conductive resin, may be employed to form the inorganic particles.

The surface layers of the inorganic particles are coated with conductive substances, such as a metal layer or conductive resin, so that conductivity is imparted to the resin particles. It is preferable that epoxy resin is employed. The reason for this lies in that satisfactory adhesiveness with the formed resin can be realized and the linear expansion coefficients are similar to each other. Therefore, a crack of the formed resin can be prevented.

It is preferable that the diameter of each of the metal particles, inorganic particles or the resin particles is 0.1 µm to 50 µm. If the particle size is smaller than 0.1 µm, electrical conduction cannot sometimes be established. If the particle size is larger than 50 mm, operability for introducing the particles into the opening deteriorates.

It is preferable that the filling factor of the metal particles, the inorganic particles or the resin particles with respect to the overall volume is 30 wt % to 90 wt %. If the foregoing factor is lower than 30 wt %, the electrical connection cannot sometimes be established. If the factor is higher than 90 wt %, the strength of adhesive bonding with the projecting pin is reduced.

The resin for filling the inside portion of the opening may be thermosetting resin or thermoplastic resin.

The thermosetting resin may be at least one material selected from a group consisting of epoxy resin, polyimide resin, polyester resin and phenol resin.

The thermoplastic resin may be at least any one of materials selected from a group consisting of epoxy resin, fluorine-resin polyethylene terephthalate (PET), such as polytetrafluoroethylene (PTFE), ethylene tetra fluoride-propylene hexa fluoride copolymer (FEP) or ethylene tetra fluoride perfluoroalkoxy copolymer (PFA); polysulfone (PSF); polyphenylsulfide (PPS); thermoplastic polyphenylether (PPE); polyether sulfon (PES); polyetherimide (PEI); polyphenylsulfone (PPES); polyethylene terephthalate (PEN); polyether etherketone (PEEK); and polyolefin resin.

The most preferred resin which must be filled in the opening is the epoxy resin. The reason for this lies in that any diluting solvent is not required to adjust the viscosity and satisfactory strength, heat resistance and chemical resistance can be realized.

To adjust the viscosity of the filler resin may be mixed with organic solvent, water, additives and particles.

The granular substances and the filler resin are mixed by a mixer or the like to uniform the particle substances in the resin. Then, the materials are introduced into the opening.

When the thermosetting resin is employed, the resin is filled in the opening by printing or potting. Then, the projecting pin is introduced to cause thermosetting to occur so that joining is performed. To remove air, gaps and excess solvent in the resin, vacuum or reduced-pressure defoaming may be performed. Then, thermosetting may be performed.

When the thermoplastic resin is employed, the resin is molded into a tablet shape. Then, the tablets are introduced into the output, and then heating is performed. Then, the projecting pin is inserted. As an alternative to this, the tablets are joined to the bonding surface of the projecting pin, and then heating and melting are performed. Then, the projecting pin is inserted into the opening.

The number of the projecting pin is basically one. If two or more projecting pins are provided, any problem arises. If two or more projecting pins are provided in parallel, the projecting pins may be disposed around one projecting pin. The shape of the projection may be a conical shape, a cylindrical shape, a pyramid shape or a polygonal shape. If the employed shape permits insertion into the connection portion of an external substrate, any shape may be employed.

It is preferable that the height of the projecting pin satisfies a range from 5 μm to 50 μm.

It is preferable that the ratio of area of the bonding surface of the projecting pin with respect to the diameter of the opening of the solder resist layer is 0.5 to 1.4. In particular, it is preferable that the ratio is 0.8 to 1.2 because the process for bonding the projecting pin to the opening can be facilitated. Moreover, the projecting pin can easily be stood erect at a right angle from the opening.

On the other hand, the bonding surface may be flat or a shape having projections. That is, when the recesses are formed around the opening, the pin-shape projections may be provided for the bonding surface to enlarge the strength of adhesive bonding of the pin.

It is preferable that the projecting pin is made of at least any one of the following materials: gold, silver, iron, copper, nickel, cobalt, tin and lead. In particular, it is preferable that iron, an iron alloy, copper or a copper alloy is employed. The reason for this lies in that, for example, covar which is an iron alloy, 42-alloy or phosphor bronze has a proven track record as the material for the pin for the PGA. Moreover, the foregoing materials are suitable to a variety of processes for forming projections.

The projecting pin may be made of a sole metal material, an alloy or formed into a structure covered with a metal layer made of gold, silver or nickel in order to prevent corrosion or a structure covered with a metal layer made of, for example, solder which is melted at a temperature not higher than 250° C. in order to enlarge the strength of the adhesive agent. The overall body of the projecting pin may be made of metal or the basic structure may be constituted by a nonconductor substances, such as ceramics or nonconductive metal, in order to realize satisfactory strength of the pin. Then, the basic structure is coated with a metal layer so as to establish the electrical connection.

In the present invention, the conductive adhesive layer, the joint-permissible projecting pin or the metal layer, the conductive adhesive layer and the joint-permissible projecting pin are provided for the opening of the solder resist. The projecting pin is inserted into the connection portion of the external substrate so that the conductor circuit formed in the package substrate and the external substrate are electrically connected to each other.

The projecting pin is so structured as to be inserted into the connection portion of the external substrate. Therefore, when crimping is performed during mounting on the external substrate, concentration of stress to the projecting pin can be relaxed. Therefore, occurrence of a crack and breakage of the conductor circuit or the like which holds the projecting pin can be prevented.

As compared with the substrate having the BGA, a large joining area can be permitted between the PGA and the adhesive layer. Therefore, if heat cycle conditions are maintained for 1000 hours or longer, occurrence of a crack and breakage of the projecting pin and the holding portion can be prevented.

BRIEF DESCRIPTION OF DRAWINGS

FIGS. 1 (a), 1 (b), 1 (c) and 1 (d) are diagrams showing a process for manufacturing a package substrate according to a first embodiment of the present invention;

FIGS. 2 (a), 2 (b), 2 (c) and 2 (d) are diagrams showing a process for manufacturing a package substrate according to the first embodiment of the present invention;

FIG. 9 (A) is a cross sectional view showing an example 1 of the first embodiment, and FIG. 9 (B) is a view B shown in FIG. 9 (A);

FIG. 12 (A) is a cross sectional view showing a pad portion of a package substrate according to example 2 of the second modification and 12 (B) is a view B of FIG. 12 (A);

FIG. 13 (A) is a cross sectional view showing a pad portion of a package substrate according to example 3 of the second modification and 13 (B) is a view B of FIG. 13 (A);

FIG. 15 is a cross sectional view showing a package substrate according to a third modification;

FIG. 16 is a cross sectional view showing example 1 of the third modification;

FIG. 17 is a cross sectional view showing example 2 of the third modification;

FIG. 18 is a graph showing results of evaluation of the package substrate according to the modifications of the first embodiment;

FIG. 24 (A) is a cross-sectional view showing a pad portion of the package substrate according to example 1 of the first modification of the second embodiment and FIG. 24 (B) is view B shown in FIG. 24 (A);

FIG. 25 (A) is a cross sectional view showing a pad portion of a package substrate according to example 2 of the first modification of the second embodiment and FIG. 25 (B) is view B of FIG. 25 (A);

FIG. 28 is a cross sectional view showing example 1 of the second modification of the second embodiment;

FIG. 29 is a cross sectional view showing example 2 of the second modification of the second embodiment;

FIG. 30 is a graph showing results of evaluation of the package substrates according to the modifications of the second embodiment;

FIG. 31 is a diagram showing a process for manufacturing a package substrate according to a third embodiment;

FIG. 32 is a cross sectional view showing the package substrate according to the third embodiment;

FIG. 33 (A) is an enlarged cross sectional view showing a portion in which the conductive connecting pin shown in FIG. 32 is connected to the pad and FIG. 33 (B) is a cross sectional view showing a modification of the conductive connecting pin;

FIG. 36 (A) is a cross sectional view showing a pad portion of a package substrate according to example 1 of the first modification of the third embodiment and FIG. 36 (B) is view B of FIG. 36 (A);

FIG. 37 (A) is a cross sectional view showing a pad portion of the package substrate according to example 2 of the first modification of the third embodiment and FIG. 37 (B) is view B of FIG. 37 (A);

FIGS. 38 (A) and 38 (B) are cross sectional views showing example 3 of the first modification of the third embodiment;

FIG. 42 is a graph showing results of evaluation of the package substrates according to the modifications of the third embodiment;

FIG. 43 is a diagram showing a process for manufacturing a package substrate according to a fourth embodiment;

FIG. 50 is a plan view showing a plane layer according to the fourth embodiment;

FIG. 51 is a graph showing results of evaluation of the package substrates according to the fourth embodiment;

FIGS. 56 (Q) and 56 (R) are diagrams showing a process for manufacturing the package substrate according to the fifth embodiment;

FIGS. 58 (Q), 58 (R) and 58 (S) are diagrams showing a process for manufacturing a package substrate according to a first modification of the fifth embodiment;

FIG. 61 (A) is a cross sectional view showing the IC chip according to the fifth embodiment and FIG. 61 (B) is an enlarged view showing portion H shown in FIG. 60;

FIGS. 62 (A), 62 (B) and 62 (C) are diagrams showing a process for manufacturing a package substrate according to a second modification of the fifth embodiment;

FIGS. 63 (D) and 63 (E) are diagrams showing the package substrate according to the second modification of the fifth embodiment;

FIGS. 65 (A), 65 (B) and 65 (C) are diagrams showing a process for manufacturing a package substrate according to a fourth modification of the fifth embodiment;

FIGS. 66 (A) and 66 (B) are diagrams showing a process for manufacturing a package substrate according to a fifth modification of the fifth embodiment;

FIGS. 67 (A), 67 (B) and 67 (C) are diagrams showing a process for manufacturing a package substrate according to a sixth modification of the fifth embodiment;

FIGS. 68 (D) and 68 (E) are diagrams showing a process for manufacturing the package substrate according to the sixth modification of the fifth embodiment;

FIG. 69 (A) is a cross sectional view showing a package substrate according to a seventh modification of the fifth embodiment and FIG. 69 (B) is a cross sectional view showing a package substrate according to an eighth modification of the fifth embodiment;

FIGS. 70 (A) and 70 (B) are diagrams showing a process for manufacturing a package substrate according to the modification of the fifth embodiment;

FIGS. 71 (A), 71 (B), 71 (C), 71 (D), 71 (E) and 71 (F) are diagrams showing a projecting pin according to each modification of the fifth embodiment;

FIGS. 72 (A), 72 (B) and 72 (C) are diagrams showing a process for manufacturing a package substrate according to a ninth modification of the fifth embodiment;

FIGS. 73 (D) and 73 (E) are diagrams showing a process for manufacturing a package substrate according to the ninth modification of the fifth embodiment;

FIG. 74 is graph showing results of experiments of the package substrates according to the fifth embodiment and comparative examples;

FIG. 75 is a cross sectional view showing a package substrate according to the sixth embodiment of the present invention.

BEST MODE FOR CARRYING OUT THE INVENTION

First Embodiment

Figure 3:
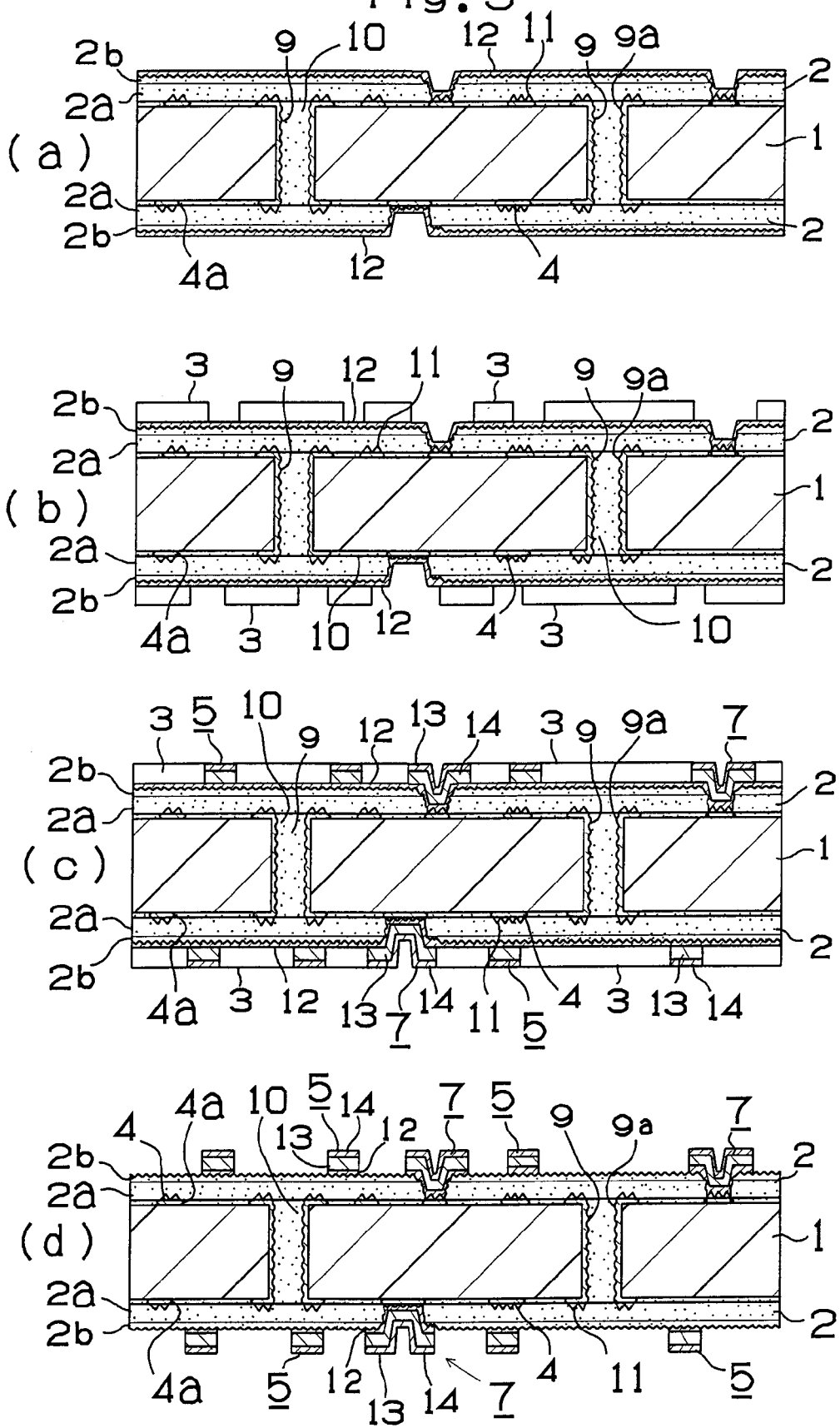
FIGS. 3 (a), 3 (b), 3 (c) and 3 (d) are diagrams showing a process for manufacturing a package substrate according to the first embodiment of the present invention.

Referring to FIGS. 1 to 8, a package substrate according to a first embodiment will now be described together with a method of manufacturing a build-up substrate. Although the following method is performed by a semi-additive method, a full additive method may be employed.

(1) Initially, a core substrate having a conductive layer formed on the surface thereof is manufactured. The core substrate may be a copper-clad laminated pad incorporating a resin insulating substrate, such as a glass epoxy substrate, a polyimide substrate or a bismaleimide-triazine resin substrate which has two surfaces to each of which copper foil 8 has been bonded (refer to FIG. 1 (a)). The copper foil 8 has either side formed into a coarsened surface (a mat surface) so as to be made to firmly contact with the resin substrate. A through hole is formed in the substrate by drilling, and then electroless plating is performed so that a through hole 9 is formed. It is preferable that the electroless plating operation is performed by copper plating. Then, a plating resist is formed, and then an etching process is performed to form a conductive layer 4. Note that electric plating may be performed to enlarge the thickness of the copper foil. It is preferable that also electric plating is copper plating. After electric plating has been performed, the surface of the conductive layer 4 and the inner wall of the through hole 9 may be coarsened surfaces 4a and 9a (refer to FIG. 1 (b)).

The coarsening method is exemplified by a blackening (oxidizing)-reducing process, a spray process using mixed solution of organic acid and cupric salt complex and a needle-shape alloy plating of Cu—Ni—P.

Then, the obtained substrate is cleaned with water, and then dried. Then, a resin filler 10 is filled in between the conductive layers 4 on the surface of the substrate and the inside portion of the through hole 9, and then drying is performed (see FIG. 1 (c)). Then, an unnecessary portion of the resin filler 10 on the two sides of the substrate is ground by performing belt-sander grinding to expose the conductive layer 4. Thus, the resin filler 10 is mainly hardened. A recess formed between the conductor layers 4 and the through hole 9 are plugged so that the substrate is flattened (see FIG. 1 (d)).

Then, the exposed surface of the conductive layer 4 is again provided with a coarsened layer 11 (see FIG. 2 (a)). Note that a portion indicated with a circle shows the enlarged conductive layer 4 provided with the coarsened layer 11. It is preferable that the coarsened layer 11 is constituted by a needle alloy of Cu—Ni—P or a porous alloy layer. As an alternative to this, the coarsened layer may be formed by a blackening (oxidizing)-reducing process or an etching process. When the Cu—Ni—P needle alloy layer or the porous alloy layer is employed, it is preferable that "INTERPLATE" which is trade name of Ebara Yusilight is employed. It is preferable that the etching process is performed by using MECetch Bond which is trade name of MEC.

(2) A resin insulating layer 2 consisting of resin layers 2a and 2b is formed on each of the two sides of a circuit substrate incorporating the conductive layer 4 formed in step (1) (see FIG. 2 (b)). The resin insulating layer 2 serves as an inter layer resin insulating layer 52 for a package substrate, as described later.

The resin insulating layer (herein after called the "interlayer resin insulating layer 52") is made of a material exemplified by thermosetting resin, thermoplastic resin and their mixture resin. It is preferable that the resin insulating layer 2 is made of an adhesive agent for electroless plating. The most suitable adhesive agent for electroless plating is acid subjected to a hardening process or a material obtained by dispersing heat-resisting resin particles, which is soluble in an oxidizer, in a refractory and non-hardened heat-resisting resin. As described later, a process using solution of the oxidizer is performed so that heat-resisting resin particles are removed. Thus, a coarsened surface incorporating anchors in the form of an octopus trap on the surface thereof can be formed.

It is preferable that the hardened heat-resisting resin particles of the adhesive agent for electroless plating are (1) heat-resisting resin powder having an average particle size of 10 μm or smaller or (2) mixed particles of particles having a relatively large average particle size and particles having a relatively small average particle size. Thus, more complicated anchors can be formed.

The adaptable heat-resisting resin may be, for example, epoxy resin (bis-A type epoxy resin, cresol novolac type epoxy resin or the like), polyimide resin or a composite material of the epoxy resin and the thermoplastic resin. The thermoplastic resin which must be combined may be polyether sulfon (PES), polysulfon (PSF), polyphenylene sulfon (PPS), polyphenylene sulfide (PPES), polyphenyl ether (PPE) or polyether imide (PI). The heat-resisting resin particles which are dissolved in acid or solution of the oxidizer is exemplified by epoxy resin (it is preferable that epoxy resin hardened by amine hardener is employed) amino resin or rubber, such as polyethylene rubber, polybutane rubber, polybutadiene rubber or polybutyne rubber. The interlayer resin insulating layer is formed by coating or heating and pressing a resin film.

The resin film may be made of a material in which particles (herein after called "soluble particles") which can be dissolved in acid or an oxidizer are dispersed in resin (herein after called "refractory resin") which is refractory in acid or the oxidizer.

The expressions "refractory" and "soluble" employed in the present invention are defined such that a material which exhibits relatively high dissolving rate when the material is immersed in solution containing the same acid or an oxidizer for the same time is called "soluble" for convenience. On the other hand, a material exhibiting relatively low dissolving rate is called "refractory" for convenience.

The foregoing soluble particles are exemplified by resin particle (herein after called "soluble resin particles") which are soluble in acid resin or the oxidizer, inorganic resin particles (herein after called "soluble inorganic particles") which are soluble in acid or the oxidizer and metal particles (herein after called "soluble metal particles") which are soluble in acid or the oxidizer. The foregoing soluble particles may be employed solely or two or more types of the particles may simultaneously be employed.

The shape of the soluble particle is not limited. The shape may be a spherical shape, a crushed shape or the like. It is preferable that the soluble particles have a uniform shape. In the foregoing case, a coarsened surface having asperities exhibiting uniform roughness can be formed.

It is preferable that the average particle size of the soluble particles is 0.1 μm to 10 μm. If the particle size satisfies the foregoing range, particles having two or more particle sizes may be contained. For example, a mixture is exemplified which contains soluble particles having an average particle size of 0.1 μm to 0.5 μm and soluble particles having an average particle size of 1 μm to 3 μm. As a result, a furthermore complicated coarsened surface can be formed. Moreover, excellent adhesiveness with the conductor circuit can be realized. In the present invention, the "particle size" of the soluble particles is the length of the longest portion of the soluble particles.

The soluble resin particles are exemplified by particles made of thermosetting resin, thermoplastic resin or the like. If the particles are immersed in solution composed of acid or the oxidizer, the soluble resin particles must have a dissolving rate higher than that of the refractory resin. Any particles satisfying the foregoing requirement may be employed.

The soluble resin particle is exemplified by epoxy resin, phenol resin, polyimide resin, polyphenylene resin, polyolefin resin and fluorine resin. The foregoing resin may solely be employed or mixture of two or more resin materials may be employed.

The soluble resin particles may be resin particles made of rubber. The foregoing rubber is exemplified by a variety of denatured polybutadiene rubber, such as polybutadiene rubber, epoxy denatured rubber, urethane denatured rubber or (meta) acrylonitrile denatured rubber and (meta) acrylonitrile.butadiene rubber containing carboxylic group. When any one of the foregoing rubber materials is employed, the soluble resin particles can easily be dissolved in acid or the oxidizer. That is, when the soluble resin particles are dissolved by using acid, except for strong acid, acid is able to dissolve the soluble resin particles. When the soluble resin particles are dissolved by using the oxidizer, permanganic acid having relatively weak oxidizing effect is able to dissolve the soluble resin particles. When chromic acid is employed, only a low concentration is sufficient to dissolve the soluble resin particles. Therefore, the acid or the oxidizer does not remain on the surface of the resin. As described later, when catalysts of palladium chloride or the like are supplied after the coarsened surface has been formed, failure of supply of the catalysts or undesirable oxidation of the catalysts can be prevented.

The soluble inorganic particles may be made of at least one material selected from a group consisting of an aluminum compound, a calcium compound, a potassium compound, a magnesium compound and a silicon compound.

The foregoing aluminum compound is exemplified by alumina and aluminum hydroxide. The calcium compound is exemplified by calcium carbonate and calcium hydroxide. The potassium compound is exemplified by potassium carbonate. The magnesium compound is exemplified by magnesia, dolomite, basic magnesium carbonate. The silicon compound is exemplified by silica and zeolite. The foregoing material may be employed solely or two or more materials may simultaneously be employed.

The soluble metal particles may be particles made of at least one material selected from a group consisting of copper, nickel, iron, zinc, lead, gold, silver, aluminum, magnesium, calcium and silicon. The foregoing soluble metal particles may be coated with resin or the like in order to maintain the insulating characteristic.

When two or more types of the foregoing soluble particles are employed in a mixed manner, it is preferable that the combination of the two types of the soluble particles which must be mixed with each other is a combination of resin particles and inorganic particles. Since the two types of the particles have low conductivity, the insulating characteristic of the resin film can be maintained. Moreover, the thermal expansion can easily be adjusted with respect to the refractory resin. Thus, occurrence of a crack of the interlayer resin insulating layer constituted by the resin film can be prevented. Therefore, separation between the interlayer resin insulating layer and the conductor circuit can be prevented.

If the foregoing refractory resin is able to maintain the shape of the coarsened surface formed by adding acid or the oxidizer to the interlayer resin insulating layer, the refractory resin is not limited to a specific resin. The refractory resin is exemplified by thermosetting resin, thermoplastic resin and their composite material. Photosensitive resin obtained by imparting a photosensitive characteristic to the foregoing resin may be employed. When the photosensitive resin is employed, an opening for a via hole can be formed in the interlayer resin insulating layer by performing exposure and development processes.

Among the foregoing materials, it is preferable that a material containing the thermosetting resin is employed. Thus, the shape of the coarsened surface can be maintained against the plating solution and a variety of heating processes.

The refractory resin is exemplified by epoxy resin, phenol resin, polyimide resin, polyphenylene resin, polyolefin resin and fluorine resin. The foregoing resin may solely be employed or their mixture may be employed. It is preferable that epoxy resin containing two or more epoxy groups in one molecule thereof is employed. Since the foregoing coarsened surface can be formed and excellent heat resistance can be realized, concentration of stress to the metal layer can be prevented even under the heat cycle conditions. As a result, separation of the metal layer or the like can be prevented.

The epoxy resin is exemplified by cresol novolak epoxy resin, bis phenol A epoxy resin, bis phenol F epoxy resin, phenol novolak epoxy resin, alkyl phenol novolak epoxy resin, bis phenol F epoxy resin, naphthalene type epoxy resin, dicyclopentadiene epoxy resin, an epoxy material of a condensate of a phenol material and an aromatic aldehyde having phenol hydroxyl group, triglycidyl isocyanate and alicyclic epoxy resin. The foregoing material may solely be employed or two or more types may simultaneously be employed. Thus, excellent heat resistance can be realized.

It is preferable that the soluble particles in the resin film according to the present invention are substantially uniformly dispersed in the foregoing refractory resin. Thus, a coarsened surface incorporating asperities having uniform roughness can be formed. If a via hole or a through hole is formed in the resin film, the adhesiveness of the metal layer of the conductor circuit which is formed on the foregoing holes can be maintained. A resin film containing soluble particles in only the surface layer on which the coarsened surface will be formed may be employed. As a result, portions of the resin film except for the surface layer are not exposed to the acid or the oxidizer. Thus, the insulating characteristic between the conductor circuits through the interlayer resin insulating layer can reliably be maintained.

It is preferable that the amount of the soluble particles dispersed in the refractory resin of the foregoing resin film is 3 wt % to 40 wt % with respect to the resin film. If the amount of the mixed soluble particles is lower than 3 wt %, the coarsened surface having required asperities cannot sometimes be formed. If the amount is larger than 40 wt %, the deep portion of the resin film is undesirably dissolved when the acid or the oxidizer is used to dissolve the soluble particles. Thus, the insulating characteristic between the conductor circuits through the inter layer resin insulating layer constituted by the resin film cannot be maintained. As a result, short circuit is sometimes caused.

It is preferable that the resin film contains a hardener and other components as well as the refractory resin.

The hardener is exemplified by an imidazole hardener, an amine hardener, a guanidine hardener, epoxy a duct of the foregoing hardeners, a material obtained by forming the foregoing hardener into a microcapsule and an organic phosphine compound, such as triphenylphosphine or tetraphenyl phosphonium.tetraphenyl borate.

It is preferable that the amount of the contained hardener is 0.05 wt % to 10 wt % with respect to the resin film. If the amount is smaller than 0.05 wt %, the degree of hardening of the resin film is insufficient. Therefore, the acid or the oxidizer is excessively introduced into the resin film. As a result, the insulating characteristic of the resin film sometimes deteriorates. If the amount is larger than 10 wt %, the excess hardener component sometimes denatures the composition of the resin. As a result, the reliability sometimes deteriorates.

The "other component" is exemplified by an inorganic compound which does not exert an influence on the formation of the coarsened surface or a filler made of resin. The inorganic compound is exemplified by silica, alumina and dolomite. The foregoing resin is exemplified by polyimide resin, polyacrylic resin, polyamideimide resin, polyphenylene resin, melanin resin and olefin resin. When the foregoing filler is contained, the thermal expansion coefficients can be matched to each other, the heat resistance and chemical resistance can be improved. Therefore, the performance of the printed circuit board can be improved.

The resin film may contain solvent. The solvent is exemplified by ketone, such as acetone, methylethylketone or cyclohexane and aromatic hydrocarbon, such as ethyl acetate, butyl acetate, cellosolve acetate or toluene and xylene. The foregoing material may solely be employed or two or more materials may simultaneously be employed.

The employed material is applied by using a roll coater or a curtain coater, and then the material is semi-hardened so as to be formed into the film shape.

(3) Then, an opening 6 for forming a via hole is formed in the resin insulating layer 2 in order to establish the electric connection with the conductive layer 4 (see FIG. 2 (*c*)).

When the adhesive agent for electroless plating is employed, a photomask having a circular pattern for forming the via hole drawn thereon is placed. Then, exposure and development processes are performed, and then heat hardening is performed so that the opening 6 is formed. When the thermosetting resin is employed, thermosetting is performed. Then, laser machining is performed so that the opening 6 for the via hole is formed in the interlayer resin insulating layer. When the inter layer resin insulating layer is formed by bonding the resin film, laser machining, such as carbonic laser, YAG laser, excimer laser of UV laser, is performed so that the opening for the via hole is formed. If necessary, a dipping process using permanganic acid or like or a dry etching using plasma is performed to perform a desmear process.

(4) Then, the surface of the resin insulating layer 2 having the opening 6 for the via hole is coarsened (see FIG. 2 (*d*)). When the adhesive agent for electroless plating is employed to form the resin insulating layer 2, heat-resisting resin particles present on the surface of the adhesive agent for electroless plating are dissolved and removed with acid or an oxidizer. Thus, the surface of the adhesive agent 2 for electroless plating is coarsened so that the anchors in the form of the octopus trap are formed.

The foregoing acid may be, for example, strong acid, such as phosphoric acid, hydrochloric acid or sulfuric acid or organic acid, such as formic acid or acetic acid. It is preferable that the organic acid is employed. When the coarsening process has been performed, the metal conductive layer 4 exposed to the outside through the opening 6 for the via hole is not easily corroded.

On the other hand, it is preferable that the oxidizer is solution of chromic acid or permanganate (potassium permanganate or the like).

It is preferable that the degree of coarsening is performed such that maximum roughness of the surface of Rmax 0.1 μm to Rmax 20 μm is realized. If the thickness is too large, the coarsened surface can easily be damaged and separated. If the thickness is too small, the adhesiveness deteriorates.

(5) Then, catalyst cores are supplied to the circuit board obtained by coarsening the surface of the resin insulating layer 2. It is preferable that the catalyst cores are supplied by using noble metal ions or noble metal colloid. In general, palladium chloride or palladium colloid is employed. It is preferable that a heating process is performed in order to secure the catalyst cores. It is preferable that the catalyst cores are made of palladium.

(6) Then, electroless plating of the overall surface of the resin insulating layer 2 which has been coarsened and supplied with the catalyst cores is performed. Thus, an electroless plated film 12 is formed (see FIG. 3 (*a*)). It is preferable that the thickness of the electroless plated film 12 is 0.1 μm to 5 μm.

Then, a plating resist 3 is formed on the surface of the electroless plated film 12 (see FIG. 3 (*b*)). A photosensitive resin film (a dry film) is laminated on the formed electroless plated film 12. Then, a photomask (a glass substrate is a suitable mask) on which a plating resist pattern has been drawn is placed in close contact with the surface of the photosensitive resin film. Then, exposure is performed, and then a development process is performed. Thus, the plating resist 3 can be formed.

(7) Then, electric plating is performed so that an electric-plated film is formed in a portion of the electroless plated film 12 in which the plating resist is not formed. Thus, a conductor layer 5 and a via hole 7 are formed. It is preferable that the thickness is 5 μm to 20 μm. It is preferable that the electric plating operation is performed by copper plating.

After electric plating has been performed, at least one method selected from electrolytic nickel plating, electroless nickel plating or sputtering is employed to form a nickel film 14 (see FIG. 3 (c)). The reason for this lies in that alloy plating composed of Cu—Ni—P can easily be deposited on the nickel film 14. Since the nickel film serves as a metal resist, an effect can be obtained in that excess etching can be prevented in the following process.

(8) Then, the plating resist 3 is removed, and then the electroless plated film 12 present below the resist is removed by etching solution, such as mixed solution of sulfuric acid and hydrogen peroxide, sodium persulfate or ammonium peroxide. Thus, an independent conductor layer 5 composed three layers consisting of the electroless plated film 12, the electrolytic plated film 13 and the nickel film 14 and the via hole 7 are formed (see FIG. 3 (d)). Note that the palladium catalyst cores on the coarsened surface exposed in the non-conductive portion are dissolved and removed by chromic acid or sulphated water.

(9) Then, a coarsened layer 11 is formed on the surfaces of the conductor layer 5 and the via hole 7. Then, a layer made of the foregoing adhesive agent for electroless plating is formed as the resin insulating layer 2 (see FIG. 4 (a)).

(10) An opening 6 is formed in the resin insulating layer 2. Moreover, the surface of the resin insulating layer 2 is coarsened (see FIG. 4 (b)).

Figure 4:
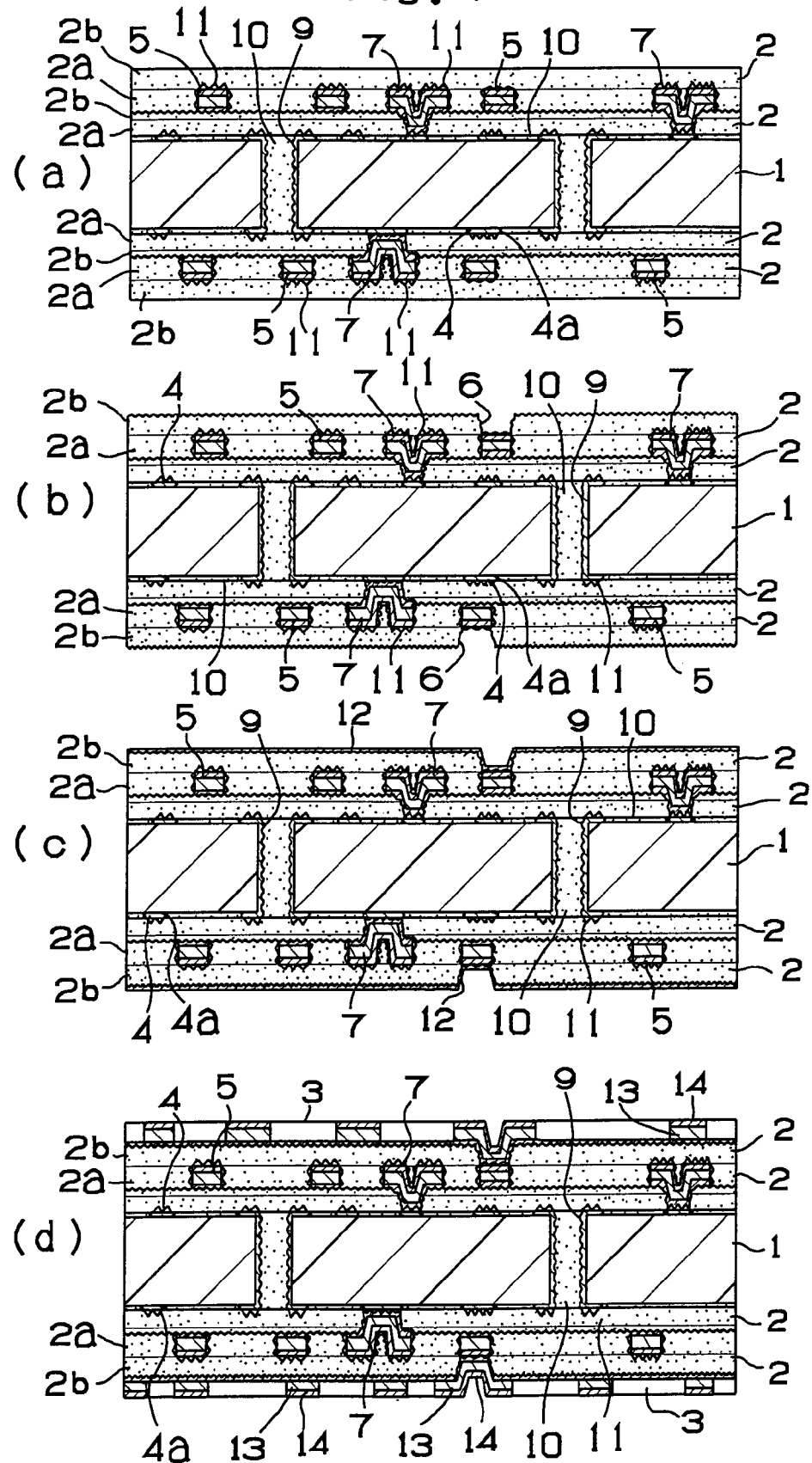
FIGS. 4 (a), 4 (b), 4 (c) and 4 (d) are diagrams showing a process for manufacturing the package substrate according to the first embodiment of the present invention.

(11) Then, catalyst cores are supplied to the coarsened surface of the resin insulating layer 2, and then an electroless plated film 12 is formed (see FIG. 4 (c)).

(12) Then, the plating resist 3 is formed on the surface of the electroless plated film 12. As described above, the electrolytic plated film 13 and the nickel film 14 are formed in the portion in which the plating resist 3 is not formed (see FIG. 4 (d)).

(13) The plating resist 3 is removed, and then the electroless plated film 12 below the plating resist is removed. Then, a conductor layer (including a conductor layer serving as a pad 16 for securing the conductive connecting pin) 5 and the via hole 7 are formed. Thus, a build-up substrate formed by six layers such that each side has three layers is obtained (see FIG. 5).

Figure 6:
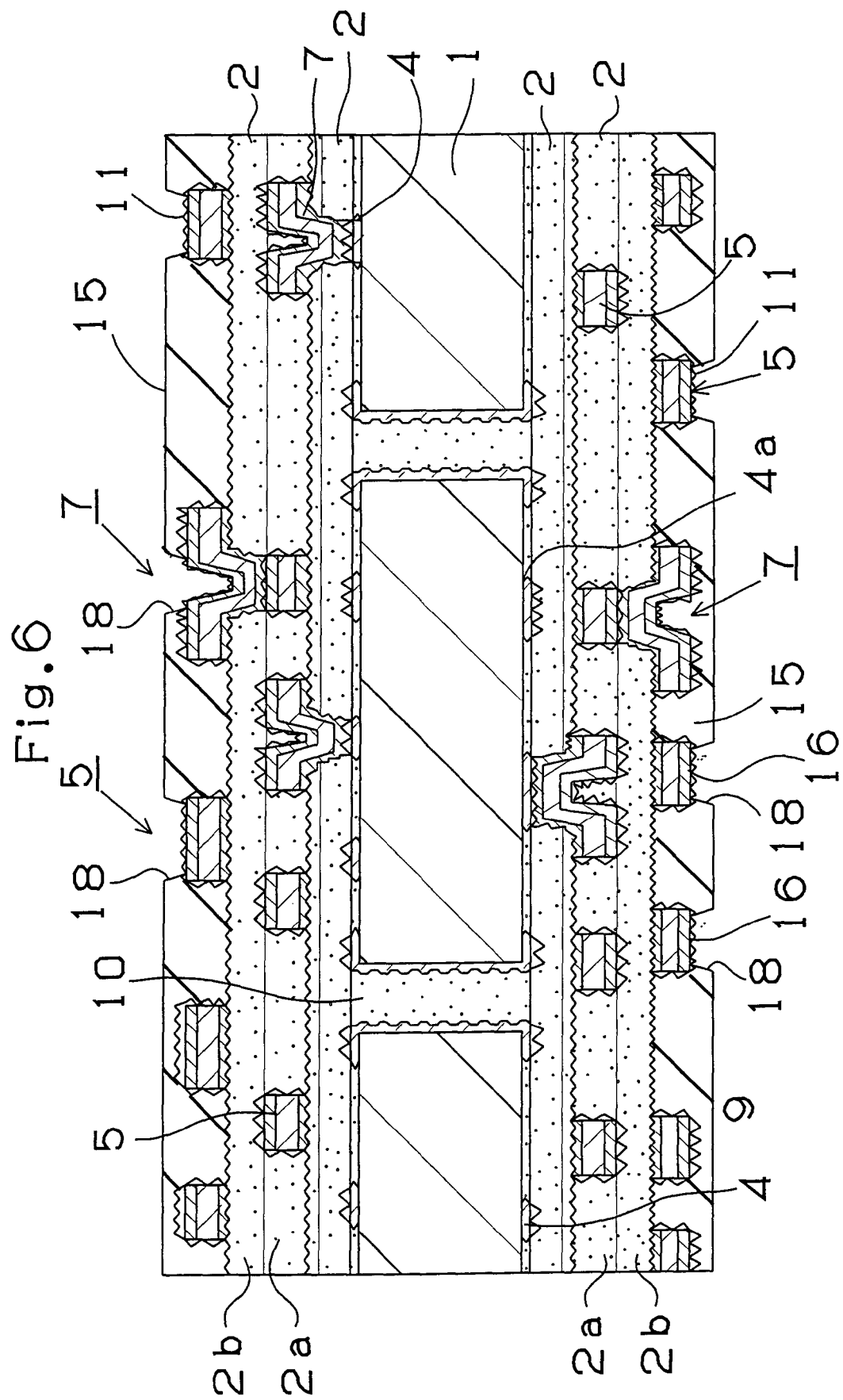
FIG. 6 is a diagram showing a process for manufacturing the package substrate according to the first embodiment.

(14) The coarsened layer 11 is provided for the conductor layer 5 and the via hole 7 of the thus-obtained build-up substrate so as to be covered with an organic resin insulating layer 15 having an opening 18 through which the pad 16 is partially exposed to the outside (see FIG. 6). It is preferable that the thickness of the organic resin insulating layer is 5 μm to 40 μm. If the thickness is too small, the insulating function deteriorates. If the thickness is too large, the opening cannot easily be formed. What is worse, undesirable contact with solder occurs, causing a crack or the like to occur.

The resin for constituting the organic resin insulating layer may be anyone of a variety of resin materials, for example, resin obtained by hardening acrylate of bis phenol-A type epoxy resin, acrylate of bis phenol-A type epoxy resin or novolak-type epoxy resin with amine hardener or imidazole hardener.

The foregoing organic resin insulating layer having the above-mentioned structure has an advantage that migration of lead (a phenomenon with which lead ions are dispersed in the organic resin insulating layer) can be reduced. Moreover, the foregoing organic resin insulating layer has excellent heat resistance and alkali resistance. In addition, deterioration does not occur at a temperature (about 200° C.) at which the conductive adhesive agent, such as solder, is melted. In addition, decomposition can be prevented with strong base plating solution, such as nickel plating solution or gold plating solution.

Acrylate of the novolak-type epoxy resin may be epoxy resin obtained by causing glycidyl ether of phenol novolak or cresol novolak to react with acrylic acid or methacrylic acid. It is preferable that the imidazole hardener is in the form of liquid at 25° C. The reason for this lies in that the liquid material permits uniform mixing.

The liquid imidazole hardener may be 1-benzyl-2-methylimidazole (trade name: 1B2MZ), 1-cyanoethyl-2-ethyl-4-methylimidazole (tradename: 2E4MZ-CN) or 4-methyl-2-ethylimidazole (trade name: 2E4MZ).

It is preferable that the quantity of the imidazole hardener which must be added is 1 wt % to 10 wt % of the total solid component of the organic resin insulating layer. The reason for this lies in that the quantity of addition satisfying the foregoing range permits easy uniform mixing. It is preferable that the solvent for the pre-hardening composition of the organic resin insulating layer is glycol ether solvent. The reason for this lies in that the organic resin insulating layer containing the foregoing composition does not generate free oxygen, does not oxidize the surface of the pad and does not harm the human body.

It is preferable that the glycol ether solvent is at least either of diethylene glycol dimethyl ether (DMDG) or triethylene glycol dimethyl ether (DMTG). The foregoing solvent can completely be dissolved in benzophenone or Michler's ketone which is a reaction initiator at a temperature of about 30° C. to about 50° C.

It is preferable that the quantity of the glycol ether solvent is 10 wt % to 40 wt % with respect to the overall weight of the compositions of the organic resin insulating layer.

The composition of the above-mentioned organic resin insulating layer may be added with a variety of defoaming agents, leveling agent, thermosetting resin for improving heat resistance and base resistance and imparting flexibility and photosensitive monomer for improving resolution. The leveling agent may be, for example, a polymer of acrylate. It is preferable that the initiator is Ilugacur I907 manufactured by Chibagaigi and the photosensitizer is DETX-S manufactured by Nippon Kayaku. The composition of the organic resin insulating layer may be added with coloring matter or pigment. The reason for this lies in that the circuit pattern can be shielded. It is preferable that the coloring matter is phthalocyanine green.

The thermosetting resin which must be added may be bis phenol type epoxy resin. The bis phenol epoxy resin includes bis phenol-A type epoxy resin and bis phenol F-type epoxy resin. When importance is attached to the base resistance, the former resin is employed. When low viscosity is required (when importance is attached to the coating smoothness), the latter resin is employed.

The viscosity of the foregoing organic resin insulating layer is 0.5 Pa·s to 10 Pa·s at 25° C., preferably 1 Pa·s to 10 Pa·s. The foregoing viscosity permits easy coating with a roll coater.

Figure 7:
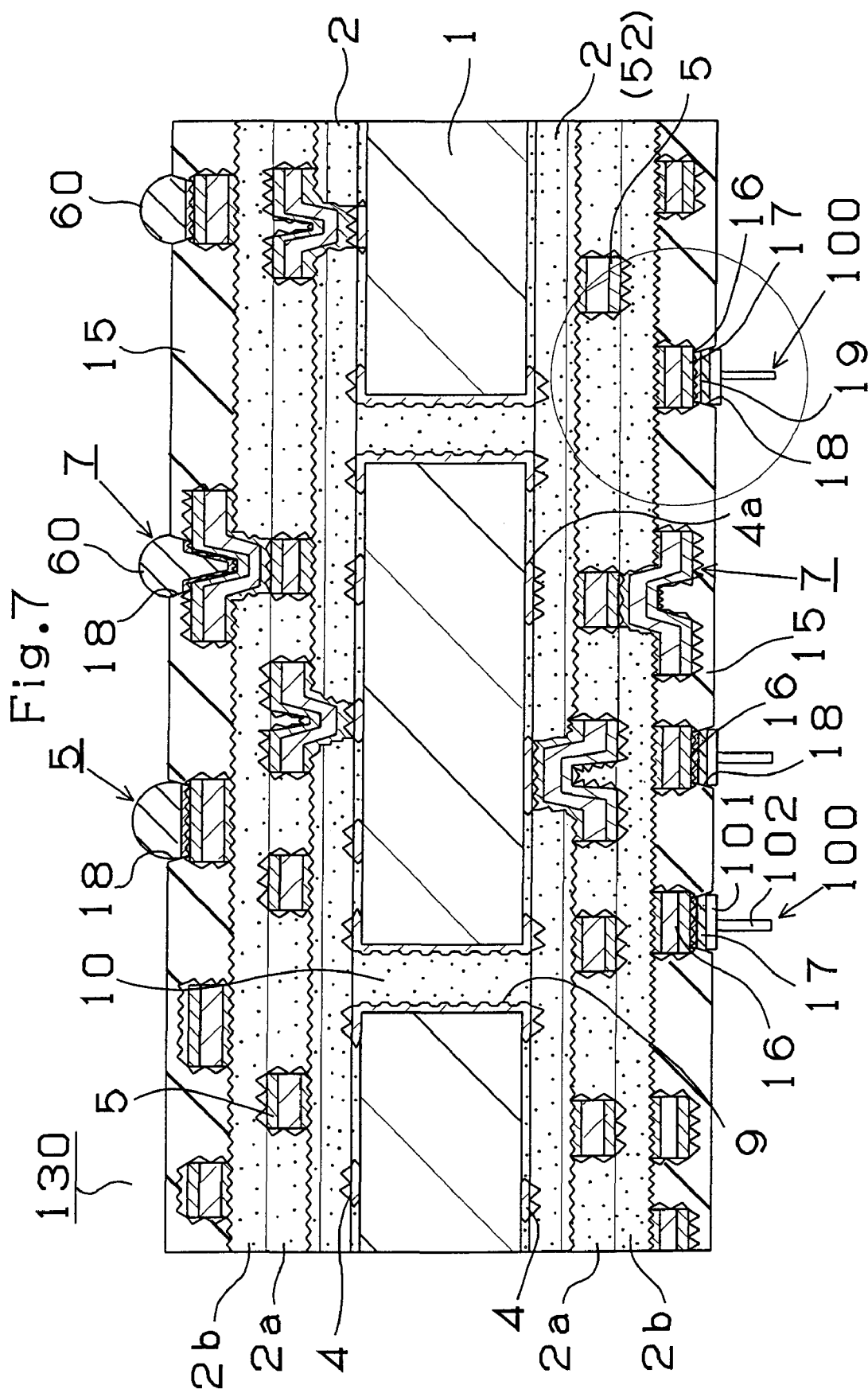
FIG. 7 is a cross sectional view showing the package substrate according to the first embodiment.
Figure 8:
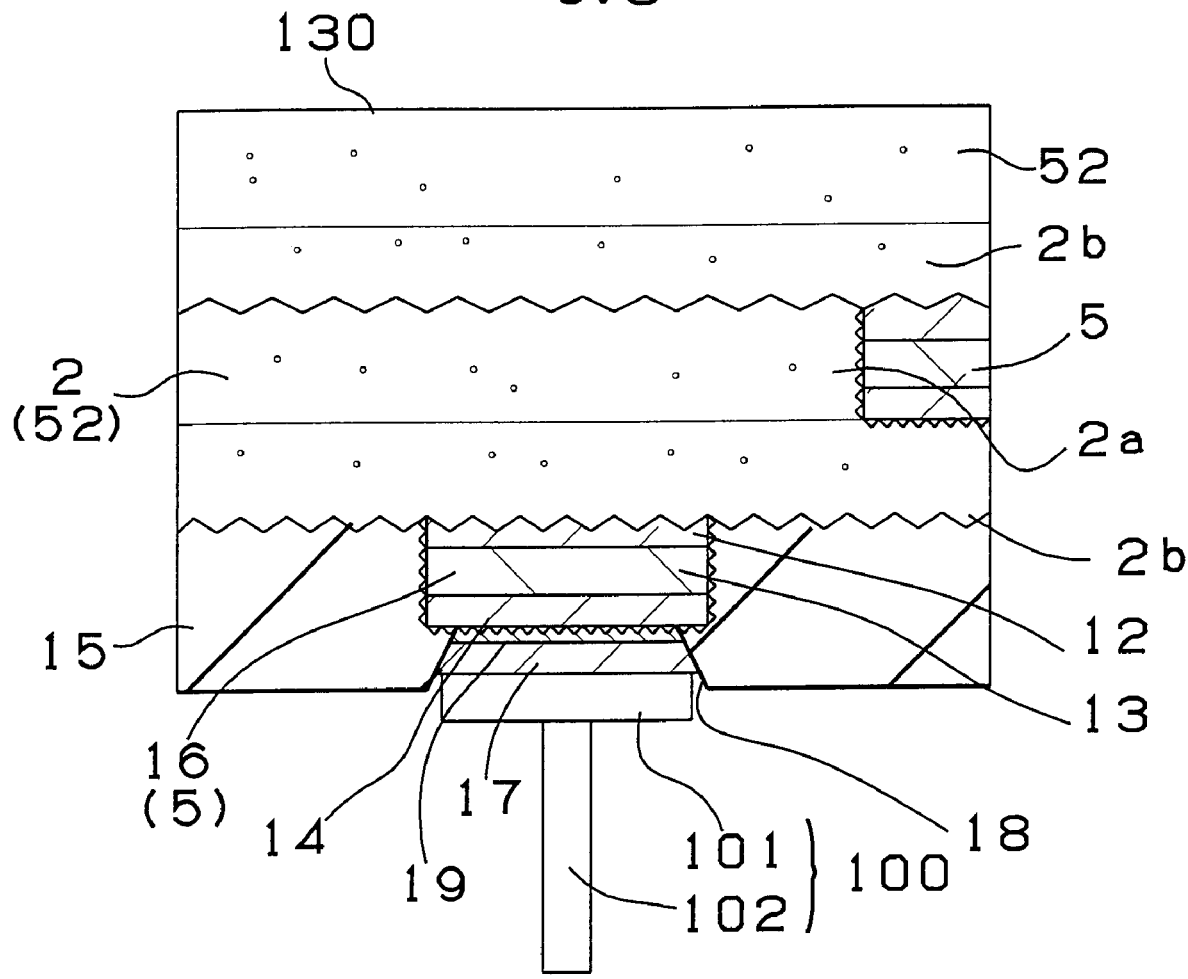
FIG. 8 is an enlarged cross sectional view showing a portion in which a conductive connecting pin is connected to a pad in a state shown in FIG. 7.

(15) A metal film 19, which is a corrosion-resisting metal in the form of a gold plated film or a nickel plated film-gold plated film is formed in the opening 18. Then, solder paste serving as a conductive adhesive agent 17 is printed on the inner surface of the pad 16 which is the lower surface (a connection surface with a daughter board or a mother board) of the package substrate. It is preferable that the viscosity of the solder paste satisfies a range from 50 PaS to 400 PaS. A conductive connecting pin 100 is joined to a proper pin holding apparatus so as to be supported. A secured portion 101 of the conductive connecting pin 100 is brought into contact with the conductive adhesive agent 17 in the opening 16. Then, a reflowing operation is performed at 240° C. to 270° C. so that the conductive connecting pin 100 is secured to the conductive adhesive agent 17 (see FIG. 7). As an alternative to this, a structure obtained by forming the conductive adhesive agent into a ball-like shape or the like may be introduced into the opening. As an alternative to this, joining to the plate-like secured portion of the conductive connection pin is performed to join the conductive connection pin. Then, reflowing may be performed. FIG. 8 shows a pad portion provided with the conductive connecting pin 100 enclosed in a circuit shown in FIG. 7, the pad portion being enlarged in FIG. 8.

The opening 18 formed in the upper surface of the package substrate 130 is provided with a solder bump 60 which can be connected to an element such as an IC chip.

The conductive connecting pin 100 according to the present invention is a so-called T-shape pin incorporating a plate-like secured portion 101 and a columnar connection portion 102 projecting over substantially the central portion of the secured portion 101. The plate-like secured portion 101 is a portion which is secured to the outermost conductor layer 5 of the package substrate serving as the pad 16 through the conductive adhesive agent 17. The shape of the secured portion 101 is formed into an arbitrary shape, such as a circular shape or a polygonal shape adaptable to the size of the pad. The shape of the connection portion 102 may be any shape which can be inserted into the connection portion, such as the terminal of another substrate. For example, the shape may be a cylindrical shape, a prism shape, a conical shape or a pyramid shape.

Also the material of the conductive connecting pin 100 is not limited if the material is a metal material. It is preferable that at least any one of metal materials, such as gold, silver, copper, iron nickel, cobalt, tin and lead is employed to form the conductive connecting pin. Any one of an iron alloy having trade name "COBAL" (an alloy of Ni—Co—Fe), stainless steel and a phosphor bronze which is a copper alloy is a preferred material because excellent electrical characteristic and processability as the conductive connection pin are realized. The conductive connection pin may be made of one type of a metal material or an alloy. The surface of the foregoing pin may be covered with another metal layer in order to prevent corrosion or improve strength. The pin may be made of an insulating material, such as ceramics, and the surface may be covered with a metal layer.

It is preferable that the columnar connection portion 102 of the conductive connecting pin 100 has a diameter of 0.1 mm to 0.8 mm, the length of 1.0 mm to 10 mm and the diameter of the columnar secured portion 101 is 0.5 mm to 2.0 mm. The foregoing values are arbitrarily determined according to the size of the pad and the type or the like of the socket of the mother board on which the pad is mounted.

The conductive adhesive agent 17 of the package substrate according to the present invention may be solder (tin-lead, tin-antimony, silver-tin-copper or the like), conductive resin or conductive paste. It is preferable that the melting point of the conductive adhesive agent satisfies a range from 180° C. to 280° C. Thus, strength of adhesive bonding of the conductive connection pin of 2.0 Kg/pin can be maintained. The separation and inclination of the conductive connection pin do not occur owing to the heat cycle condition and heat applied when the IC chip has been mounted. Also the electrical connection can be maintained. It is most preferable that solder is performed. The reason for this lies in that great connection strength with the conductive connection pin can be obtained, satisfactory resistance against heat can be realized and the bonding operation can easily be performed.

When the conductive adhesive agent 17 is constituted by solder, it is preferable that solder having a composition that Sn/Pb=95/5 or 60/40 is employed. It is preferable that the melting point of the employed solder satisfies a range from 180° C. to 280° C. It is most preferable that the melting point satisfies a range from 200° C. to 260° C. Thus, dispersion of the strength of adhesive bonding of the conductive connection pin can be reduced. Moreover, applied heat does not damage the resin layer which constitutes the package substrate.

As shown in FIG. 8, the pad 16 is covered with the organic resin insulating layer (the through hole layer) 15 having the opening 18 through which the pad 16 is partially exposed. The secured portion 101 of the conductive connecting pin 100 is, through the conductive adhesive agent 17, secured to the pad 16 exposed through the opening 18. As can be understood from the drawing, the organic resin insulating layer 15 covers the pad 16 such that the periphery of the pad 16 is held. Therefore, when stress is applied to the conductive connecting pin 100 when the package substrate is mounted on the mother board, breakage of the pad 16 and separation from the organic resin insulating layer 15 can be prevented. If different materials, such as the metal material and resin, are bonded, separation does not easily occur. Although the package substrate comprising the multilayer printed circuit board having the interlayer resin insulating layer has been described as an example, the structure of the first embodiment may be applied to a package substrate in the form of only one substrate.

[First Modification]

FIG. 9 shows a package substrate 139 according to a first modification of the first embodiment. FIG. 9 (A) is a cross sectional view showing an essential portion of the package substrate 139. FIG. 9 (B) is a view B of FIG. 9 (A). Note that cross section A-A shown in FIG. 9 (B) corresponds to FIG. 9 (A). As shown in FIG. 9 (B), a pad 16 incorporates a circular body 16b for joining the conductive connecting pin 100; and an extension portion 16a disposed in the vicinity of the body 16b. Moreover, a signal line 16c is connected to the body 16b. In the foregoing embodiment described with reference to FIG. 8, the periphery of the pad 16 is held by the interlayer resin insulating layer (the organic resin insulating layer) 15. On the other hand, the first modification has a structure that the extension portion 16a disposed in the vicinity of the pad (the body 16b) is covered with a solder resist layer 15. The body 16b is exposed through the opening 18 formed in the solder resist layer 15.

Also the first modification has the structure that the extension portion 16a disposed in the vicinity of the pad (the body 16b) is covered with the solder resist layer 15. If stress is applied to the conductive connecting pin 100, separation from the substrate can be prevented. On the other hand, the body 16b of the pad is exposed through the opening 18 of the organic resin insulating layer 15. The organic resin insulating layer 15 and the extension portion 16*a* are not in contact with each other. Therefore, contact between the organic resin insulating layer 15 and the extension portion 16*a* of the pad portion does not cause a crack to be formed in the organic resin insulating layer 15.

[Second Modification]

Figure 10:
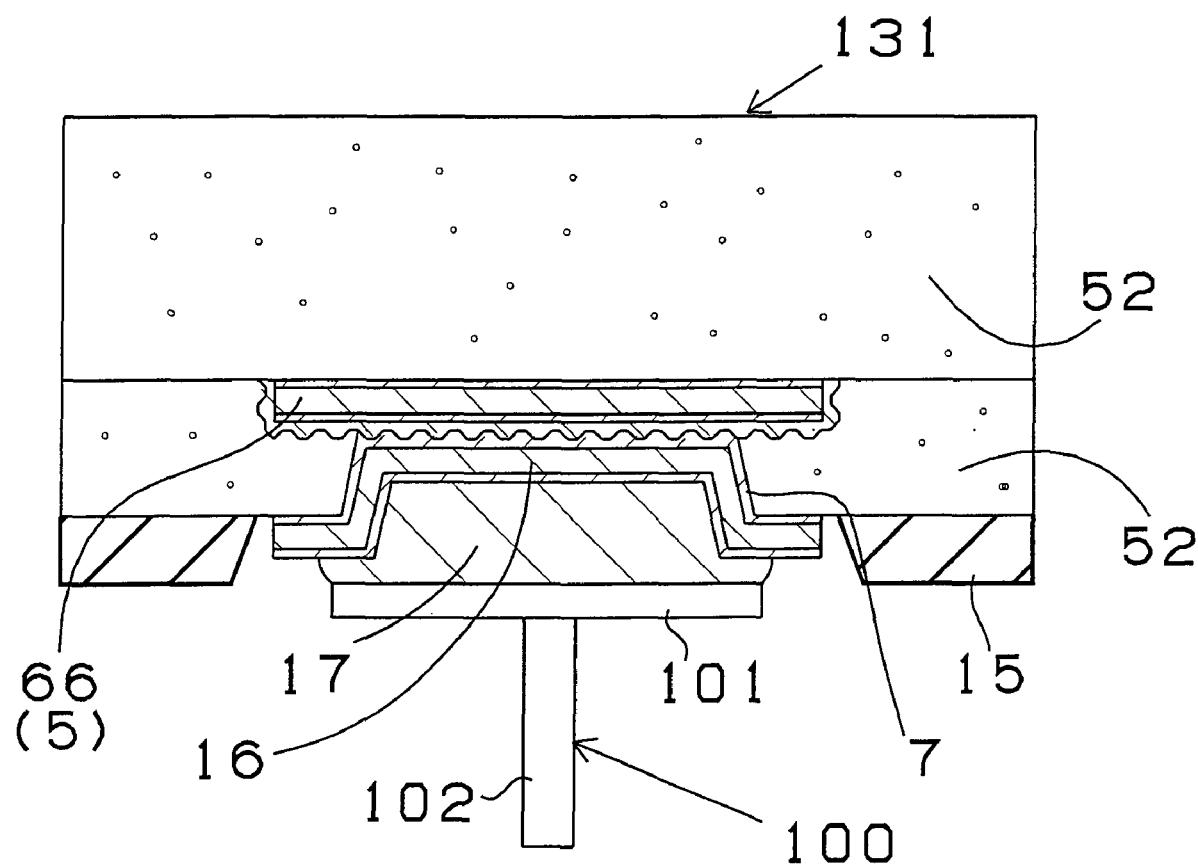
FIG. 10 is a cross sectional view showing a package substrate according to second modification of the first embodiment.

A package substrate 131 has a basic structure similar to that according to the first embodiment described with reference to FIGS. 7 and 8. The pad 16 for securing the conductive connecting pin 100 is, through the via hole 7, connected to a conductor layer 66 (5) which is an inner layer of the outermost inter layer resin insulating layer 52. In this modification, the pad 16 is not covered with the organic resin insulating layer 15 (see FIG. 10). Since the manufacturing process from (1) to (14) are the same as that according to the first embodiment, description is started at the following step (15).

(15) Solderpaste (Sn/Sb=95:5) 17 which is the conductive adhesive agent is filled in the via hole 7. In this step, a mask member (not shown) is placed on the surface of the organic resin insulating layer 15, and then solder paste is printed. Then, reflowing is performed at 270° C. or lower.

(16) The conductive connection pin is secured to the pad by a method which is the same as that according to the first embodiment.

In this modification, the area of bond between the pad 16 and the substrate can be enlarged by the via hole 7. Therefore, the peeling strength of the pad 16 can be enlarged. Since the conductor layer 66 which is the inner layer is a metal layer, adhesiveness with the metal pad 16 can be improved. Therefore, peeling can be satisfactorily prevented.

The conductor layer to which the pad is connected may be provided for the core substrate 1. As described above, the conductor layer on the core substrate is made to firmly contact with the core substrate through the coarsened surface. Therefore, peeling off the pad can furthermore be reliably prevented.

a. Example 1

Figure 11:
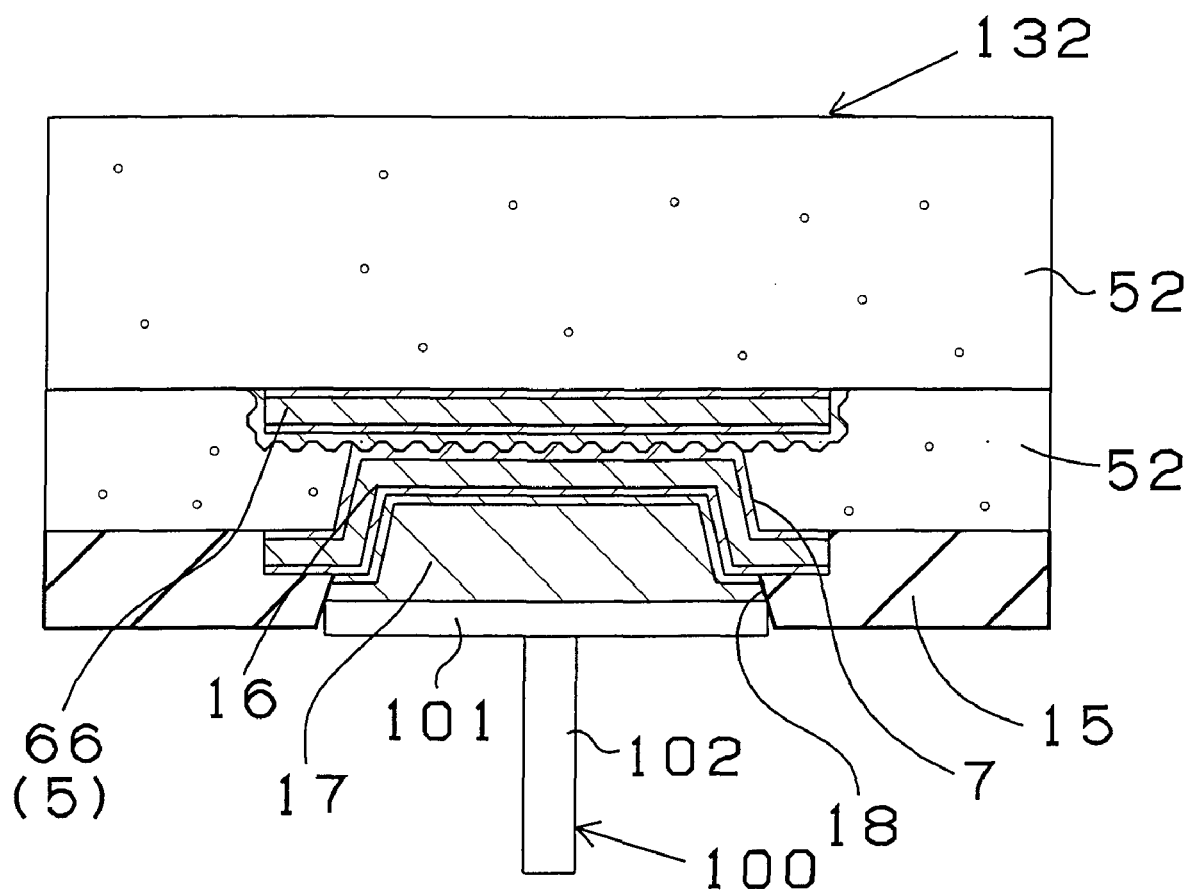
FIG. 11 is a cross sectional view showing example 1 of the second modification.

The basic structure is the same as that of the second modification. A package substrate 132 (see FIG. 11) has a structure that the via hole 7 provided with the pad 16 is covered with the organic resin insulating layer 15 having the opening 18 through which the pad is partially exposed to the outside. The package substrate 132 has the structure that the pad 16 is provided for the via hole 7. Moreover, the surface of the via hole 7 is covered with the organic resin insulating layer 15. Therefore, satisfactory large peeling strength between the pad 16 and the substrate can be realized.

b. Example 2

The basic structure is the same as that of the example 1. A package substrate 133 (see FIG. 12 (A)) has a structure that the pad 16 for securing one conductive connecting pin 100 is, through a plurality of via holes 7, connected to the conductor layer 66 which is the inner layer of the interlayer resin insulating layer 52. As shown in FIG. 12 (B), this example has a structure that six via holes 7 are formed in a circular configuration. Moreover, a pad 16 for covering each via hole 7 is formed. FIG. 12 (B) is view B of FIG. 12 (A) viewed from the via hole 7. Note that the position of the via hole 7 shown in FIG. 12 (B) does not cause the three via holes 7 shown in FIG. 12 (A) to appear on the cross section. To simplify the drawing, the via hole away from the front organic resin insulating layer is indicated with a dashed line.

c. Example 3

A package substrate 134 (see FIG. 13) has the same basic structure except for the shape of the via hole 7 which is formed into a ring shape as shown in FIG. 13 (B). FIG. 13 (B) is view B of FIG. 13 (A).

The area of bonding to the substrate can furthermore be enlarged by the plural via holes 7 according to example 2 and by the ring via hole 7 according to example 3.

d. Example 4

Figure 14:
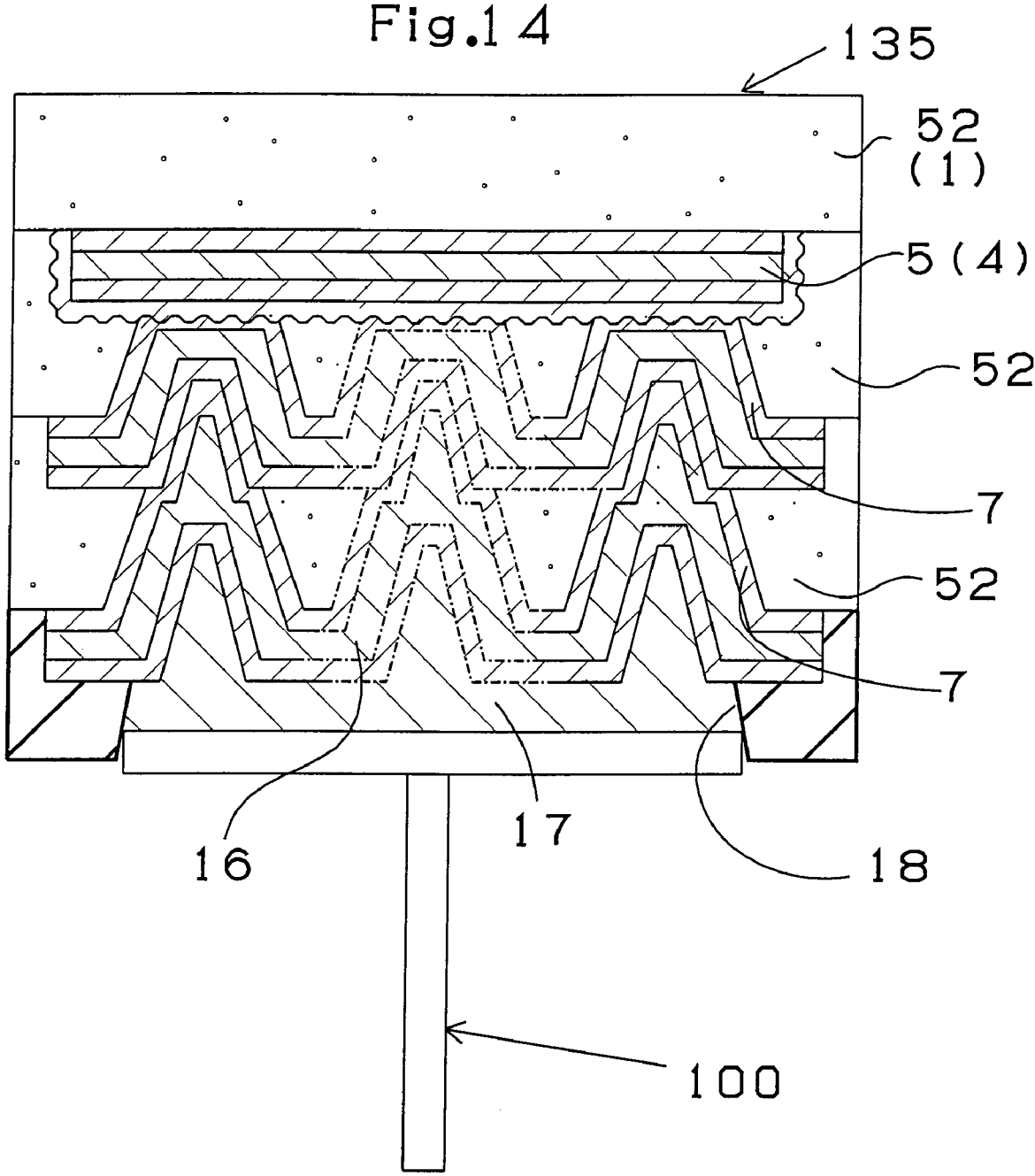
FIG. 14 is a cross sectional view showing example 4 of the second modification.

The basic structure is the same as that according to example 2 described with reference to FIG. 12. A package substrate 135 (see FIG. 14) has a structure that a plurality of via holes 7 formed in a circular configuration are as well as provided for the interlayer resin insulating layer 52 which is the inner layer. Moreover, the outer via hole 7 provided with the pad 16 and the inner via hole 7 are joined to each other. The package substrate 135 has the structure that the plurality of the via holes 7 are joined to one another. Thus, peeling off the pad 16 can significantly be prevented.

As described above, it is preferable that each of the modifications has the structure that the inner conductor layer with which the pad is provided is provided for the core substrate 1. The conductor layer on the core substrate is made to firmly contact with the insulating substrate which is the core substrate through the coarsened surface (the mat surface). When connection with the conductor layer on the core substrate is established, separation of the pad 16 from the interlayer resin insulating layer 52 can be prevented.

[Third Modification]

The basic structure is the same as that according to example 2 of the second modification. A package substrate 136 (see FIG. 15) has a structure that the conductor layer to which the pad 16 is connected is made to be a conductor layer (a land 91) provided for the through hole 9 of the core substrate 1. Moreover, the periphery of the pad 16 is covered with the organic resin insulating layer 15. As shown in the drawing, the pad 16 is, through the via hole 7, connected to the land 91 of the through hole 9 and the resin filler 10 in the through hole 9.

That is, the characteristic of this modification is that the pad 16 is connected to the conductor layer of the CORE SUBSTRATE 1 through the via hole 7. The conductor layer on the CORE SUBSTRATE 1 is made to firmly contact with the insulating substrate, which is the core substrate, through the coarsened surface (the mat surface). Since the connection with the conductor layer on the core substrate is established, peeling off the pad 16 from the interlayer resin insulating layer 52 can be satisfactorily prevented. Moreover, the through hole 9 and the pad 16 are connected to each other through the via hole 7. Therefore, the length of the electric wire from the conductive connecting pin 100, which is the external terminal, to an IC chip (a semiconductor chip) disposed opposite to the side on which the conductive connecting pin 100 is provided, can be shortened.

a. Example 1

The basic structure is the same as that according to the third modification. A package substrate 137 (see FIG. 16) has a structure that a conductor layer 90 called "cover plating" and covering the through hole 9 is provided for the through hole 9.

Moreover, the pad 16 is connected to the conductor layer 90 through the via hole 7 (see FIG. 16).

b. Example 2

The basic structure is the same as that of the third modification. A package substrate 138 (see FIG. 17) has a structure that the pad 16 is connected to only the land 91 of the through hole 9 through the via hole. In example 2, the structure is formed such that the pad 16 is bonded to the conductive layer 4 on the surface of the core substrate 1. Thus, peeling can be prevented. Moreover, joining to the land 91 of the through hole is performed so that the length of the electric wire from the reverse side of the substrate is shortened.

[Fourth Modification]

The basic structure is the same as that of the second modification. A structure obtained by forming solder into a ball-like shape is joined to the conductive connection pin. Then, the conductive connection pin is disposed.

As described above, the package substrate according to the first embodiment is able to enlarge the strength of adhesive bonding between the pad and the substrate. Therefore, separation of the conductive connection pin and the pad prevented with the pin can be effectively prevented. Therefore, reliability of the connection can be improved.

FIG. 18 shows results of evaluation of the package substrate according to the first embodiment. The following factors were evaluated: smallest strength of adhesive bonding of the joined conductive connection pin, states of each pin after a heating test (reproduction of virtual IC measured state and evaluation performed such that a substrate having the pin is allowed to pass through a nitrogen reflow furnace set to 250° C.) and heat cycle condition (1000 cycles each consisting of one cycle in which 130° C./3 minutes+−65° C./3 minutes) smallest strength of adhesive bonding and conduction test.

Second Embodiment

A package substrate according to a second embodiment and a manufacturing method therefor will now be described. The foregoing steps (1) to (13) are similar to those according to the first embodiment described with reference to FIGS. 1 to 5. Therefore, the similar steps are omitted from illustration and description.

Figure 5:
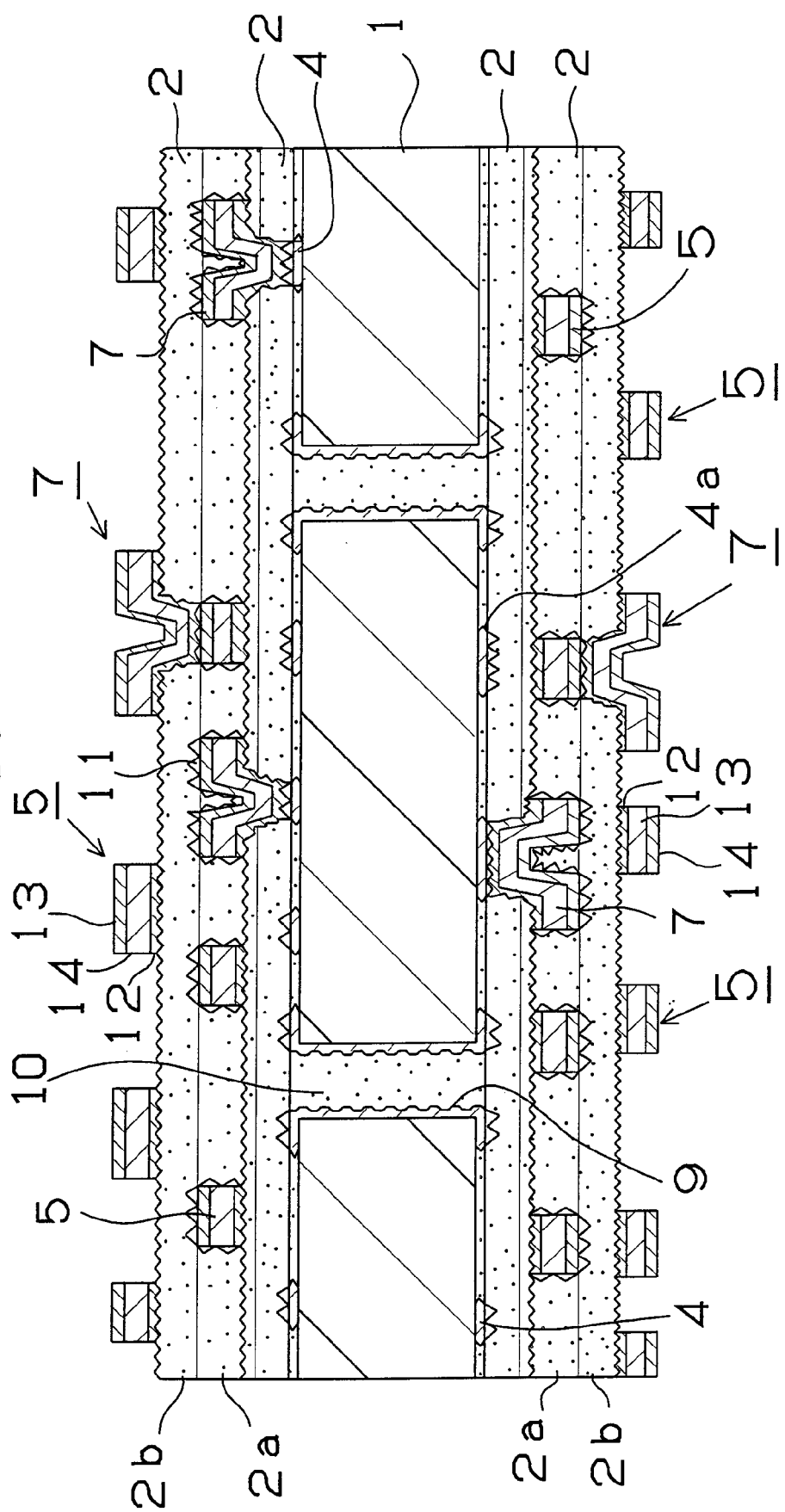
FIG. 5 is a diagram showing a process for manufacturing the package substrate according to the first embodiment.
Figure 19:
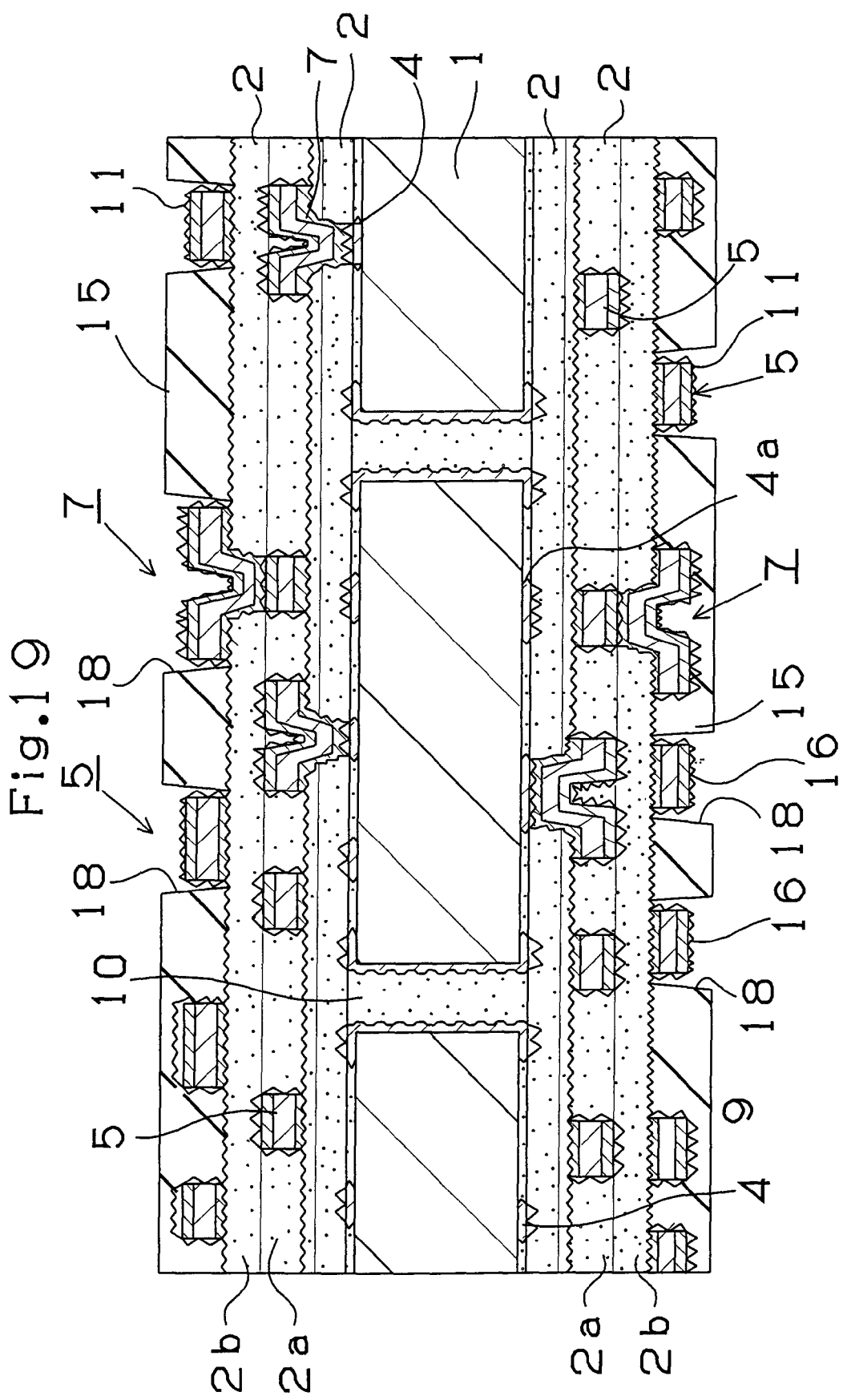
FIG. 19 is a diagram showing a process for manufacturing a package substrate according to a second embodiment.

(14) The conductor layer 5 and the coarsened layer 11 of the build-up substrate obtained in steps in (1) to (13) and shown in FIG. 5 are formed. Then, covering with the organic resin insulating layer 15 having the opening 18 through which the pad 16 is exposed is performed (see FIG. 19). It is preferable that the thickness of the organic resin insulating layer is 5 μm to 40 μm. If the thickness is too small, the insulating performance deteriorates. If the thickness is too large, opening cannot be easily formed. What is worse, undesirable contact with solder occurs, causing a crack or the like to occur.

Figure 20:
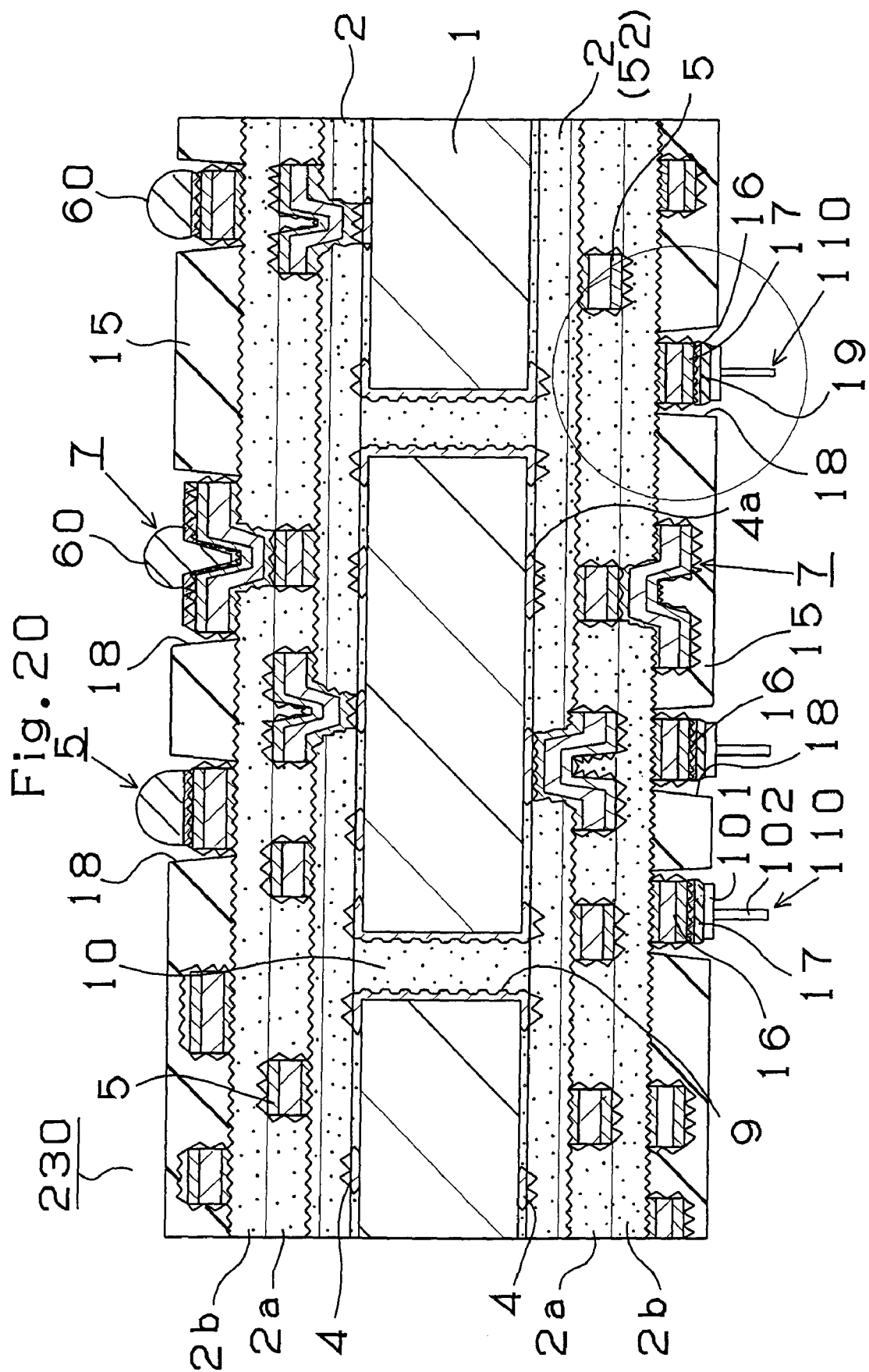
FIG. 20 is a cross sectional view showing the package substrate according to the second embodiment.
Figure 21:
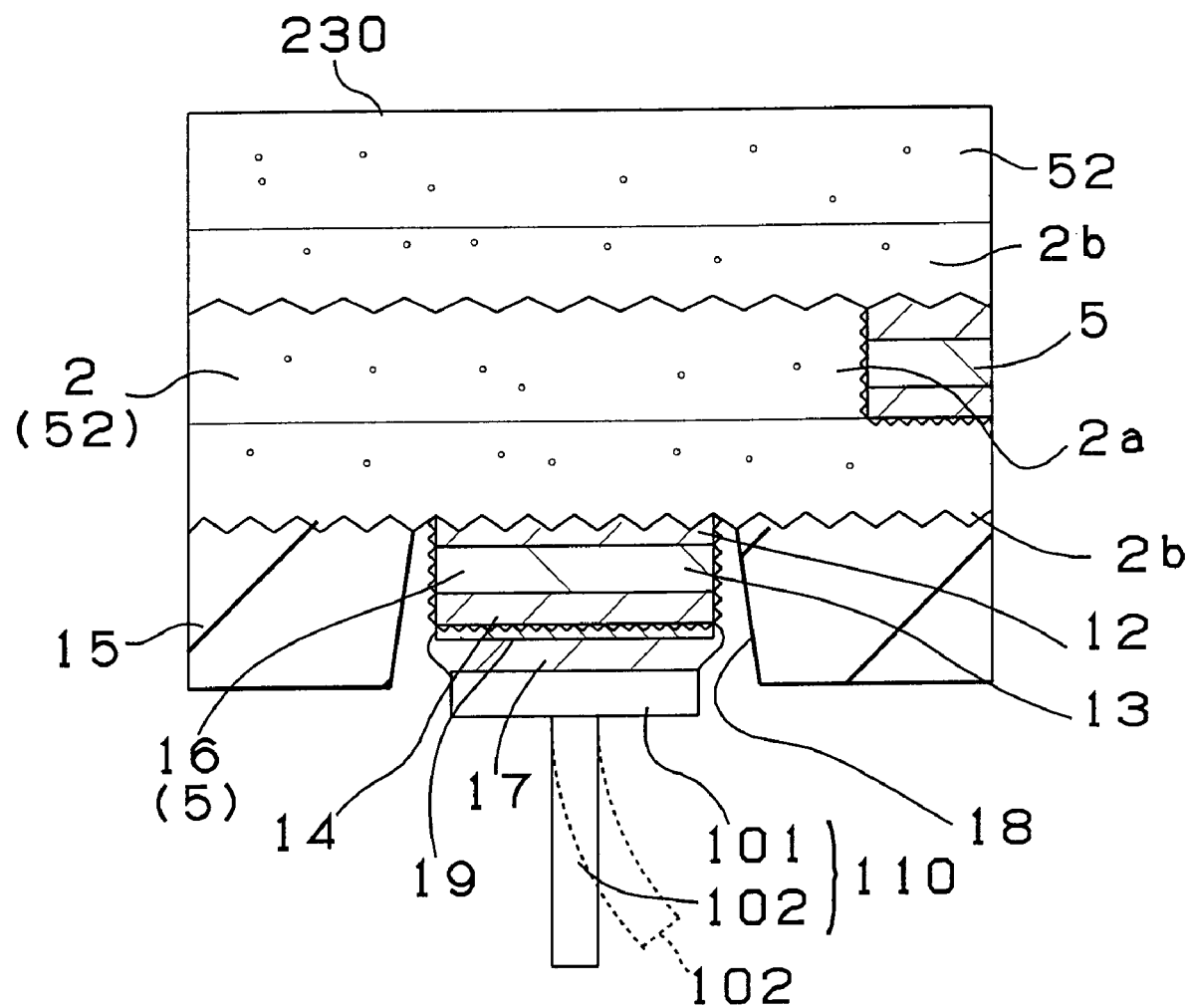
FIG. 21 is an enlarged cross sectional view showing a portion in which the conductive connecting pin shown in FIG. 20 is connected to the pad.

(15) A metal film 19 made of corrosion resisting metal in the form of a gold plated film or a nickel plated film-gold plated film is formed in the opening 18. Then, the conductive adhesive agent 17 and solder paste are printed in the opening 16 which is the lower surface (the connection surface with the daughter board or the mother board) of the package substrate. It is preferable that the viscosity of the solder paste is 50 PaS to 400 PaS. The conductive connecting pin 110 made of copper or a copper alloy is joined to a proper pin holding apparatus so as to be supported. The secured portion 101 of the conductive connecting pin 110 is brought into contact with the conductive adhesive agent 17 in the pad 16. Then, reflowing is performed at 220° C. to 270° C., and then the conductive connecting pin 110 is secured to the conductive adhesive agent 17 (see FIG. 20). As an alternative to this, a conductive adhesive agent formed into a ball-like shape is introduced into the opening. As an alternative to this, joining to the plate-like secured portion of the conductive connecting pin is performed so that the conductive connecting pin is joined. Then, reflowing may be performed. FIG. 21 is an enlarged view showing the pad portion enclosed in a circle shown in FIG. 20 and provided with the conductive connecting pin 110.

The package substrate 230 has the upper opening 18 provided with a solder pump 230 which can be connected to an element, such as an IC chip.

The conductive connecting pin 110 according to the present invention incorporates a plate-like secured portion 101 and a columnar connection portion 102 projecting over substantially the central portion of the secured portion 101. That is, the foregoing pin is a so-called T-shape pin. The coarsened layer 101 is a portion which is, through the conductive adhesive agent 17, secured to the outermost conductor layer 5 of the Package substrate which is formed into the pad 16. The secured portion 101 is formed into a proper shape, for example, a circular shape or a polygonal shape adaptable to the size of the pad. The shape of the connection portion 102 is not limited if the employed shape permits insertion into the connection portion, such as a terminal, of another substrate. The shape may be a cylindrical shape, a prism shape, a conical shape or a pyramid shape.

It is preferable that the material of the conductive connecting pin 110 is at least one type of metal materials selected from copper, a copper alloy, tin, zinc, aluminum and noble metal. Each of the foregoing material has excellent flexibility. In particular, it is preferable that phosphor bronze, which is a copper alloy, is employed. The reason for this lies in that excellent electric characteristics and processability as the conductive connecting pin can be realized. The conductive connecting pin may be coated with another metal layer in order to prevent corrosion or enlarge strength.

It is preferable that the diameter of the columnar connection portion 102 of the conductive connecting pin 110 is 0.1 mm to 0.8 mm and the length of the same is 1.0 mm to 10 mm. It is preferable that the diameter of the plate-like secured portion 101 is 0.5 mm to 2.0 mm. The foregoing dimensions are arbitrarily determined according to, for example the type of the socket of the mother board which must be mounted.

The conductive adhesive agent 17 adapted to the package substrate according to the present invention may be solder (tin-lead, tin-antimony, silver-tin-copper or the like), conductive resin or conductive paste, similar to the first embodiment. It is preferable that the conductive adhesive agent having a melting point of 180° C. to 280° C. is employed.

When the conductive adhesive agent 17 is made of solder, it is preferable that solder having a composition that Sn/Pb=95/5 or 60/40 is employed similar to the first embodiment. Also it is preferable that the melting point of the employed solder satisfies a range from 180° C. to 280° C. It is furthermore preferable that the melting point satisfies a range from 200° C. to 260° C.

As can be understood from FIG. 21, the conductive connecting pin 110 is made of a material, such as copper or a copper alloy, having excellent flexibility. Therefore, stress applied to the conductive connecting pin 110 when, for example, the package substrate is joined to another substrate can be absorbed because the connection portion 102 is deflected as indicated with a dashed line shown in FIG. 21.

a. Example 1

Figure 22:
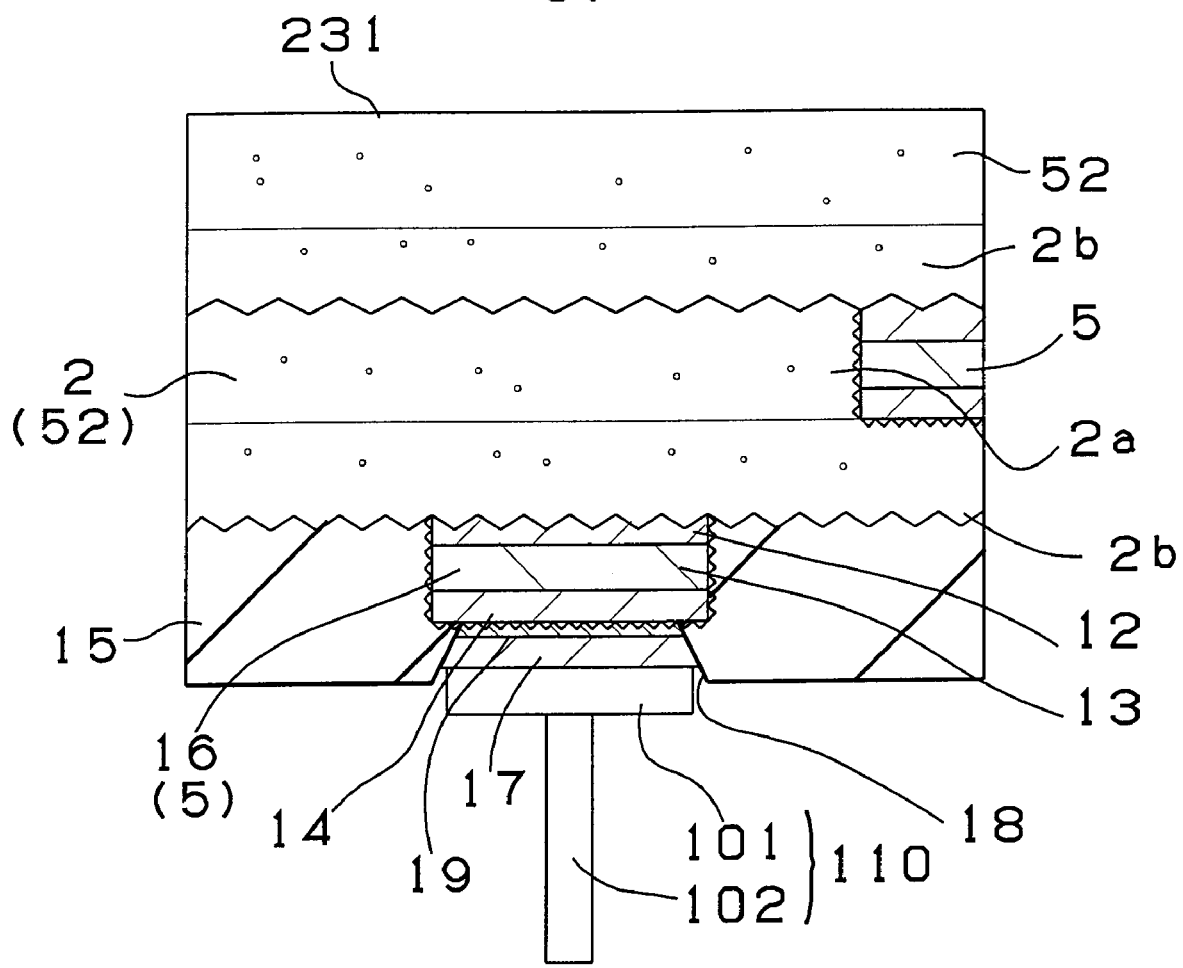
FIG. 22 is a cross sectional view showing a package substrate according to example 1 of the second embodiment.
Figure 23:
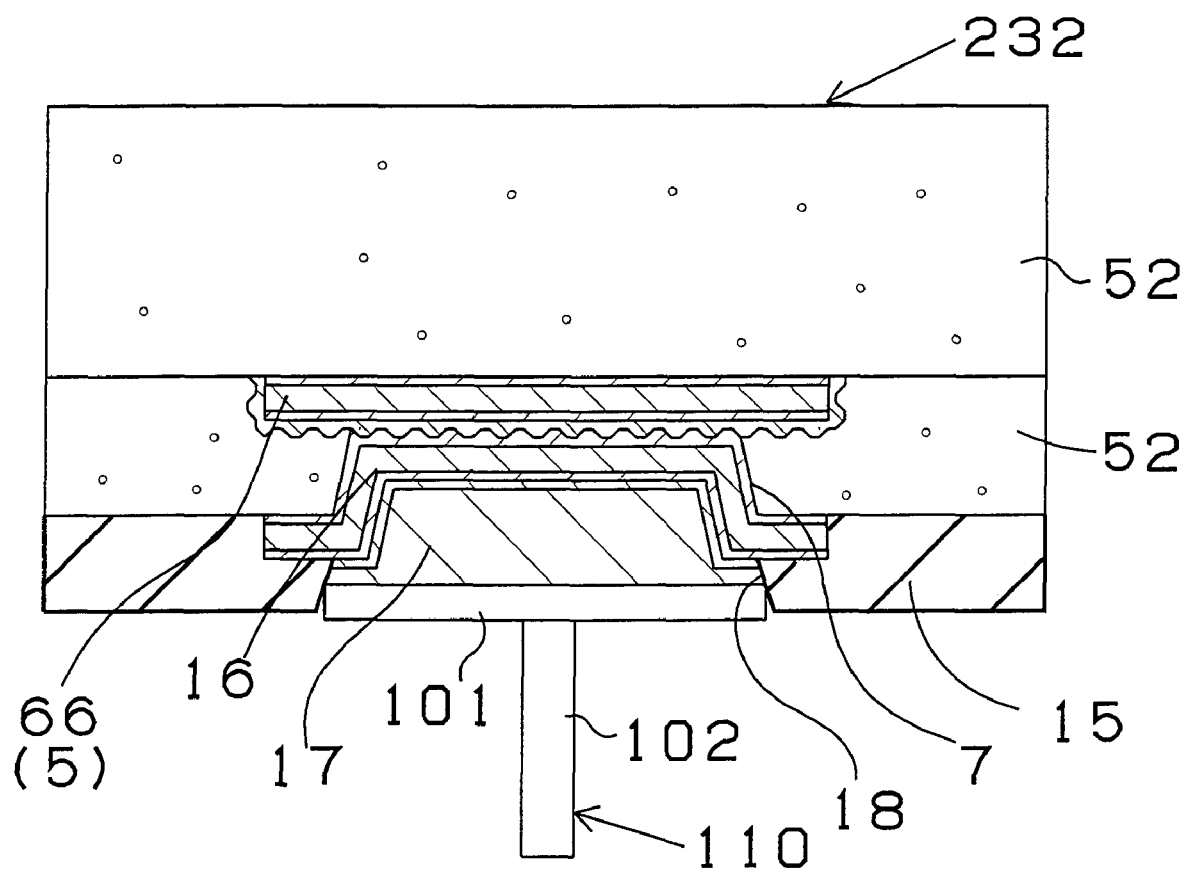
FIG. 23 is a cross sectional view showing a package according to a first modification of the second embodiment.

The pad 16 of a package substrate 231 according to example 1, as shown in FIG. 22, has a structure that the pad 16 is covered with the organic resin insulating layer (the through hole) 15 having the opening 18 through which the pad 16 is partially exposed to the outside. The secured portion 101 of the conductive connecting pin 110 is, through the conductive adhesive agent 17, secured to the pad 16 exposed to the outside through the opening 18. As can be understood from the drawing, the organic resin insulating layer 15 covers and holds the periphery of the pad 16. Therefore, if stress is applied to the conductive connecting pin 110 when the heat cycle is performed or when the package substrate is mounted on the mother board, breakage of the pad 16 and separation from the organic resin insulating layer 15 can be prevented. If different materials, such as metal and resin, are bonded to each other, separation does not easily occur. Although the package substrate in the form of the multilayer printed circuit board having the interlayer resin insulating layer has been described, the structure of the second embodiment can be applied to a package substrate having only one substrate.

[First Modification]

A package substrate 232 according to this modification has the basic structure which is the same as that according to the second embodiment described with reference to FIGS. 20 and 21. The pad 16 for securing the conductive connecting pin 110 is, through the via hole 7, connected to the conductor layer 160 which is the inner layer of the interlayer resin insulating layer 200. A portion of the pad 16 is covered with the organic resin insulating layer 15 (see FIG. 22). The manufacturing steps from (1) to (14) are the same as those according to the second embodiment.

(15) The via hole 7 is filled with solder paste (Sn/Sb=95:5) 17 serving as the conductive adhesive agent. A mask member (not shown) is placed on the surface of the organic resin insulating layer 15 such that the mask member is made in hermetic contact with the foregoing surface. Then, solder paste is printed. Then, reflowing is performed at 270° C. or lower.

(16) The conductive connecting pin is secured to the pad by the same method as that employed in the second embodiment. In the first modification, stress can significantly effectively be absorbed by the conductive connecting pin 110. Moreover, the via hole 7 enables the area of bonding between the pad 16 and the substrate to be enlarged. Therefore, the peeling strength of the pad 16 can be enlarged. Since the conductor layer 160 which is the inner layer is a metal layer, excellent adhesiveness with the pad 16, which is made of metal, can be realized. Therefore, separation does not easily occur. Since the surface of the pad 16 is covered with the organic resin insulating layer 15, great peeling strength is permitted between the pad 16 and the substrate.

The conductor layer which is the inner layer and to which the pad is connected may be provided for the core substrate 1. Since the conductor layer on the core substrate is made to firmly contact with the core substrate through the coarsened surface, separation of the pad can be furthermore effectively performed.

a. Example 1

A package substrate 233 (see FIG. 24 (A)) according to this example has a basic structure which is the same as that according to the first modification. A pad 16 for securing the conductive connecting pin 110 is, through a plurality of via holes 7, connected to a conductor layer 160 which is the inner layer of an interlayer resin insulating layer 200. In this example, as shown in FIG. 24 (B), six via holes 7 are disposed to form a circular configuration. The pad 16 is formed to cover each via hole 7. FIG. 24 (B) is view B of FIG. 24 (A) viewed from the via hole 7. Note that the position of the via hole 7 shown in FIG. 24 (B) does not cause the three via holes 7 shown in FIG. 24 (A) to appear on the cross section. To simplify the drawing, the via hole away from the front organic resin insulating layer is indicated with a dashed line.

b. Example 2

A package substrate 234 (see FIG. 25) has the same basic structure except for the shape of the via hole 7 which is formed into a ring shape as shown in FIG. 25 (B). FIG. 25 (B) is view B of FIG. 25 (A).

The area of bonding to the substrate can furthermore be enlarged by the plural via holes 7 according to example 1 and by the ring via hole 7 according to example 2.

c. Example 3

Figure 26:
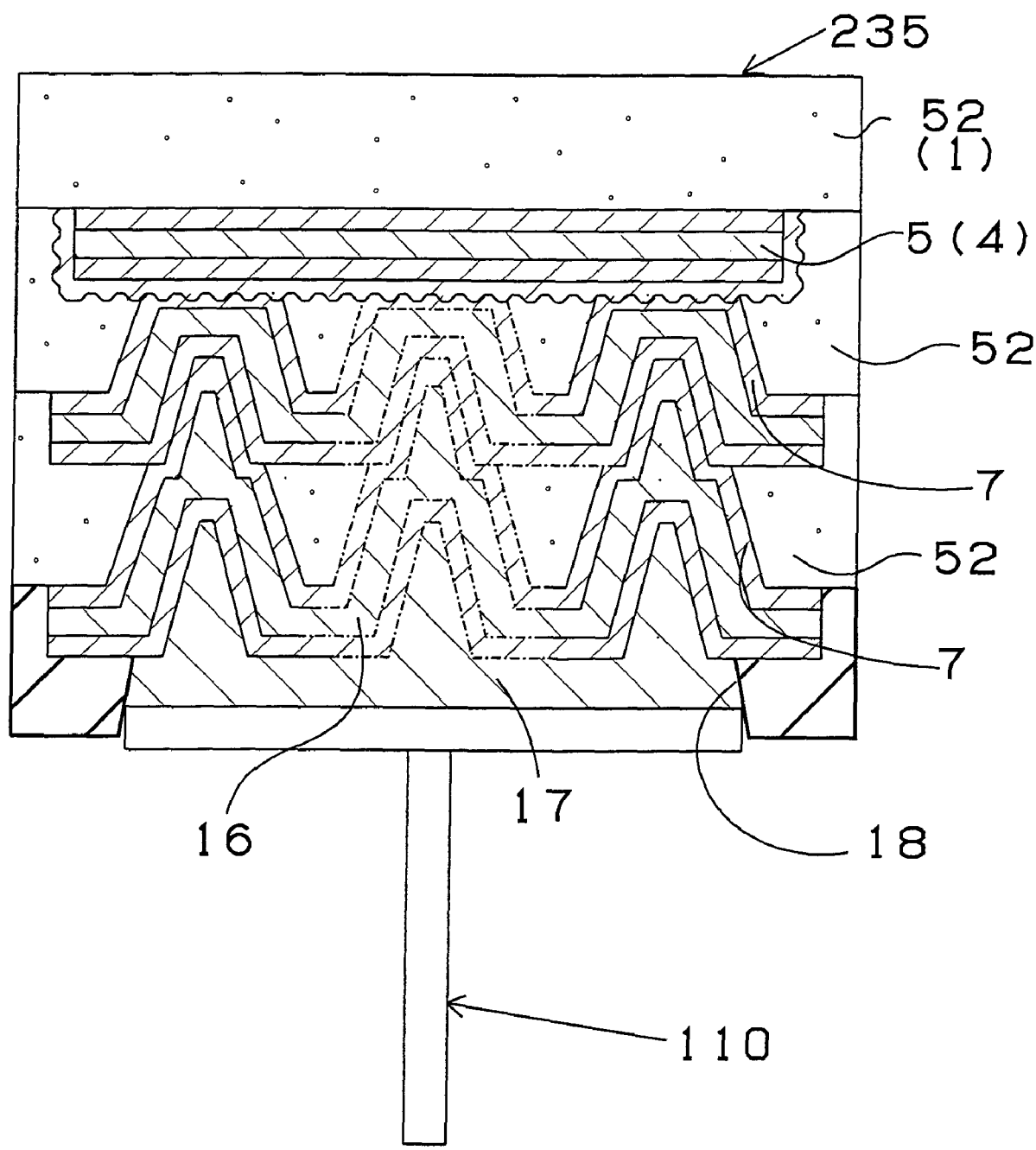
FIG. 26 is a cross sectional view showing example 3 of the first modification of the second embodiment.

The basic structure is the same as that according to example 1 described with reference to FIG. 24. A package substrate 235 (see FIG. 26) has a structure that a plurality of via holes 7 formed in a circular configuration are as well as provided for the interlayer resin insulating layer 200 which is the inner layer. Moreover, the outer via hole 7 provided with the pad 16 and the inner via hole 7 are joined to each other. The package substrate 235 has the structure that the plurality of the via holes 7 are joined to one another. Thus, peeling off the pad 16 can be significantly prevented.

As described above, it is preferable that each of the modifications has the structure that the inner conductor layer with which the pad is provided is provided for the core substrate 1. The conductor layer on the core substrate is made to firmly contact with the insulating substrate which is the core substrate through the coarsened surface (the mat surface). When connection with the conductor layer on the core substrate is established, separation of the pad 16 from the interlayer resin insulating layer 200 can be prevented.

[Second Modification]

Figure 27:
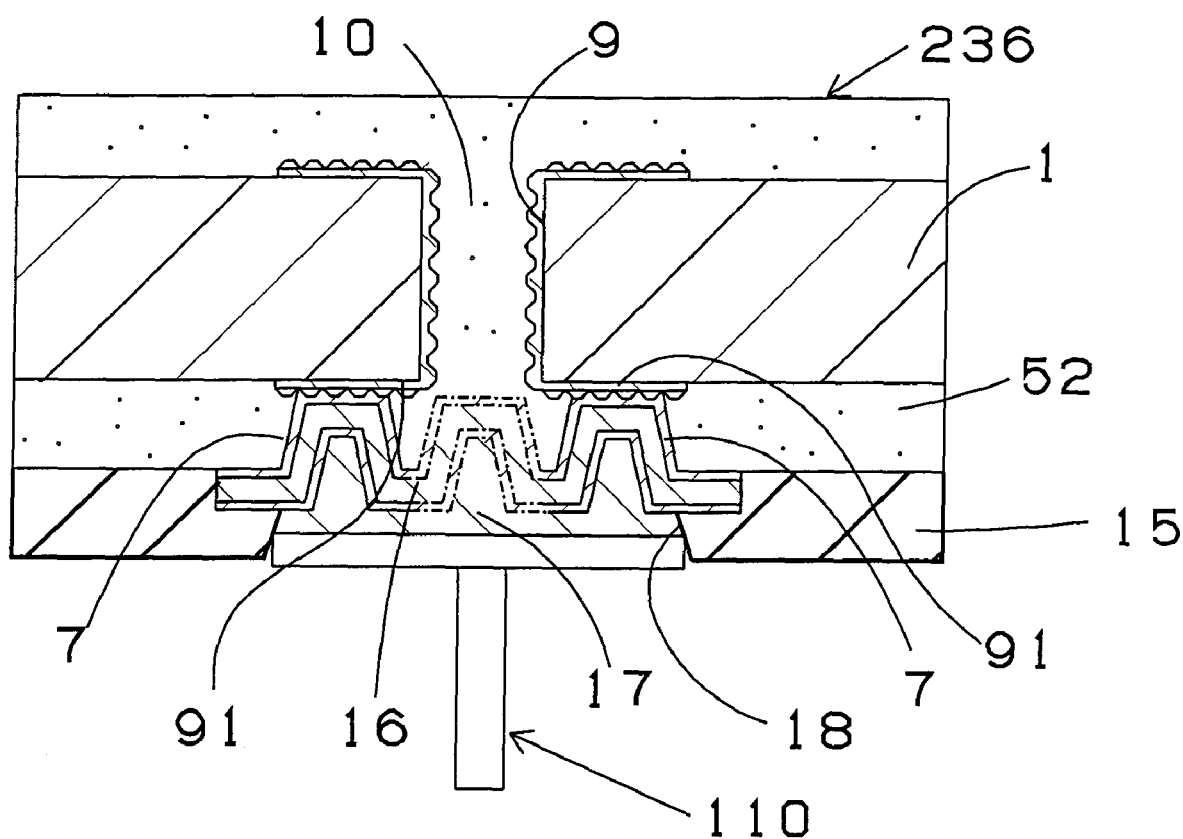
FIG. 27 is a cross sectional view showing a package substrate according to a second modification of the second embodiment.

The basic structure is the same as that according to example 2 of the first modification. A package substrate 236 (see FIG. 27) has a structure that the inner conductor layer to which the pad 16 is connected is made to be a conductor layer (a land 91) provided for the through hole 9 of the core substrate 1. Moreover, the periphery of the pad 16 is covered with the organic resin insulating layer 15. As shown in the drawing, the pad 16 is, through the via hole 7, connected to the land 91 of the through hole 9 and the resin filler 10 in the through hole 9.

That is, the characteristic of this modification is that the pad 16 is connected to the conductor layer of the core substrate 1 through the via hole 7. The conductor layer on the core substrate 1 is made to firmly contact with the insulating substrate, which is the core substrate, through the coarsened surface (the mat surface). Since the connection with the conductor layer on the core substrate is established, peeling off the pad 16 from the interlayer resin insulating layer 200 can be satisfactorily prevented. Moreover, the through hole 9 and the pad 16 are connected to each other through the via hole 7. Therefore, the length of the electric wire from the conductive connecting pin 110, which is the external terminal, to an IC chip (a semiconductor chip) disposed opposite to the side on which the conductive connecting pin 110 is provided, can be shortened.

a. Example 1

The basic structure is the same as that according to the second modification. A package substrate 237 (see FIG. 28) has a structure that a conductor layer 90 called "cover plating" and covering the through hole 9 is provided for the through hole 9. Moreover, the pad 16 is connected to the conductor layer 90 through the via hole 7 (see FIG. 28).

b. Example 2

The basic structure is the same as that of the second modification. A package substrate 238 (see FIG. 29) has a structure that the pad 16 is connected to only the land 91 of the through hole 9 through the via hole. In the foregoing examples, the pad 16 is bonded to the conductor layer 4 on the surface of the core substrate 1 so that peeling is prevented. Since joining to the land 91 of the through hole is performed, the length of the electric wire from the reverse side of the substrate is shortened.

[Third Modification]

The basic structure is the same as that of the first modification. A structure obtained by forming solder into a ball-like shape is joined to the conductive connection pin. Then, the conductive connection pin is disposed.

As described above, the second embodiment has the structure that the conductive connecting pin is made of the material, such as copper or a copper alloy, having excellent flexibility. Therefore, stress which is applied to the pin when the heat cycle test is performed or when the package substrate is mounted can sufficiently be absorbed. Therefore, separation of the pin from the substrate can be prevented. The package substrate incorporating the foregoing conductive connecting pin is able to prevent concentration of stress to the conductive connecting pin. Therefore, great strength of adhesive bonding is permitted between the conductive connecting pin and the pad and between the pad and the substrate. Therefore, excellent reliability of the connection is realized.

FIG. 30 shows results of evaluation of the package substrate according to the first embodiment. The following factors were evaluated: smallest strength of adhesive bonding of the joined conductive connection pin, states of each pin after a heating test (reproduction of virtual IC measured state and evaluation performed such that a substrate having the pin is allowed to pass through a nitrogen reflow furnace set to 250° C.) and heat cycle condition (1000 cycles each consisting of one cycle in which 130° C./3 minutes+−65° C./3 minutes) smallest strength of adhesive bonding and conduction test.

Third Embodiment

A package substrate according to a third embodiment and a manufacturing method therefor will now be described. The foregoing steps (1) to (13) are similar to those according to the first embodiment described with reference to FIGS. 1 to 5. Therefore, the similar steps are omitted from illustration and description.

(14) The coarsened layer 11 is provided for the conductor layer and the via hole 7 of the build-up substrate obtained by the steps (1) to (13) and shown in FIG. 5. Then, covering with the organic resin insulating layer 15 having the opening 18 through which the pad 16 is exposed is performed (see FIG. 31). It is preferable that the thickness of the organic resin insulating layer is 5 μm to 40 μm. If the thickness is too small, the insulating performance deteriorates. If the thickness is too large, opening cannot easily be formed. What is worse, undesirable contact with solder occurs, causing a crack or the like to occur.

(15) A metal film 19 made of corrosion resisting metal in the form of a gold plated film or a nickel plated film-gold plated film is formed in the opening 18. Then, the conductive adhesive agent 17 serving as the solder paste are printed in the opening 16 which is the lower surface (the connection surface with the daughter board or the mother board) of the package substrate. It is preferable that the viscosity of the solder paste is 50 PaS to 400 PaS. Moreover, a conductive connecting pin 120 having a connection portion 102 provided with a constriction portion 103 is joined and supported by a proper pin holding apparatus. Then, the secured portion 101 of the conductive connecting pin 120 is brought into contact with the conductive adhesive agent 17 in the opening 16. Then, reflowing is performed at 240° C. to 270° C. so that the conductive connecting pin 120 is secured to the conductive adhesive agent 17 (see FIG. 32). As an alternative to this, a structure obtained by forming a conductive adhesive agent into a ball-like shape is introduced into the opening. As an alternative to this, the joining to the plate-like secured portion of the conductive connecting pin is performed so that the conductive connecting pin is joined. Then, reflowing may be performed. FIG. 33 (A) is an enlarged view of the pad portion provided with the conductive connecting pin 120 enclosed in a circle shown in FIG. 32.

The upper opening 18 of the package substrate 330 has a solder bump 60 which can be connected to an element, such as an IC chip.

The conductive connecting pin 120 according to the present invention is a so-called T-shape pin incorporating a plate-like secured portion 101 and a columnar connection portion 102 projecting over substantially the central portion of the secured portion 101. The plate-like secured portion 101 is a portion which is secured to the outermost conductor layer 5 of the package substrate serving as the pad 16 through the conductive adhesive agent 17. The shape of the secured portion 101 is formed into an arbitrary shape, such as a circular shape or a polygonal shape adaptable to the size of the pad. The shape of the connection portion 102 may be any shape which can be inserted into the connection portion, such as the terminal of another substrate. For example, the shape may be a cylindrical shape, a prism shape, a conical shape or a pyramid shape.

The constriction portion 103 is formed at an intermediate position of the connection portion 102, the constriction portion 103 having a diameter smaller than the other portions. It is an important factor that the diameter of the constriction portion 103 is not less than 50% nor more than 98% of the other portions. If the diameter is smaller than 50% of the diameter of the other portions, the strength of the connection portion is insufficient to prevent deformation and breakage when the package substrate is mounted. If the diameter of the constriction portion is larger than 98% of the diameter of the other portions, predetermined flexibility cannot be imparted to the connection portion. Therefore, the effect of absorbing stress cannot be obtained.

The material of the conductive connecting pin according to the present invention is not limited if the material is a metal material. It is preferable that at least any one of metal materials, such as gold, silver, copper, nickel, cobalt, tin and lead is employed to form the conductive connecting pin. Any one of an iron alloy having trade name "COBAL" (an alloy of Ni—Co—Fe), stainless steel and a phosphor bronze which is a copper alloy is a preferred material because of an external electrical characteristic and satisfactory processability of the conductive connecting pin. Phosphor bronze having external flexibility is able to satisfactorily absorb stress.

It is preferable that the columnar connection portion 102 of the conductive connecting pin 120 has a diameter of 0.1 mm to 0.8 mm, the length of 1.0 mm to 10 mm and the diameter of the columnar secured portion 101 is 0.5 mm to 2.0 mm. The foregoing values are arbitrarily determined according to the size of the pad and the type or the like of another substrate which must be mounted.

Similarly to the first embodiment, the conductive adhesive agent 17 of the package substrate may be solder (tin-lead, tin-antimony, silver-tin-copper or the like), conductive resin or conductive paste. It is preferable that the conductive adhesive agent having a melting point of 180° C. to 280° C. is employed.

When the conductive adhesive agent 17 is constituted by solder, it is preferable that solder having a composition Sn/Pb=95:5 or 60/40 is employed similarly to the first embodiment. It is also preferable that the melting point of the employed solder satisfies a range from 180° C. to 280° C. It is furthermore preferable that the range from 200° C. to 260° C. is satisfied.

As can be understood from FIGS. 33 (A) and 33 (B), the conductive connecting pin 120 has the connection portion 102 provided with the constriction portion 103. Therefore, satisfactory flexibility is obtained and thus the conductive connecting pin 120 can be easily bent. Thus, stress applied to the conductive connecting pin 120 when the package substrate is joined to the mother board or the like can be absorbed because the connection portion 102 is bent through the constriction portion 103.

a. Example 1

Figure 34:
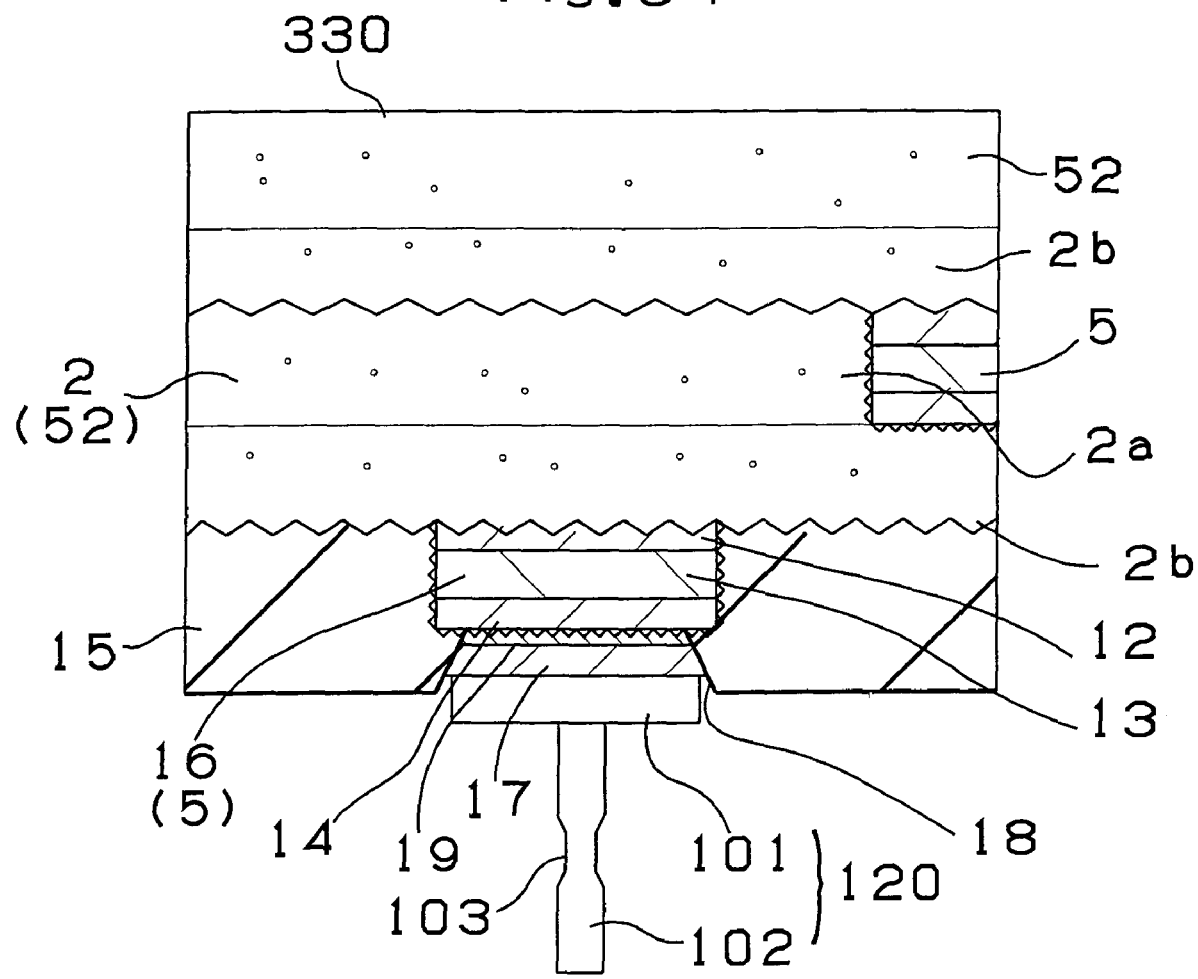
FIG. 34 is a cross sectional view showing a package substrate according to example 1 of a first modification of the third embodiment.

The pad 16 of the package substrate 331 according to example is, as shown in FIG. 34, covered with the organic resin insulating layer (the through hole layer) 15 having the opening 18 through which the pad 16 is partially exposed to the outside. The secured portion 101 of the conductive connecting pin 120 is, through the conductive adhesive agent 17, secured to the pad 16 exposed to the outside through the opening 18. As can be understood from the drawing, the organic resin insulating layer 15 holds and covers the periphery of the pad 16. Therefore, if stress is applied to the conductive connecting pin 120 when the heat cycle test is performed or when the package substrate is joined to the mother board, breakage of the pad 16 and separation from the organic resin insulating layer 15 can be prevented. Although the package substrate in the form of the multilayer printed circuit board having the interlayer resin insulating layer has been described as an example, the structure according to the third embodiment can be applied to a package substrate constituted by only one substrate.

[First Modification]

Figure 35:
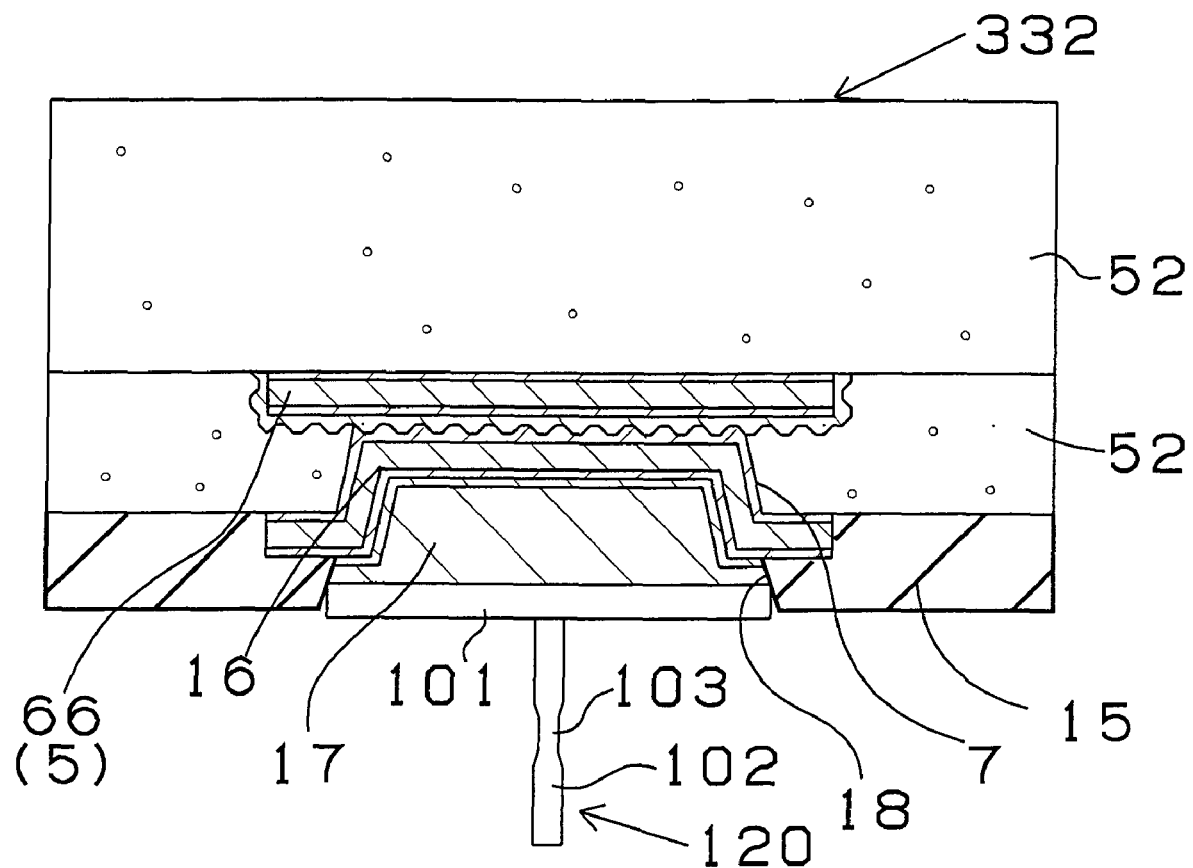
FIG. 35 is a cross sectional view showing a package substrate according to the first modification of the third embodiment.

A package substrate 332 according to this modification has a basic structure which is the same as that according to the third embodiment described with reference to FIGS. 32 and 33. The pad 16 for securing the conductive connecting pin 120 is, through the via hole 7, connected to the conductor layer 66 which is the inner layer of the interlayer resin insulating layer 52. The organic resin insulating layer 15 covers a portion of the pad 16 (see FIG. 35). The manufacturing steps from (1) to (14) are the same as that according to the third embodiment.

(15) The via hole 7 is filled with solder paste (Sn/Sb=95:5) 17 serving as the conductive adhesive agent. A mask member (not shown) is placed and made in hermetic contact with the surface of the organic resin insulating layer 15. Then, solder paste is printed, and then reflowing is performed at 270° C. or lower.

(16) The conductive connecting pin is secured to the pad by a method which is the same as that employed in the third embodiment. The first modification having the constriction portion 103 of the conductive connecting pin 110 enables satisfactory effect of absorbing stress. Moreover, the via hole 7 enables the area of bonding between the pad 16 and the substrate to be enlarged. Therefore, the peeling strength of the pad 16 can be enlarged. Since the conductor layer 66, which is the inner layer, is a metal layer, adhesiveness with the pad 16 made of the metal can be improved. Therefore, separation can be satisfactorily prevented. Moreover, the surface of the pad 16 is covered with the organic resin insulating layer 15, great peeling strength can be obtained between the pad 16 and the substrate.

Note that the conductor layer to which the pad is connected and which is the inner layer may be provided for the core substrate 1. As described above, the conductor layer on the core substrate is made to firmly contact with the core substrate through the coarsened surface. Therefore, separation of the Pad can furthermore be reliably prevented.

a. Example 1

The basic structure is the same as that of the first modification. A package substrate 333 (see FIG. 36 (A)) has a structure that the pad 16 for securing one conductive connecting pin 120 is, through a plurality of via holes 7, connected to the conductor layer 66 which is the inner layer of the inter layer resin insulating layer 52. As shown in FIG. 36 (B), this example has a structure that six via holes 7 are formed in a circular configuration. Moreover, a pad 16 for covering each via hole 7 is formed. FIG. 36 (B) is view B of FIG. 36 (A) viewed from the via hole 7. Note that the position of the via hole 7 shown in FIG. 36 (B) does not cause the three via holes 7 shown in FIG. 36 (A) to appear on the cross section. To simplify the drawing, the via hole away from the front organic resin insulating layer is indicated with a dashed line.

b. Example 2

A package substrate 334 (see FIG. 37) has the same basic structure except for the shape of the via hole 7 which is formed into a ring shape as shown in FIG. 37 (B). FIG. 37 (B) is view B of FIG. 37 (A).

The area of bonding to the substrate can be furthermore enlarged by the plural via holes 7 according to example 1 and by the ring via hole 7 according to example 2.

c. Example 3

A package substrate 335 (see FIGS. 38 (A) and 38 (B)) according to this example has the basic structure which is the same as that according to example 1 described with reference to FIG. 36. A plurality of via holes 7 disposed to form a circular configuration are as well as provided for the interlayer resin insulating layer 52 which is the inner layer. The outer via hole 7 and the inner via hole 7 provided with the pad 16 are joined to each other. Since the package substrate 335 incorporates the plural via holes 7 which are joined to one another, separation of the pad 16 can considerably be reliably prevented.

As described above, it is preferable for each modification that the conductor layer which is provided with the pad and which is the inner layer is provided for the core substrate 1. The conductor layer on the core substrate is, through the coarsened surface (the mat surface), made to firmly contact with the insulating substrate which is the core substrate. Since the connection to the conductor layer on the core substrate is established, the pad 16 cannot easily be separated from the inter layer resin insulating layer 52.

[Second Modification]

Figure 39:
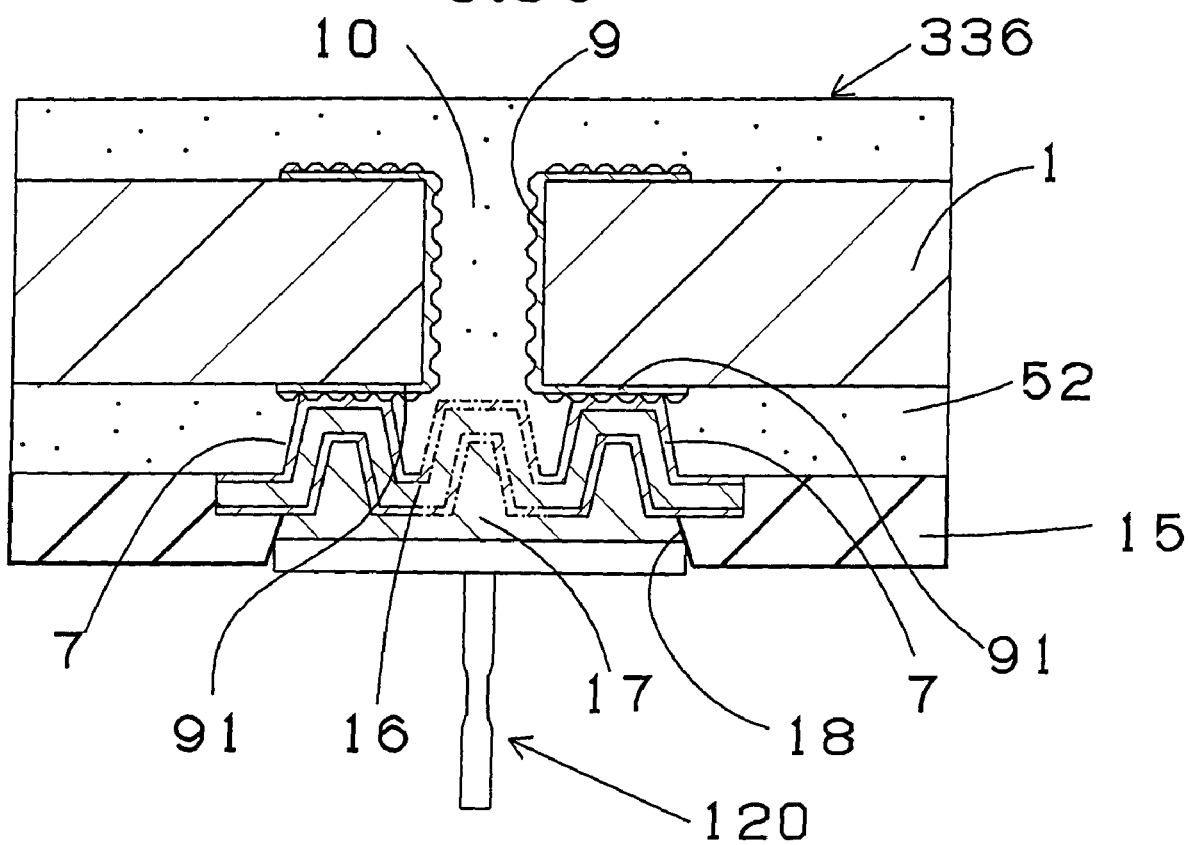
FIG. 39 is a cross sectional view showing a package substrate according to a second modification of the third embodiment.

A package substrate 336 (see FIG. 39) according to this modification has a basic structure which is the same as that according to example 2 of the first modification. The conductor layer to which the pad 16 is connected and which is the inner layer is a conductor layer (a land 91) provided for the through hole 9 of the core substrate 1. The organic resin insulating layer 15 covers the periphery of the pad 16. As shown in the drawing, the pad 16 is, through the via hole 7, connected to the land 91 of the through hole 9 and the resin filler 10 in the through hole 9.

That is, a characteristic of this modification is that the pad 16 is connected to the conductor layer of the core substrate 1 through the via hole 7. The conductor layer on the core substrate 1 is made to firmly contact with the insulating substrate which is the core substrate through the coarsened surface (the mat surface). Since the connection to the conductor layer on the core substrate is established, separation of the pad 16 from the interlayer resin insulating layer 52 can be prevented. Moreover, the through hole 9 and the pad 16 are connected to each other through the via hole 7. Therefore, the length of the electric wire from the conductive connecting pin 120 which is an external terminal to an IC chip (a semiconductor chip) disposed on the side opposite to the side on which the conductive connecting pin 120 is disposed can be shortened.

a. Example 1

Figure 40:
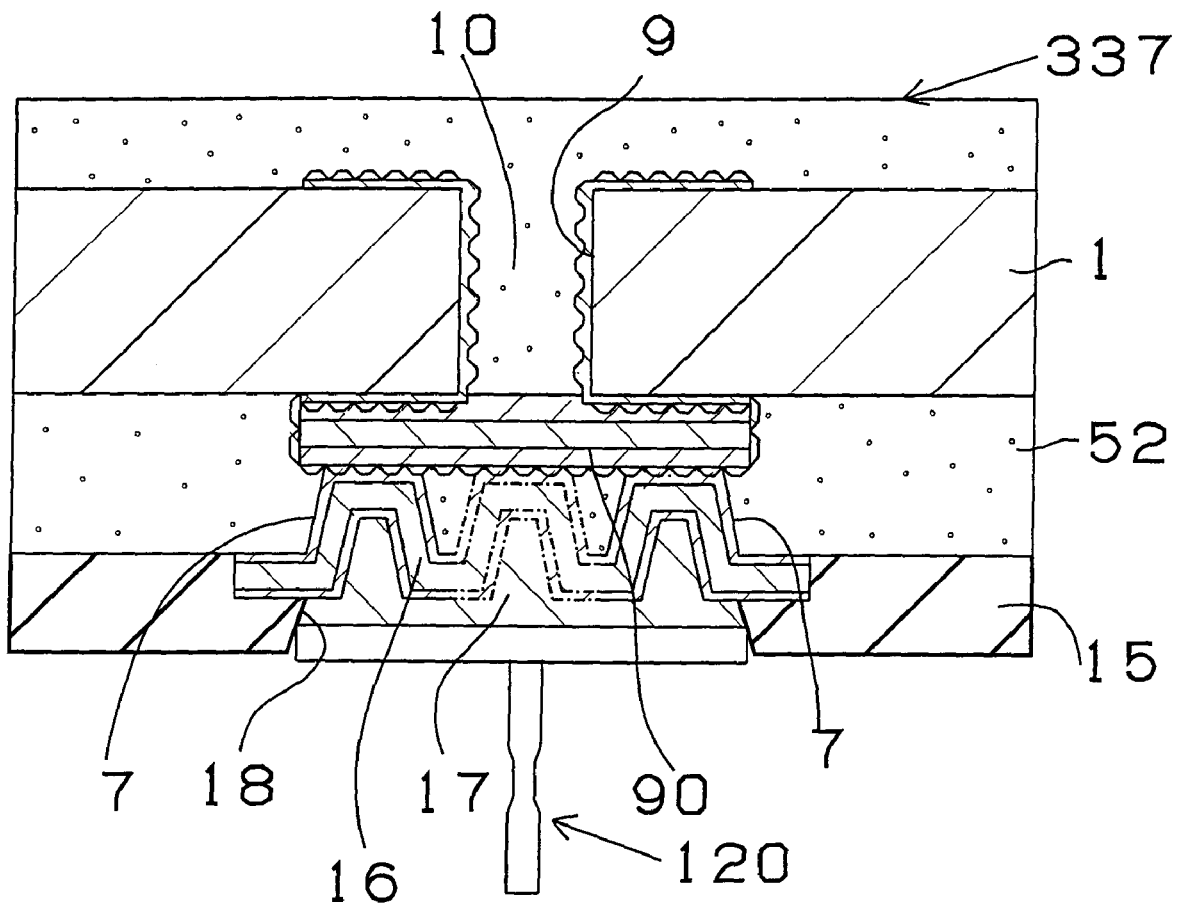
FIG. 40 is a cross sectional view showing example 1 of the second modification of the third embodiment.

A package substrate 337 (see FIG. 40) according to this example has a basic structure which is the same as that according to the second modification. A conductor layer 90 called a cover plating and arranged to cover the through hole 9 is provided for the through hole 9. The pad 16 is connected to the conductor layer 90 through the via hole 7.

b. Example 2

Figure 41:
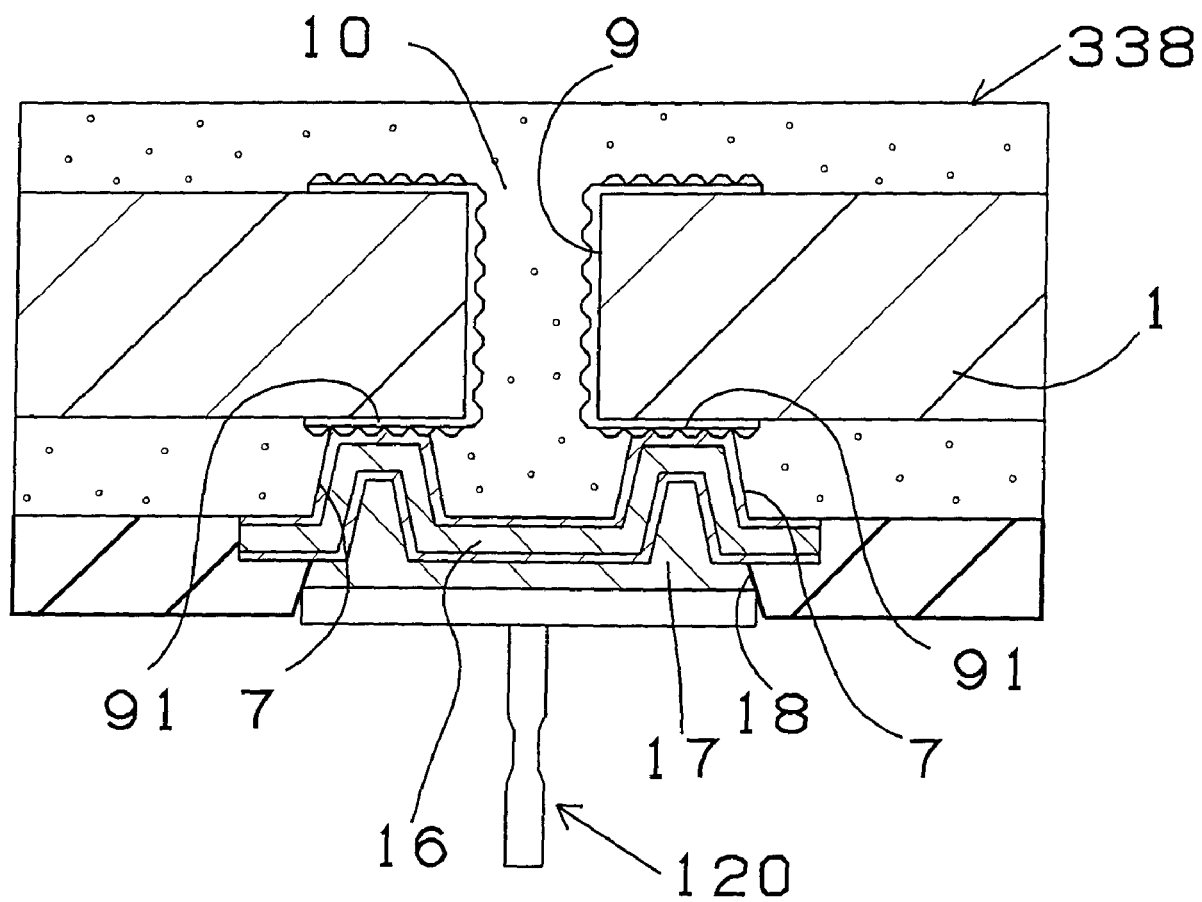
FIG. 41 is a cross sectional view showing example 2 of the second modification of the third embodiment.

A package substrate 338 (see FIG. 41) according to this example has a basic structure which is the same as that according to the second modification. The pad 16 is connected to only the land 91 of the through hole 9. In the foregoing examples, the pad 16 is bonded to the conductive layer 4 on the surface of the core substrate 1 so that easy separation is prevented. Moreover, joining to the land 91 of the through hole is performed so that the length of the electric width from the reverse side of the substrate is shortened.

[Third Modification]

The structure according to this modification is basically the same as that according to the first modification. A structure obtained by forming solder into a ball-like shape is joined to the conductive connecting pin. Then, the conductive connecting pin is disposed.

As described above, the conductive connecting pin according to the third embodiment incorporates the columnar connection portion and a plate-like secured portion, wherein a constriction portion having a diameter smaller than that of the other portions is provided for the columnar connection portion. Therefore, stress which is applied to the pin when the heat cycle is performed or when the package substrate is mounted can be sufficiently absorbed because the constriction portion is bent. Therefore, separation of the pin from the substrate can be prevented. The package substrate incorporating the foregoing conductive connecting pin is able to ease concentration of stress to the conductive connecting pin. Therefore, great strength of adhesive bonding is obtained between the conductive connecting pin and the pad and between the pad and the substrate. As a result, excellent reliability in the connection can be obtained.

FIG. 42 shows results of evaluation of the package substrate according to the third embodiment. The following factors were evaluated: smallest strength of adhesive bonding of the joined conductive connection pin, states of each pin after a heating test (reproduction of virtual IC measured state and evaluation performed such that a substrate having the pin is allowed to pass through a nitrogen reflow furnace set to 250° C.) and heat cycle condition (1000 cycles each consisting of one cycle in which 130° C./3 minutes+−65° C./3 minutes) smallest strength of adhesive bonding and conduction test.

Fourth Embodiment

A package substrate according to a fourth embodiment and a manufacturing method therefor will now be described. Steps (1) to (12) are similar to those according to the first embodiment described with reference to FIGS. 1 to 4. Therefore, similar steps are omitted from illustration and description.

(13) The plating resist 3 of the substrate shown in FIG. 4 (*d*) is removed, the electroless plated film 12 below the plating resist is removed, the conductor layer 5, and the via hole 7 and the plane layer 21 are formed. Thus, a build-up substrate constituted by six layers such that three layers are provided for each side (see FIG. 43).

Figure 44:
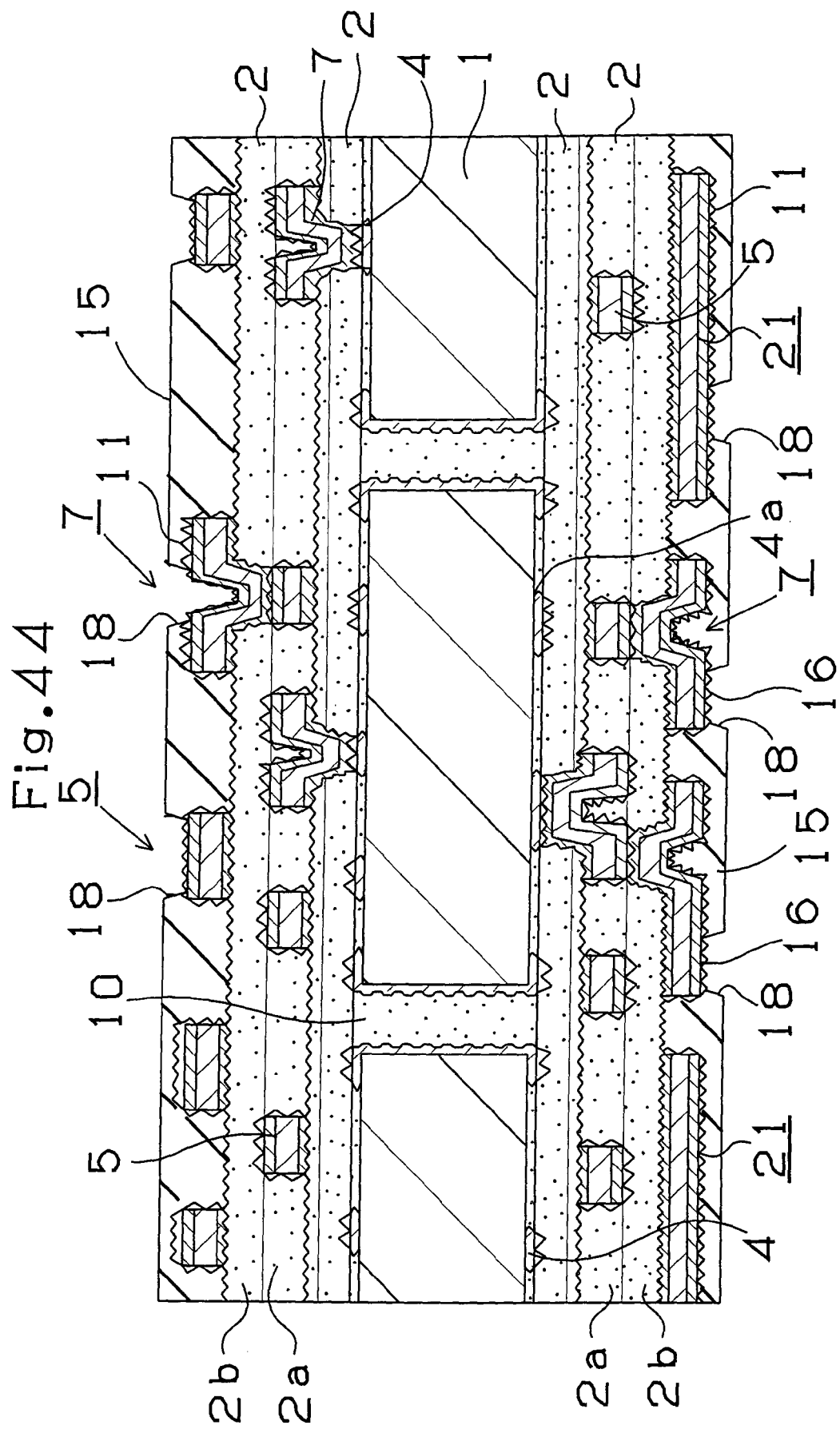
FIG. 44 is a diagram showing a process for manufacturing the package substrate according to the fourth embodiment.

(14) A coarsened layer 11 is provided for the conductor layer 5, the via hole 7 and the plane layer 21 of the thus-obtained build-up substrate. Then, covering with the organic resin insulating layer 15 having the opening 18 through which the pad 16 and the plane layer 21 are exposed to the outside is performed (see FIG. 44). It is preferable that the thickness of the organic resin insulating layer is 5 µm to 40 µm. If the thickness is too small, the insulating performance deteriorates. If the thickness is too large, opening cannot easily be formed. What is worse, undesirable contact with solder occurs, causing a crack or the like to take place.

(15) A metal film 19 in the form of a gold plated film or a nickel plated film-gold plated film and made of corrosion resisting metal is formed in the opening 18. Then, solder paste serving as the conductive adhesive agent 17 is printed in the opening 18 which is the lower surface (the connection surface with the daughter board or the mother board) of the package substrate. It is preferable that the viscosity outside the solder paste satisfies a range from 50 PaS to 400 PaS. A conductive connecting pin 100 is joined to a proper pin holding apparatus so as to be supported. A secured portion 101 of the conductive connecting pin 100 is brought into contact with the conductive adhesive agent 17 in the opening 16. Then, a reflowing operation is performed at 240° C. to 270° C. so that the conductive connecting pin 100 is secured to the conductive adhesive agent 17 (see FIG. 45). As an alternative to this, a structure obtained by forming the conductive adhesive agent into a ball-like shape or the like may be introduced into the opening. As an alternative to this, joining to the plate-like secured portion of the conductive connection pin is performed to join the conductive connection pin. Then, reflowing may be performed.

The opening 18 formed in the upper surface of the package substrate 431 is provided with a solder bump 60 which can be connected to an element such as an IC chip.

The conductive connecting pin 100 according to the present invention is a so-called T-shape pin incorporating a plate-like secured portion 101 and a columnar connection portion 102 projecting over substantially the central portion of the secured portion 101. The plate-like secured portion 101 is a portion which is secured to the outermost conductor layer 5 of the package substrate serving as the pad 16 through the conductive adhesive agent 17. The shape of the secured portion 101 is formed into an arbitrary shape, such as a circular shape or a polygonal shape adaptable to the size of the pad. The shape of the connection portion 102 may be any shape which can be inserted into the connection portion, such as the terminal of another substrate. For example, the shape may be a cylindrical shape, a prism shape, a conical shape or a pyramid shape.

The conductive adhesive agent 17 for use in the package substrate according to the present invention may be solder (tin-lead, tin-antimony, silver-tin-copper or the like), conductive resin or conductive paste. It is preferable that the melting point of the conductive adhesive agent satisfies a range from 180° C. to 280° C.

When the conductive adhesive agent 17 is constituted by solder, it is preferable that solder having a composition that Sn/Pb=95/5 or 60/40 is employed. It is preferable that the melting point of the employed solder satisfies a range from 180° C. to 280° C. It is most preferable that the melting point satisfies a range from 200° C. to 260° C.

FIG. 50 is a plan view showing a plane layer 21. The plane layer 21 is provided with a circular portion 21a in which any conductor is not formed so as to be formed into a mesh shape. The connection portion 21b to which the conductive connecting pin is connected is formed in a portion except for the portion 21a in which a conductor is not formed. Note that the mesh may be formed into a rectangular shape as a substitute for the circular shape. The mesh may be omitted from the plane layer.

Figure 45:
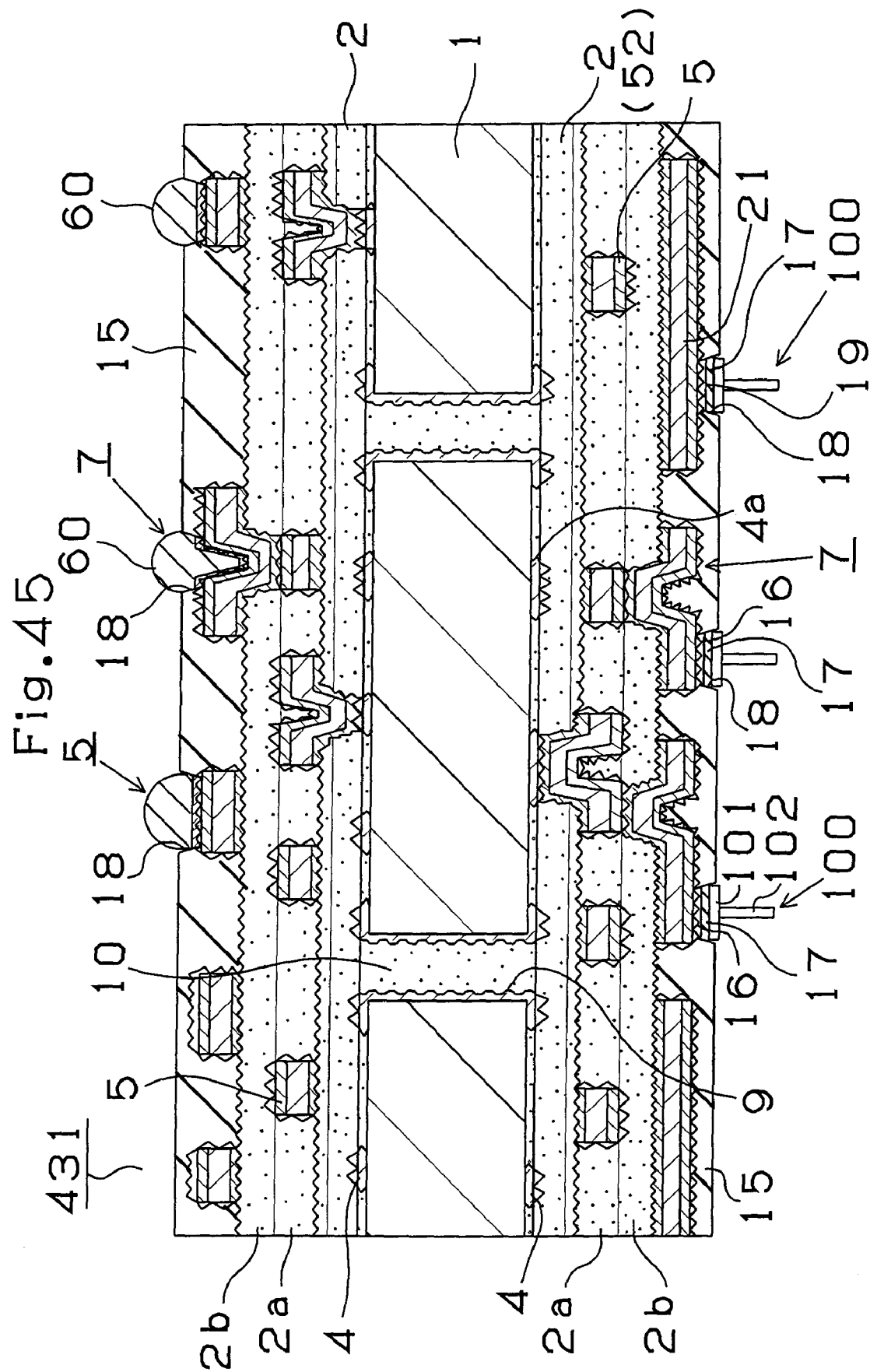
FIG. 45 is a cross sectional view showing the package substrate according to the fourth embodiment.

As shown in FIG. 45, a package substrate 431 according to the fourth embodiment of the present invention has the plane layer 21 provided for the surface of the substrate and constituting the power source layer. The conductive connecting pin 100 is directly connected to the plane layer 21 so that the electric resistance from the external substrate (for example, the daughter board) to the plane layer 21 is lowered. As a result, supply of electric power from the daughter board can be facilitated. Thus, supply of large electricity to the IC chip is permitted. As a result, the plane layer 21 constituting the power source layer has a satisfactory function.

[First Modification]

Figure 46:
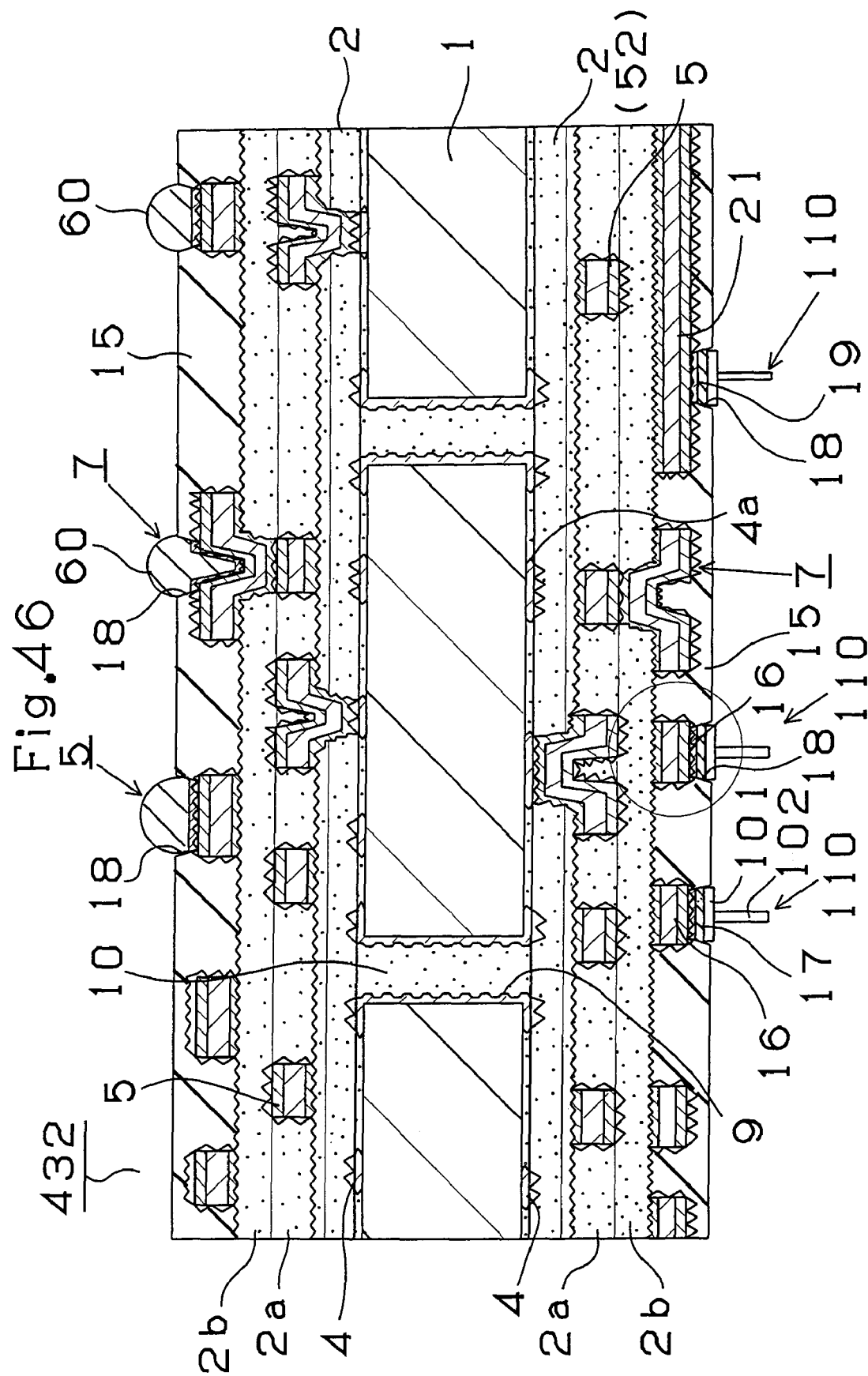
FIG. 46 is a cross sectional view showing a package substrate according to a first modification of the fourth embodiment.
Figure 47:
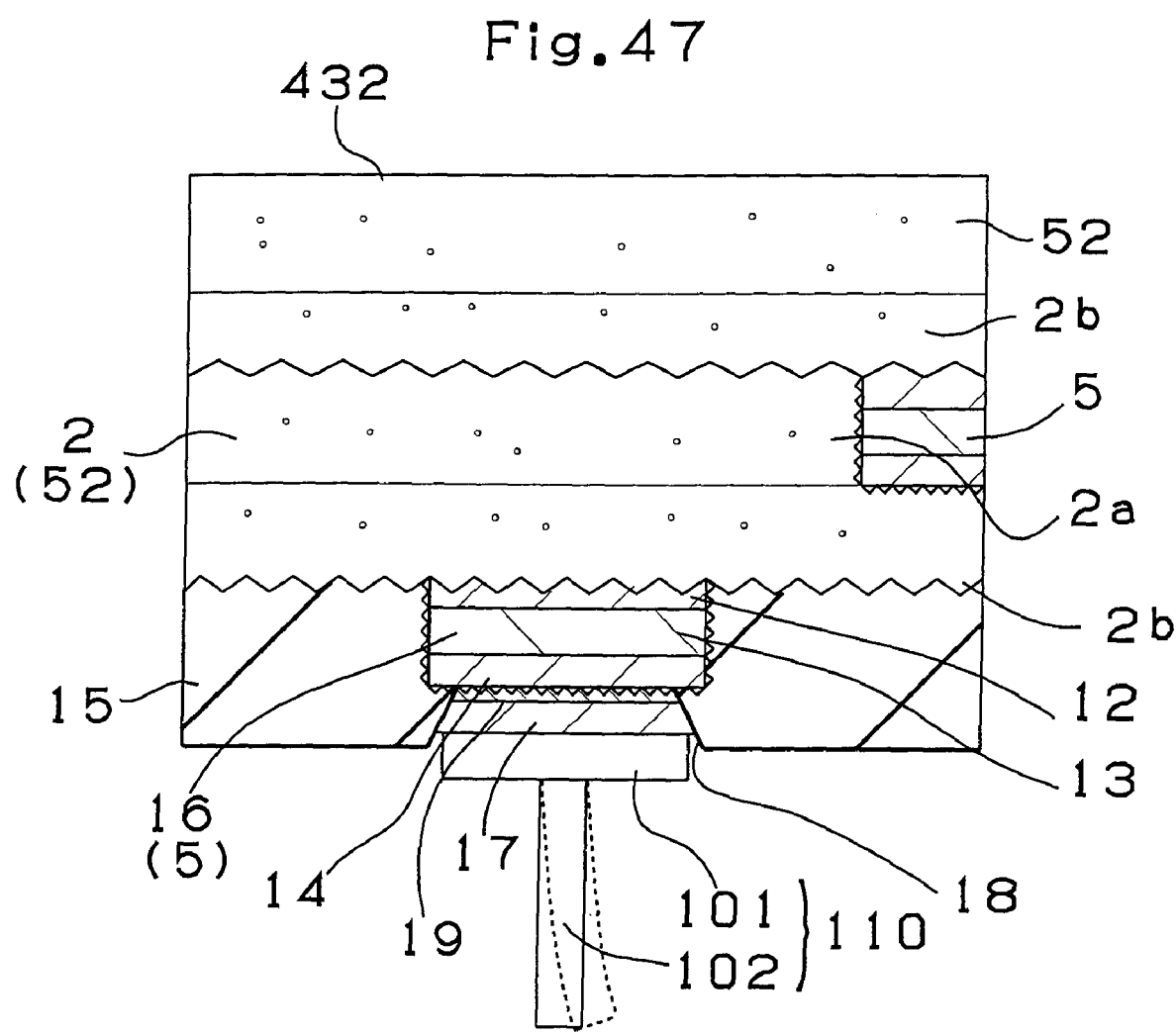
FIG. 47 is an enlarged cross sectional view showing a portion in which the conductive connecting pin shown in FIG. 46 is connected to the pad.

FIG. 46 shows the cross section of a package substrate 432 according to a first modification of the present invention. FIG. 47 is an enlarged view showing the pad portion provided with the conductive connecting pin 110 enclosed in a circle shown in FIG. 46.

The pad 16 of the package substrate 432 according to the first modification is, as shown in FIG. 47, covered with the organic resin insulating layer (the through hole layer) 15 having the opening 18 through which the pad 16 is partially exposed to the outside. The secured portion 101 of the conductive connecting pin 110 is, through the conductive adhesive agent (Sn/Sb=95:5) 17, connected to the pad 16 exposed to the outside through the opening 18. As can be understood from the drawing, the organic resin insulating layer 15 holds and covers the periphery of the pad 16. Therefore, if stress is applied to the conductive connecting pin 110 when the heat cycle test is performed or when the package substrate is mounted on the mother board, breakage of the pad 16 and separation from the organic resin insulating layer 15 can be prevented. If different materials, such as metal and resin, are bonded to each other, separation does not easily occur.

As shown in FIG. 46, the package substrate according to the first modification of the present invention has the structure that the plane layer 21 for constituting the earth layer is formed on the surface of the substrate. Moreover, the conductive connecting pin 110 is directly connected to the plane layer 21. Therefore, the electric resistance from the external substrate (for example, the daughterboard) to the plane layer 21 is lowered. As a result, also the plane layer which constitutes the earth layer is connected to the earth line on the daughter board side through the conductive connecting pin having low resistance. Thus, noise elimination can be sufficiently performed.

The package substrate 432 according to the first modification incorporates the conductive connecting pin 110 which is made of at least one type of a material having excellent flexibility and selected from copper, a copper alloy, tin, zinc, aluminum and noble metal. In particular, it is preferable that phosphor bronze which is a copper alloy is employed because excellent electric characteristics and processability as the conductive connecting pin can be obtained. The foregoing conductive connecting pin may be covered with another metal layer in order to prevent corrosion or enlarge strength.

As can be understood from FIG. 47, the conductive connecting pin 110 is made of the material having excellent flexibility. Therefore, stress applied to the conductive connecting pin 110 when the package substrate is joined to another substrate can be absorbed such that the connection portion 102 is deflected as indicated with a dashed line shown in the drawing.

[Second Modification]

Figure 48:
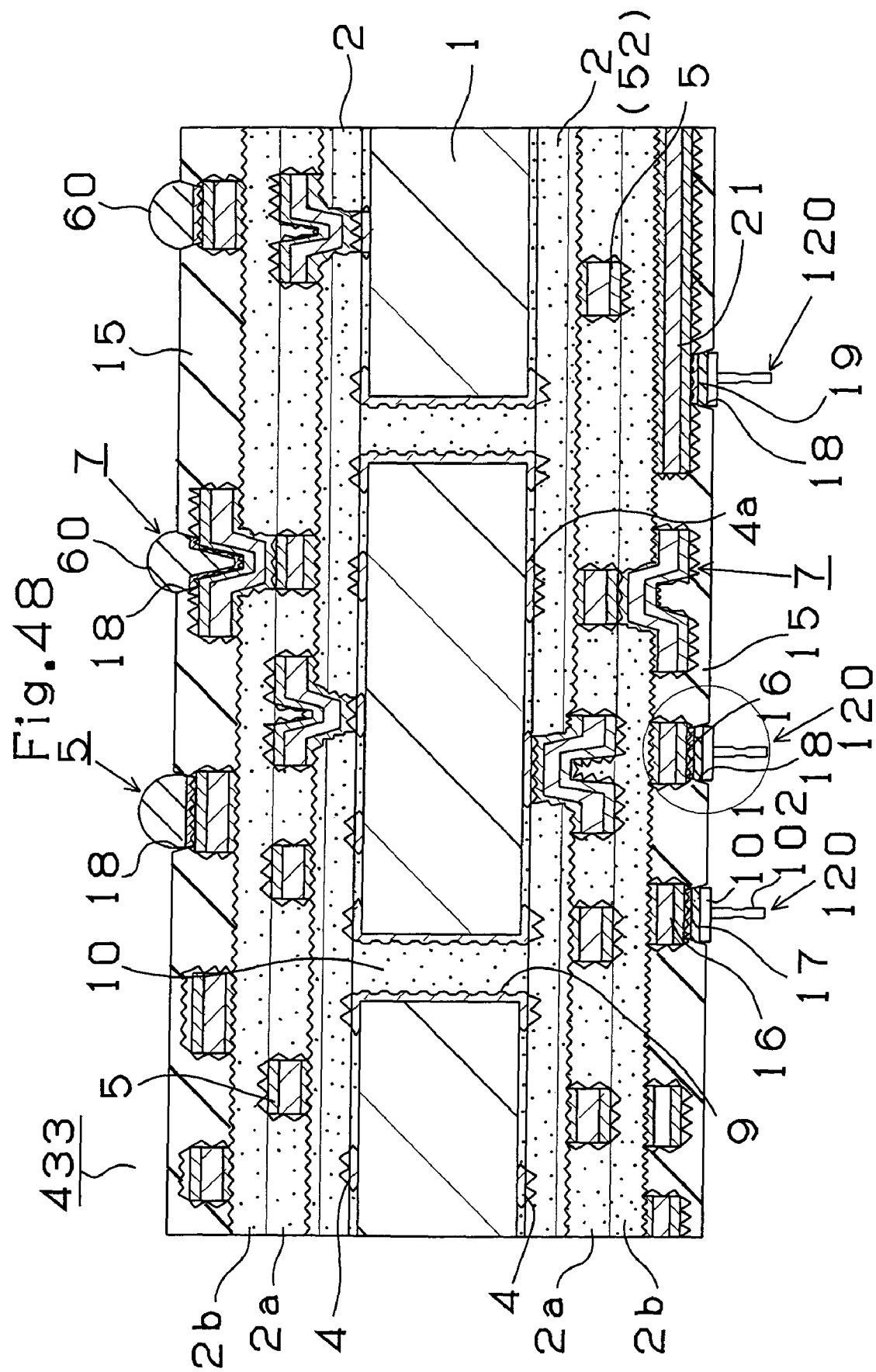
FIG. 48 is a cross sectional view showing a package substrate according to a second modification of the fourth embodiment.
Figure 49:
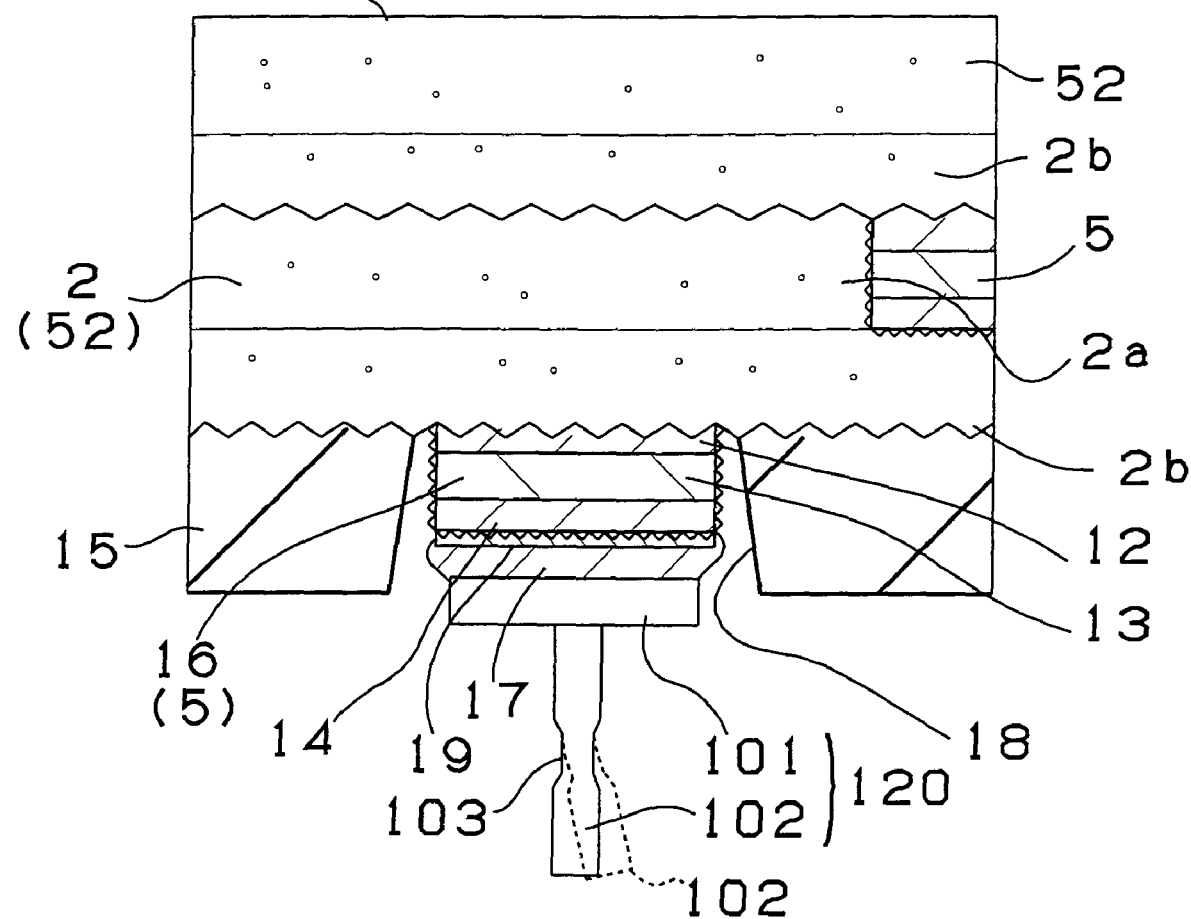
FIG. 49 is an enlarged cross sectional view showing a portion in which the conductive connecting pin shown in FIG. 48 is connected to the pad.

FIG. 48 shows the section of a package substrate 433 according to a second modification of the present invention. FIG. 49 is an enlarged view showing a pad portion provided with the conductive connecting pin 120 enclosed in a circle shown in FIG. 48.

As can be understood from FIG. 49, the conductive connecting pin 120 of the package substrate 433 according to the second modification has the constriction portion 103 provided for the connection portion 102 thereof. Therefore, excellent flexibility can be obtained and, therefore, the conductive connecting pin 120 can easily be bent. Stress applied to the conductive connecting pin 120 when the package substrate is joined to the mother board or the like can be absorbed because the connection portion 102 is bent through the constriction portion 103.

[Third Modification]

The structure is basically the same as that according to the first modification. A structure obtained by forming solder into a ball-like shape is joined to the conductive connecting pin. Then, the conductive connecting pin is disposed.

In the fourth embodiment, the conductive connecting pin is directly connected to the plane layer so that electric resistance from the external substrate to the plane layer is lowered. As a result, the function of the plane layer can be improved.

FIG. 51 shows results of evaluation of the package substrate according to the first embodiment. The following factors were evaluated: smallest strength of adhesive bonding of the joined conductive connection pin, states of each pin after a heating test (reproduction of virtual IC measured state and evaluation performed such that a substrate having the pin is allowed to pass through a nitrogen reflow furnace set to 250° C.) and heat cycle condition (1000 cycles each consisting of one cycle in which 130° C./3 minutes+−65° C./3 minutes) smallest strength of adhesive bonding and conduction test.

Fifth Embodiment

A package substrate according to a fifth embodiment and a manufacturing method therefor will now be described.

Initially, a circuit board having a surface on which a conductor circuit is formed is manufactured. The substrate may be a resin insulating substrate, such as a glass epoxy substrate, a polyimide substrate or a bismaleimide-triazine resin substrate, a copper-clad laminate plate, a ceramic substrate, a metal substrate or the like. An interlayer resin insulating layer is provided for the foregoing substrate, and then the inter layer resin insulating layer is coarsened so that a coarsened surface is formed. The overall surface of the coarsened surface is subjected to an electroless plating to have a thin thickness. Then, plating resist is formed, and then electrolytic plating is performed to have a large thickness in the portion in which the plating resist is not formed. Then, the plating resist is removed, and then an etching process is performed so that a conductor circuit composed of the electrolytic plated film and an electroless plated film is formed. Either of the conductor circuits is constituted by a copper pattern.

The substrate having the conductor circuits formed thereon is provided with a recess owing to the conductor circuit or the through hole. To plug the recess, a resin filler is applied by printing or the like. After the substrate has been dried, excess portion of the resin filler is ground by a grinding operation to expose the conductor circuit to the outside. Then, the resin filler is mainly hardened.

Then, a coarsened layer is provided for the conductor circuit. It is preferable that the coarsened layer is a coarsened surface of copper formed by an etching process, a grinding process, an oxidizing process or an oxidizing and reduction process or a coarsened surface constitute by a plated film. It is preferable that the maximum height Ry of the asperities on the coarsened layer is 1 µm to 10 µm.

Then, an interlayer resin insulating layer is formed on the coarsened surface of the conductor circuit. The foregoing inter layer resin insulating layer can be formed by using an adhesive agent for electroless plating. The adhesive agent for electroless plating constitutes thermosetting resin as the base thereof. If necessary, hardened heat-resisting resin particles, heat-resisting resin particles which are dissolved in acid or an oxidizer, inorganic particles or a fibrous filler may be contained in the foregoing adhesive agent for electroless plating. The foregoing resin insulating layer is formed between the lower conductor circuit and the upper conductor circuit so as to be formed into the interlayer resin insulating layer.

A plurality of the foregoing resin insulating layers may be provided. For example, the lower layer is formed into a reinforcing layer made of inorganic particles, the fibrous filler and a resin base. On the other hand, the upper layer may be formed into the adhesive agent layer for electroless plating. As an alternative to this, heat-resisting resin particles which have an average particle size of 0.1 µm to 2.0 µm and which may be dissolved in acid or an oxidizer are dispersed in heat-resisting resin which is refractory with respect to acid or the oxidizer to form the lower layer. On the other hand, the adhesive agent layer for electroless plating may be formed into the upper layer.

An electroless plated film having a small thickness is formed on the overall surface of the interlayer resin insulating layer which has been coarsened and which have been supplied with catalyst cores. It is preferable that the electroless plated film may be an electroless copper plating film having a thickness of 0.5 µm to 5 µm, preferably 1 µm to 3 µm.

Then, a photosensitive resin film (a dry film) is laminated on the formed electroless plated film. Then, a photomask (it is preferable that a glass substrate is employed) on which a plating resist pattern has been drawn is made in hermetic contact with the surface of the photosensitive resin film so as to be placed on the same. Then, exposure and a development process are performed so that a non-conductor portion having the plating resist pattern is formed.

Then, an electrolytic plated film is formed in the portion except for the non-conductor portion on the electroless copper plated film. Thus, a conductor circuit and a conductive portion which is formed into the via hole are formed. It is preferable that the electrolytic plating is electrolytic copper plating to have a thickness of 5 µm to 20 µm.

Then, etching solution, such as mixed solution of sulfuric acid and peroxide, sodium persulfate, ammonium persulfate, ferric chloride or cupric chloride is used to remove the electroless plated film. Thus, an independent conductor circuit and a via hole constituted by two layers incorporating the electroless plated film and the electrolytic plated film are obtained.

The palladium catalyst cores on the coarsened surface exposed over the non-conductor portion is dissolved and removed by chromic acid, sulphated water or the like.

Then, the coarsened layer is formed on the conductor circuit on the right side of the substrate. It is preferable that the formed coarsened layer is a coarsened layer of copper formed by an etching process, a grinding process, an oxidizing process or an oxidizing and reducing process or a coarsened layer constituted by plated film.

Then, a solder resist layer which is the organic resin insulating layer according to the fifth embodiment is formed on the conductor circuit. The thickness of the solder resist layer according to the present invention satisfies a range from 5 µm to 150 µm. In particular, it is preferable that the thickness is 5 µm to 40 µm.

If the thickness is too small, the function of a solder dam cannot be obtained. If the thickness is too large, the opening cannot easily be formed. Moreover, undesirable contact with the solder occurs, causing a crack to be formed.

Then, the opening is formed in the solder resist layer. A metal layer constituted by one or more types of materials selected from gold, silver, copper, nickel, tin, aluminum, lead, phosphorus, chrome, tungsten, molybdenum, titanium, platinum and solder may be formed in the opening. The metal layer may be formed by any one of plating, evaporating and sputtering capable of forming the metal layer.

Although two metal layers are formed in the following description, the number of the metal layer may be one or three or more. As an alternative to this, the metal layer may be omitted. An example case in which the metal layer is provided for the opening will now be described. The metal layer is constituted by nickel or gold. The reason why the metal layer is formed is that corrosion of the exposed conductor circuit must be prevented.

A nickel plated layer is formed in the opening by electroless plating. An example of the composition of nickel plating solution is as follows: nickel sulfate by 4.5 g/l, sodium hypophosphate by 25 g/l, sodium citrate by 40 g/l, boric acid by 12 g/l and thiourea by 0.1 g/l (PH=11). Then, degreasing solution is used to clean the opening in the solder resist layer and the surface. Then, a catalyst, such as palladium, is supplied to the conductor portion exposed over the opening to activate the material. Then, immersion in plating solution is performed so that a nickel plated layer is formed.

It is preferable that the thickness of the nickel plated layer is 0.5 μm to 20 μm, more preferably 3 μm to 10 μm. If the thickness is too small, the connection between the solder bump and the nickel plated layer cannot easily be established. If the thickness is too large, occupancy of the solder bump formed in the opening is inhibited. In the foregoing case, peeling sometimes occurs.

After the nickel plated layer has been formed, gold plating is performed to form a gold plated layer having a thickness of 0.01 μm to 0.1 μm, preferably about 0.03 μm.

After the solder resist has been formed, an opening for exposing the conductor circuit is formed or a recess for improving adhesiveness of the projecting pin is formed around the opening. The recess is formed by exposing and developing. As an alternative to this, carbon dioxide gas laser, excimer laser or YAG laser is used. As an alternative to this, punching may be employed. A plurality of the foregoing methods may be employed without any problem.

The diameter of the opening satisfies a range from 100 mm to 900 mm. The diameter of the recess satisfies a range from 5 mm to 70 mm. The most suitable shape of the opening and that of the recess are circles. The shape may be a polygonal shape, such as a rectangular shape or the shape of a star.

A conductive adhesive layer is formed in the opening and the recess. The adhesive agent may be solder, a brazing material, conductive granular substances and thermosetting resin or conductive granular substances and thermoplastic resin. It is preferable that solder is employed to form the adhesive layer. The reason for this lies in that great strength of adhesive bonding can be obtained and the forming method can be selected from a variety of methods.

When the adhesive layer is constituted by solder, a material in which Pb is blended by 35% to 97% is employed. The solder which does not include the Pb, such as Sn/Sb, Sn/Ag or Sn/Ag/cu may be used.

When the adhesive layer is constituted by the brazing material, at least one material selected from gold, silver, copper, phosphorus, nickel, palladium, zinc, indium, molybdenum or manganese is employed. In particular, it is preferable that gold brazing material constituted by a gold alloy or a material called a "silver brazing material" constituted by a silver alloy is employed. The reason for this lies in that satisfactory conductivity can be obtained and corrosion can sufficiently be prevented.

When the conductive granular substances and the thermosetting resin and the thermoplastic resin are used to form the adhesive layer, it is preferable that the granular substances are constituted by metal, an inorganic material and resin. The reason for this lies in that the linear expansion coefficient and the melting point with respect to the resin can easily be adjusted. Moreover, dispersion and coagulation do not easily occur when mixing with resin is performed. Note that substances except for the foregoing substances may be employed. The material constituted by the conductive and granular substances, such as metal or the conductive resin is, as it is, or coated with a metal layer is employed as the conductive and granular material. The material constituted by the non-conductive substances, such as the inorganic material or the resin, is coated with the metal layer and the conductive, and then used as the conductive and granular substances. The foregoing conductive resin is stirred, mixed and uniformly distributed in the thermosetting resin or the thermoplastic resin. Then, the foregoing material is employed to form the adhesive layer. It is preferable that the resin is the thermosetting resin. The reason for this lies in that a satisfactory operability can be realized at room temperatures and filling of the opening can be reliably performed.

The conductive adhesive layer is formed by printing, plating, potting or resist etching. The foregoing method is a method for filling the opening in the solder resist with the foregoing material. Another method may be employed with which applying and coating of the foregoing material to the bonding surface of the projecting pin are performed. Then, insertion into the opening is performed.

After the adhesive layer has been formed, the projecting pin is disposed above the opening. The number of the projecting pin may be one, or one or more projecting pin may be provided. The material may be a metal material, such as gold, silver, iron, nickel, cobalt, tin or lead or a non-conductive material, such as ceramics. In the latter case, conductive metal is used to cove the projecting pin to establish the electrical connection.

The shape of the bonding surface of the projecting pin may be a flat shape. In a case where the recess is provided around the opening, a projection may be provided so as to be inserted into the recess. The package substrate according to this embodiment has the structure that when mounting on an external substrate is performed, the projecting pin disposed on the substrate is engaged and connected to the connection portion of the external substrate. Therefore, concentration of stress occurring when heat crimping is performed can be relaxed. As a result, a crack and breakage of the projecting pin and the portion for holding the projecting pin can be prevented.

Even under the heat cycle condition of the reliability test, occurrence of a crack and breakage of the connection portion can be prevented as compared with the substrate provided with the BGA.

A package substrate and a manufacturing method therefor according to the fifth embodiment will now be described with reference to the drawings.

Figure 59:
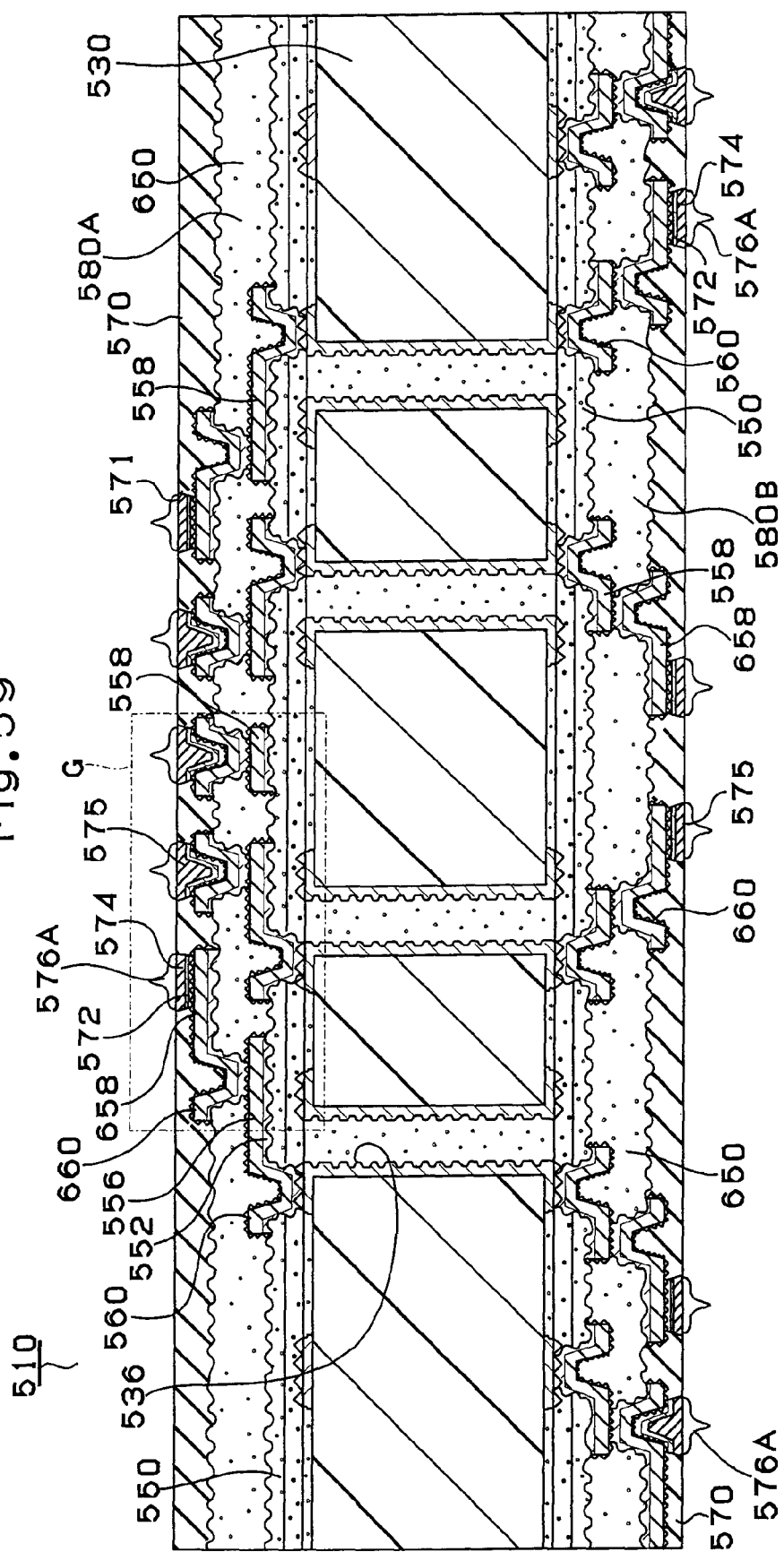
FIG. 59 is a cross sectional view showing a package substrate according to the first modification of the fifth embodiment of the present invention.
Figure 60:
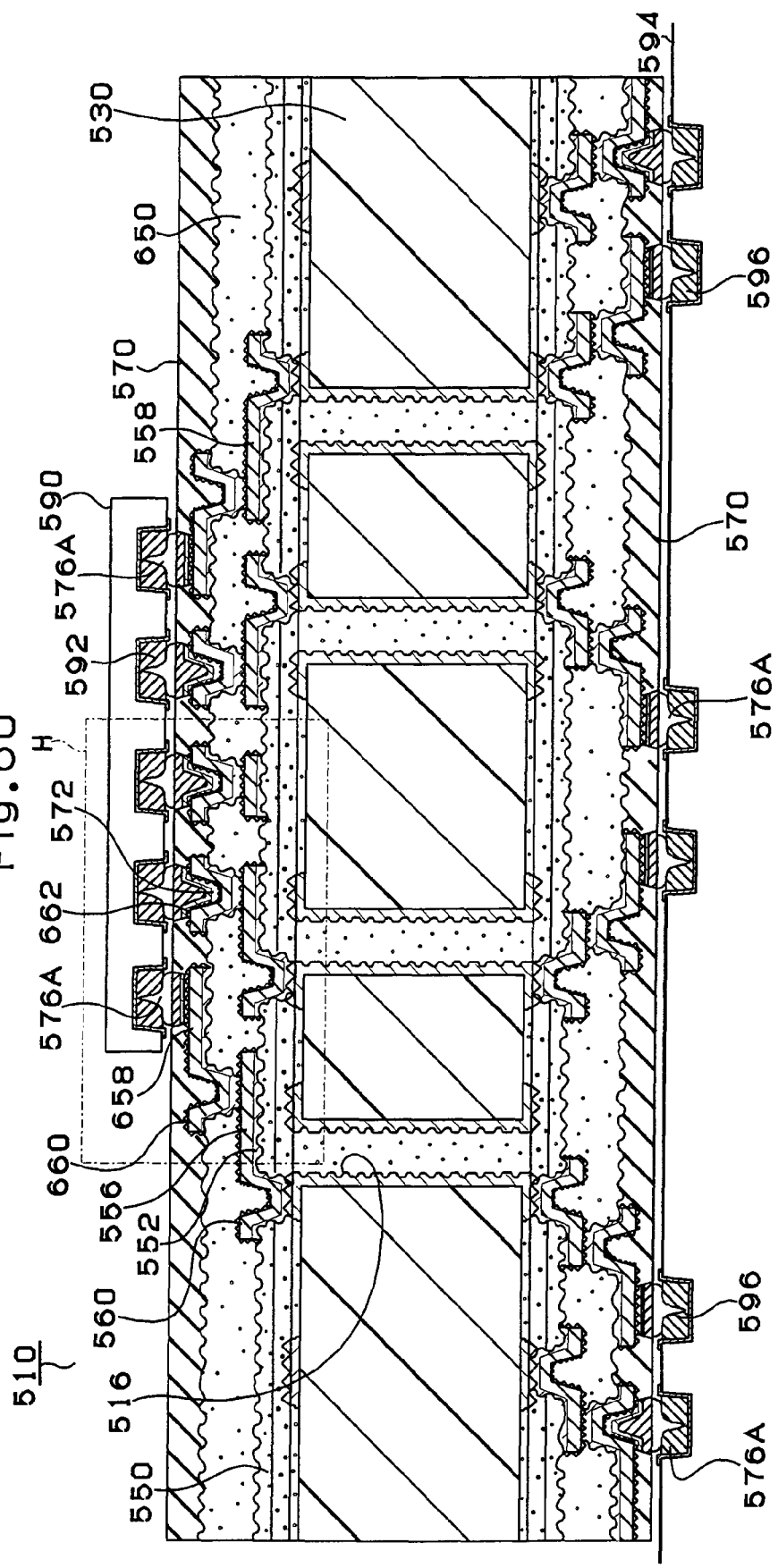
FIG. 60 is a cross sectional view showing a state in which an IC chip has been mounted on the package substrate according to the fifth embodiment.

The structure of a package substrate 510 according to the fifth embodiment will now be described with reference to FIGS. 59 and 60. FIG. 59 shows the cross section of a package substrate (a package substrate) 510 before an IC chip 590, which is a semiconductor element, is mounted. FIG. 60 shows the cross section of the package substrate 510 on which the IC chip 590 has been mounted and which has been joined to a mother board (the external substrate). As shown in FIG. 60, the IC chip 590 has been mounted on the upper surface of the package substrate 510. The lower surface of the package substrate 510 is connected to a daughter board 594.

Referring to FIG. 59, the structure of the package substrate will now be described. The package substrate 510 incorporates a multilayer core substrate 530 having right and reverse sides on which build-up circuit layers 580A and 580B are formed. The build-up player 580A incorporates an interlayer resin insulating layer 550 provided with a via hole 560 and a conductor electric circuit 558; and an interlayer resin insulating layer 650 provided with a via hole 660 and a conductor electric circuit 658. The build-up circuit layer 580B incorporates an interlayer resin insulating layer 550 provided with a via hole 560 and a conductor electric circuit 558; and an interlayer resin insulating layer 650 provided with a via hole 660 and a conductor electric circuit 658.

A projecting pin 576A for establishing the connection with a connection portion 592 (see FIG. 60) of the IC chip 590 is disposed on the upper surface of the package substrate 510. On the other hand, a projecting pin 576A for establishing the connection with a connection portion 596 (see FIG. 60) of the daughterboard (a sub-board) 594 is disposed on the lower surface. The projecting pin 576A is connected to the via hole 660 and the conductor electric circuit 658 through solder 575. Although also the projecting pin 576A is provided for the daughter board in this embodiment, a conventional structure may be employed in which a land is provided for the daughter board.

The projecting pin 576A incorporates conical projections which are inserted into a connection portion 592 of the IC chip 590 and a connection portion 596 of the daughter board 94. The projecting pin 576A is made of covar.

A process for mounting the IC chip 590 on the package substrate 510 will now be described with reference to FIG. 61. FIG. 61 (A) shows the IC chip before mounting, while FIG. 61 (B) is an enlarged view showing the projecting pin 576A indicated with symbol H shown in FIG. 60.

As shown in FIG. 61 (A), the connection portion 592 of the IC chip 590 and the projecting pin 576A of the package substrate 510 are located such that the two elements correspond to each other. Then, pressure is applied in a heating state so that the projecting pin 576A is inserted into the connection portion 592 (see FIG. 61 (B)).

Another example will now be described with reference to FIG. 70. In this example, a through hole serving as the connection portion 596 is formed in the daughter board 594. The locating of the package substrate 510 and the daughter board is performed (see FIG. 70 (A)), and then pressure is applied to the substrate 10 in a state in which no heat is applied. Then, the projecting pin 576A is inserted into the foregoing through hole (the connection portion) 596 (see FIG. 70 (B)).

In the foregoing example, when pressure is applied in a state in which no heat is applied, the projecting pin 576A of the package substrate is inserted into an electrode (the connection portion 596) of the daughter board 594. Thus, stress which is applied when the crimping process is performed can be relaxed. Therefore, occurrence of a crack and breakage of the projecting pin and the holding portion (the solder portion) 575 for the projecting pin at the time of the mounting operation can be prevented. Since a large joining area is permitted between the projecting pin 576A and the adhesive layer (the solder layer) 575, the strength of adhesive bonding can be enlarged as compared with the conventional structure constituted by the solder bump.

An embodiment of the projecting pin will now be described with reference to FIG. 71. Basically, the projecting pin 576A has one projecting pin 576a as shown in FIG. 71 (A). Two or more projecting pins 576C may be provided as shown in FIG. 71 (C) without any problem. If two or more projecting pins are provided, parallel disposition is permitted to surround one projecting pin. The shape of the projecting 576a is formed into the conical shape. As an alternative to this, a projecting pin 576B formed into a cylindrical shape as shown in FIG. 71 (B) may be employed.

It is preferable that the lower surface (the bonding surface) of the projecting pin 576A is flat. If a recess is provided around the opening, a projecting pin 576D formed as shown in FIG. 71 (D) may be employed such that a pin-shape projection 576b is provided for the bonding surface (the bottom surface). Thus, the strength of adhesive bonding of the projecting pin can be enlarged.

The projecting pin 576A is made of covar and 42-alloy which are iron alloys and phosphor bronze which is a copper alloy. The projecting pin 576A is, as shown in FIGS. 71 (A), 71 (C) and 71 (D), constituted by one type of metal or an alloy. As an alternative to this, projecting pins 576B and 576E shown in FIGS. 71 (B) and 71 (E) may be employed which are made of ceramic 77 in order to enlarge the strength. Then, the surface of the projecting pin is coated with a metal layer.

An example of the method of manufacturing the package substrate according to the fifth embodiment will now be described.

Figure 52:
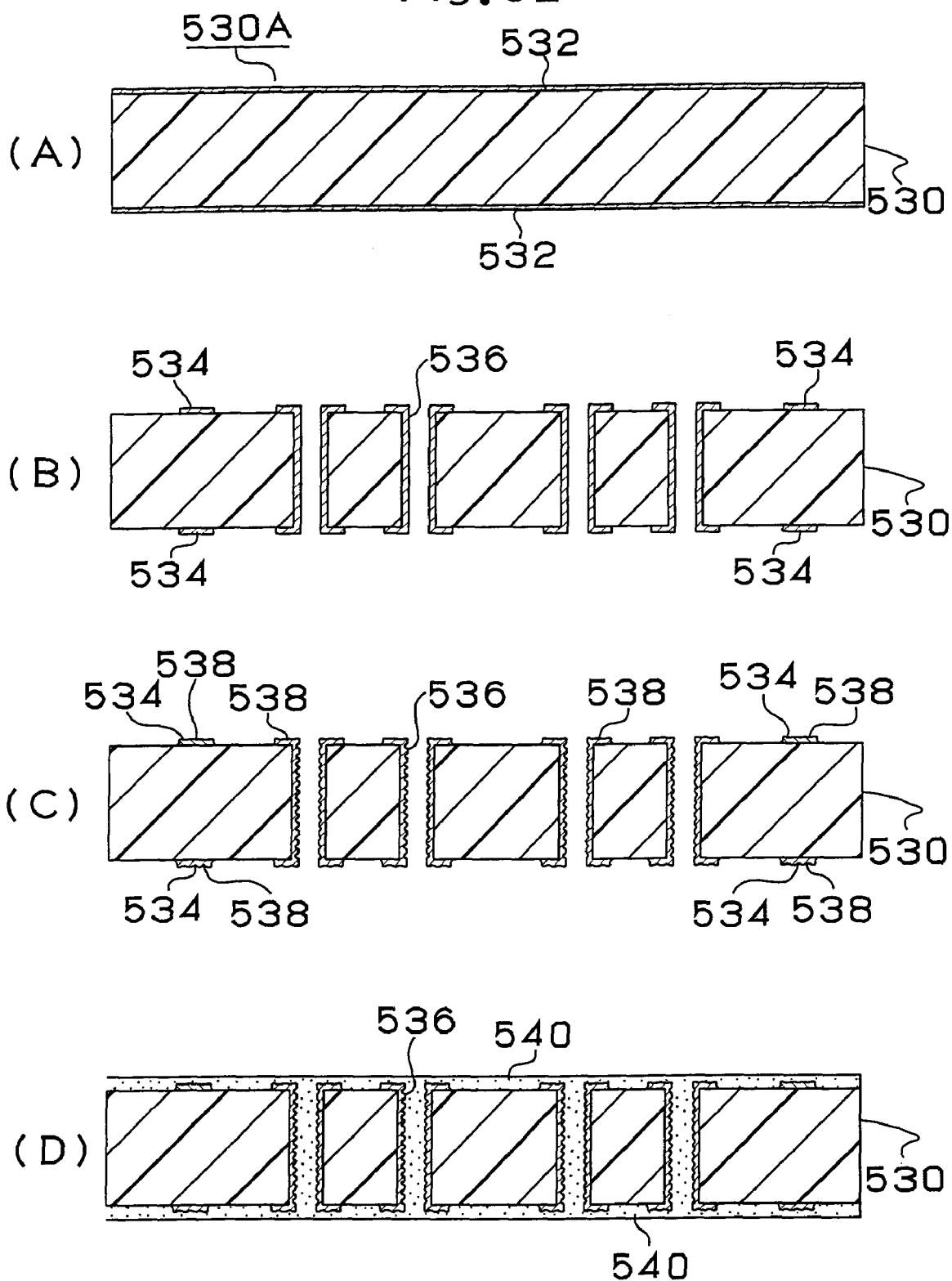
FIGS. 52 (A), 52 (B), 52 (C) and 52 (D) are diagrams showing a process for manufacturing a package substrate according to a fifth embodiment.

Manufacture of Package Substrate (1) A starting material was a copper-clad laminate plate 530A structured such that copper foil 532 having a thickness of 18 μm was laminated on each of the two sides of a substrate 530 made of glass epoxy resin or BT (bismaleimide-triazine) resin (step (A) shown in FIG. 52). Initially, a hole was formed in the copper-clad laminate plate 530A by drilling, and then electroless plating was performed. Then, etching was performed to correspond to the pattern. Thus, an inner copper pattern 534 and a through hole 536 were formed on each of the two sides of the substrate 530 (step (B) shown in FIG. 52).

(2) The substrate 530 having the inner copper pattern 34 and the through hole 536 was cleaned with water, and then the substrate 530 was dried. Then, oxidizing bath (a blackening bath) composed such that NaOH (10 g/l), NaClO2 (40 g/l) and Na3O4 (6 g/l) and reducing bath composed of NaOH (10 g/l) and NaBH4 (6 g/l) were used so that oxidizing-reducing process was performed. Thus, a coarsened layer 538 was formed on the surfaces of the inner copper pattern 534 and the through hole 536 (step (C) shown in FIG. 52).

(3) A raw material composition for preparing a resin filler was mixed and kneaded so that the resin filler was prepared.

(4) The resin filler prepared in step (3) was applied to the two sides of the substrate 530 by using a roll coater within 24 hours from the preparation. Thus, the resin filler was filled between the inner copper pattern 34 and the inner copper pattern 534 or in the through hole 536. Then, the resin filler was dried at 70° C. for 20 minutes. Also another surface was subjected to a similar process. Thus, the resin filler 540 was filled between the inner copper patterns 534 or in the through hole 536. Then, the resin filler 540 was dried at 70° C. for 20 minutes (step (D) shown in FIG. 52).

(5) Either side of the substrate 530 subjected to step (4) was ground by belt sander grinding using a # 600 belt grinding paper (manufactured by Sankyo). Then, buffing was performed.

Then, a heat process was performed at 120° C. for one hour and at 150° C. for one hour so that the resin filler 540 was hardened.

Figure 53:
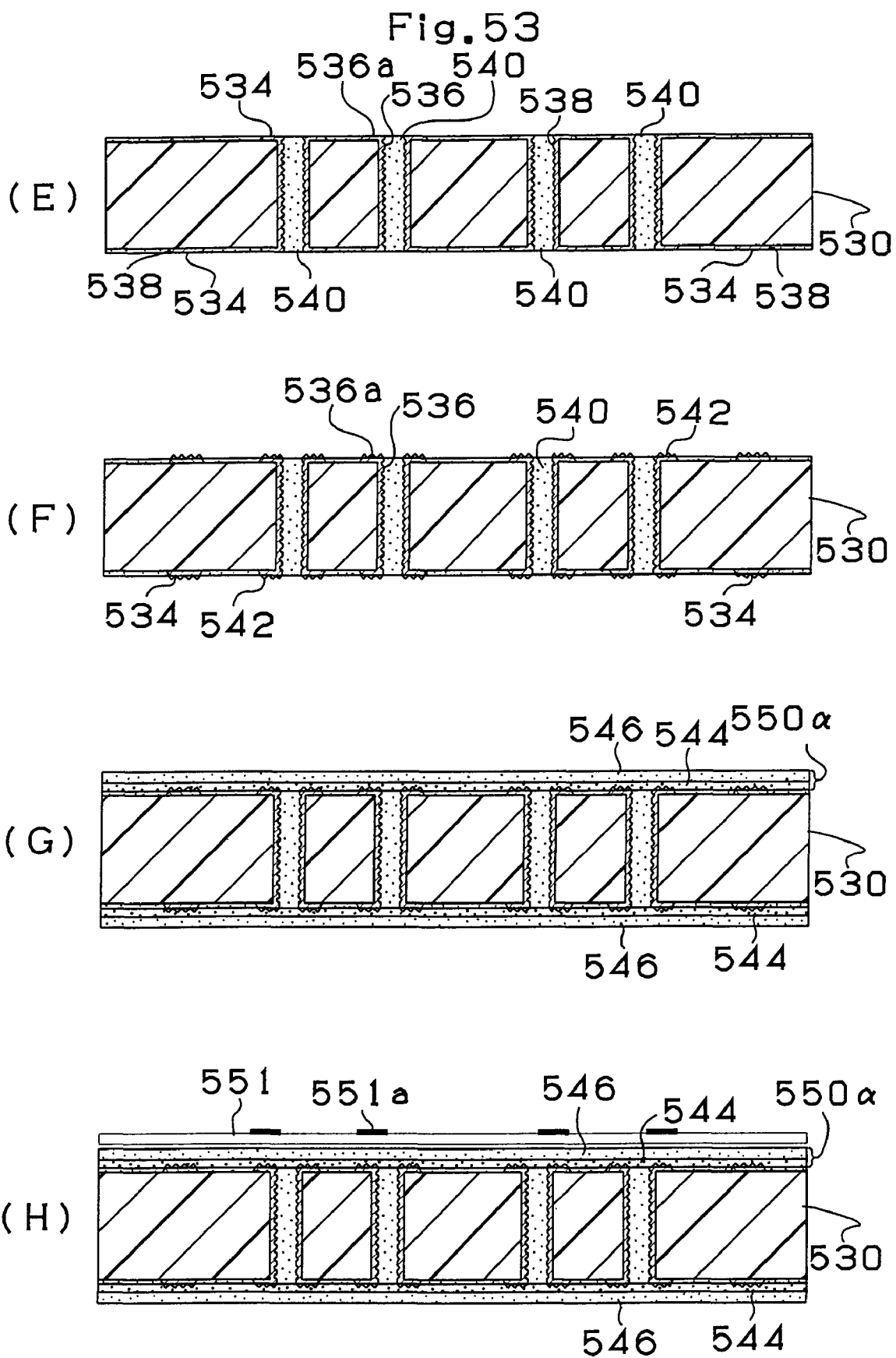
FIGS. 53 (E), 53 (F), 53 (G) and 53 (H) are diagrams showing a process for manufacturing the package substrate according to the fifth embodiment.

(6) The package substrate having the conductor circuit formed thereon was decreased with an alkaline material so that soft etching was performed. Then, a process was performed by using catalyst solution composed of palladium chloride and organic acid so that Pd catalyst was supplied. The foregoing catalyst was activated, and then immersed in electroless plating solution composed of copper sulfate by $3.2 \times 10^{-2}$ mol/l, nickel sulfate by $3.9 \times 10^{-3}$ mol/l, a complexing agent by $5.4 \times 10^{-2}$ mol/l, sodium hypophosphite by $3.3 \times 10^{-1}$ mol/l, boric acid $5.0 \times 10^{-1}$ mol/l and surface active agent (Surfil 465 manufactured by Nissin) by 0.1 g/l and having PH=9. One minute after the immersion, vertical vibrations and lateral vibrations were performed one time/four second. Thus, a coating layer constituted by a needle alloy composed of Cu—Ni—P and a coarsened layer 542 were formed on the surface of the inner copper pattern 534 and that of a land 536a of the through hole 536 (step (F) shown in FIG. 53). The maximum height of asperities of the coarsened layer 542 was 3 μm.

After the coarsened layer was formed, Cu—Sn substitution reaction was caused to take place under conditions that tin borofluoride by 0.1 mol/l, thiourea by 1.0 mol/l, the temperature was 35° C. and PH=1.2. Thus, an Sn layer (not shown) having a thickness of 0.3 μm was formed on the surface of the coarsened layer.

(7) A raw material for preparing the interlayer resin insulating material was stirred and mixed so that the viscosity was adjusted to 1.5 Pa·s. Thus, an interlayer resin insulating material (for the lower layer) was obtained.

Then, a raw material composition for preparing the adhesive agent for electroless plating was stirred and mixed so that the viscosity was adjusted to 7 Pa·s. Thus, the adhesive agent solution for electroless plating (for the upper layer) was obtained.

(8) The two sides of the substrate 530 manufactured in step (6) was coated with the interlayer resin insulating material (for the lower layer) 44 obtained in step (7) and having the viscosity of 1.5 Pa·s by a roll coater 24 hours after the preparation. Then, the substrate 530 was allowed to stand for 20 minutes in a horizontal state. Then, drying (prebaking) was performed at 60° C. for 30 minutes. Then, the photosensitive adhesive solution (for the upper layer) 46 obtained in step (7) and having the viscosity of 7 Pa·s was applied 24 hours after the prepared. Then, the substrate 530 was allowed to stand for 20 minutes in the horizontal state. Then, drying (prebaking) at 60° C. was performed for 30 minutes. Thus, an adhesive layer 550a having a thickness of 35 μm was formed (step (G) shown in FIG. 53).

(9) A photomask film 551 having a printed black circle 551a having a diameter of 85 mm was made in hermetic contact with each of the two sides of the substrate 530 having the adhesive layer 550a formed in step (8). Then, an extra-high pressure mercury lamp was operated to perform exposure with 500 mJ/cm2 (step (H) shown in FIG. 53). Then, spray development was performed by using DMTG solution. Then, the substrate was exposed with the extra-high pressure mercury lamp with 3000 mJ/cm2, and then a heating process was performed at 100° C. for one hour, 120° C. for one hour and 150° C. for three hours (post baking). Thus, an interlayer resin insulating layer (a two-layer structure) 550 incorporating an opening (an opening for forming the via hole) 48 having a diameter of 85 mm, corresponding to the photomask film, exhibiting excellent dimension accuracy and having a thickness of 35 mm was formed (step (I) shown in FIG. 54). Note that the tin plated layer (not shown) was partially exposed in the opening 548 for a via hole.

The interlayer resin insulating layer can be made by using a resin film of which the via hole is formed by the photo or the laser.

(10) The substrate 530 having the formed opening 48 was immersed in chromic acid for 19 minutes. Then, epoxy resin particles present on the surface of the interlayer resin insulating layer 550 were dissolved and removed so that the surface of the inter layer resin insulating layer 550 was coarsened (step (J) shown in FIG. 54). Then, the substrate 530 was immersed in neutral solution (manufactured by Shiplay), and then the substrate 530 was cleaned with water.

Then, palladium catalyst (manufactured by Atotech) was supplied to the surface of the substrate subjected to the coarsened process (a depth of coarsening was 6 μm) so that catalyst cores (not shown) were supplied to the surface of the inter layer resin insulating layer 550 and the inner surface of the opening 548 for a via hole.

Figure 54:
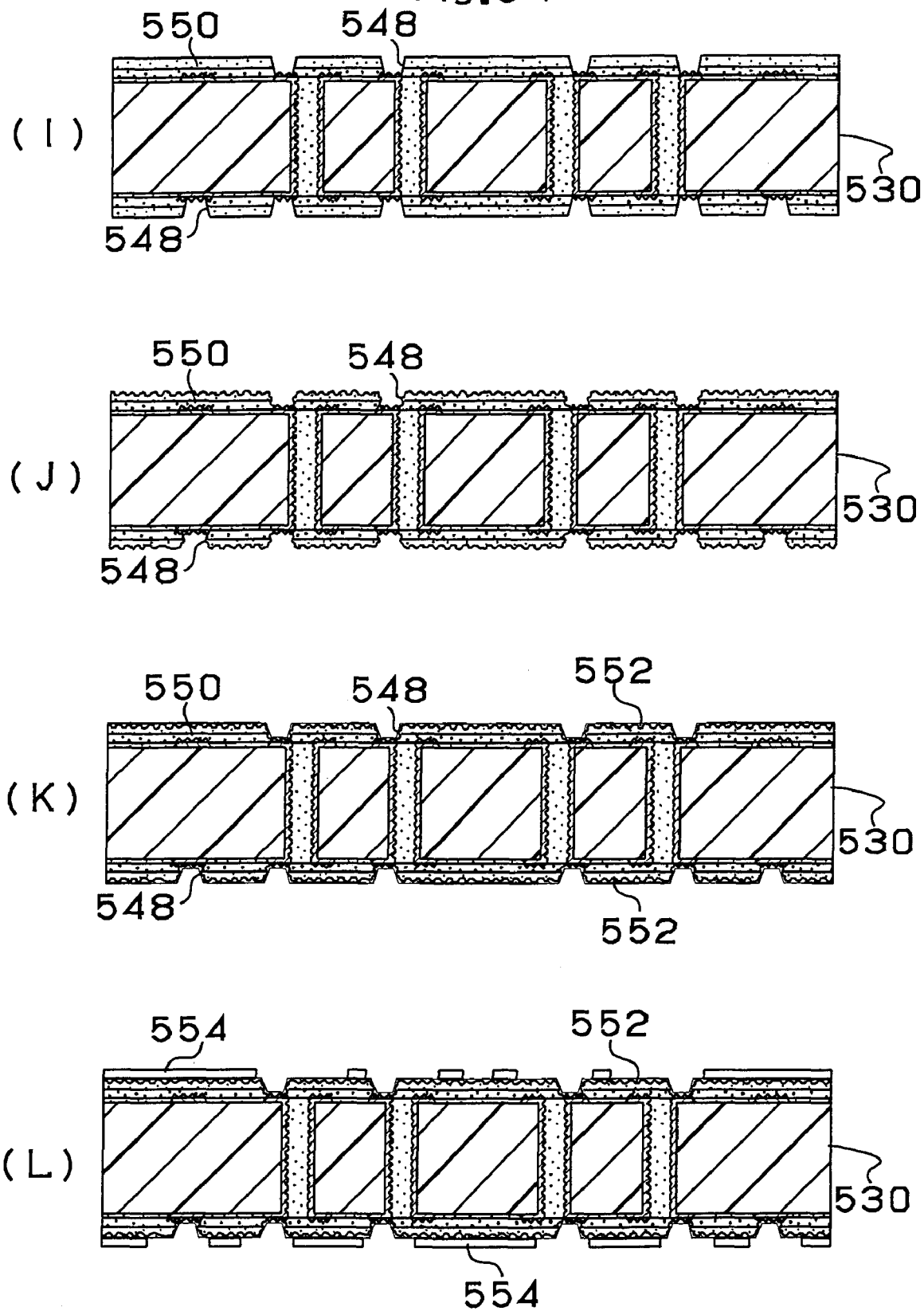
FIGS. 54 (I), 54 (J), 54 (K) and 54 (L) are diagrams showing a process for manufacturing the package substrate according to the fifth embodiment.

(11) The substrate was immersed in electroless copper plating solution having the following composition so that an electroless copper-plated film 552 having a thickness of 0.6 μm to 1.2 μm was formed on the overall surface of the coarsened surface (step (K) shown in FIG. 54).

| [Electroless Plating Solution] | |
| --- | --- |
| EDTA | 0.08 mol/l |
| Copper Sulfate | 0.03 mol/l |
| HCHO | 0.05 mol/l |
| NaOH | 0.05 mol/l |
| a,a'-bipyridyl | 80 mg/l |
| PEG | 0.10 g/l |

[Electroless Plating Conditions]
20 minutes such that the resin of the solution was 65° C.

(12) A marketed photosensitive dry film was applied to the surface of the electroless copper-plated film 552 formed in step (11). Then, a mask was placed, and then, exposure was performed with 100 mJ/cm². Then, a development process was performed by using 0.8% sodium carbonate. Thus, a plating resist 554 having a thickness of 15 μm was formed (step (L) shown in FIG. 54).

Figure 55:
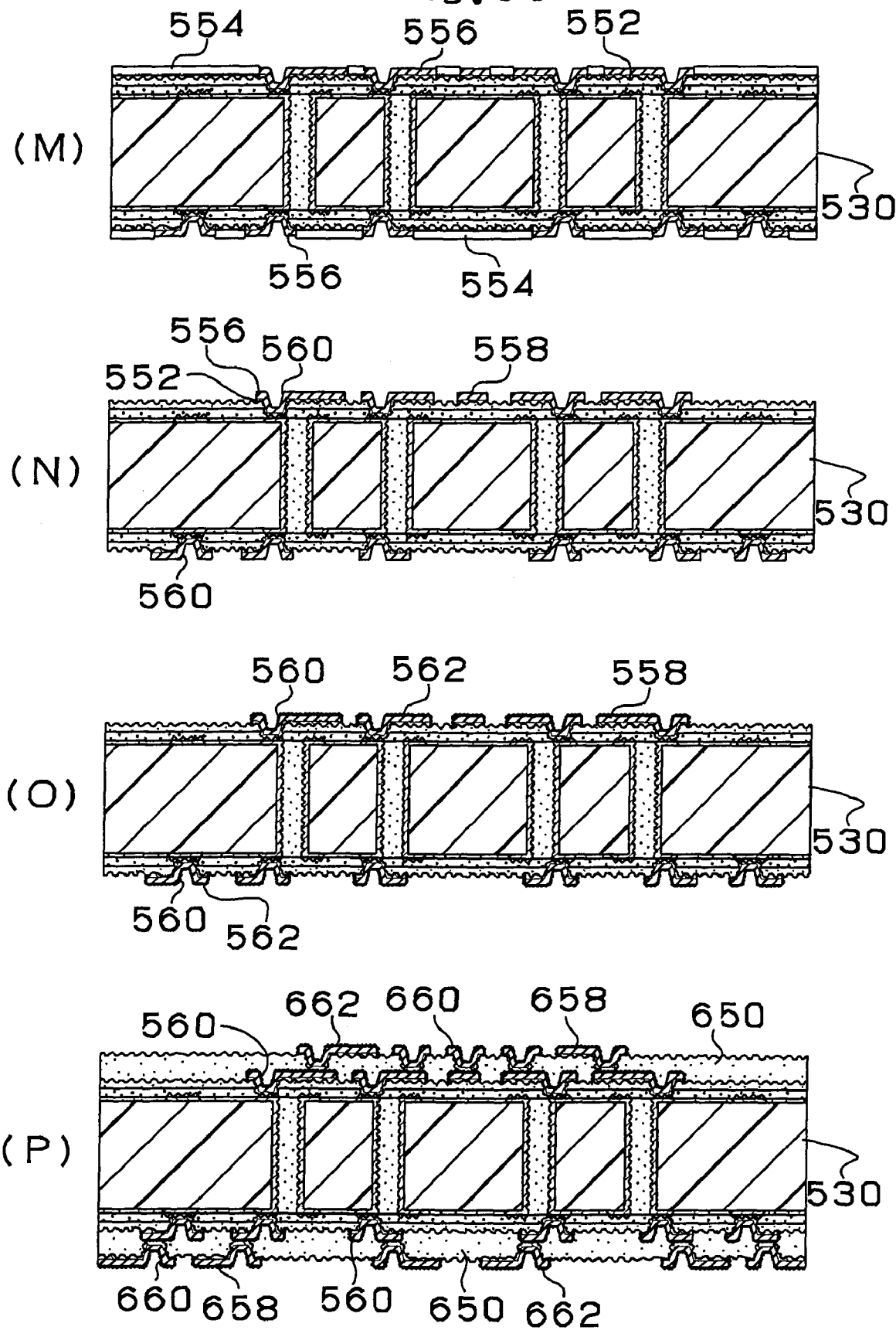
FIGS. 55 (M), 55 (N), 55 (O) and 55 (P) are diagrams showing a process for manufacturing the package substrate according to the fifth embodiment.

(13) Then, the portion in which no resist was formed was subjected to electrolytic copper plating under the following conditions so that an electrolytic copper-plated film 556 having a thickness of 15 μm was formed (step (M) shown in FIG. 55).

| [Electrolytic Plating Solution] | |
| --- | --- |
| Sulfuric Acid | 2.24 mol/l |
| Copper Sulfate | 0.26 mol/l |
| Additive (CAPALASIDE HL manufactured by ATOTECH) | 19.5 ml/l |
| [Electrolytic Plating Conditions] | |
| Density of Electric Current | 1 A/dm2 |
| Duration | 65 minutes |
| Temperature | 22 ± 2° C. |

(14) The plating resist 554 was separated and removed by using 5% KOH. Then, the electroless plated film below the plating resist was etched with mixed solution of sulfuric acid and hydrogen peroxide so as to be dissolved and removed. Thus, a conductor electric circuit 558 composed of the electroless copper plated film and the electrolytic copper plated film and a thickness of 18 μm and a via hole 560 were formed (step (N) shown in FIG. 55).

(15) A process similar to that in step (6) was performed so that a coarsened layer 562 made of Cu—Ni—P was formed. Then, Sn-substitution of the surface was performed (step (O) shown in FIG. 55).

Without using the plating alloy, the coarsened layer can be made by the etching (second copper complex and organic acid salt).

(16) Steps (7) to (15) were repeated so that the upper conductor electric circuit 658 and the via hole 660 (the conductor circuit) were formed. Thus, a multilayer printed circuit board was obtained (step (P) shown in FIG. 55). Note that the Sn substitution was not performed.

(17) On the other hand, 46.67 g of oligomer (having a molecular weight of 4000) which was obtained by forming 50% of epoxy bases of 60 wt % cresol novolak epoxy resin (manufactured by Nippon Kayaku) dissolved in DMDG into acrylic material and with which was given the photosensitive characteristic, 15.0 g of 80 wt % bis phenol A-type epoxy resin (EPICOAT manufactured by Yuka Shell) dissolved in methyl ethyl ketone, 1.6 g of imidazole hardener (2E4MZ- CN manufactured by Shikoku Kasei), 3 g of polyhydric acrylic monomer (R604 manufactured by Nippon Kayaku) which is photosensitive monomer, 1.5 g of polyhydric acrylic monomer (DPE6A manufactured by Kyoeisha) and 0.71 g of dispersing defoaming agent (S-65 manufactured by Sannopko) were mixed with one another. Then, 2 g of benzophenone (manufactured by Kanto Kagaku) serving as a photoinitiator and 0.2 g of Michler's ketone (manufactured by Kanto Kagaku) serving as a photosensitizer were added. Then, the viscosity was adjusted to 2.0 Pa·s at 25° C. so that a solder resist composition was obtained.

(18) Each of the two sides of the multilayer circuit board obtained in step (16) was coated with the foregoing solder resist composition to have a thickness of 20 μm. Then, a drying process was performed at 70° C. for 20 minutes and 70° C. for 30 minutes. Then, a photomask film (not shown) having a circular pattern (a mask pattern) for forming the opening and the recess around the opening and having a thickness of 5 mm was disposed in close contact. Then, exposure was performed with ultra violet rays with 500 mJ/cm² so that a recess 571b was formed around the opening (step (B) shown in FIG. 62) Then, photomask film (not shown) having a circular pattern (a mask pattern) for forming the opening drawn thereon and having a thickness of 5 mm was placed in closed contact. Then, exposure was performed with ultra violet rays with 1000 mJ/cm², and then the DMTG development process was performed. Then, a heating process was performed at 80° C. for one hour, 100° C. for one hour, 120° C. for one hour and 150° C. for three hours so that the solder pad portion (including the via hole and its land portion) was formed into the opening 571 (having a diameter of 200 μm). Thus, a solder resist layer (having a thickness of 200 μm) 570 was formed (step (Q) shown in FIG. 56).

(19) Then, solder 575 having a composition that Sn/Pb=4:6 and serving as the adhesive layer was formed on the surface of the opening 571 of the solder resist layer 570 to have a thickness of 18 μm (step (R) shown in FIG. 56).

Figure 57:
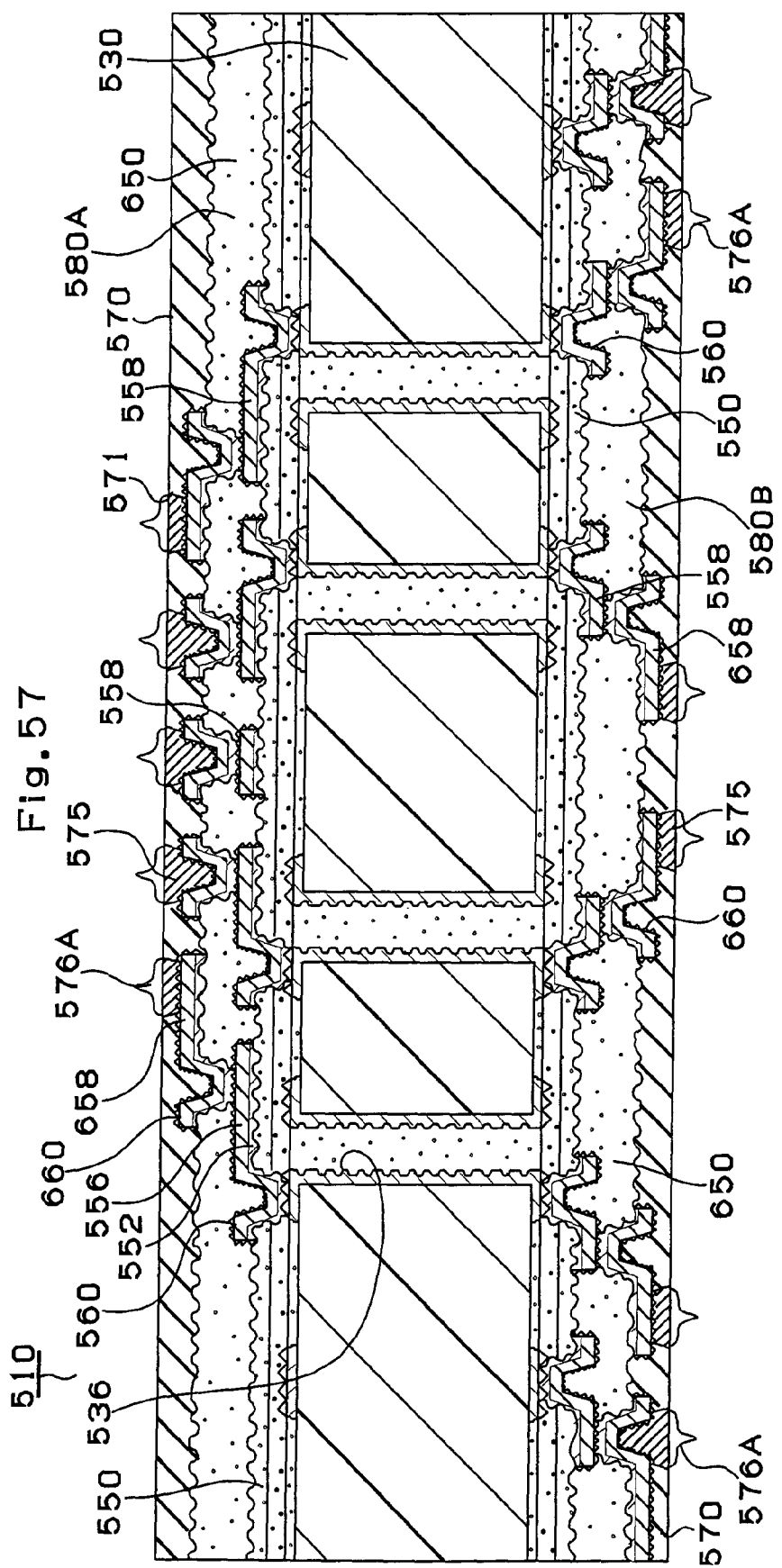
FIG. 57 is a cross sectional view showing the package substrate according to the fifth embodiment.

On the other hand, the projecting pin 576A constituted by 42-alloy was supported by a pin holding jig (not shown). Then, flux was applied to the inner surface of the opening 571, and then reflowing was performed in a state in which the jig holding the projecting pin 576A was made contact with the package substrate so that the projecting pin 576A was connected to the solder 575. Thus, a package substrate 510 having the projecting pin metal pin was obtained (see FIG. 57).

(First Modification)

The basic structure was the same as that according to the fifth embodiment. A metal layer was formed on the inner surface of the opening.

Steps (1) to (18) were the same as those according to the fifth embodiment. An opening 571 having an opening 571 was formed (step (Q) shown in FIG. 58).

(19) The substrate having the opening in the solder resist layer hereof was immersed in an electroless nickel plating solution composed of nickel chloride by 30 g/l, sodium hypophosphite by 10 g/l and sodium citrate by 10 g/l and having pH=5 for 20 minutes. Thus, a nickel layer 572 having a thickness of 5 μm was provided for the opening. Then, the substrate 530 was immersed in an electroless plating solution composed of gold cyanide potassium by 2 g/l, ammonium chloride by 75 g/l, sodium citrate by 50 g/l and sodium hypophosphite by 10 g/l at 93° C. for 23 seconds. Thus, a gold-plated layer 574 having a thickness of 0.03 μm was formed on the nickel layer 572 (step (R) shown in FIG. 58)

(20) Then, solder 575 having a composition that Sn/Pb=4:6 serving as the adhesive layer for the opening 571 of the solder resist layer 570 was formed by mask printing to have a thickness of 18 mm.

On the other hand, the projecting pin 576A constituted by 42-alloy was supported by a pin holding jig (not shown). Then, flux was applied to the inner surface of the opening 571, and then reflowing was performed at 200° C. in a state where the jig supporting the projecting pin 576A was made contact with the package substrate so that the connection was established. Thus, a package substrate 510 incorporating the projecting metal pin was obtained (see FIG. 59).

(Second Modification)

The basic structure was the same as that according to the fifth embodiment. Four recesses were formed around each opening 571.

Steps (1) to (17) were the same as those according to the fifth embodiment.

(18) Each of the two sides of the multilayer circuit board 10 obtained in step (16) was coated with the solder resist composition 70 to have a thickness of 20 μm (step (A) shown in FIG. 62). Then, a drying process was performed at 70° C. for 20 minutes and 70° C. for 30 minutes. A photomask film (not shown) having a circular pattern (a mask pattern) for forming the opening and the recess around the opening and having a thickness of 5 mm was disposed in close contact. Then, exposure was performed with ultra violet rays with 500 mJ/cm², and then the DMTG development process was performed. Then, a heating process was performed at 80° C. for one hour, 100° C. for one hour, 120° C. for one hour and 150° C. for three hours. Thus, the solder pad portion (including the via hole and its land portion) was formed into the opening 571 (having a diameter of 150 μm). Thus, a solder resist layer (having a thickness of 20 μm) 70 having four recesses 571b each having a diameter of 10 μm and a depth of 10 μm around the opening 571 on the diagonal was formed (step (C) shown in FIG. 62).

(19) As the adhesive layer of the opening 571 of the solder resist layer 570, solder 575 having a composition that Sn/Pb=4:6 was formed by mask printing to have a thickness of 18 μm (step (D) shown in FIG. 63).

On the other hand, the projecting pin 576D (see FIG. 71 (D)) constituted by 42-alloy was supported by a pin holding jig (not shown). Then, flux was applied to the inner surface of the opening 571, and then reflowing was performed to establish the connection in a state in which the jig supporting the projecting pin 576D was made contact with the package substrate. Thus, a package substrate 510 having the projecting metal pin was obtained (step (E) shown in FIG. 63).

(Third Modification)

Figure 64:
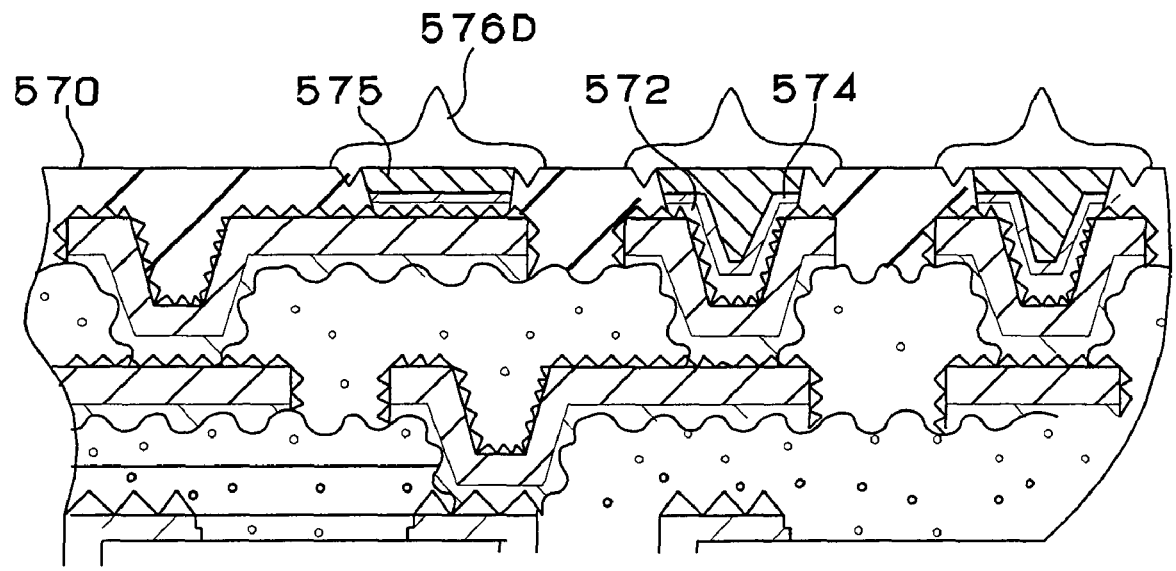
FIG. 64 is a diagram showing a process for manufacturing a package substrate according to a third modification of the fifth embodiment.
Figure 76:
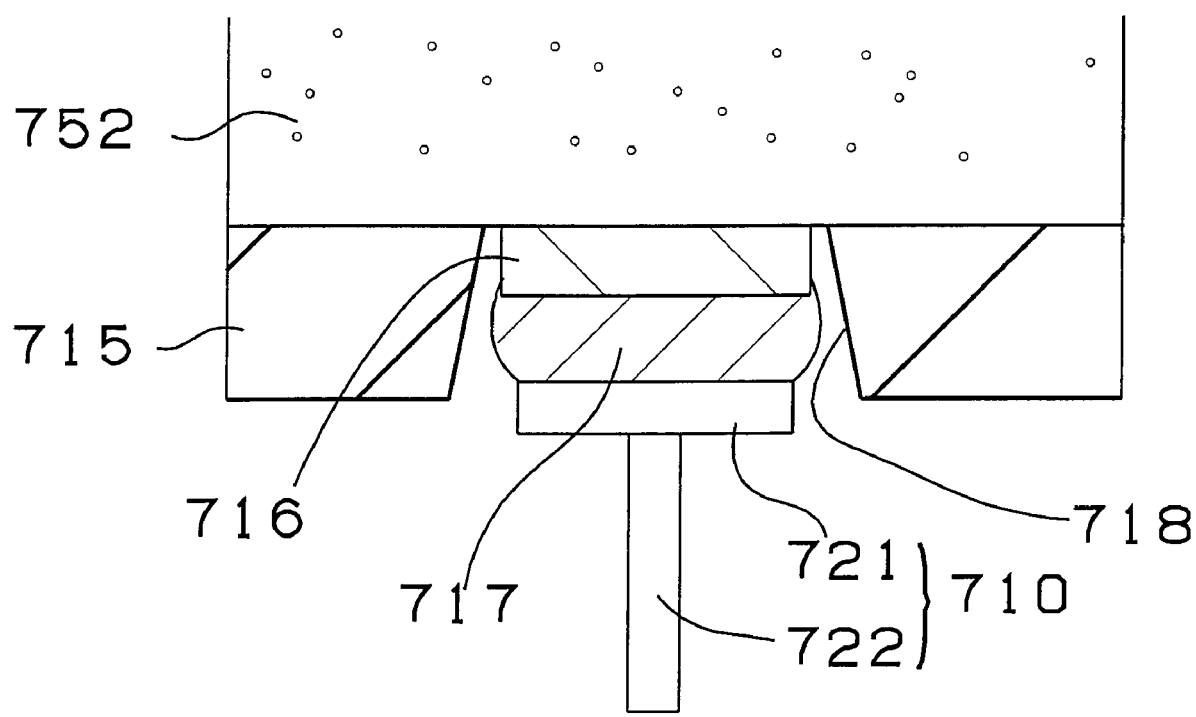
FIG. 76 is a cross sectional view showing a conventional package substrate.

The structure was basically the same as that according to the second modification. As shown in FIG. 64, a metal layer was formed in the opening 571. Similarly to the first modification, the metal layer was such that the nickel layer 572 and the gold-plated layer 574 were formed.

(Fourth Modification)

The basic structure was the same as that according to the first modification. As the metal layer, an aluminum layer was formed in the opening. Steps (1) to (18) were the same as those according to the first modification.

(19) The substrate 530 having the opening 571 formed in the solder resist layer 570 was subjected to the following process: an aluminum layer 672 was, by sputtering, formed on the conductor electric circuit 658 and the via hole 660 through which the opening 571 was exposed to the outside to have a thickness of 4 μm (step (A) shown in FIG. 65).

(20) Silver brazing material (BAg-8) 75 C in a quantity of 0.1 g was placed on the aluminum layer 672 of the opening 571 so as to be dissolved (step (B) shown in FIG. 65). Then, a projecting pin 576A made of covar was placed on the dissolved silver brazing material 75C so as to be joined by crimping. Thus, a package substrate was obtained (step (C) shown in FIG. 65).

(Fifth Modification)

The basic structure was the same as that according to the fifth embodiment. The metal particles in the adhesive layer was copper, while polyimide resin was employed as the thermoplastic resin.

Steps (1) to (18) were the same as those according to the first modification.

(19) The adhesive agent was prepared by using metal particles and thermoplastic resin. Copper which was metal particles was formed into spherical shapes having a diameter of 1 μm and a diameter of 0.6 μm, respectively. The molded copper particles arranged such that copper particles having the diameter of 1 μm and those having the diameter of 0.6 μm were blended at a ratio of 3:1, as the thermoplastic resin, stirred in polyimide resin such that coagulation was prevented. The filling factor was made to be 85%. Thus, a tablet 675 having a diameter of 50 μm and a thickness of 10 μm was molded.

(20) The molded tablet 675 was inserted into the opening 571 (step (A) shown in FIG. 66), and then the substrate was heated to 200° C. Then, a projecting pin 576A made of covar was placed, and then crimping was performed to perform joining. Thus, a package substrate was obtained (step (B) shown in FIG. 66).

(Sixth Modification)

The basic structure was the same as that according to the third modification. An Sn layer was provided for the metal layer by Cu—Sn substitutional reaction. As the adhesive layer, silica was employed as the inorganic particle and epoxy resin was employed as the thermosetting resin.

Steps (1) to (16) were the same as those according to the fifth embodiment.

(17) Before the solder resist layer was formed, the surface of the coarsened layer of the conductor circuit was tin-substituted so that a tin layer having a thickness of 0.3 μm was formed.

(18) On the other hand, 46.67 g of oligomer (having a molecular weight of 4000) which was obtained by forming 50% of epoxy bases of 60 wt % cresol novolak epoxy resin (manufactured by Nippon Kayaku) dissolved in DMDG into acrylic material and with which was given the photosensitive characteristic, 15.0 g of 80 wt % bis phenol A-type epoxy resin (EPICOAT 1001 manufactured by Yuka Shell) dissolved in methyl ethyl ketone, 1.6 g of imidazole hardener (2E4MZ-CN manufactured by Shikoku Kasei), 3 g of polyhydric acrylic monomer (R604 manufactured by Nippon Kayaku) which is photosensitive monomer, 1.5 g of polyhydric acrylic monomer (DPE6A manufactured by Kyoeisha) and 0.71 g of dispersing defoaming agent (S-65 manufactured by Sannopko) were mixed with one another. Then, 2 g of benzophenone (manufactured by Kanto Kagaku) serving as a photoinitiator and 0.2 g of Michler's ketone (manufactured by Kanto Kagaku) serving as a photosensitizer were added. Then, the viscosity was adjusted to 2.0 Pa·s at 25° C. so that a solder resist composition was obtained.

Note that the viscosity was measured by using No. 4 rotor of a B-type viscometer (DVL-B manufactured by Tokyo Keiki) when the velocity was 60 rpm and No. 3 rotor of the same when the velocity was 6 rpm.

(19) The solder resist composition 70 was applied to each side of the multilayer circuit board obtained in step (17) to have a thickness of 20 μm (step (A) shown in FIG. 67). Then, a drying process was performed at 70° C. for 20 minutes and 70° C. for 30 minutes. Then, a photomask film (not shown) having a circular pattern (a mask pattern) drawn thereon and a thickness of 5 mm was made in hermetic contact and placed. Then, exposure was performed with ultra violet rays with 1000 mJ/cm$^2$, and then a DMTG development process was performed. Then, a heat process was performed at 80° C. for one hour, 100° C. for one hour, 120° C. for one hour and 150° C. for three hours. Thus, a solder resist layer (having a thickness of 20 μm) 70 having the opening 571 (having a diameter of 200 μm) constituted by the solder pad portion (including the via hole and its land portion) was formed (step (B) shown in FIG. 67).

(20) Two recesses 571*b* each having a diameter of 50 μm and a depth of 15 μm were formed around the opening 571 by using a drill 630 having a diameter of 50 μm (step (C) shown in FIG. 67).

(21) The adhesive agent was constituted by inorganic particles and thermosetting resin. Silica in the form of inorganic particles was formed into a polygonal shape having a diameter of 1 μm. The molded inorganic particles were immersed in nickel plating solution, and then the surface layer of the inorganic particle was coated with a nickel layer. The inorganic particle coated with nickel was, as the thermosetting resin, stirred in epoxy resin such that coagulation was prevented. The filling factor was made to be 90%. Then, the thermosetting resin was injected into a pot for potting such that introduction of air was inhibited.

(20) Potting was performed to insert the adhesive agent 75D into the opening 571 (step (D) shown in FIG. 68). Then, heating was performed, and then the projecting pin 576D made of covar was placed. Then, hardening was performed at 200° C. so that joining was performed. As a result, a package substrate was obtained (step (E) shown in FIG. 68).

(Seventh Modification)

The basic structure was the same as that according to the first modification. As shown in FIG. 69 (A), nickel plating 572 was performed as the metal layer. Gold plating was not performed. As the projecting pin 576A, the inner portion was made of covar and the surface layer was constituted by gold plating. Thus, coating with gold was performed.

(Eighth Modification)

The basic structure was the same as that according to the first modification. As shown in FIG. 71 (E), the projecting pin 576E had a structure that the inner portion was made of ceramic 77, the surface layer was formed by nickel and copper coating. Thus, a package substrate was obtained.

(Ninth Modification)

Referring to FIGS. 72 and 73, a package substrate according to a ninth modification will now be described.

In the ninth modification, a projecting pin 576F, the side surface and bottom surface of which were shown in FIG. 71 (F) is employed. The projecting pin 576F has five projections 576*b* formed over the bottom surface. Initially, an opening 571 is formed in the solder resist 571 of a package substrate shown in FIG. 72 (A). Then, a recess 571*b* allowed to communicate with a conductor circuit 658 is formed in the opening 571 (FIG. 72 (B)). Then, a metal layer 73 made of nickel and so forth is formed in the opening 571 (FIG. 72 (C)). Then, an adhesive layer 575 made of solder and so forth is formed on the metal layer 73 (FIG. 73 (D)). Finally, the projecting pin 576F is accommodated in the opening 571.

In the ninth modification, the electrical connection is established with the conductor circuit 658 through the recess 571b as well as the opening 571. Therefore, transmission of a large capacity electric power and large capacity electric signal to the external substrate can be performed without any problem.

(Tenth Modification)

The basic structure is the same as that according to the fifth embodiment. The solder layer was in the form of Sn/Sb.

Comparative Example

The basic structure was the same as that according to the fifth embodiment. The electrode formed from the opening was molded as a solder ball so that an IC chip was mounted.

The package substrates according to the fifth embodiment to the eighth modification and the comparative example were evaluated such that the joining strength, tensile test after the external substrate was mounted (the reliability test), occurrence of a crack and breakage of the electrode were compared. Results were shown in the graph shown in FIG. 74

The fifth embodiment to the eighth modification were such that the joining strength was 20 Kg/cm$^2$ or greater, no defective connection of the electrode occurred in the tensile test and the reliability test was resulted in no crack and breakage of the electrode under the heat cycle conditions after 1000 cycles.

Sixth Embodiment

A package substrate according to a sixth embodiment will now be described with reference to FIG. 75.

The resin multilayer printed circuit board 10 has build-up circuit layers 80U and 80D on the right and reverse sides of the core substrate 30. The build-up circuit layers 80U and 80D incorporates a lower interlayer resin insulating layer 50 having a via hole 46, an upper interlayer resin insulating layer 60 having an upper via hole 66 and a solder resist layer 70 formed on the upper interlayer resin insulating layer 60. A solder bump (an external connection terminal) 76 for establishing the connection to an IC chip (not shown) is provided for the upper via hole 66 through an opening 71 of the solder resist 70. A conductive connecting pin (an external connection terminal) 78 for establishing the connection to a daughter board (not shown) is connected to the lower via hole 66.

In the sixth embodiment, a through hole 36 for connecting the build-up circuit layers 80U and 80D to each other penetrates the core substrate 30 and the lower interlayer resin insulating layer 50. The through hole 36 is filled with a resin filler 54. Cover plating 58 is applied to the opening. Similarly, the via hole 46 formed in the lower interlayer resin insulating layer 50 is filled with a resin filler 54. The opening is applied with cover plating 58.

In the sixth embodiment, a through hole is formed to penetrate the core substrate 30 and the lower interlayer resin insulating layer 50 by drilling or a laser beam so that the through hole 36 is formed. The via hole 66 is formed immediately above the through hole 36. Therefore, the through hole 36 and the via hole 66 are disposed in line so that the length of the electric line is shortened. Thus, a signal transmission rate can be raised. Since the through hole 36 and the via hole 66 which is connected to the external connection terminal (a solder pump 76 and a conductive connecting pin 78) are directly connected to each other, satisfactory connection reliability can be realized. In particular, the sixth embodiment has the structure that a filler 54 enclosed in the through hole 36 is flattened by grinding. Then, the cover plating (the conductor layer) 58 is applied. Then, the via hole 66 is formed on the cover plating 58. Therefore, the surface of the through hole 36 exhibits satisfactory smoothness. Moreover, satisfactory connection reliability between the through hole 36 and the via hole 66 can be realized.

The multilayer printed circuit board according to the sixth embodiment has the structure that the same filling resin 54 is enclosed in the through hole 36 and the lower via hole 46. The filler resin is simultaneously ground so as to be flattened. Therefore, the cost reduction is permitted. The strength of the inside portion of the through hole and that in the via hole can uniformly be maintained. As a result, the reliability of the multilayer printed circuit board can be improved. The filler 54 enclosed in the via hole 46 is flattened by grinding, and then the cover plating (the conductor layer) 58 for covering the filler 54 is applied. Then, the upper via hole 66 is formed on the cover plating 58. Therefore, the surface of the lower via hole 46 exhibits excellent flatness. Therefore, connection reliability between the lower via hole 46 and the upper via hole 66 can be improved.

To secure the conductive connecting pin 78 to the lower via hole 66, a solder layer 77 in the form of Sn/Sb, Sn/Ag or Sn/Ag/Cu is provided.

What is claimed is:

1. A package substrate comprising:
   an inner interlayer resin insulating layer;
   a conductor layer formed over the inner interlayer resin insulating layer;
   an outermost interlayer resin insulating layer formed over the conductor layer;
   a pad structure having an outermost conductor portion formed on the outermost interlayer resin insulating layer and a plurality of via holes formed through the outermost interlayer resin insulating layer, each of the plurality of via holes being formed directly on the conductor layer and electrically connecting the outermost conductor portion to the conductor layer and;
   a solder resist formed on the outermost interlayer resin insulating layer and the pad structure, the solder resist having an opening exposing a partially exposed portion of the pad structure; and
   a conductive connecting pin configured to establish an electrical connection with another substrate, the conductive connecting pin being secured to the partially exposed portion of the pad structure via a solder, the solder being disposed over the partially exposed portion of the pad structure,
   wherein the outermost conductor portion and the plurality of via holes comprise a first film having an electroless plated film structure, and a second film having an electrolytic plated film structure and formed on the electroless plated film structure.

2. The package substrate according to claim 1, further comprising:
   at least one additional conductor layer comprising a plurality of conductor circuits formed below the inner layer interlayer resin insulating layer.

3. The package substrate according to claim 1, wherein the conductor layer is positioned directly below the pad structure.

4. The package substrate according to claim 1, further comprising at least one lower via hole directly connected to the conductor layer and formed through the inner interlayer resin insulating layer, the at least one lower via hole being configured to electrically connect the plurality of via holes to at least one conductor circuit in at least one conductor layer formed below the inner interlayer resin insulating layer.

5. The package substrate according to claim 1, wherein the outermost conductor portion of the pad structure comprises a plane layer.

6. The package substrate according to claim 1, further comprising a signal line formed on the outermost interlayer resin insulating layer, wherein the signal line connects to the pad structure, and the signal line is covered with the solder resist.

7. The package substrate according to claim 1, wherein a diameter of the pad structure is 1.02 times to 100 times a diameter of the opening.

8. The package substrate according to claim 1, wherein the conductive connecting pin comprises a columnar connection portion and a plate-like secured portion, the secured portion is secured to the pad through the solder, and the conductive connecting pin comprises at least one of Cu, a copper alloy, Ti, Zn, Al and a noble metal.

9. The package substrate according to claim 1, wherein the pad structure has a roughened surface.

10. The package substrate according to claim 1, further comprising at least one metal layer formed in the partially exposed portion of the pad structure, wherein the solder is disposed over the at least one metal layer, and the at least one metal layer formed in the partially exposed portion of the pad structure comprises a plurality of metal layers.

11. The package substrate according to claim 1, further comprising at least one metal layer formed in the partially exposed portion of the pad structure, wherein the solder is disposed over the at least one metal layer, and the at least one metal layer formed in the partially exposed portion of the pad structure comprises at least one metal which prevents corrosion.

12. The package substrate according to claim 1, further comprising at least one metal layer formed in the partially exposed portion of the pad structure, wherein the solder is disposed over the at least one metal layer, and the at least one metal layer formed in the partially exposed portion of the pad structure comprises at least one material selected from the group consisting of gold, silver, copper, nickel, tin, aluminum, lead, phosphorus, chrome, tungsten, molybdenum, titanium, platinum and solder.

13. The package substrate according to claim 1, further comprising at least one metal layer formed in the partially exposed portion of the pad structure, wherein the solder is disposed over the at least one metal layer, and the at least one metal layer is formed in the partially exposed portion of the pad structure after the opening is formed in the solder resist.

14. The package substrate according to claim 1, further comprising at least one metal layer formed in the partially exposed portion of the pad structure, wherein the solder is disposed over the at least one metal layer.

15. The package substrate according to claim 1, wherein:
the conductor layer comprises:
an electroless copper layer formed on the inner interlayer resin insulating layer,
an electrolytic copper layer formed on the electroless copper layer,
a nickel layer formed on the electrolytic copper layer, and
a roughened layer comprising a nickel alloy formed on the nickel layer; and
the outermost interlayer resin insulating layer is formed on a peripheral region of the conductor layer, and on an internal region of the conductor layer between adjacent vias of said plurality of vias.

* * * * *